US012706132B2

(12) United States Patent
Rikimaru et al.

(10) Patent No.: US 12,706,132 B2
(45) Date of Patent: Aug. 11, 2026

(54) OPERATION METHOD OF SEMICONDUCTOR DEVICE

(71) Applicant: SEMICONDUCTOR ENERGY LABORATORY CO., LTD., Atsugi (JP)

(72) Inventors: Hidefumi Rikimaru, Tokyo (JP); Yoshiyuki Kurokawa, Sagamihara (JP); Satoru Ohshita, Hadano (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 63 days.

(21) Appl. No.: 18/727,223

(22) PCT Filed: Jan. 25, 2023

(86) PCT No.: PCT/IB2023/050612
§ 371 (c)(1),
(2) Date: Jul. 8, 2024

(87) PCT Pub. No.: WO2023/148580
PCT Pub. Date: Aug. 10, 2023

(65) Prior Publication Data

US 2025/0078895 A1 Mar. 6, 2025

(30) Foreign Application Priority Data

Feb. 7, 2022 (JP) ................................ 2022-017268

(51) Int. Cl.
*G11C 11/405* (2006.01)
*G11C 11/4096* (2006.01)
(Continued)

(52) U.S. Cl.
CPC ........ *G11C 11/405* (2013.01); *G11C 11/4096* (2013.01); *G11C 11/54* (2013.01); *H10B 12/00* (2023.02)

(58) Field of Classification Search
CPC ....... G06G 7/60; G11C 11/54; G11C 11/4096; G11C 11/405; H10B 12/00; G06F 7/523
See application file for complete search history.

(56) References Cited

U.S. PATENT DOCUMENTS 9,092,736 B2 7/2015 Aparin et al.
9,130,182 B2 9/2015 Seo et al.
(Continued)

FOREIGN PATENT DOCUMENTS

CN 102959565 A 3/2013
EP 2591451 A 5/2013
(Continued)

OTHER PUBLICATIONS

International Search Report (Application No. PCT/IB2023/050612) Dated Apr. 18, 2023.
(Continued)

*Primary Examiner* — Woo H Choi
(74) *Attorney, Agent, or Firm* — NIXON PEABODY LLP; Jeffrey L. Costellia

(57) ABSTRACT

An operation method of a semiconductor device that performs data writing and correction processing is provided. The operation method is for a semiconductor device including a control circuit, a first circuit, a second circuit, a wiring, a cell, and a converter circuit. In the operation method, first, the control circuit transmits, to the first circuit, a first signal corresponding to the value of first data. Next, the first circuit outputs, to the wiring, a first current with an amount corresponding to the first signal. Moreover, the cell retains a first potential corresponding to the amount of first current. Then,
(Continued)

the cell makes a second current corresponding to the first potential flow from the wiring, and the converter circuit outputs a second signal corresponding to the amount of second current. Next, the second circuit obtains a difference value between a value corresponding to the second signal and the value of the first data. If the difference value is 0, the operation is terminated. If the difference value is not 0, the control circuit generates an update value obtained by adding the difference value to a value corresponding to the first signal previously transmitted. The first circuit obtains the first signal corresponding to the update value and outputs the updated first current to the cell.

3 Claims, 51 Drawing Sheets

(51) Int. Cl.

| | |
|---|---|
| ***G11C 11/54*** | (2006.01) |
| ***H10B 12/00*** | (2023.01) |

(56) References Cited

U.S. PATENT DOCUMENTS

| | | | | |
|---|---|---|---|---|
| 10,733,946 | B2 | 8/2020 | Kurokawa | |
| 12,026,608 | B2 | 7/2024 | Kataeva et al. | |
| 2012/0011088 | A1 | 1/2012 | Aparin et al. | |
| 2019/0221248 | A1* | 7/2019 | Shim | G11C 7/1063 |
| 2020/0110991 | A1 | 4/2020 | Kataeva et al. | |
| 2022/0180159 | A1 | 6/2022 | Kimura et al. | |
| 2022/0254401 | A1 | 8/2022 | Kurokawa et al. | |
| 2022/0293049 | A1 | 9/2022 | Godo et al. | |
| 2023/0049977 | A1 | 2/2023 | Kurokawa et al. | |
| 2023/0284429 | A1 | 9/2023 | Godo et al. | |
| 2024/0237435 | A1 | 7/2024 | Tsuda et al. | |

FOREIGN PATENT DOCUMENTS

| | | | |
|---|---|---|---|
| JP | 2013-534677 | | 9/2013 |
| JP | 2018-036639 | A | 3/2018 |
| JP | 2019-003546 | A | 1/2019 |
| JP | 2019-046375 | A | 3/2019 |
| KR | 2013-0036325 | A | 4/2013 |
| TW | 201214307 | | 4/2012 |
| WO | WO-2012/006470 | | 1/2012 |
| WO | WO-2018/235448 | | 12/2018 |

OTHER PUBLICATIONS

Written Opinion (Application No. PCT/IB2023/050612) Dated Apr. 18, 2023.

Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.

Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.

Kagawa.Y et al., "The Scaling of Cu—Cu Hybrid Bonding For High Density 3D Chip Stacking", EDTM 2019 (IEEE Electron Devices Technology and Manufacturing Conference), Mar. 12, 2019, pp. 297-299.

Kagawa.Y et al., "Novel Stacked CMOS Image Sensor with Advanced Cu2Cu Hybrid Bonding", IEDM 2016: Technical Digest of International Electron Devices Meeting, Dec. 3, 2016, pp. 208-211.

Lhostis.S et al., "Reliable 300 mm Wafer Level Hybrid Bonding for 3D Stacked CMOS Image Sensors", ECTC 2016 (IEEE 66th Electronic Components and Technology Conference), May 31, 2016, pp. 869-876.

Baba.H et al., "Novel Analog in-Memory Compute with < 1 nA Current/Cell and 143.9 TOPS/W Enabled by Monolithic Normally-off Zn-rich CAAC-IGZO FET-on-Si CMOS Technology", IEDM 2021: Technical Digest of International Electron Devices Meeting, Dec. 11, 2021, pp. 466-469.

Gambino.J et al., "Reliability of Hybrid Bond Interconnects", IITC 2017 (IEEE International Interconnect Technology Conference), May 16, 2017, p. 3pages.

Boybat.I et al., "Temperature sensitivity of analog in-memory computing using phase-change memory", IEDM 2021: Technical Digest of International Electron Devices Meeting, Dec. 11, 2021, pp. 609-612.

Khaddam-Aljameh.R et al., "Hermes Core—A 14nm CMOS and PCM-based In-Memory Compute Core using an array of 300ps/LSB Linearized CCO-based ADCs and local digital processing", 2021 Symposium on VLSI Circuits Digest of Technical Papers, Jun. 13, 2021, pp. JFS2-5-1-JFS2-5-2.

Jung.S et al., "A crossbar array of magnetoresistive memory devices for in-memory computing", Nature, Jan. 12, 2022, vol. 601, No. 7892, pp. 211-216.

Jia.H et al., "A Programmable Heterogeneous Microprocessor Based on Bit-Scalable In-Memory Computing", IEEE Journal of Solid-State Circuits, Sep. 1, 2020, vol. 55, No. 9, pp. 2609-2621.

Luo.Y et al., "Experimental Demonstration of Non-volatile Capacitive Crossbar Array for In-memory Computing", IEDM 2021: Technical Digest of International Electron Devices Meeting, Dec. 11, 2021, pp. 474-477.

De.S et al., "Ultra-Low Power Robust 3bit/cell Hf0.5Zr0.5O2 Ferroelectric FinFET with High Endurance for Advanced Computing-In-Memory Technology", 2021 Symposium on VLSI Technology : Digest of Technical Papers, Jun. 13, 2021, pp. 1-2.

* cited by examiner 100
15
60_k
PON1 VDD PON2 VHM
50
22
23
31
41
ADDR
42
43
BW
CE
GW
CLK
32
33
WAKE
44
45
Din
Dout
47
48
WDA RDA GND
10 [1,1]
10 [1,q]
10 [i, j]
10 [p,1]
10 [p,q]
Y
X
Z 60_k
XCL [j]
VE1 [j]
WDL [j]
WDL [j+1]
VE1 [j+1]
XCL [j+1]
XCL [j+2]
VE1 [j+2]
WDL [j+2]
WDL [j+3]
VE1 [j+3]
XCL [j+3]
VE0 [i,s]
VE0 [i,s+1]
VE0 [i,s+2]
10 [i, j]
WCL [i,s]
10 [i, j+1]
10 [i, j+2]
WCL [i,s+1]
10 [i, j+3]
Z
Y
X 60_k
XCL [j]
VE1 [j]
WDL [j]
XCL [j+1]
VE1 [j+1]
WDL [j+1]
XCL [j+2]
VE1 [j+2]
WDL [j+2]
XCL [j+3]
VE1 [j+3]
WDL [j+3]
VE0 [i,s]
WCL [i,s]
VE0 [i,s+1]
WCL [i,s+1]
VE0 [i,s+2]
10 [i, j]
10 [i, j+1]
10 [i, j+2]
10 [i, j+3]
Y
X
Z 10[i, j]
WCL[i,s]
10[i, j+1]
VE0[i,s]
XCL [ j]
C5
WDL [ j]
F1
F1
WDL [ j+1]
C5
XCL [ j+1]
VE0[i,s+1]
60_k
Z
X
Y
F2
VE1 [ j]
F5
F5
VE1 [ j+1]
F2
242b
242b2
242b1
366
242a
242a2
242a1
230
230b
230a
WBL[i,s]

254
253
260
150a A6 A4 200a A8 200b 150b
A1 A2
160
154
153
Y
Z X
242b A5 205 A3 242a A7 240
224,230a,230b 242b 260 254 242a 253
282
275
224
222
230bb 230bc 230ba
230b 242b 260 254 242a 253
282
275
230a
224
222
230bb 230bc 230ba
230b 254
253
260
150a A6 A4 200a A8 200b 150b
A1 A2
160
154
153
Y
Z X
242b A5 205 A3 242a A7 240
224,230a,230b

4800
SCL2
SCL1
4802
4803
4801

4800a
4803a
4801a
4802

4700
4711
4800a
4802
4801a
4712
4714
4713
4704
4700
4702

4730
4731
4710
4732
4710
4735
4710
4710
4733

OPERATION METHOD OF SEMICONDUCTOR DEVICE

TECHNICAL FIELD

One embodiment of the present invention relates to an operation method of a semiconductor device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits, for example. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). For example, Non-Patent Document 1 and Non-Patent Document 2 each disclose an arithmetic device including an artificial neural network constructed using an SRAM (Static Random Access Memory).

An attempt has been made to use an arithmetic device in which an artificial neural network is constructed, for example, for correction of images to be displayed by a display apparatus. For example, in a display apparatus disclosed in Patent Document 1, an arithmetic circuit in which an artificial neural network is constructed is used to adjust the luminance, tone, and the like of displayed images in accordance with the preference of the user.

REFERENCE

Patent Document

[Patent Document 1] Japanese Published Patent Application No. 2018-36639

Non-Patent Documents

[Non-Patent Document 1] M. Kang et al., "IEEE Journal Of Solid-State Circuits", 2018, Volume 53, No. 2, pp. 642-655.

[Non-Patent Document 2] J. Zhang et al., "IEEE Journal Of Solid-State Circuits", 2017, Volume 52, No. 4, pp. 915-924.

SUMMARY OF THE INVENTION

Problems to be Solved by the Invention

Examples of an arithmetic circuit in which an artificial neural network is constructed include an arithmetic circuit that performs product-sum operation by yielding the sum of analog currents each corresponding to the product of a weight coefficient and input data. Since the arithmetic circuit performs arithmetic operation by using an analog current, the circuit scale can be smaller than that of an arithmetic circuit formed of a digital circuit and the circuit area can be small. Furthermore, the arithmetic circuit can have lower power consumption when designed such that an analog current used in the arithmetic operation becomes lower.

Examples of a configuration of the arithmetic circuit include a configuration in which, while a potential corresponding to a weight coefficient is retained, a potential corresponding to input data is input to the arithmetic circuit and accordingly an analog current corresponding to the product of the weight coefficient and the input data is output. In this case, the potential corresponding to the weight coefficient to be retained in the arithmetic circuit is preferably written correctly. However, the potential written to the arithmetic circuit may be shifted from an intended potential in accordance with conditions such as an operating environment of the arithmetic circuit. That is, in some cases, the weight coefficient retained in the arithmetic circuit is shifted from the intended weight coefficient that is actually written; thus, the arithmetic operation result in the arithmetic circuit might be different from the assumed result.

An object of one embodiment of the present invention is to provide an operation method of a semiconductor device in which a multiplicand or a multiplier (one of the multiplicand and the multiplier may be referred to as first data and the other may be referred to as second data in this specification and the like) is written correctly. Another object of one embodiment of the present invention is to provide an operation method of a semiconductor device with high arithmetic operation accuracy. Another object of one embodiment of the present invention is to provide an operation method of a semiconductor device that performs multiplication of a multi-valued multiplicand and a multi-valued multiplier. Another object of one embodiment of the present invention is to provide a novel operation method of a semiconductor device.

Note that the objects of one embodiment of the present invention are not limited to the objects listed above. The objects listed above do not preclude the existence of other objects. Note that the other objects are objects that are not described in this section and will be described below. The objects that are not described in this section can be derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all of the objects listed above and the other objects.

Means for Solving the Problems (1)

One embodiment of the present invention is an operation method of a semiconductor device including a control circuit, a first circuit, a second circuit, a first wiring, a first cell, and a converter circuit. The control circuit is electrically connected to the first circuit and the second circuit. The first circuit is electrically connected to the first wiring. An input terminal of the converter circuit is electrically connected to the first wiring, and an output terminal of the converter circuit is electrically connected to the second circuit. The first cell is electrically connected to the first wiring, and the first cell has a function of retaining a potential corresponding to the amount of current flowing from the first wiring and a function of making a current with an amount corresponding to the potential retained flow from the first wiring. The operation method of the semiconductor device includes a first step to a sixth step. The first step includes an operation in which the control circuit transmits, to the first circuit, a first signal corresponding to a value of first data. The second step includes an operation in which the first circuit generates a first current with an amount corresponding to the first signal by obtaining the first signal and outputs the first current to the first wiring; and an operation in which the first current flowing from the first wiring to the first cell makes the first cell retain a first potential corresponding to the amount of the first current. The third step includes an operation in which the first cell makes a second current with an amount corresponding to the first potential flow from the first wiring; and an operation in which the converter circuit outputs a second signal corresponding to the amount of the second current from the output terminal of the converter circuit, with reference to the second current flowing through the first wiring electrically connected to the input terminal of the converter circuit. The fourth step includes an operation in which the control circuit transmits, to the second circuit, a signal corresponding to the value of the first data; an operation in which the second circuit calculates a difference value between a value corresponding to the second signal obtained from the converter circuit and the value of the first data obtained from the control circuit, and transmits the difference value to the control circuit; and an operation in which the control circuit obtains the difference value, and operation termination is performed when the difference value is 0, whereas the operation method proceeds to the fifth step when the difference value is not 0. The fifth step includes an operation in which the control circuit generates an update value obtained by adding the difference value to a value of the first signal previously transmitted. The sixth step includes an operation in which the control circuit transmits, to the first circuit, the first signal having the update value changed from the value of the first data; and an operation of proceeding to the second step.

(2)

In one embodiment of the present invention according to (1) described above, the second circuit may include a subtractor.

(3)

Another embodiment of the present invention is an operation method of a semiconductor device that includes a control circuit, a first circuit, a second circuit, a first wiring, a first cell, and a converter circuit and is different from (1) described above. The control circuit is electrically connected to the first circuit and the second circuit. The first circuit is electrically connected to the first wiring. An input terminal of the converter circuit is electrically connected to the first wiring, and an output terminal of the converter circuit is electrically connected to the second circuit. The first cell is electrically connected to the first wiring, and the first cell has a function of retaining a potential corresponding to the amount of current flowing from the first wiring and a function of making a current with an amount corresponding to the potential retained flow from the first wiring. The operation method of the semiconductor device includes a first step to a third step and a fifth step to an eighth step. The first step includes an operation in which the control circuit transmits, to the first circuit, a first signal corresponding to a value of first data. The second step includes an operation in which the first circuit generates a first current with an amount corresponding to the first signal by obtaining the first signal and outputs the first current to the first wiring; and an operation in which the first current flowing from the first wiring to the first cell makes the first cell retain a first potential corresponding to the amount of the first current. The third step includes an operation in which the first cell makes a second current with an amount corresponding to the first potential flow from the first wiring; and an operation in which the converter circuit outputs a second signal corresponding to the amount of the second current from the output terminal of the converter circuit, with reference to the second current flowing through the first wiring electrically connected to the input terminal of the converter circuit. The seventh step includes an operation in which the control circuit transmits, to the second circuit, a signal corresponding to the value of the first data; and an operation in which the second circuit calculates a difference value between a value corresponding to the second signal obtained from the converter circuit and the value of the first data obtained from the control circuit, and transmits the difference value to the control circuit. The eighth step includes an operation in which the second circuit obtains a reference value from the control circuit, and operation termination is performed when the difference value is smaller than the reference value, whereas the operation method proceeds to the fifth step when the difference value is larger than the reference value. The fifth step includes an operation in which the control circuit generates an update value obtained by adding the difference value to a value of the first signal previously transmitted. The sixth step includes an operation in which the control circuit transmits, to the first circuit, the first signal having the update value changed from the value of the first data; and an operation of proceeding to the second step.

(4) In one embodiment of the present invention according to (3) described above, the second circuit may include a subtractor and a comparator.

(5)

In one embodiment of the present invention according to any one of (1) to (4) described above, the first cell may include a first transistor, a second transistor, a third transistor, and a capacitor. Specifically, it is preferable that one of a source and a drain of the first transistor be electrically connected to a gate of the second transistor, one of a source and a drain of the second transistor be electrically connected to one of a source and a drain of the third transistor, and the other of the source and the drain of the first transistor be electrically connected to the other of the source and the drain of the third transistor. It is preferable that a first terminal of the capacitor be electrically connected to the one of the source and the drain of the first transistor, and the first wiring be electrically connected to the other of the source and the drain of the first transistor.

Effect of the Invention

One embodiment of the present invention can provide an operation method of a semiconductor device in which a multiplicand or a multiplier is written correctly. Another embodiment of the present invention can provide an operation method of a semiconductor device with high arithmetic operation accuracy. Another object of one embodiment of the present invention can provide an operation method of a semiconductor device that performs multiplication of a multi-valued multiplicand and a multi-valued multiplier. Another embodiment of the present invention can provide a novel operation method of a semiconductor device.

Note that the effects of one embodiment of the present invention are not limited to the effects listed above. The effects listed above do not preclude the presence of other effects. Note that the other effects are effects that are not described in this section and will be described below. The effects that are not described in this section can be derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above.

MODE FOR CARRYING OUT THE INVENTION

Figure 1:
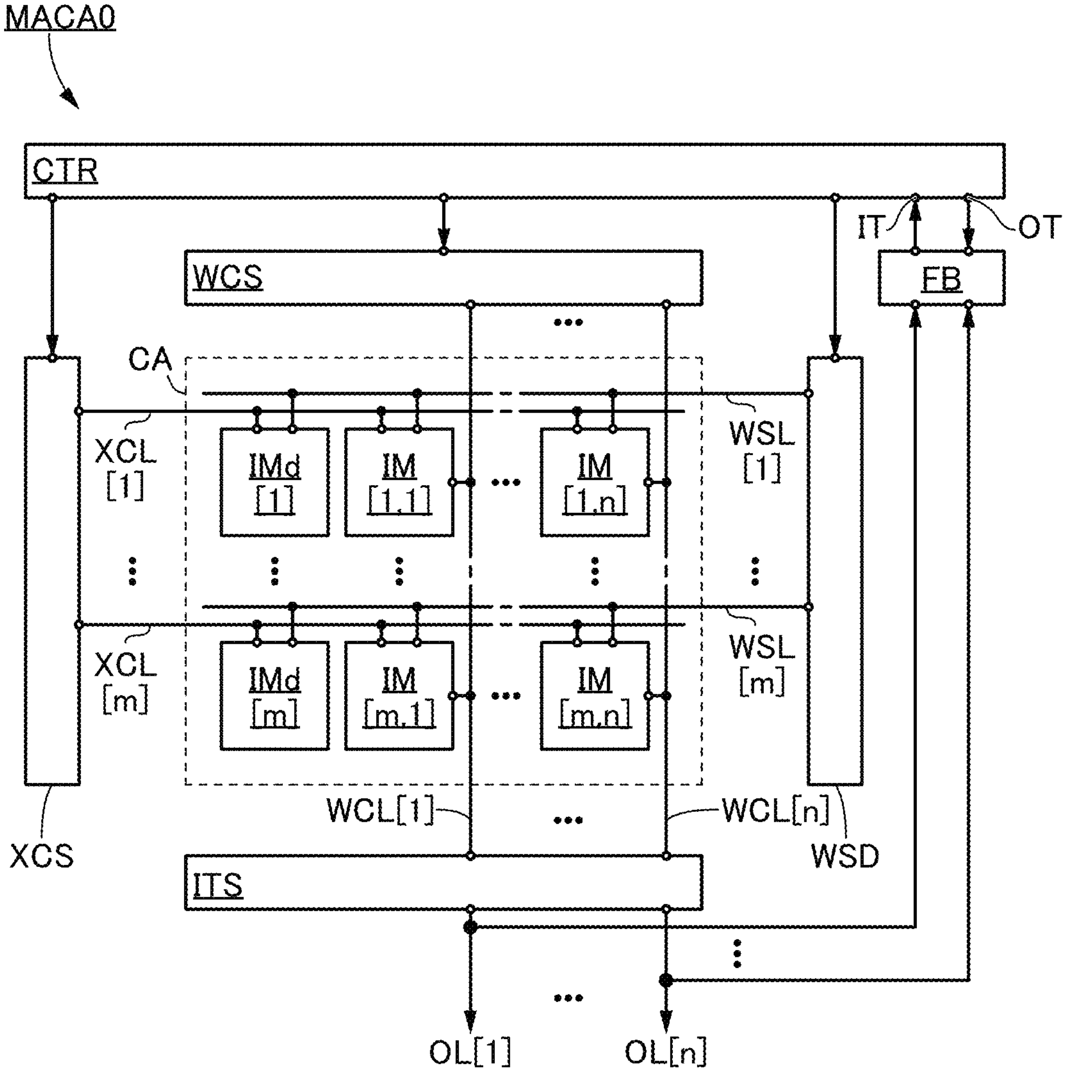
FIG. 1 is a block diagram illustrating a configuration example of an arithmetic circuit.

In this specification and the like, a semiconductor device refers to a device that utilizes semiconductor characteristics, and means a circuit including a semiconductor element (e.g., a transistor, a diode, and a photodiode), and a device including the circuit. The semiconductor device also means all devices that can function by utilizing semiconductor characteristics. For example, an integrated circuit, a chip including an integrated circuit, and an electronic component including a chip in a package are each an example of the semiconductor device. Moreover, for example, a memory device, a display apparatus, a light-emitting apparatus, a lighting device, an electronic device, and the like themselves are semiconductor devices and include semiconductor devices in some cases.

In the case where there is description "X and Y are connected" in this specification and the like, a case where X and Y are electrically connected, a case where X and Y are functionally connected, and a case where X and Y are directly connected are regarded as being disclosed in this specification and the like. Accordingly, without being limited to a predetermined connection relation, for example, a connection relation shown in drawings or described with texts, a connection relation other than one shown in drawings or described with texts is regarded as being disclosed in the drawings or description with the texts. Each of X and Y denotes an object (e.g., a device, an element, a circuit, a wiring, an electrode, a terminal, a conductive film, and a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conducting state (on state) or a non-conducting state (off state) to control whether current flows or not.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit such as a step-up circuit or a step-down circuit, or a level shifter circuit for changing the potential level of a signal); a voltage source; a current source; a switching circuit; an amplifier circuit (e.g., a circuit that can increase signal amplitude, the amount of current, or the like, an operational amplifier, a differential amplifier circuit, a source follower circuit, or a buffer circuit); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

This specification describes a circuit structure in which a plurality of elements are electrically connected to a wiring (a wiring for supplying a constant potential or a wiring for transmitting a signal). For example, in the case where X is directly connected to a wiring and Y is directly connected to the wiring, this specification may describe that X and Y are directly electrically connected to each other.

It can be expressed as, for example, "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order". Alternatively, it can be expressed as "a source of a transistor is electrically connected to X; a drain of the transistor is electrically connected to Y; and X, the source of the transistor, the drain of the transistor, and Y are electrically connected to each other in this order". Alternatively, it can be expressed as "X is electrically connected to Y through a source and a drain of a transistor, and X, the source of the transistor, the drain of the transistor, and Y are provided in this connection order". When the connection order in a circuit structure is defined by an expression similar to the above examples, a source and a drain of a transistor can be distinguished from each other to specify the technical scope. Note that these expressions are examples and the expression is not limited to these expressions. Here, each of X and Y denotes an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has both functions of a wiring and an electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0Ω. Therefore, in this specification and the like, a "resistor" includes a wiring having a resistance value, a transistor in which current flows between a source and a drain, a diode, and a coil. Thus, the term "resistor" can sometimes be replaced with the term "resistance", "load", "region having a resistance value", or the like. Conversely, the term "resistance", "load", "region having a resistance value", or the like can sometimes be replaced with the term "resistor". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^{9}$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The term "capacitor", "parasitic capacitance", or "gate capacitance" can sometimes be replaced with the term "capacitance". Conversely, the term "capacitance" can be replaced with the term "capacitor", "parasitic capacitance", or "gate capacitance" in some cases. In addition, a "capacitor" (including a "capacitor" with three or more terminals) includes an insulator and a pair of conductors between which the insulator is sandwiched. Thus, the term "pair of conductors" of "capacitor" can be replaced with "pair of electrodes", "pair of conductive regions", "pair of regions", or "pair of terminals". In addition, the terms "one of a pair of terminals" and "the other of the pair of terminals" are referred to as a first terminal and a second terminal, respectively, in some cases. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can sometimes be replaced with each other in this specification and the like. In this specification and the like, expressions "one of a source and a drain" (which may be replaced with a first electrode, a first terminal, or the like) and "the other of the source and the drain" (which may be replaced with a second electrode, a second terminal, or the like) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of an operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

In this specification and the like, circuit elements such as a "light-emitting device" and a "light-receiving device" sometimes have polarities called an "anode" and a "cathode". In the case of a "light-emitting device", the "light-emitting device" can sometimes emit light when a forward bias is applied (a positive potential with respect to a "cathode" is applied to an "anode"). In the case of a "light-receiving device", current is sometimes generated between an "anode" and a "cathode" when a zero bias or a reverse bias is applied (a negative potential with respect to a "cathode" is applied to an "anode") and the "light-receiving device" is irradiated with light. As described above, an "anode" and a "cathode" are sometimes regarded as input/output terminals of the circuit elements such as a "light-emitting device" and a "light-receiving device". In this specification and the like, an "anode" and a "cathode" of the circuit element such as a "light-emitting device" or a "light-receiving device" are sometimes called terminals (a first terminal, a second terminal, and the like). For example, one of an "anode" and a "cathode" is called a first terminal and the other of the "anode" and the "cathode" is called a second terminal in some cases.

The case where a single circuit element is illustrated in a circuit diagram may include a case where the circuit element includes a plurality of circuit elements. For example, the case where a single resistor is illustrated in a circuit diagram may include a case where two or more resistors are electrically connected to each other in series. As another example, the case where a single capacitor is illustrated in a circuit diagram may include a case where two or more capacitors are electrically connected to each other in parallel. As another example, the case where a single transistor is illustrated in a circuit diagram may include a case where two or more transistors are electrically connected to each other in series and their gates are electrically connected to each other. Similarly, as another example, the case where a single switch is illustrated in a circuit diagram may include a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure and the device structure. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit or the like, and a potential output from a circuit or the like, for example, change with a change of the reference potential.

In this specification and the like, the terms "high-level potential" and "low-level potential" do not mean a particular potential. se where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer phenomenon (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A". The description "current is input to element A" can be rephrased as "current is output from element A".

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the SCOPE OF CLAIMS. Moreover, in this specification and the like, for example, a "first" component in one embodiment can be omitted in other embodiments or the SCOPE OF CLAIMS.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the terms "over" and "under" do not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B. Similarly, for example, the expression "electrode B above insulating layer A" does not necessarily mean that the electrode B is formed above and in direct contact with the insulating layer A, and does not exclude the case where another component is provided between the insulating layer A and the electrode B. Similarly, for example, the expression "electrode B under insulating layer A" does not necessarily mean that the electrode B is formed under and in direct contact with the insulating layer A, and does not exclude the case where another component is provided between the insulating layer A and the electrode B.

In this specification and the like, components arranged in a matrix and their positional relation are sometimes described using terms such as "row" and "column". The positional relation between components is changed as appropriate in accordance with the direction in which the components are described. Thus, the positional relation is not limited to the terms described in the specification and the like, and can be described with another term as appropriate depending on the situation. For example, the term "row direction" can be replaced with the term "column direction" when the direction of the diagram is rotated by 90°.

In this specification and the like, the terms "film" and "layer" can be interchanged with each other depending on the situation. For example, the term "conductive layer" can be changed into the term "conductive film" in some cases. As another example, the term "insulating film" can be changed into the term "insulating layer" in some cases. Alternatively, the terms "film" and "layer" are not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the terms "electrode", "wiring", "terminal", and the like do not limit the functions of such components. For example, an "electrode" is used as part of a "wiring" in some cases, and vice versa. Furthermore, the term "electrode" or "wiring" can also mean, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where one or more selected from "electrodes", "wirings", and "terminals" are formed in an integrated manner, for example. Therefore, for example, an "electrode" can be part of a "wiring" or a "terminal", and a "terminal" can be part of a "wiring" or an "electrode". Moreover, the term "electrode", "wiring", or "terminal" is sometimes replaced with the term "region" depending on the case.

In this specification and the like, the terms "wiring", "signal line", and "power supply line" can be interchanged with each other depending on the case or the situation. For example, the term "wiring" can be changed into the term "signal line" in some cases. As another example, the term "wiring" can be changed into the term "power supply line" or the like in some cases. Conversely, the term "signal line" or "power supply line" can be changed into the term "wiring" in some cases. The term "power supply line" can be changed into the term "signal line" in some cases. Conversely, the term "signal line" can be changed into the term "power supply line" in some cases. The term "potential" that is applied to a wiring can be changed into the term "signal" depending on the case or the situation. Conversely, the term "signal" can be changed into the term "potential" in some cases.

In this specification and the like, a timing chart is used in some cases to describe an operation method of a semiconductor device. In this specification and the like, the timing chart shows an ideal operation example and a period, a level of a signal (e.g., a potential or a current), and a timing described in the timing chart are not limited unless otherwise specified. In the timing chart described in this specification and the like, the level of a signal (e.g., a potential or a current) input to a wiring (including a node) and a timing can be changed depending on the circumstances. For example, even when two periods are shown to have an equal length, the two periods have different lengths in some cases. Furthermore, for example, even when one of two periods is shown long and the other is shown short, the two periods can have an equal length in some cases, or the one period has a short length and the other has a long length in other cases.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, an impurity in a semiconductor refers to, for example, an element other than a main component of a semiconductor layer. For example, an element with a concentration of lower than 0.1 atomic % is an impurity. When an impurity is contained, for example, one or more of an increase in the density of defect states in a semiconductor, a decrease in carrier mobility, and a decrease in crystallinity may occur. For example, in the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. As another example, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to control whether current flows or not. Alternatively, a switch has a function of selecting and changing a current path. Thus, a switch may have two terminals or three or more terminals through which current flows, in addition to a control terminal. For example, an electrical switch or a mechanical switch can be used. That is, a switch can be any element capable of controlling a current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to a state where a source electrode and a drain electrode of the transistor can be regarded as being electrically short-circuited or a state where a current can be made to flow between the source electrode and the drain electrode. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically and controls conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be provided.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, illustration of some components may be omitted for clarity of the drawings.

In this specification, a plan view is sometimes used to explain a structure in each embodiment. A plan view is, for example, a diagram showing a plane of a structure seen in a direction perpendicular to a horizontal plane or a diagram showing a plane (section) of a structure cut in a horizontal direction. Hidden lines (e.g., dashed lines) shown in a plan view can indicate the positional relation between a plurality of components included in a structure or the overlapping relation between the plurality of components. In this specification and the like, the term "plan view" can be replaced with the term "projection view", "top view", or "bottom view". A plane (section) of a structure cut in a direction other than the horizontal direction may be referred to as a plan view depending on circumstances.

In this specification, a cross-sectional view is sometimes used to explain a structure in each embodiment. A cross-sectional view is, for example, a diagram showing a plane of a structure seen in a direction perpendicular to a horizontal plane or a diagram showing a plane (section) of a structure cut in a direction perpendicular to a horizontal plane. In this specification and the like, the term "cross-sectional view" can be replaced with the term "front view" or "side view". A plane (section) of a structure cut in a direction other than the vertical direction may be referred to as a cross-sectional view depending on circumstances.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes described without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variation in signal, voltage, or current due to noise, variation in signal, voltage, or current due to difference in timing, or the like can be included.

Embodiment 1

In this embodiment, an arithmetic circuit that is a semiconductor device of one embodiment of the present invention will be described.

Configuration Example 1 of Arithmetic Circuit

FIG. 1 illustrates a configuration example of an arithmetic circuit that performs product-sum operation of positive or "0" first data and positive or "0" second data. An arithmetic circuit MACA0 illustrated in FIG. 1 is a circuit that performs product-sum operation of a plurality of pieces of first data corresponding to potentials retained in cells and a plurality of pieces of input second data, and performs arithmetic operation of a function with the use of the product-sum operation result. The function can be, for example, an activation function in the case where arithmetic operation in a neural network is performed. Note that the first data and the second data can be, for example, analog data (e.g., a continuous analog potential) or multilevel data (e.g., a discrete analog potential or a digital signal). The arithmetic circuit MACA0 has a function of appropriately correcting a potential retained in a cell.

The arithmetic circuit MACA0 includes a control circuit CTR, a circuit WCS, a circuit XCS, a circuit WSD, a circuit ITS, a circuit FB, and a cell array CA.

The cell array CA includes a cell IM[1,1] to a cell IM[m,n] (m is an integer greater than or equal to 1 and n is an integer greater than or equal to 1) and a cell IMd[1] to a cell IMd[m]. Note that FIG. 1 selectively illustrates the cell IM[1,1], the cell IM[m,1], the cell IM[1,*n*], the cell IM[m,n], the cell IMd[1], and the cell IMd[m] among the cell IM[1,1] to the cell IM[m,n] and the cell IMd[1] to the cell IMd[m].

The cell IMd[1] to the cell IMd[m] have a function of supplying, to a wiring XCL[1] to a wiring XCL[m], the retained potential and a potential corresponding to second data necessary for product-sum operation, for example.

In the cell array CA in FIG. 1, the cells are arranged in a matrix of m rows and n+1 columns; the cell array CA can have any configuration in which the cells are arranged in a matrix of one or more rows and two or more columns.

[Configuration Examples of Cell IM and Cell IMd]

Here, configuration examples of the cell IM[1,1] to the cell IM[m,n] and the cell IMd[1] to the cell IMd[m] will be described. An arithmetic circuit MACA1 illustrated in FIG. 2 shows a configuration example of the arithmetic circuit MACA0 illustrated in FIG. 1, and FIG. 2 illustrates circuit configuration examples of the cell IM and the cell IMd.

Figure 2:
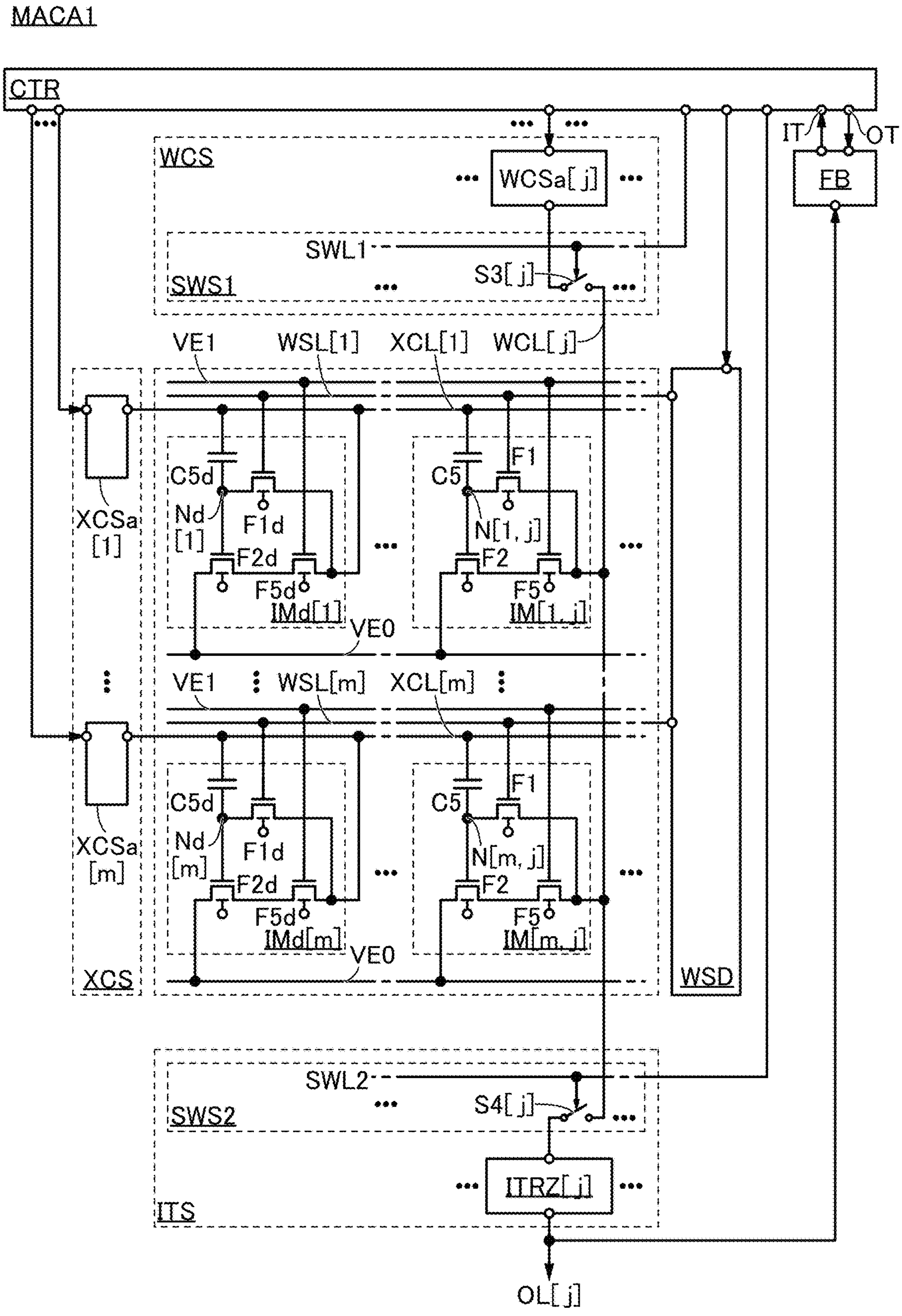
FIG. 2 is a circuit diagram illustrating a configuration example of an arithmetic circuit.

Note that FIG. 2 selectively illustrates the cell IM[1,*j*] (j is an integer greater than or equal to 1 and less than or equal to n), the cell IM[m,j], the cell IMd[1], and the cell IMd[m] among the cell IM[1,1] to the cell IM[m,n] and the cell IMd[1] to the cell IMd[m]. Thus, unless otherwise specified, the cell IM[1,*j*] to the cell IM[m,j] and the cell IMd[1] to the cell IMd[m] are selectively used to describe configuration examples of the cell IM[1,1] to the cell IM[m,n] and the cell IMd[1] to the cell IMd[m].

The cell IM[1,*j*] to the cell IM[m,j] each include a transistor F1, a transistor F2, a transistor F5, and a capacitor C5, for example. The cell IMd[1] to the cell IMd[m] each include a transistor F1*d*, a transistor F2*d*, a transistor F5*d*, and a capacitor C5*d*, for example.

In particular, the structures (e.g., sizes such as a channel length and a channel width) of the transistors F1 included in the cell IM[1,*j*] to the cell IM[m,j] are preferably the same, the sizes of the transistors F2 included in the cell IM[1,*j*] to the cell IM[m,j] are preferably the same, and the sizes of the transistors F5 included in the cell IM[1,*j*] to the cell IM[m,j] are preferably the same. The sizes of the transistors F1*d* included in the cell IMd[1] to the cell IMd[m] are preferably the same, the sizes of the transistors F2*d* included in the cell IMd[1] to the cell IMd[m] are preferably the same, and the sizes of the transistors F5*d* included in the cell IMd[1] to the cell IMd[m] are preferably the same. The sizes of the transistor F1 and the transistor F1*d* are preferably the same, the sizes of the transistor F2 and the transistor F2*d* are preferably the same, and the sizes of the transistor F5 and the transistor F5*d* are preferably the same.

By making the transistors have the same size, the transistors can have substantially the same electrical characteristics. Thus, by making the transistors F1 included in the cell IM[1,*j*] to the cell IM[m,j] have the same size, making the transistors F2 included in the cell IM[1,*j*] to the cell IM[m,j] have the same size, and making the transistors F5 included in the cell IM[1,*j*] to the cell IM[m,j] have the same size, the cell IM[1,*j*] to the cell IM[m,j] can perform almost the same operation when under the same conditions. The same conditions here refer to, for example, the potentials of a source, a drain, and a gate of the transistor F1, the potentials of a source, a drain, and a gate of the transistor F2, the potentials of a source, a drain, and a gate of the transistor F5, and voltages input to the cell IM[1,*j*] to the cell IM[m,j]. Similarly, by making the transistors F1*d* included in the cell IMd[1] to the cell IMd[m] have the same size, making the transistors F2*d* included in the cell IMd[1] to the cell IMd[m] have the same size, and making the transistors F5*d* included in the cell IMd[1] to the cell IMd[m] have the same size, the cell IMd[1] to the cell IMd[m] can perform almost the same operation when under the same conditions. The same conditions here refer to, for example, the potentials of a source, a drain, and a gate of the transistor F1*d*, the potentials of a source, a drain, and a gate of the transistor F2*d*, the potentials of a source, a drain, and a gate of the transistor F5*d*, and voltages input to the cell IMd[1] to the cell IMd[m].

Unless otherwise specified, the transistor F1 and the transistor F1*d* in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor F1 and the transistor F1*d* in an on state may operate in a saturation region or may operate both in a linear region and a saturation region.

Unless otherwise specified, the transistor F2 and the transistor F2*d* may operate in a subthreshold region (i.e., the gate-source voltage may be lower than the threshold voltage in the transistor F2 or the transistor F2*d*, further preferably, the drain current increases exponentially with respect to the gate-source voltage). In other words, the gate voltage, the source voltage, and the drain voltage of each of the above transistors may be appropriately biased to voltages in the range where the transistor operates in the subthreshold region. Thus, the transistor F2 and the transistor F2*d* may operate such that the off-state current flows between the source and the drain.

The transistor F5 and the transistor F5*d* each function as a clamp transistor (also called a clamp FET in some cases), for example. Thus, a constant voltage is preferably applied to the gates of the transistor F5 and the transistor F5*d*. Providing the transistor F5 (transistor F5*d*) can prevent drain-induced barrier lowering (DIBL) in the transistor F2 (transistor F2*d*), which will be described later in detail.

Meanwhile, in the case where drain-induced barrier lowering (DIBL) in the transistor F2 (transistor F2*d*) can be ignored, the cell IM (cell IMd) may have a configuration in which the transistor F5 (transistor F5*d*) is not provided.

One or both of the transistor F1 and the transistor F1*d* are preferably an OS transistor, for example. Examples of a metal oxide included in a channel formation region of the OS transistor include indium oxide, gallium oxide, and zinc oxide. The metal oxide preferably includes one kind or two or more kinds selected from indium, an element M, and zinc. The element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, and magnesium.

Specifically, the element M is preferably one or more kinds selected from aluminum, gallium, yttrium, and tin.

It is particularly preferable that an oxide containing indium (In), gallium (Ga), and zinc (Zn) (also referred to as IGZO) be used as the metal oxide used for the semiconductor layer. Alternatively, it is preferable to use an oxide containing indium, tin, and zinc (also referred to as ITZO (registered trademark)). Alternatively, it is preferable to use an oxide containing indium, gallium, tin, and zinc. Alternatively, it is preferable to use an oxide containing indium (In), aluminum (Al), and zinc (Zn) (also referred to as IAZO). Alternatively, it is preferable to use an oxide containing indium (In), aluminum (Al), gallium (Ga), and zinc (Zn) (also referred to as IAGZO). Note that the OS transistor will be described in detail in Embodiment 4.

One or both of the transistor F1 and the transistor F1*d* can be, other than an OS transistor, a transistor including silicon in its channel formation region (hereinafter referred to as a Si transistor). As the silicon, amorphous silicon (referred to as hydrogenated amorphous silicon in some cases), microcrystalline silicon, polycrystalline silicon, single crystal silicon, or the like can be used, for example.

The use of an OS transistor as one or both of the transistor F1 and the transistor F1*d* can reduce the leakage current of the selected transistor, so that power consumption of the arithmetic circuit can be reduced. Specifically, the amount of leakage current from a retention node to a write word line when the selected transistor is in the non-conducting state can be extremely small; thus, the frequency of refresh operation for the potential of the retention node can be reduced. By reducing the frequency of refresh operation, power consumption of the arithmetic circuit can be reduced. An extremely low leakage current from the retention node to a later-described wiring WCL[j] or any of the wiring XCL [1] to the wiring XCL[m] allows the cells to retain the potential of the retention node for a long time, increasing the arithmetic operation accuracy of the arithmetic circuit.

The use of an OS transistor also as one or both of the transistor F2 and the transistor F2*d* enables operation with a wide range of current in the subthreshold region, leading to a reduction in the current consumption. With the use of an OS transistor also as the transistor F2 and the transistor F2*d*, the transistor F2 and the transistor F2*d* can be manufactured concurrently with the transistor F1 and the transistor F1*d*; thus, the manufacturing process of the arithmetic circuit can sometimes be shortened. The transistor F2 and the transistor F2*d* can be, if not an OS transistor, a Si transistor.

It is further preferable that the transistors F1, the transistor F1*d*, the transistor F2, the transistor F2*d*, the transistor F5, and the transistor F5*d* have a structure of a transistor 300, a transistor 500, and the like described in Embodiment 4.

When semiconductor devices are arranged with high density on a chip, heat may be generated in the chip by driving of the circuit. This heat generation increases the temperature of a transistor to change the characteristics of the transistor; thus, the field-effect mobility thereof might change or the operating frequency thereof might decrease, for example. Since an OS transistor has a higher heat resistance than a Si transistor, a change in field-effect mobility and a decrease in operating frequency due to a temperature change do not easily occur. Even when having a high temperature, an OS transistor is likely to keep a property of the drain current increasing exponentially with respect to the gate-source voltage. With the use of an OS transistor, arithmetic operation, processing, or the like can thus be easily performed even in a high temperature environment. Accordingly, to form a semiconductor device highly resistant to heat generation due to driving, an OS transistor is preferably used as its transistor.

In each of the cell IM[1,j] to the cell IM[m,j], a first terminal of the transistor F1 is electrically connected to the gate of the transistor F2. A first terminal of the transistor F2 is electrically connected to a wiring VE0. A first terminal of the capacitor C5 is electrically connected to the gate of the transistor F2. A second terminal of the transistor F2 is electrically connected to a first terminal of the transistor F5. A second terminal of the transistor F5 is electrically connected to a second terminal of the transistor F1, and the gate of the transistor F5 is electrically connected to a wiring VE1.

The second terminal of the transistor F2 and the wiring WCL[j] are electrically connected in series with each other through the first terminal and the second terminal of the transistor F5, thereby preventing direct application of a high-level potential from the wiring WCL[j] to the second terminal of the transistor F2. Thus, drain-induced barrier lowering in the transistor F2 can be prevented.

In the case where the second terminal of the transistor F2 is directly electrically connected to the wiring WCL[j] (i.e., the case where the transistor F5 is not provided) in the configuration of the cell IM[1,j] to the cell IM[m,j], direct application of a high-level potential from the wiring WCL[j] to the second terminal of the transistor F2 might cause drain-induced barrier lowering in the transistor F2. When drain-induced barrier lowering occurs in the transistor F2, the threshold voltage of the transistor F2 is lowered, so that the voltage range of the subthreshold region of the transistor F2 might change. As a result, when the cell IM[1,j] has a configuration in which the transistor F5 is not provided, a current in the subthreshold region that flows through the transistor F2 might vary.

In each of the cell IMd[1] to the cell IMd[m], a first terminal of the transistor F1d is electrically connected to the gate of the transistor F2d. A first terminal of the transistor F2d is electrically connected to the wiring VE0. A first terminal of the capacitor C5d is electrically connected to the gate of the transistor F2d. A second terminal of the transistor F2d is electrically connected to a first terminal of the transistor F5d. A second terminal of the transistor F5d is electrically connected to a second terminal of the transistor F1d, and the gate of the transistor F5d is electrically connected to the wiring VE1.

Like the transistors F5 in the cell IM[1,j] to the cell IM[m,j], the transistors F5d in the cell IMd[1] to the cell IMd[m] have a function of preventing drain-induced barrier lowering in the transistor F2d.

In FIG. 2, back gates are illustrated for the transistor F1, the transistor F2, the transistor F5, the transistor F1d, the transistor F2d, and the transistor F5d. Although the connection structure of the back gates is not illustrated, portions to which the back gates are electrically connected can be determined at the design stage. For example, in a transistor including a back gate, a gate and the back gate may be electrically connected to each other to increase the on-state current of the transistor. That is, for example, the gate and the back gate of the transistor F1 may be electrically connected to each other, and the gate and the back gate of the transistor F1d may be electrically connected to each other. As another example, in a transistor including a back gate, a wiring electrically connecting the back gate of the transistor to an external circuit or the like may be provided and a potential may be supplied to the back gate of the transistor with the external circuit or the like to change the threshold voltage of the transistor or to reduce the off-state current of the transistor.

Although the transistor F1, the transistor F2, and the transistor F5 illustrated in FIG. 2 each include the back gate, the semiconductor device of one embodiment of the present invention is not limited thereto. For example, the transistor F1, the transistor F2, and the transistor F5 illustrated in FIG. 2 may each be a transistor having a structure not including a back gate, i.e., a single-gate structure. It is also possible that some transistors have a structure including a back gate and the other transistors have a structure not including a back gate.

Although the transistor F1, the transistor F2, and the transistor F5 illustrated in FIG. 2 are n-channel transistors, the semiconductor device of one embodiment of the present invention is not limited thereto. For example, some or all of the transistor F1, the transistor F2, and the transistor F5 may be replaced with p-channel transistors.

The above-described examples of changes in the structure and polarity of the transistors are not limited to the transistor F1, the transistor F2, and the transistor F5. The same applies to, for example, the transistor F1d, the transistor F2d, the transistor F5d, transistors described in other parts of this specification, and transistors illustrated in other drawings.

The wiring VE0 functions as a wiring for making a current flow between the first terminal and the second terminal of the transistor F2 in each of the cell IM[1,j] to the cell IM[m,j]. The wiring VE0 functions as a wiring for making a current flow between the first terminal and the second terminal of the transistor F2d in each of the cell IMd[1] to the cell IMd[m]. The wiring VE0 functions as a wiring for supplying a constant voltage, for example. The constant voltage can be, for example, a low-level potential, a ground potential, or the like.

The wiring VE1 functions as a wiring for applying a potential to the gates of the transistors F5 in the cell IM[1,j] to the cell IM[m,j] and the gates of the transistors F5d in the cell IMd[1] to the cell IMd[m]. Note that the potential is preferably a potential within a range where the transistor F5 and the transistor F5d function as clamp transistors.

In the cell IM[1,j], the second terminal of the transistor F1 and the second terminal of the transistor F5 are electrically connected to the wiring WCL[j], and the gate of the transistor F1 is electrically connected to a wiring WSL[1]. The second terminal of the transistor F5 is electrically connected to the wiring WCL[j], and a second terminal of the capacitor C5 is electrically connected to the wiring XCL[1]. In FIG. 2, a connection portion of the first terminal of the transistor F1, the gate of the transistor F2, and the first terminal of the capacitor C5 in the cell IM[1,j] is a node N[1,j].

In the cell IM[m,j], the second terminal of the transistor F1 and the second terminal of the transistor F5 are electrically connected to the wiring WCL[j], and the gate of the transistor F1 is electrically connected to a wiring WSL[m]. The second terminal of the transistor F5 is electrically connected to the wiring WCL[j], and the second terminal of the capacitor C5 is electrically connected to the wiring XCL[m]. In FIG. 2, a connection portion of the first terminal of the transistor F1, the gate of the transistor F2, and the first terminal of the capacitor C5 in the cell IM[m,j] is a node N[m,j].

In the cell IMd[1], the second terminal of the transistor F1d and the second terminal of the transistor F5d are electrically connected to the wiring XCL[1], and the gate of the transistor F1d is electrically connected to the wiring WSL[1]. The second terminal of the transistor F5d is electrically connected to the wiring XCL[1], and a second terminal of the capacitor C5d is electrically connected to the wiring XCL[1]. In FIG. 2, a connection portion of the first terminal of the transistor F1*d*, the gate of the transistor F2*d*, and the first terminal of the capacitor C5*d* in the cell IMd[1] is a node Nd[1].

In the cell IMd[m], the second terminal of the transistor F1*d* and the second terminal of the transistor F5*d* are electrically connected to the wiring XCL[m], and the gate of the transistor F1*d* is electrically connected to the wiring WSL[m]. The second terminal of the transistor F2*d* is electrically connected to the wiring XCL[m], and the second terminal of the capacitor C5*d* is electrically connected to the wiring XCL[m]. In FIG. 2, a connection portion of the first terminal of the transistor F1*d*, the gate of the transistor F2*d*, and the first terminal of the capacitor C5*d* in the cell IMd[m] is a node Nd[m].

Note that the node N[1,*j*], the node N[m,j], the node Nd[1], and the node Nd[m] function as retention nodes of their respective cells.

In the cell IM[1,*j*] to the cell IM[m,j], for example, when the transistor F1 and the transistor F5 are in an on state, electrical continuity is established between the gate and the second terminal of the transistor F2. When a constant voltage applied from the wiring VE0 is a ground potential (GND), the transistor F1 is in an on state, and a current with a current amount I flows from the wiring WCL[j] to the second terminal of the transistor F2, the potential of the gate of the transistor F2 (the node N) is determined in accordance with the current amount. Since the transistor F1 is in an on state, the potential of the second terminal of the transistor F2 ideally becomes equal to that of the gate of the transistor F2 (the node N). Here, by turning off the transistor F1, the potential of the gate of the transistor F2 (the node N) is retained by the capacitor C5. Accordingly, the transistor F2 can make the current with the current amount I corresponding to the ground potential of the first terminal of the transistor F2 and the potential of the gate of the transistor F2 (the node N) flow between the source and the drain of the transistor F2. In this specification and the like, such operation is called "setting (programing) the amount of current flowing between the source and the drain of the transistor F2 in the cell IM to/".

In a similar manner, the amount of current flowing between the source and the drain of the transistor F2*d* in the cell IMd[i] (i is an integer greater than or equal to 1 and less than or equal to m) can be set when the transistor F1 is replaced with the transistor F1*d*, the transistor F2 is replaced with the transistor F2*d*, and the node N is replaced with the node Nd in the above description.

[Circuit WCS]

Next, a configuration example of the circuit WCS corresponding to a peripheral circuit of the cell array CA is described.

The circuit WCS includes a circuit SWS1 and a circuit WCSa[j], for example.

The circuit SWS1 has a function of establishing or breaking electrical continuity between the wiring WCL[j] and the circuit WCSa[j].

The circuit SWS1 includes a switch S3[*j*], for example.

The number of switches S3[*j*] is, for example, the number of columns of the matrix in which the cells IM of the cell array CA are arranged. That is, in the arithmetic circuit MACA1 illustrated in FIG. 2, the circuit SWS1 includes a switch S3[1] to a switch S3[*n*] (n switches in total).

A first terminal of the switch S3[*j*] is electrically connected to the wiring WCL[j], a second terminal of the switch S3[*j*] is electrically connected to the circuit WCSa[j], and a control terminal of the switch S3[*j*] is electrically connected to a wiring SWL1.

As the switch S3[*j*], an electrical switch such as an analog switch or a transistor can be used, for example. Specifically, as an electrical switch for the switch S3[*j*], the above-described transistor is preferably used, and in particular, an OS transistor is further preferably used. In the case where an electrical switch is used as the switch S3[*j*], the electrical switch can be a Si transistor other than an OS transistor, for example. As another example, a mechanical switch may be used as the switch S3[*j*].

In this specification and the like, the switch S3[*j*] illustrated in FIG. 2 is turned on when a high-level potential is supplied to the control terminal and turned off when a low-level potential is supplied to the control terminal.

The wiring SWL1 functions as a wiring for switching the on state and the off state of the switch S3[*j*], for example. Accordingly, the wiring SWL1 is supplied with a high-level potential or a low-level potential.

As described above, the circuit SWS1 functions as a circuit that establishes or breaks electrical continuity between the circuit WCS and the wiring WCL[j]. That is, the circuit SWS1 switches electrical continuity and discontinuity between the circuit WCS and the wiring WCL[j] by using the switch S3[*j*].

The circuit WCSa[j] has a function of supplying a signal corresponding to the first data to the wiring WCL[j]. In other words, the circuit WCS supplies, when the switch S3[*j*] is in an on state, the first data that is to be stored in the cells of the cell array CA. Note that in the case of the arithmetic circuit MACA1 in FIG. 2, the value of the signal can be expressed as the amount of current.

Figure 3A:
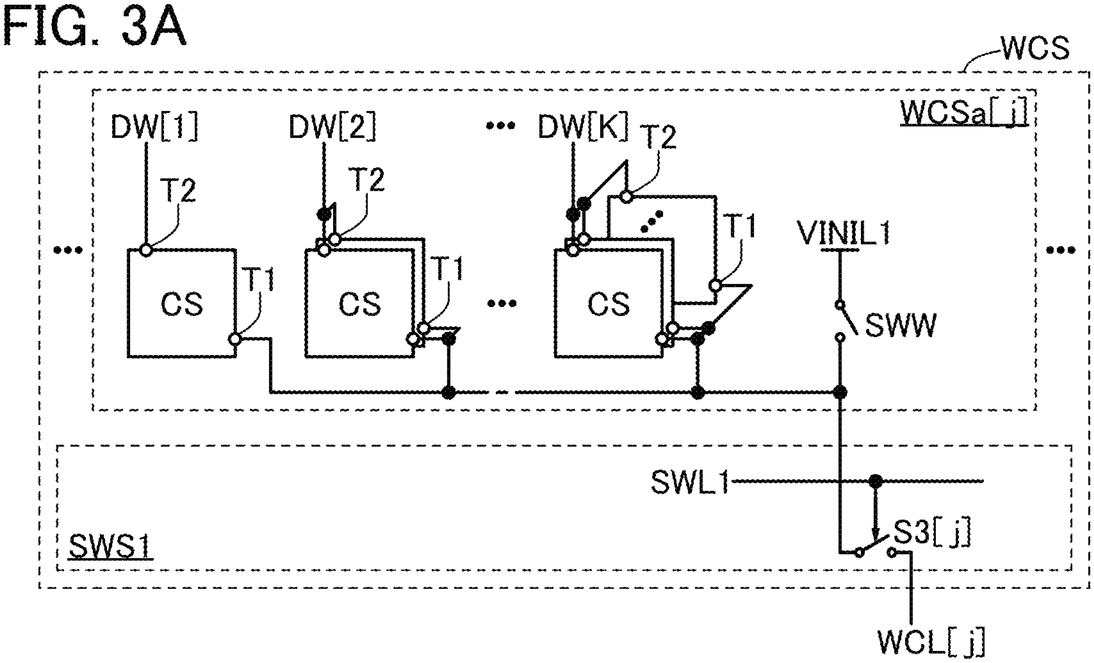
FIG. 3A to FIG. 3C are circuit diagrams each illustrating a configuration example of a circuit included in an arithmetic circuit.

The circuit WCSa[j] can have a configuration illustrated in FIG. 3A, for example. FIG. 3A also illustrates the circuit SWS1, the switch S3[*j*], the wiring SWL1, and the wiring WCL[j] to show electrical connection between the circuit WCSa and its peripheral circuits.

The number of circuits WCSa[j] is, for example, the number of columns of the matrix in which the cells IM of the cell array CA are arranged. That is, in the arithmetic circuit MACA1 illustrated in FIG. 2, the circuit WCS includes a circuit WCSa[1] to a circuit WCSa[n] (n circuits in total).

Thus, the switch S3[*j*] illustrated in FIG. 3A can be any one of the switch S3[1] to the switch S3[*n*] included in the arithmetic circuit MACA1 in FIG. 2. Similarly, the wiring WCL[j] can be any one of the wiring WCL[1] to the wiring WCL[n] included in the arithmetic circuit MACA1 in FIG. 2.

Accordingly, the circuit WCSa[j] is electrically connected to the wiring WCL[j] through the switch S3[*j*].

The circuit WCSa[j] illustrated in FIG. 3A includes a switch SWW, for example. A first terminal of the switch SWW is electrically connected to the second terminal of the switch S3[*j*], and a second terminal of the switch SWW is electrically connected to a wiring VINIL1. The wiring VINIL1 functions as a wiring for supplying an initialization potential to the wiring WCL, and the initialization potential can be a ground potential (GND), a low-level potential, or a high-level potential. Note that the switch SWW is turned on only when the initialization potential is supplied to the wiring WCL; otherwise, the switch is in an off state.

As the switch SWW, an electrical switch such as an analog switch or a transistor can be used, for example. When a transistor is used as the switch SWW, for example, the transistor can be a transistor having a structure similar to that of the transistor F1 or the transistor F2. Other than the electrical switch, a mechanical switch may be used.

The circuit WCSa in FIG. 3A includes a plurality of current sources CS, for example. Specifically, the circuit WCSa[j] has a function of outputting K-bit first data ($2^K$ values) (K is an integer greater than or equal to 1) as the current amount; in this case, the circuit WCSa[j] includes $2^K-1$ current sources CS. The circuit WCSa[j] includes, for example, one current source CS that outputs information corresponding to the first bit value as current, two current sources CS that output information corresponding to the second bit value as current, and $2^{K-1}$ current sources CS that output information corresponding to the K-th bit value as current.

Each of the current sources CS in FIG. 3A includes a terminal T1 and a terminal T2. The terminal T1 of each of the current sources CS is electrically connected to the second terminal of the switch S3 included in the circuit SWS1. The terminal T2 of the one current source CS is electrically connected to a wiring DW[1], the terminals T2 of the two current sources CS are electrically connected to a wiring DW[2], and the terminals T2 of the $2^{K-1}$ current sources CS are electrically connected to a wiring DW[K].

The plurality of current sources CS included in the circuit WCSa[j] have a function of outputting the same constant current $I_{Wut}$ from the terminals T1. Actually, at the manufacturing stage of the arithmetic circuit MACA1, variations in electrical characteristics of transistors included in the current sources CS may produce errors. Each of the errors in the constant currents $I_{Wut}$ output from the terminals T1 of the plurality of current sources CS is thus preferably within 10%, further preferably within 5%, still further preferably within 1%. In this embodiment, the description is made on the assumption that there is no error in the constant currents $I_{Wut}$ output from the terminals T1 of the plurality of current sources CS included in the circuit WCSa.

The wiring DW[1] to the wiring DW[K] function as wirings for transmitting control signals to make the current sources CS, which are electrically connected to the wiring DW[1] to the wiring DW[K], output the constant currents $I_{Wut}$. Specifically, for example, when a high-level potential is supplied to the wiring DW[1], the current source CS electrically connected to the wiring DW[1] supplies $I_{Wut}$ as the constant current to the second terminal of the switch S3[*j*], and when a low-level potential is supplied to the wiring DW[1], the current source CS electrically connected to the wiring DW[1] does not output $I_{Wut}$. For example, when a high-level potential is supplied to the wiring DW[2], the two current sources CS electrically connected to the wiring DW[2] supply the sum of constant currents $2I_{Wut}$ to the second terminal of the switch S3[*j*], and when a low-level potential is supplied to the wiring DW[2], the current sources CS electrically connected to the wiring DW[2] do not output the sum of constant currents $2I_{Wut}$. For example, when a high-level potential is supplied to the wiring DW[K], the $2^{K-1}$ current sources CS electrically connected to the wiring DW[K] supply the sum of constant currents $2^{K-1} I_{Wut}$ to the second terminal of the switch S3[*j*], and when a low-level potential is supplied to the wiring DW[K], the current sources CS electrically connected to the wiring DW[K] do not output the sum of constant currents $2^{K-1}I_{Wut}$.

The current flowing from the one current source CS electrically connected to the wiring DW[1] corresponds to the value of the first bit, the current flowing from the two current sources CS electrically connected to the wiring DW[2] corresponds to the value of the second bit, and the amount of current flowing from the $2^{J-1}$ current sources CS electrically connected to the wiring DW[K] corresponds to the value of the K-th bit. Here, the circuit WCSa with K of 2 is considered. For example, when the value of the first bit is "1" and the value of the second bit is "0", a high-level potential is supplied to the wiring DW[1], and a low-level potential is supplied to the wiring DW[2]. In this case, the constant current $I_{Wut}$ flows to the second terminal of the switch S3[*j*] of the circuit SWS1 from the circuit WCSa. As another example, when the value of the first bit is "0" and the value of the second bit is "1", a low-level potential is supplied to the wiring DW[1], and a high-level potential is supplied to the wiring DW[2]. In this case, the constant current $2I_{Wut}$ flows to the second terminal of the switch S3[*j*] of the circuit SWS1 from the circuit WCSa. As another example, when the value of the first bit is "1" and the value of the second bit is "1", a high-level potential is supplied to the wiring DW[1] and the wiring DW[2]. In this case, the constant current $3I_{Wut}$ flows to the second terminal of the switch S3[*j*] of the circuit SWS1 from the circuit WCSa. As another example, when the value of the first bit is "0" and the value of the second bit is "0", a low-level potential is supplied to the wiring DW[1] and the wiring DW[2]. In this case, the constant current does not flow from the circuit WCSa to the second terminal of the switch S3[*j*] of the circuit SWS1.

FIG. 3A illustrates the circuit WCSa[j] with K of an integer greater than or equal to 3; when K is 1, the current sources CS electrically connected to the wiring DW[2] to the wiring DW[K] are not provided in the circuit WCSa in FIG. 3A. When K is 2, the current sources CS electrically connected to the wiring DW[3] to the wiring DW[K] are not provided in the circuit WCSa in FIG. 3A.

Next, a specific configuration example of the current source CS is described.

Figure 4A:
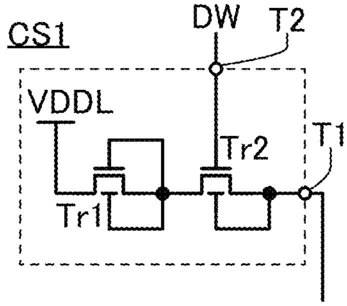
FIG. 4A to FIG. 4D are circuit diagrams each illustrating a configuration example of a circuit included in an arithmetic circuit.

A current source CS1 illustrated in FIG. 4A is a circuit that can be used as the current source CS included in the circuit WCSa in FIG. 3A, and the current source CS1 includes a transistor Tr1 and a transistor Tr2.

A first terminal of the transistor Tr1 is electrically connected to a wiring VDDL, and a second terminal of the transistor Tr1 is electrically connected to a gate of the transistor Tr1, a back gate of the transistor Tr1, and a first terminal of the transistor Tr2. A second terminal of the transistor Tr2 is electrically connected to the terminal T1, and a gate of the transistor Tr2 is electrically connected to the terminal T2. The terminal T2 is electrically connected to the wiring DW.

The wiring DW is any one of the wiring DW[1] to the wiring DW[K] in FIG. 3A.

The wiring VDDL functions as a wiring for supplying a constant voltage. The constant voltage can be a high-level potential, for example.

When a constant voltage supplied from the wiring VDDL is set to a high-level potential, the high-level potential is input to the first terminal of the transistor Tr1. The potential of the second terminal of the transistor Tr1 is lower than the high-level potential. At this time, the first terminal of the transistor Tr1 functions as a drain, and the second terminal of the transistor Tr1 functions as a source. Since the gate of the transistor Tr1 and the second terminal of the transistor Tr1 are electrically connected to each other, the gate-source voltage of the transistor Tr1 is 0 V. Accordingly, when the threshold voltage of the transistor Tr1 is within an appropriate range, current in the current range of the subthreshold region (drain current) flows between the first terminal and the second terminal of the transistor Tr1. When the transistor Tr1 is an OS transistor, the amount of the current is preferably lower than or equal to $1.0\times10^{-8}$ A, further preferably lower than or equal to $1.0\times10^{-12}$ A, still further preferably lower than or equal to $1.0\times10^{-15}$ A, for example. For example, the current is further preferably within a range where the current exponentially increases with respect to the gate-source voltage. That is, the transistor Tr1 functions as a current source for supplying current within a current range of the transistor Tr1 operating in the subthreshold region. The current corresponds to $I_{Wut}$ described above or $I_{Xut}$ described later.

The transistor Tr2 functions as a switching element. When the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected to each other, the back gate-source voltage is 0 V. Thus, when the threshold voltage of the transistor Tr2 is within an appropriate range and a high-level potential is input to the gate of the transistor Tr2, the transistor Tr2 is turned on; when a low-level potential is input to the gate of the transistor Tr2, the transistor Tr2 is turned off. Specifically, when the transistor Tr2 is in an on state, current within the current range of the subthreshold region flows from the second terminal of the transistor Tr1 to the terminal T1, and when the transistor Tr2 is in an off state, the current does not flow from the second terminal of the transistor Tr1 to the terminal T1.

Figure 4B:
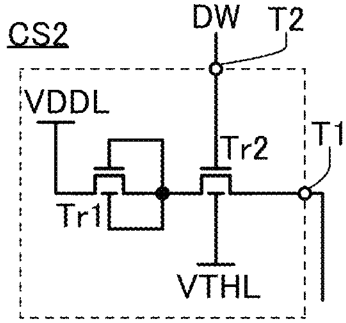

The circuit that can be used as the current source CS included in the circuit WCSa[j] in FIG. 3A is not limited to the current source CS1 in FIG. 4A. For example, the current source CS1 has a configuration in which the back gate of the transistor Tr2 and the second terminal of the transistor Tr2 are electrically connected to each other; alternatively, the back gate of the transistor Tr2 may be electrically connected to another wiring. Such a configuration example is illustrated in FIG. 4B. In a current source CS2 illustrated in FIG. 4B, the back gate of the transistor Tr2 is electrically connected to a wiring VTHL. When the wiring VTHL of the current source CS2 is electrically connected to an external circuit or the like, the external circuit or the like supplies a predetermined potential to the wiring VTHL and the back gate of the transistor Tr2 can be supplied with the predetermined potential. This can change the threshold voltage of the transistor Tr2. In particular, the off-state current of the transistor Tr2 can be reduced by an increase in the threshold voltage of the transistor Tr2.

Figure 4C:
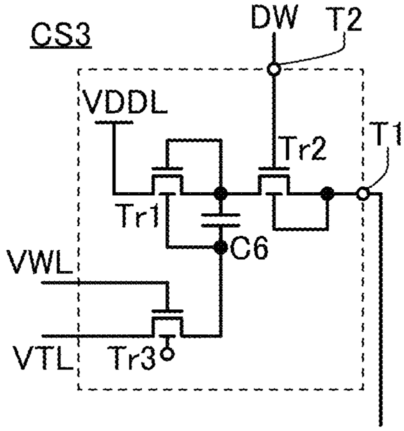

For example, the current source CS1 has a configuration in which the back gate of the transistor Tr1 and the second terminal of the transistor Tr1 are electrically connected to each other; alternatively, the voltage between the back gate and the second terminal of the transistor Tr2 may be retained with a capacitor. Such a configuration example is illustrated in FIG. 4C. A current source CS3 illustrated in FIG. 4C includes a transistor Tr3 and a capacitor C6 in addition to the transistor Tr1 and the transistor Tr2. The current source CS3 is different from the current source CS1 in that the second terminal of the transistor Tr1 and the back gate of the transistor Tr1 are electrically connected to each other through the capacitor C6, and the back gate of the transistor Tr1 and a first terminal of the transistor Tr3 are electrically connected to each other. In the current source CS3, a second terminal of the transistor Tr3 is electrically connected to a wiring VTL, and a gate of the transistor Tr3 is electrically connected to a wiring VWL. In the current source CS3, when the wiring VWL is supplied with a high-level potential to turn on the transistor Tr3, electrical continuity can be established between the wiring VTL and the back gate of the transistor Tr1. At this time, a predetermined potential can be input to the back gate of the transistor Tr1 from the wiring VTL. Then, when the wiring VWL is supplied with a low-level potential to turn off the transistor Tr3, a voltage between the second terminal of the transistor Tr1 and the back gate of the transistor Tr1 can be retained with the capacitor C6. That is, the threshold voltage of the transistor Tr1 can be changed when the voltage supplied to the back gate of the transistor Tr1 is determined by the wiring VTL, and the threshold voltage of the transistor Tr1 can be fixed with the transistor Tr3 and the capacitor C6.

Figure 4D:
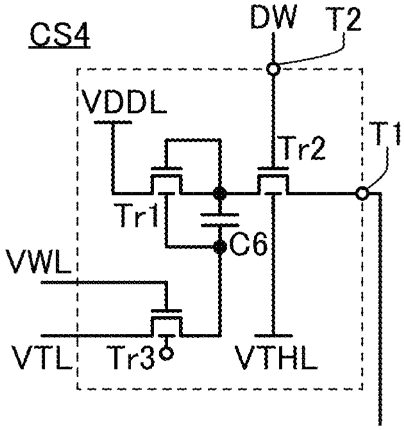

As another example, as the circuit that can be used as the current source CS included in the circuit WCSa[j] in FIG. 3A, a current source CS4 illustrated in FIG. 4D may be used. The current source CS4 has a configuration in which the back gate of the transistor Tr2 is electrically connected not to the second terminal of the transistor Tr2 but to the wiring VTHL in the current source CS3 in FIG. 4C. That is, in the current source CS4, the threshold voltage of the transistor Tr2 can be changed with the potential supplied from the wiring VTHL, as in the current source CS2 in FIG. 4B.

When a high current flows between the first terminal and the second terminal of the transistor Tr1 in the current source CS4, the on-state current of the transistor Tr2 needs to be increased to make the current flow from the terminal T1 to the outside of the current source CS4. In this case, in the current source CS4, the wiring VTHL is supplied with a high-level potential to decrease the threshold voltage of the transistor Tr2 and increase the on-state current of the transistor Tr2, whereby a high current flowing between the first terminal and the second terminal of the transistor Tr1 can be made flow from the terminal T1 to the outside of the current source CS4.

The use of the current source CS1 to the current source CS4 illustrated in FIG. 4A to FIG. 4D as the current sources CS included in the circuit WCSa[j] in FIG. 3A enables the circuit WCSa to output current corresponding to the K-bit first data. The amount of the current can be, for example, the amount of current flowing between the first terminal and the second terminal of the transistor F1 in the range where the transistor F1 operates in the subthreshold region.

As the circuit WCSa[j] in FIG. 3A, the circuit WCSa[j] illustrated in FIG. 4A may be used. In the circuit WCSa[j] in FIG. 3B, one current source CS in FIG. 4A is connected to each of the wiring DW[1] to the wiring DW[K]. When the channel width of a transistor Tr1[1] is w[1], the channel width of a transistor Tr1[2] is w[2], and the channel width of a transistor Tr1[K] is w[K], the ratio of the channel widths is $w[1]:w[2]:w[K]=1:2:2^{K-1}$. Since current flowing between a source and a drain of a transistor that operates in the subthreshold region is proportional to the channel width, the circuit WCSa illustrated in FIG. 3B can output current corresponding to the K-bit first data like the circuit WCSa in FIG. 3A.

As the transistor Tr1 (including the transistor Tr1[1] to the transistor Tr1[K]), the transistor Tr2 (including the transistor Tr2[1] to the transistor Tr2[K]), and the transistor Tr3, a transistor that can be used as the transistor F1 or the transistor F2 can be used, for example. In particular, as the transistor Tr1 (including the transistor Tr1[1] to the transistor Tr1[K]), the transistor Tr2 (including the transistor Tr2[1] to the transistor Tr2[K]), and the transistor Tr3, OS transistors are preferably used.

[Circuit XCS]

Next, a configuration example of the circuit XCS corresponding to a peripheral circuit of the cell array CA is described.

The circuit XCS includes a circuit XCSa[1] to a circuit XCSa[m] (m circuits in total), for example.

In FIG. 2, the circuit XCSa[1] is electrically connected to the wiring XCL[1], for example, and the circuit XCSa[m] is electrically connected to the wiring XCL[m], for example.

The circuit XCSa[1] to the circuit XCSa[m] have a function of supplying a signal corresponding to after-mentioned reference data or a signal corresponding to the second data to the wiring XCL[1] to the wiring XCL[n], respectively. Note that in the case of the arithmetic circuit MACA1 in FIG. 2, the values of the above-described signals can be expressed as the amount of current.

Figure 3B:
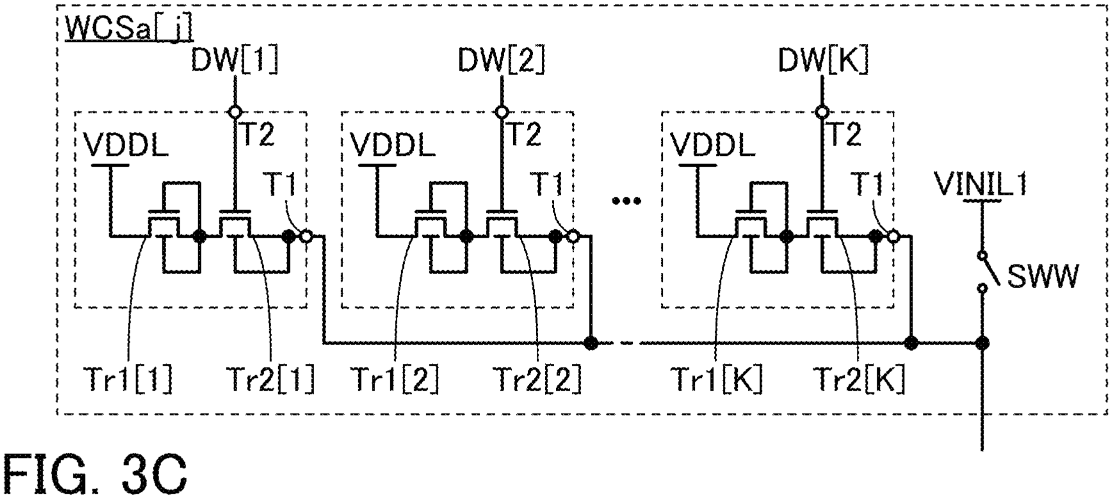
Figure 3C:
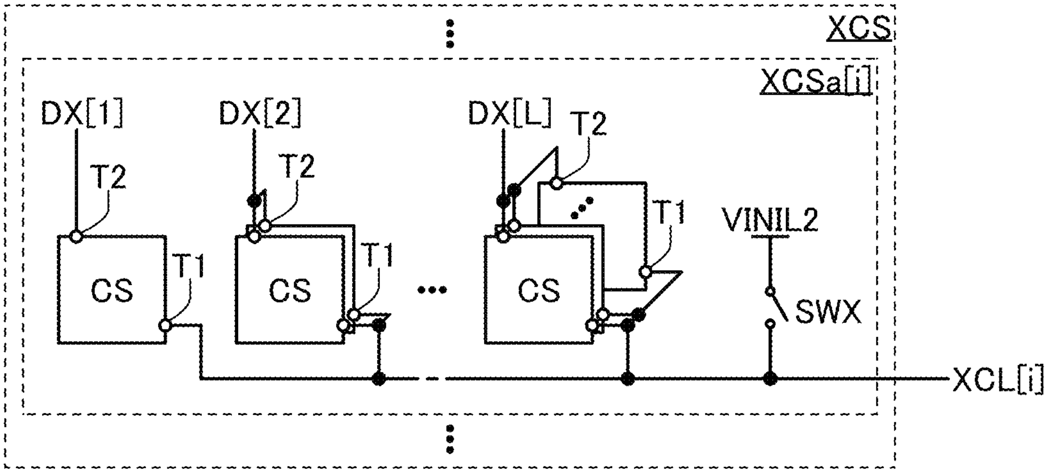

FIG. 3C is a block diagram illustrating an example of the circuit XCS that can be used in the arithmetic circuit MACA1 in FIG. 2. FIG. 3C selectively illustrates a circuit XCSa[i] corresponding to any one of the circuit XCSa[1] to the circuit XCSa[m]. FIG. 3C also illustrates the wiring XCL[i] to show electrical connection between the circuit XCS and its peripheral circuits.

Accordingly, the circuit XCSa[i] is electrically connected to the wiring XCL[i].

The circuit XCSa[i] illustrated in FIG. 3C includes a switch SWX, for example. A first terminal of the switch SWX is electrically connected to the wiring XCL[i], and a second terminal of the switch SWX is electrically connected to a wiring VINIL2. The wiring VINIL2 functions as a wiring for supplying an initialization potential to the wiring XCL[i], and the initialization potential can be a ground potential (GND), a low-level potential, or a high-level potential. The initialization potential supplied from the wiring VINIL2 may be equal to the potential supplied from the wiring VINIL1. The switch SWX [i] is turned on only when the initialization potential is supplied to the wiring XCL[i]; otherwise, the switch is in an off state.

As the switch SWX, a switch that can be used as the switch SWW can be used, for example.

The circuit XCSa[i] in FIG. 3C can have almost the same configuration as that of the circuit WCSa[j] in FIG. 3A. Specifically, the circuit XCSa[i] has a function of outputting reference data as the current amount, and a function of outputting L-bit second data (24 values) (L is an integer greater than or equal to 1) as the current amount; in this case, the circuit XCSa[i] includes $2^L-1$ current sources CS. The circuit XCSa[i] includes one current source CS that outputs information corresponding to the first bit value as current, two current sources CS that output information corresponding to the second bit value as current, and $2^{L-1}$ current sources CS that output information corresponding to the L-th bit value as current.

The reference data output from the circuit XCSa[i] as current can be information in which the first bit value is "1" and the second and subsequent bit values are "0", for example.

In FIG. 3C, the terminal T2 of the one current source CS is electrically connected to a wiring DX[1], the terminals T2 of the two current sources CS are electrically connected to a wiring DX[2], and the terminals T2 of the $2^{L-1}$ current sources CS are electrically connected to a wiring DX[L].

The plurality of current sources CS included in the circuit XCSa[i] have a function of outputting the same constant current $I_{Xut}$ from the terminals T1. The wiring DX[1] to the wiring DX[L] function as wirings for transmitting control signals to make the current sources CS, which are electrically connected to the wiring DX[1] to the wiring DX[L], output/Nut. In other words, the circuit XCSa[i] has a function of making current with the amount corresponding to the L-bit data transmitted from the wiring DX[1] to the wiring DX[I] flow to the wiring XCL.

Specifically, the circuit XCSa[i] with L of 2 is considered here. For example, when the value of the first bit is "1" and the value of the second bit is "0", a high-level potential is supplied to the wiring DX[1], and a low-level potential is supplied to the wiring DX[2]. In this case, the constant current $I_{Xut}$ flows from the circuit XCSa[i] to the circuit XCL. As another example, when the value of the first bit is "0" and the value of the second bit is "1", a low-level potential is supplied to the wiring DX[1], and a high-level potential is supplied to the wiring DX[2]. In this case, the constant current $2I_{Xut}$ flows from the circuit XCSa[i] to the wiring XCL[i]. As another example, when the value of the first bit is "1" and the value of the second bit is "1", a high-level potential is supplied to the wiring DX[1] and the wiring DX[2]. In this case, the constant current $3I_{Xut}$ flows from the circuit XCSa[i] to the wiring XCL[i]. As another example, when the value of the first bit is "0" and the value of the second bit is "0", a low-level potential is supplied to the wiring DX[1] and the wiring DX[2]. In this case, the constant current does not flow from the circuit XCSa[i] to the wiring XCL[i]. In this specification and the like, this case is sometimes rephrased as "current with an amount 0 flows from the circuit XCSa[i] to the wiring XCL[i]". The current amounts 0, $I_{Xut}$, $2I_{Xut}$, $3I_{Xut}$, and the like output from the circuit XCSa[i] can be the second data output from the circuit XCSa[i]; in particular, the current amount INut output from the circuit XCSa[i] can be the reference data output from the circuit XCSa[i].

When errors in the constant currents/Nut output from the terminals T1 of the plurality of current sources CS occur owing to variations in electrical characteristics of the transistors in the current sources CS included in the circuit XCSa[i], the errors are preferably within 10%, further preferably within 5%, still further preferably within 1%. In this embodiment, the description is made on the assumption that there is no error in the constant currents $I_{Xut}$ output from the terminals T1 of the plurality of current sources CS included in the circuit XCSa.

As the current source CS of the circuit XCSa[i], any of the current source CS1 to the current source CS4 in FIG. 4A to FIG. 4D can be used as in the case of the current source CS of the circuit WCSa[j]. In such a case, the wiring DW illustrated in FIG. 4A to FIG. 4D is replaced with the wiring DX. This allows the circuit XCSa[i] to make current within the current range of the subthreshold region flow through the wiring XCL[i] as the reference data or the L-bit second data.

The circuit XCSa[i] in FIG. 3C can have a circuit configuration similar to that of the circuit WCSa[j] illustrated in FIG. 3B. In this case, the circuit WCSa[j] illustrated in FIG. 3B is replaced with the circuit XCSa[i], the wiring DW[1] is replaced with the wiring DX[1], the wiring DW[2] is replaced with the wiring DX[2], the wiring DW[K] is replaced with the wiring DX[L], the switch SWW is replaced with the switch SWX, and the wiring VINIL1 is replaced with the wiring VINIL2.

[Circuit WSD]

The circuit WSD has a function of selecting a row in the cell array CA to which the first data is to be written, by supplying a predetermined signal to the wiring WSL[i] at the time of writing the first data to each of the cells included in the cell array CA. For example, in FIG. 1, when the circuit WSD supplies a high-level potential to the wiring WSL[1] and supplies a low-level potential to the wiring WSL[2] (not illustrated) to the wiring WSL[m], the transistor F1 and the transistor F1*d* each having a gate electrically connected to the wiring WSL[1] can be turned on and the transistors F1 and the transistors F1*d* each having a gate electrically connected to the wiring WSL[2] to the wiring WSL[m] can be turned off.

[Circuit ITS]

Next, a configuration example of the circuit ITS corresponding to a peripheral circuit of the cell array CA is described.

The circuit ITS includes a circuit SWS2 and a circuit ITRZ[j], for example.

The circuit SWS2 has a function of establishing or breaking electrical continuity between the wiring WCL[j] and the circuit ITRZ[j].

The circuit SWS2 includes a switch S4[*j*], for example. A first terminal of the switch S4[*j*] is electrically connected to the wiring WCL[j], a second terminal of the switch S4[*j*] is electrically connected to a first input terminal of the converter circuit ITRZ[j] described later, and a control terminal of the switch S4[*j*] is electrically connected to a wiring SWL2.

The wiring SWL2 functions as a wiring for switching the on state and the off state of the switch S4[*j*], for example. Accordingly, the wiring SWL2 is supplied with a high-level potential or a low-level potential.

As the switch S4[*j*], a switch that can be used as the switch S3[*j*] can be used, for example. In particular, an OS transistor is preferably used as the switch S4[*j*]. Alternatively, an electrical switch such as an analog switch or a mechanical switch may be used as the switch S4[*j*].

As described above, the circuit SWS2 has a function of establishing or breaking electrical continuity between the wiring WCL[j] and the circuit ITS. That is, the circuit SWS2 switches electrical continuity and discontinuity between the circuit ITS and the wiring WCL[j] by using the switch S4[*j*].

The converter circuit ITRZ[j] includes the input terminal and an output terminal, for example. For example, the input terminal of the converter circuit ITRZ[j] is electrically connected to the second terminal of the switch S4[*j*], and the output terminal of the converter circuit ITRZ[j] is electrically connected to a wiring OL[j].

The converter circuit ITRZ[j] has a function of obtaining the amount of current input to the input terminal from the wiring WCL[j] and outputting a signal corresponding to the amount of current when the switch S4[*j*] is in an on state, for example. Note that the signal can be a voltage or a current. The voltage can be, for example, an analog voltage or a digital voltage. The converter circuit ITRZ[j] may include an arithmetic circuit of a function system. In this case, for example, the arithmetic circuit may perform arithmetic operation of a function with the use of the converted voltage, and the arithmetic operation result may be output to the wiring OL[j].

In particular, in the case of performing arithmetic operation of a hierarchical neural network, a sigmoid function, a tanh function, a softmax function, a ReLU function, or a threshold function can be used as the above-described function, for example.

Figure 5A:
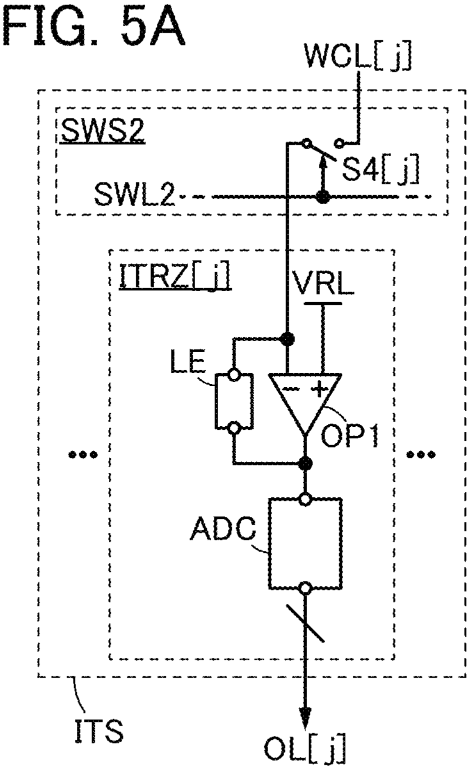
FIG. 5A and FIG. 5B are circuit diagrams each illustrating a configuration example of a circuit included in an arithmetic circuit.

The converter circuit ITRZ[j] illustrated in FIG. 5A is an example of a circuit that can be used as the converter circuit ITRZ[j] in FIG. 2. FIG. 5A also illustrates the circuit SWS2, the wiring WCL[j], the wiring SWL2, the switch S4[*j*], and the wiring OL[j] to show electrical connection between the converter circuit ITRZ[j] and its peripheral circuits. The wiring WCL[j] is any one of the wiring WCL[1] to the wiring WCL[n] included in the arithmetic circuit MACA1 in FIG. 2, the switch S4[*j*] is any one of the switch S4[1] to the switch S4[*n*] included in the arithmetic circuit MACA1 in FIG. 2, and the wiring OL[j] is any one of the wiring OL[1] to the wiring OL[n] included in the arithmetic circuit MACA1 in FIG. 2.

The converter circuit ITRZ[j] in FIG. 5A is electrically connected to the wiring WCL through the switch S4[*j*]. The converter circuit ITRZ[j] is electrically connected to the wiring OL[j]. For example, the converter circuit ITRZ[j] has a function of converting the amount of current flowing from the converter circuit ITRZ[j] to the wiring WCL[j] or the amount of current flowing from the wiring WCL[j] to the converter circuit ITRZ[j] into an analog voltage; converting the analog voltage into a digital voltage and then converting the digital voltage into an analog current; and outputting the analog current to the wiring OL[j].

The converter circuit ITRZ[j] in FIG. 5A includes a load LE, an operational amplifier OP1, and an analog-digital converter circuit ADC, for example.

An inverting input terminal of the operational amplifier OP1 is electrically connected to a first terminal of the load LE and a second terminal of the switch S4[*j*]. A non-inverting input terminal of the operational amplifier OP1 is electrically connected to a wiring VRL. An output terminal of the operational amplifier OP1 is electrically connected to a second terminal of the load LE and an input terminal of the analog-digital converter circuit ADC. An output terminal of the analog-digital converter circuit ADC is electrically connected to the wiring OL[j].

The wiring VRL functions as a wiring for supplying a constant voltage. The constant voltage can be a ground potential (GND) or a low-level potential, for example.

As the load LE, a resistor, a diode, or a transistor can be used, for example.

In the converter circuit ITRZ[j], the amount of current flowing from the wiring WCL to the inverting input terminal of the operational amplifier OP1 and the first terminal of the load LE through the switch S4[*j*] or the amount of current flowing from the inverting input terminal of the operational amplifier OP1 and the first terminal of the load LE to the wiring WCL[j] through the switch S4[*j*] can be converted into an analog potential owing to the configuration of the operational amplifier OP1 and the load LE. The analog potential is input to the input terminal of the analog-digital converter circuit ADC.

In particular, by setting the constant voltage supplied from the wiring VRL to a ground potential (GND), the inverting input terminal of the operational amplifier OP1 is virtually grounded, and an analog voltage output to the wiring OL[j] can be a voltage relative to the ground potential (GND).

The analog-digital converter circuit ADC has a function of, in response to input of an analog voltage to its input terminal, outputting a digital voltage corresponding to the analog voltage to the wiring OL[j], for example.

Note that here, the wiring OL[j] is one or more wirings. The number of wirings OL[j] is determined by, for example, the resolution of the analog-digital converter circuit ADC. For example, when the resolution of the analog-digital converter circuit ADC is one bit, the number of wirings OL[j] can be one; as another example, when the resolution of the analog-digital converter circuit ADC is eight bits, the number of wirings OL[j] can be eight.

The analog-digital converter circuit ADC can be regarded as one of the above-described arithmetic circuits of a function system. Thus, to use an arithmetic circuit of a different function system in the converter circuit ITRZ[j], the analog-digital converter circuit ADC is replaced with a circuit that performs desired function operation. Note that the circuit performing the function operation preferably has a configuration in which the input is an analog voltage and the output is a digital voltage.

Although the converter circuit ITRZ[j] in FIG. 5A is configured to output a digital signal, the converter circuit ITRZ[j] may be configured to output an analog potential of the output terminal of the operational amplifier OP1 directly to the wiring OL[j] without including the analog-digital converter circuit ADC. Specifically, a configuration may be employed in which the analog-digital converter circuit ADC is not provided in the converter circuit ITRZ[j] in FIG. 5A, as shown in the converter circuit ITRZ[j] in FIG. 5B.

[Circuit FB]

The circuit FB is a circuit that performs arithmetic operation necessary for correcting potentials corresponding to first data written to the cell IM[1,*j*] to the cell IM[m,j], for example.

Figure 6A:
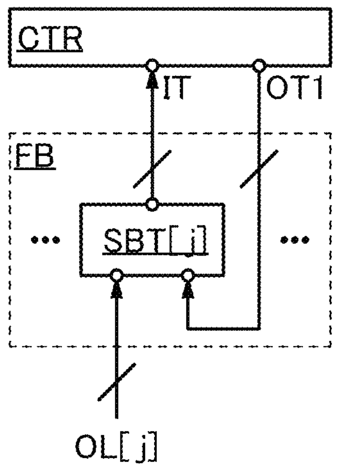
FIG. 6A to FIG. 6C are circuit diagrams each illustrating a configuration example of a circuit included in an arithmetic circuit.

The circuit FB illustrated in FIG. 6A is an example of a circuit that can be used as the circuit FB illustrated in FIG. 1 and FIG. 2 in the case where the converter circuit ITRZ[j] included in the circuit ITS outputs a digital signal (e.g., the case where the converter circuit ITRZ[j] illustrated in FIG. 5A is used as the converter circuit ITRZ[j] in FIG. 2). FIG. 6A also illustrates the control circuit CTR and the wiring OL[j] to show electrical connection between the circuit FB and its peripheral circuits. The wiring OL[j] is any one of the wiring OL[1] to the wiring OL[n] included in the arithmetic circuit MACA0 in FIG. 1.

The circuit FB in FIG. 6A includes a circuit SBT[j], for example.

The circuit SBT[j] illustrated in FIG. 6A includes a first input terminal, a second input terminal, and an output terminal. The control circuit CTR here includes a terminal IT and a terminal OT1, for example.

The first input terminal of the circuit SBT[j] is electrically connected to the wiring OL[j]. The second input terminal of the circuit SBT[/] is electrically connected to the terminal OT1 of the control circuit CTR. The output terminal of the circuit SBT[j] is electrically connected to the terminal IT of the control circuit CTR.

A digital signal output from the converter circuit ITRZ[j] is supplied to the wiring OL[j]. Thus, the digital signal is input to the first input terminal of the circuit SBT[j].

The control circuit CTR here has a function of outputting comparison data to the terminal OT1. The comparison data can be, for example, data for determining whether the first data read from the cell IM[1,*j*] to the cell IM[m,j] is an appropriate value. Thus, the comparison data can be, for example, the first data transmitted from the control circuit CTR to the circuit XCSa at the time of writing to the cell IM[1,*j*] to the cell IM[m,j]. Accordingly, in this configuration example, the first data used at the time of writing to the cell IM[1,*j*] to the cell IM[m,j] is input to the second input terminal of the circuit SBT[j]. Note that in FIG. 6A, the first data is shown as a digital signal.

The circuit SBT[j] has a function of calculating a difference between the value of a digital signal input to the first input terminal from the converter circuit ITRZ[j] and the value of first data input to the second input terminal from the control circuit CTR and outputting the arithmetic operation result (hereinafter referred to as a difference value) as a digital signal to the output terminal of the circuit SBT[j]. That is, the circuit SBT[j] can be a subtractor configured with a digital circuit.

For example, when the value of first data to be written to the cell IM[i,j] is output as a digital signal from the terminal OT1 of the control circuit CTR and a value read from the cell IM[i,j] to which the first data has been written is output as a digital signal from the wiring OL[j], the circuit SBT[j] can obtain a difference value between the first data at the time of writing and the first data at the time of reading. It is found that the first data at the time of writing and the first data at the time of reading match when the difference value is 0 in the circuit SBT[j]. On the other hand, when the difference value is not 0 in the circuit SBT[j], the first data at the time of writing and the first data at the time of reading do not match; thus, it can be determined that the first data written to the cell IM[i,j] differs from the value of the first data at the time of writing.

Figure 5B:
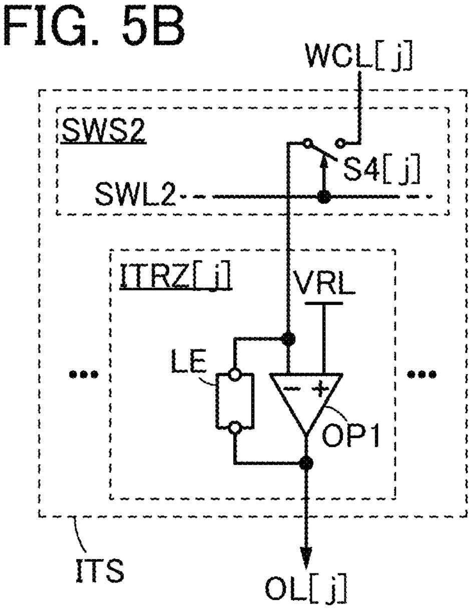
Figure 6B:
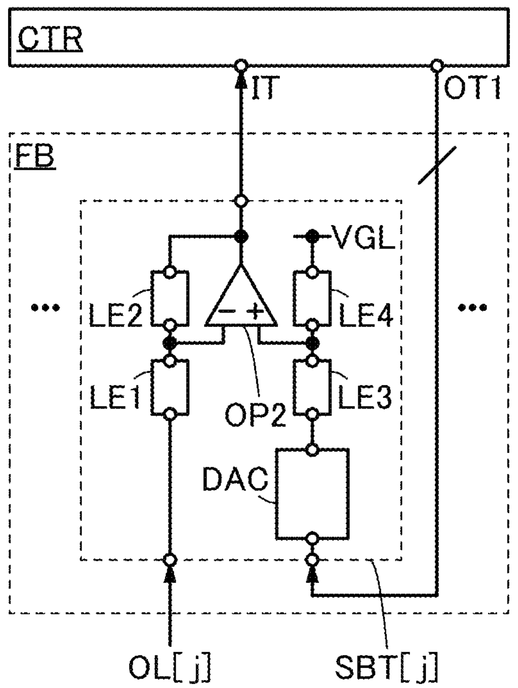

In the case where the converter circuit ITRZ[j] included in the circuit ITS outputs not a digital signal but an analog potential (e.g., the case where the converter circuit ITRZ[j] illustrated in FIG. 5B is used as the converter circuit ITRZ[j] in FIG. 2), the circuit configuration of the circuit FB in FIG. 6A is changed to that of the circuit FB illustrated in FIG. 6B.

The circuit SBT[j] illustrated in FIG. 6B includes a digital-analog converter circuit DAC, a load LE1 to a load LE4, and an operational amplifier OP2, for example.

A first terminal of the load LE1 is electrically connected to the first input terminal of the circuit SBT[j], and a second terminal of the load LE1 is electrically connected to a first terminal of the load LE2 and an inverting input terminal of the operational amplifier OP2. A second terminal of the load LE2 is electrically connected to an output terminal of the operational amplifier OP2 and the output terminal of the circuit SBT[j]. An input terminal of the digital-analog converter circuit DAC is electrically connected to the second input terminal of the circuit SBT[j], and an output terminal of the digital-analog converter circuit DAC is electrically connected to a first terminal of the load LE3. A second input terminal of the load LE3 is electrically connected to a non-inverting input terminal of the operational amplifier OP2 and a first terminal of the load LE4. A second terminal of the load LE4 is electrically connected to a wiring VGL.

The wiring VGL functions as a wiring for supplying a constant voltage, for example. The constant voltage can be a ground potential (GND) or a low-level potential, for example.

For example, the digital-analog converter circuit DAC has a function of, in response to input of a digital signal to its input terminal, outputting an analog potential corresponding to the digital signal to the output terminal of the digital-analog converter circuit DAC.

As the load LE1 to the load LE4, a resistor, a diode, or a transistor can be used as in the case of the load LE, for example.

When the resistance values of the load LE1 to the load LE4 are made equal to each other, the circuit SBT[j] illustrated in FIG. 6B can be a subtractor of analog potentials.

For example, when the value of first data to be written to the cell IM[i,j] is output as a digital signal from the terminal OT1 of the control circuit CTR, the digital signal is converted into an analog potential by the digital-analog converter circuit DAC of the circuit SBT[j]. A value read from the cell IM[i,j] to which the first data has been written is input as an analog potential to the wiring OL[j]. Accordingly, the circuit SBT[j] can obtain a difference between the analog potential corresponding to the first data at the time of writing and the analog potential corresponding to the first data at the time of reading.

By obtaining, through the terminal IT, the difference value output from the output terminal of the circuit SBT[j], the control circuit CTR can determine whether the first data at the time of writing and the first data at the time of reading match. For example, in the case where the difference value is 0 in the circuit SBT[j], the control circuit CTR determines that the first data at the time of writing and the first data at the time of reading match. On the other hand, in the case where the difference value is not 0 in the circuit SBT[j], the first data at the time of writing and the first data at the time of reading do not match; thus, the control circuit CTR determines that the first data written to the cell IM[i,j] differs from the value of the first data at the time of writing. Accordingly, the control circuit CTR can determine whether the first data written to the cell IM[i,j] needs to be corrected.

Instead of the configurations in FIG. 6A and FIG. 6B for determination that the first data at the time of writing and the first data at the time of reading match when the difference value output from the circuit SBT[j] is 0, the circuit FB may have a circuit configuration for determination that the first data at the time of writing and the first data at the time of reading match when the difference value output from the circuit SBT[j] falls within a predetermined range.

Figure 6C:
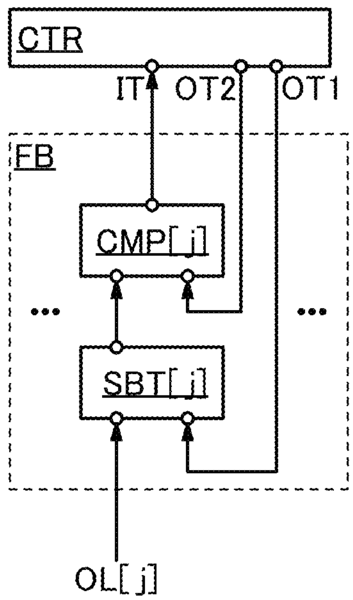

FIG. 6C illustrates such a circuit configuration. The circuit FB illustrated in FIG. 6C has a configuration in which a comparison circuit CMP[j] is provided in the circuit FB in FIG. 6A or FIG. 6B. Note that each of a plurality of wirings illustrated in FIG. 6C is a wiring supplied with one of an analog potential and a digital signal.

In FIG. 6C, the control circuit CTR includes the terminal IT, the terminal OT1, and a terminal OT2, for example.

The comparison circuit CMP[j] includes a first input terminal, a second input terminal, and an output terminal, for example.

The first input terminal of the comparison circuit CMP[j] is electrically connected to the output terminal of the circuit SBT[j]. The second input terminal of the comparison circuit CMP[j] is electrically connected to the terminal OT2 of the control circuit CTR. The output terminal of the comparison circuit CMP[j] is electrically connected to the terminal IT of the control circuit CTR.

The control circuit CTR here has a function of outputting reference data to the terminal OT2. The reference data can be, for example, data for determining whether a difference value between the first data at the time of writing and the first data at the time of reading, which is transmitted from the output terminal of the circuit SBT[j], falls within an acceptable range (hereinafter such data is referred to as a reference value).

Accordingly, the comparison circuit CMP[j] has a function of comparing a value input to the first input terminal and a value input to the second input terminal and outputting the result of the magnitude relation between the values to the output terminal, for example. Alternatively, the comparison circuit CMP[j] may have a function of obtaining an absolute value of a value input to the first input terminal, comparing the absolute value with a value input to the second input terminal, and outputting the result of the magnitude relation between the values to the output terminal. Hence, the comparison circuit CMP[j] can be replaced with the term "comparator".

For example, when δ is input as the reference value from the terminal OT2 of the control circuit CTR to the second input terminal of the comparison circuit CMP[j], the comparison circuit CMP[j] outputs, from its output terminal, the result of the magnitude relation between the reference value δ and the difference value between the first data at the time of writing and the first data at the time of reading, which is input to the first input terminal.

By obtaining, through the terminal IT, the result output from the output terminal of the comparison circuit CMP[j], the control circuit CTR can determine whether the first data at the time of writing and the first data at the time of reading match. For example, in the case where the difference value between the first data at the time of writing and the first data at the time of reading is smaller than the reference value δ in the comparison circuit CMP[j], the control circuit CTR determines that the first data at the time of writing and the first data at the time of reading substantially match. On the other hand, in the case where the difference value between the first data at the time of writing and the first data at the time of reading is larger than the reference value δ, the control circuit CTR determines that the first data at the time of writing and the first data at the time of reading do not match. Accordingly, the control circuit CTR can determine whether the first data written to the cell IM[i,j] needs to be corrected.

Note that the above-described difference value may be an absolute value.

The above-described reference value δ can be determined, for example, in accordance with the distribution width (sometimes referred to as bit accuracy) of binary or multilevel potentials written to the cell IM[i,j].

[Control circuit CTR]

The control circuit CTR has a function of controlling the circuit WCS, the circuit SWS1, the circuit SWS2, the circuit WSD, the circuit XCS, and the circuit ITS, which correspond to the peripheral circuits of the cell array CA, for example.

The control circuit CTR has a function of transmitting, to the circuit WCSa[j], a signal corresponding to the first data to be written to the cell IM[1,*j*] to the cell IM[m,j], for example. Note that the signal can be a digital signal transmitted to the wiring DW[1] to the wiring DW[K] in the circuit WCSa[j].

The control circuit CTR has a function of transmitting a signal corresponding to the second data to the circuit XCSa [1] to the circuit XCSa[m], for example. Note that the signal can be a digital signal transmitted to the wiring DX[1] to the wiring DX[L] in the circuit XCSa[j].

The control circuit CTR has a function of switching the on state and the off state of the switch S3[*j*] included in the circuit SWS1, for example. Hence, the control circuit CTR is electrically connected to the wiring SWL1. Similarly, the control circuit CTR has a function of switching the on state and the off state of the switch S4[*j*] included in the circuit SWS2, for example. Hence, the control circuit CTR is electrically connected to the wiring SWL2.

The control circuit CTR has a function of transmitting a control signal to the circuit WSD, for example. The control circuit CTR has a function of transmitting, to the circuit WSD, a signal including an address of any of the first row to the m-th row of the cell array CA in which the first data is to be written, for example.

The control circuit CTR includes the terminal IT and a terminal OT, for example. Note that the terminal IT corresponds to the terminal IT in FIG. 6A to FIG. 6C described above. The terminal OT and the terminal IT correspond to the terminal OT1 and the terminal OT2 in FIG. 6A to FIG. 6C described above.

The terminal IT and the terminal OT of the control circuit CTR are electrically connected to the circuit FB.

The control circuit CTR has a function of transmitting an analog potential or a digital signal corresponding to a value necessary for arithmetic operation performed in the circuit FB, to the circuit FB through the terminal OT, for example.

The control circuit CTR has a function of obtaining, through the terminal IT, the result of the arithmetic operation by the circuit FB, for example.

To write the first data to the cell IM[i,j] (not illustrated) in the arithmetic circuit MACA1 in FIG. 2, the transistor F1 included in the cell IM[i,j] is turned on, and the transistors F1 included in the cell IM[1,*j*] to the cell IM[m,j] other than the cell IM[i,j], which are electrically connected to the wiring WCL[j], are turned off. Next, the switch S3[*j*] is turned on and the switch S4[*j*] is turned off, and a current with an amount corresponding to the first data flows from the circuit WCSa[j] to the cell IM[i,j] through the switch S3[*j*], whereby the potential of the node N[i,j] is set. At this time, the current with the amount corresponding to the first data flows between the source and the drain of the transistor F2; thus, the potential of the gate of the transistor F2 (the node N[i,j]) is determined by itself. After that, the transistor F1 in the cell IM[i,j] is turned off, whereby the potential of the node N[i,j] can be retained by the capacitor C5.

At this time, the value of the first data written to the cell IM[i,j] depends on the amount of current flowing through the cell IM[i,j]. That is, an analog potential or a multilevel potential is determined at the node N[i,j] of the cell IM[i,j] in accordance with the value of the first data.

When the first data is multilevel data and a variation in the potential written to the node N[i,j] of the cell IM[i,j] is large, the first data written to the cell IM[i,j] may be shifted from a desired value. For example, fabrication variations of the transistor F1, the transistor F2, the transistor F5, and the capacitor C5 included in the cell IM[i,j] might cause a difference between the amount of current flowing through the cell IM[i,j] at the time of writing the first data and the amount of current output from the cell IM[i,j] at the time of arithmetic operation.

In the case where the amount of current flowing through the cell IM[i,j] at the time of writing the first data and the amount of current output from the cell IM[i,j] at the time of arithmetic operation are different from each other, the first data written to the cell IM[i,j] is sometimes read as an incorrect value. Therefore, the amount of current output from the cell IM[i,j] at the time of arithmetic operation is preferably equal to the amount of current at the time of writing the first data to the cell IM[i,j].

<<Example 1 of First Data Writing Operation Including Correction Processing>>

Here, the description is made on processing in which a potential written to the node N[i,j] of the cell IM[i,j] is corrected in order that the cell IM[i,j] to which the first data has been written in the arithmetic circuit MACA1 in FIG. 2 adequately outputs a current with an amount corresponding to the first data.

Figure 7:
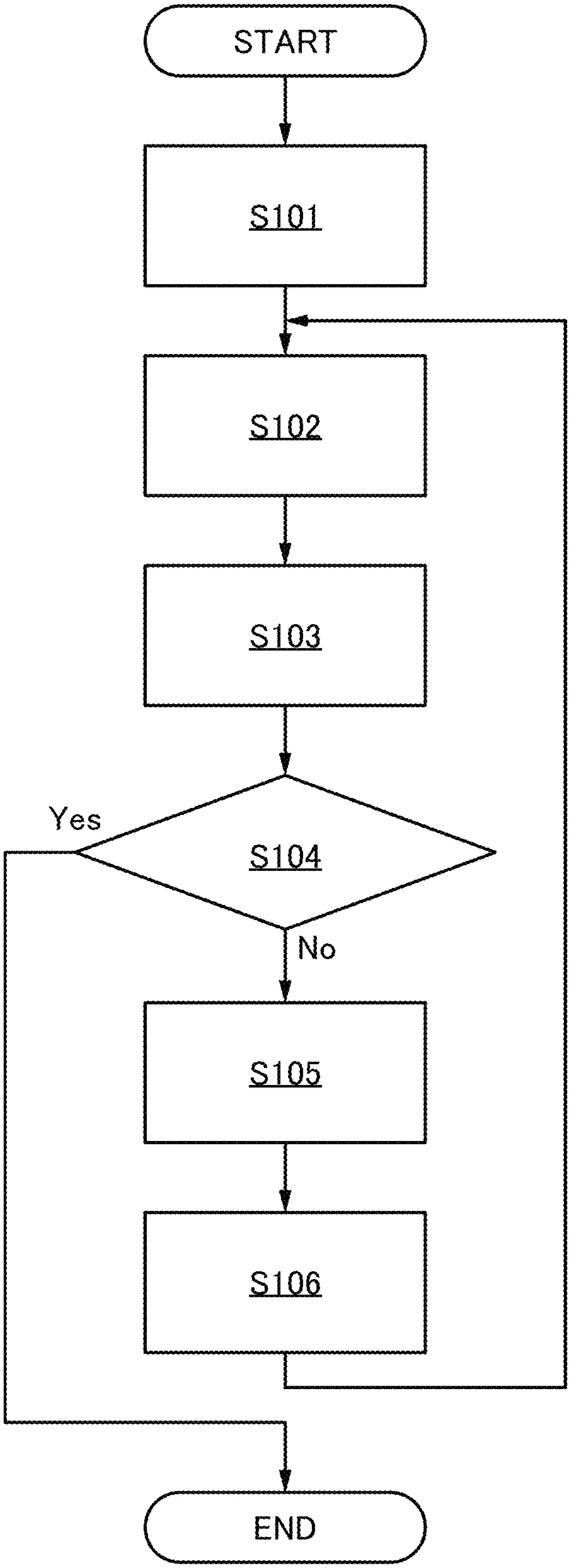
FIG. 7 is a flowchart illustrating an operation example of an arithmetic circuit.

FIG. 7 is a flowchart showing an example of a first data writing operation including correction processing. The writing operation includes Step S101 to Step S106. In FIG. 7, the start of the writing operation is denoted by "START", and the end of the writing operation is denoted by "END".

[Step S101]

Step S101 includes, for example, an operation of inputting a signal corresponding to $W_{TRG}$ as the value of the first data from the control circuit CTR to the circuit WCSa[j] included in the circuit WCS.

In the circuit WCSa[j] in FIG. 3, a signal corresponding to $W_{TRG}$ can be a digital signal input to each of the wiring DW[1] to the wiring DW[K], for example.

Hereinafter, the value of a digital signal input to each of the wiring DW[1] to the wiring DW[K] is referred to as $W_{WR}$. For example, $W_{WR}=W_{TRG}$ at the stage of Step S101.

[Step S102]

Step S102 includes, for example, an operation in which the circuit WCSa[j] generates a current (referred to as a write current) with an amount $I_{WR}$ corresponding to the value $W_{WR}$ of a digital signal input to each of the wiring DW[1] to the wiring DW[K], and transmits the current with $I_{WR}$ to the wiring WCL[j]; and an operation in which a write current with $I_{WR}$ flows through the cell IM[i,j], and a potential corresponding to the write current with $I_{WR}$ is written to the first terminal of the capacitor C5 (the node N[i,j]) of the cell IM[i,j].

In the circuit WCSa[j] in FIG. 3, the amount $I_{WR}$ corresponding to the first data can be generated by one or more current sources CS included in the circuit WCSa[j].

When a high-level potential is input to the wiring SWL1 to apply the high-level potential to the control terminal of the switch S3[*j*], the switch S3[*j*] can be turned on. Thus, the current with $I_{WR}$ generated in the circuit WCSa[j] can flow to the wiring WCL[j].

A high-level potential is input to the wiring WSL[i] among the wiring WSL[1] to the wiring WSL[m], and a low-level potential is input to the wiring WSL[1] to the wiring WSL[m] in the rows other than the i-th row. Thus, the transistor F1 of the cell IM[i,j] among the cell IM[1,*j*] to the cell IM[m,j] positioned in the j-th column can be turned on, and the transistors F1 of the cell IM[1,*j*] to the cell IM[m,j] in the rows other than the i-th row can be turned off.

In the cell IMd[1] to the cell IMd[m], a current with an amount $I_{ref0}$ (=/Nut) flows to the cell IMd[i] from the circuit XCSa[i] (note that $I_{ref0}$ (=$I_{Xut}$) is the amount of current corresponding to the second data with a value "1", and $I_{ref0}$ flowing from the circuit XCSa[i] will be described in detail in after-mentioned Operation example 1 of arithmetic circuit). Accordingly, the potential of the wiring XCL[i] becomes $V_{gm}$. A ground potential (GND) is supplied to the cell IMd[1] to the cell IMd[m] in the rows other than the i-th row from the circuit XCSa[1] to the circuit XCSa[m], respectively. That is, the potentials of the wiring XCL[1] to the wiring XCL[m] in the rows other than the i-th row become GND.

Since the transistors F1 included in the cell IM[1,*j*] to the cell IM[m,j] positioned in the j-th column and the rows other than the i-th row are in an off state, the node N[1,*j*] to the node N[m,j] in the rows other than the i-th row are in a floating state. At this time, the potentials of the wiring XCL[1] to the wiring XCL[m] in the rows other than the i-th row becoming GND result in changes of the potentials of the node N[1,*j*] to the node N[m,j] in the rows other than the i-th row. At this time, the transistors F2 included in the cell IM[1,*j*] to the cell IM[m,j] positioned in the j-th column and the rows other than the i-th row are turned off.

When a low-level potential is input to the wiring SWL2 to apply the low-level potential to the control terminal of the switch S4[*j*], the switch S4[*j*] can be turned off.

Since the switch S3[*j*] is in an on state, the switch S4[*j*] is in an off state, and the transistors F1 and the transistors F2 in the cell IM[1,*j*] to the cell IM[m,j] positioned in the j-th column and the rows other than the i-th row are in an off state as described above, the current with $I_{WR}$ generated in the circuit WCSa[j] flows only through the cell IM[i,j]. At this time, in the cell IM[i,j], the write current with $I_{WR}$ flows between the source and the drain of the transistor F2; hence, the potential of the gate of the transistor F2 (the node N[i,j]) is determined by itself. After that, a low-level potential is input to the wiring WSL[i] to turn off the transistor F1 in the cell IM[i,j], whereby the potential of the node N[i,j] can be retained by the capacitor C5. That is, the first data can be written to the cell IM[i,j].

[Step S103]

Step S103 includes, for example, an operation of reading the first data written to the cell IM[i,j]. In other words, Step S103 includes an operation in which the cell IM[i,j] outputs a read current corresponding to the potential of the capacitor C5 (the node N[i,j]), and an operation in which the read current is input to the converter circuit ITRZ[j] and thus the converter circuit ITRZ[j] outputs a value corresponding to the read current to the wiring OL[j].

Specifically, for example, a low-level potential is input to the wiring SWL1 to apply the low-level potential to the control terminal of the switch S3[*j*], whereby the switch S3[*j*] is turned off. Furthermore, a high-level potential is input to the wiring SWL2 to apply the high-level potential to the control terminal of the switch S4[*j*], whereby the switch S4[*j*] is turned on.

A low-level potential is continuously input to the wiring WSL[1] to the wiring WSL[m] to maintain the off state of the transistors F1 in the cell IM[i,j] to the cell IM[m,j] positioned in the j-th column.

In and after Step S102, the potential of the wiring XCL[i] is kept at $V_{gm}$, and the potentials of the wiring XCL[1] to the wiring XCL[m] in the rows other than the i-th row are kept at GND. This maintains the off state of the transistors F2 included in the cell IM[1,*j*] to the cell IM[m,j] positioned in the j-th column and the rows other than the i-th row.

In the cell IM[i,j], the potential written in Step S102 is retained at the node N[i,j]. Here, given that a potential supplied from the wiring VE0 is a ground potential, the source-drain current of the transistor F2 in the cell IM[i,j] is determined in accordance with the potential of the gate of the transistor F2. The source-drain current of the transistor F2 flows from the wiring WCL[j] through the cell IM[i,j] as the read current in Step S103. Here, the amount of source-drain current of the transistor F2 in the cell IM[i,j] (read current) is denoted as $I_{RD}$. Note that when the potential of the node N[i,j] in the cell IM[i,j] is appropriate, the write current amount $I_{WR}$ and the read current amount $I_{RD}$ are equal to each other.

Since the switch S3[*j*] is in an off state, the switch S4[*j*] is in an on state, and the transistors F1 and the transistors F2 in the cell IM[1,*j*] to the cell IM[m,j] positioned in the j-th column and the rows other than the i-th row are in an off state as described above, the current with $I_{RD}$ set in the cell IM[i,j] is output from the converter circuit ITRZ[j] of the circuit ITS through the switch S4[*j*].

When a current with the current amount $I_{RD}$ flows from the converter circuit ITRZ[j] to the wiring WCL[j] through the switch S4[*j*], the converter circuit ITRZ[j] outputs a potential corresponding to the current amount $I_{RD}$. The potential is transmitted to the circuit FB as a value $W_{RD}$ read from the cell IM[i,j].

Specifically, the converter circuit ITRZ[j] converts the current amount $I_{RD}$ into an analog potential by a current-voltage converter circuit (the operational amplifier OP1 and the load LE). Then, the converter circuit ITRZ[j] transmits the analog potential to the circuit FB as a signal including the value $W_{RD}$ read from the cell IM[i,j]. For example, when the converter circuit ITRZ[j] in FIG. 5B is used as the converter circuit ITRZ[j], a signal including the value $W_{RD}$ can be output as an analog potential.

The converter circuit ITRZ[j] may convert the analog potential into a digital signal by the analog-digital converter circuit and transmit the digital signal to the circuit FB as a signal including the value $W_{RD}$ read from the cell IM[i,j]. In this case, for example, when the converter circuit ITRZ[j] in FIG. 5A is used as the converter circuit ITRZ[j], a signal including the value $W_{RD}$ can be output as a digital signal.

[Step S104]

Step S104 includes, for example, an operation in which the circuit FB compares the value $W_{TRG}$ as the first data and the value $W_{RD}$ read from the cell IM[i,j].

Specifically, Step S104 includes an operation of terminating the writing operation including correction processing in the case where $W_{TRG}$ and $W_{RD}$ are equal to each other, and an operation of proceeding to Step S105 in the case where $W_{TRG}$ and $W_{RD}$ are not equal to each other.

In Step S104, a signal including the value $W_{RD}$ from the wiring OL[j] is input to the first input terminal of the circuit SBT[j] included in the circuit FB. A signal including the value $W_{TRG}$ from the control circuit CTR is input to the second input terminal of the circuit SBT[j]. Thus, $W_{TRG}-W_{RD}$ ($=\Delta W_1$) is output to the output terminal of the circuit SBT[j] as a difference value between the value $W_{RD}$ and the value $W_{TRG}$.

[Step S105]

Step S105 includes, for example, an operation in which the control circuit CTR generates the corrected first data to be written to the cell IM[i,j] again.

Specifically, Step S105 includes an operation in which the control circuit CTR obtains $\Delta W_1$ from the circuit SBT[j] included in the circuit FB and generates $W_{WR}+\Delta W_1$ (hereinafter referred to as an update value) as the corrected first data.

Note that the update value may be $W_{WR+S}\cdot\Delta W_1$ using a desired coefficient s. When the update value is $W_{WR}+S\cdot\Delta W_1$, the number of loops of Step S102 to Step S106 can be reduced in some cases.

[Step S106]

Step S106 includes, for example, an operation of inputting a signal corresponding to $W_{WR}+\Delta W$ as the update value from the control circuit CTR to the circuit WCSa[j] included in the circuit WCS, and an operation of proceeding to Step S102.

That is, the value of the digital signal input to each of the wiring DW[1] to the wiring DW[K] in the circuit WCSa[j] in FIG. 3 is a value obtained by adding $\Delta W$ to the value of $W_{WR}$ previously input to the circuit WCSa[j].

Therefore, after the transition from Step S106 to Step S102, the description can be made by replacing $W_{WR}$ in Step S102 to Step S106 described above with $W_{WR}+\Delta W$, which is the update value.

After that, Step S102 to Step S106 are repeated until $W_{TRG}$ and $W_{RD}$ become equal to each other (the difference between the write current and the read current becomes 0) in Step S104, whereby a potential corresponding to the first data can be appropriately written to the cell IM[i,j].

As described above, performing Step S101 to Step S106 can inhibit the variation at the time of writing the first data to the cell IM[i,j].

Example 2 of First Data Writing Operation Including Correction Processing

Note that the first data writing operation including correction processing of the semiconductor device of one embodiment of the present invention is not limited to the flowchart shown in FIG. 7. The flowchart shown in FIG. 7 may be changed as appropriate.

For example, in the flowchart in FIG. 7, the first data writing operation including correction processing is terminated when the value $W_{TRG}$ as the first data and the value $W_{RD}$ read from the cell IM[i,j] are equal to each other; alternatively, a flowchart may be such that the first data writing operation including correction processing is terminated when the difference between $W_{TRG}$ and $W_{RD}$ is within a predetermined range.

Figure 8:
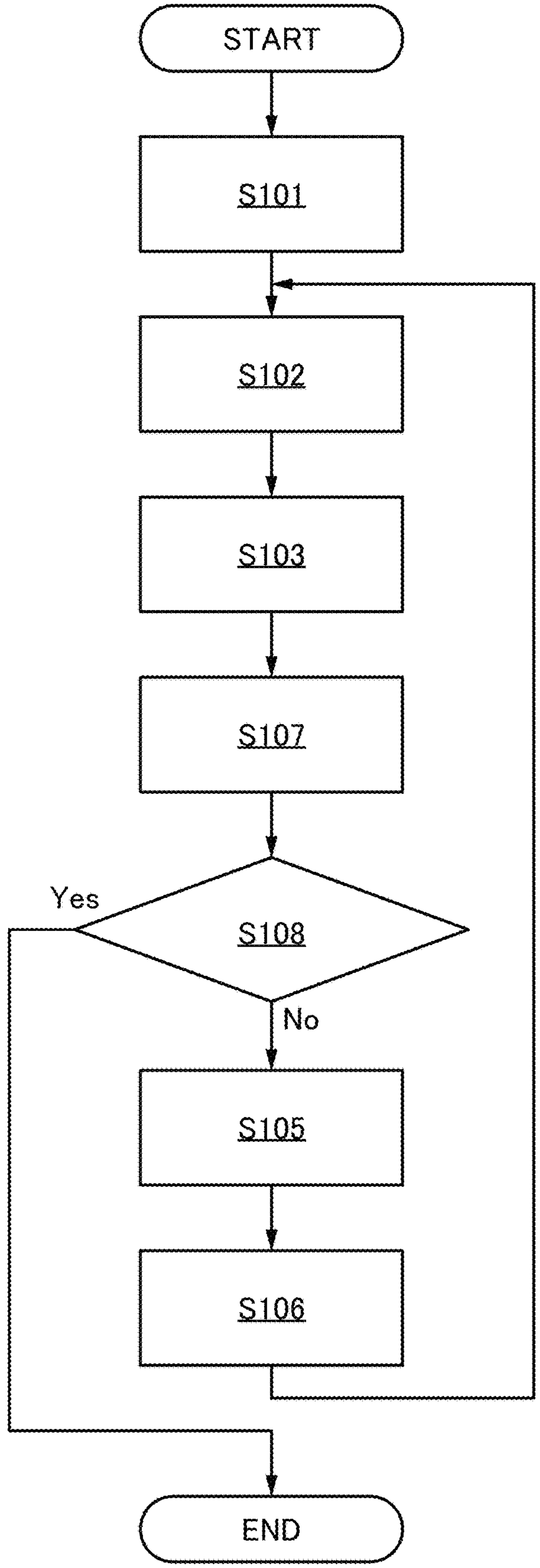
FIG. 8 is a flowchart illustrating an operation example of an arithmetic circuit.

A flowchart in FIG. 8 is a variation example of the flowchart in FIG. 7 and differs from the flowchart in FIG. 7 in including Step S107 and Step S108 instead of Step S104. In FIG. 8, the start of the writing operation is denoted by "START", and the end of the writing operation is denoted by "END".

[Step S107]

Step S107 includes, for example, an operation in which the circuit FB obtains a difference value between the value $W_{TRG}$ as the first data and the value $W_{RD}$ read from the cell IM[i,j].

In Step S107, a signal corresponding to the value $W_{RD}$ from the wiring OL[/] is input to the first input terminal of the circuit SBT[j] included in the circuit FB. A signal corresponding to the value $W_{TRG}$ from the control circuit CTR is input to the second input terminal of the circuit SBT[j]. Thus, a signal corresponding to $W_{TRG}-W_{RD}$ ($=\Delta W_1$) is output to the output terminal of the circuit SBT[j] as a difference value between the value $W_{RD}$ and the value $W_{TRG}$.

[Step S108]

Step S108 includes, for example, an operation in which the control circuit CTR determines whether the absolute value of $\Delta W_1$ (hereinafter referred to as $|\Delta W_1|$) is smaller than the reference value δ.

Specifically, Step S108 includes an operation of terminating the writing operation including correction processing in the case where $|\Delta W_1|$ is smaller than the reference value δ, and an operation of proceeding to Step S105 in the case where $|\Delta W_1|$ is larger than the reference value δ.

Note that in the case where $|\Delta W_1|$ is equal to the reference value δ, either the operation of terminating the writing operation including correction processing or the operation of proceeding to Step S105 may be selected.

The control circuit CTR obtains $\Delta W_1$ from the output terminal of the circuit SBT[j] included in the circuit FB and compares $|\Delta W_1|$ and the reference value δ.

Thus, the control circuit CTR is preferably provided with a comparator for comparing $|\Delta W_1|$ and the reference value δ. Instead of the control circuit CTR, the circuit SBT[j] included in the circuit FB may be provided with the comparison circuit CMP[j] functioning as a comparator, as illustrated in FIG. 6C.

The value of the reference value δ can be determined in accordance with the distribution width (sometimes referred to as bit accuracy) of binary or multilevel potentials written to the cell IM[i,j]. Specifically, for example, the reference value δ is set large when the bit accuracy is low as in the case of binary values, and the reference value δ is set small when the bit accuracy is high as in the case of ternary values or larger.

[Step S105 and Later]

In Step S105 and later, an operation in which $W_{WR}+\Delta W_1$ is generated in the control circuit CTR as the corrected first data (update value) and is written again to the cell IM[i,j] is performed as in the flowchart of FIG. 7.

Note that in the operation method in the flowchart of FIG. 8, instead of the operation of determining whether $|\Delta W_1|$ is smaller than the reference value δ and terminating the procedure when $|\Delta W_1|$ is smaller than the reference value δ, Step S108 may include an operation of terminating the procedure when processing from Step S105 to Step S106 is performed a predetermined number of times.

For example, the value read from the cell IM[i,j] in Step S103 can be expressed as $W_{RD}=(1+\sigma)\ W_{WR}$. Note that σ is a value expressing the amount of change from $W_{WR}$ to $W_{RD}$ as a percentage. For example, $\sigma=-0.1$ in the case where $W_{WR}$ decreases by 10% to be $W_{RD}$.

When the value read from the cell IM[i,j] in Step S103 can be expressed as $W_{RD}=(1+\sigma)\ W_{WR}$, $W_{RD}$ can be converged to $W_{WR}$ in some cases by repeating processing from Step S105 to Step S106.

Here, for example, Step S108 is assumed to include an operation of terminating the procedure in the case where processing from Step S105 to Step S106 is performed N times (Nis an integer greater than or equal to 1).

When processing from Step S105 to Step S106 is performed for the first time, $W_{TRG}=W_{WR}$ and $W_{RD}=(1+\sigma)\ W_{WR}$; thus, $\Delta W_1=W_{TRG}-W_{RD}=W_{TRG}-(1+\sigma)\ W_{TRG}=-\sigma W_{TRG}$.

The value read from the cell IM[i,j] when processing from Step S105 to Step S106 is performed for the N-th time can be expressed as $W_{RD}=W_{TRG}\ \{1+(-1)^{N-1}\sigma^N\}$. Note that the difference value at this time is $\Delta W_1=W_{TRG}\ (-\sigma)^N$.

That is, when σ is identified, the number N of times of processing necessary for converging $W_{RD}$ can be estimated.

As described above, in the case where the number N of times of processing necessary for converging $W_{RD}$ can be estimated, comparison between the difference value $\Delta W_1$ and the reference value δ does not need to be performed every time Step S105 to Step S106 are repeated. Thus, when Step S108 includes the operation of terminating the procedure when processing from Step S105 to Step S106 is performed a predetermined number of times, instead of the operation of determining whether $|\Delta W_1|$ is smaller than the reference value δ and terminating the procedure when $|\Delta W_1|$ is smaller than the reference value δ, the speed of the first data writing operation including correction processing can be increased.

<Configuration Example 2 of Arithmetic Circuit>

The semiconductor device of one embodiment of the present invention is not limited to the arithmetic circuit MACA1 illustrated in FIG. 2. The arithmetic circuit MACA1 illustrated in FIG. 2 may be changed in accordance with the circumstances.

Figure 10:
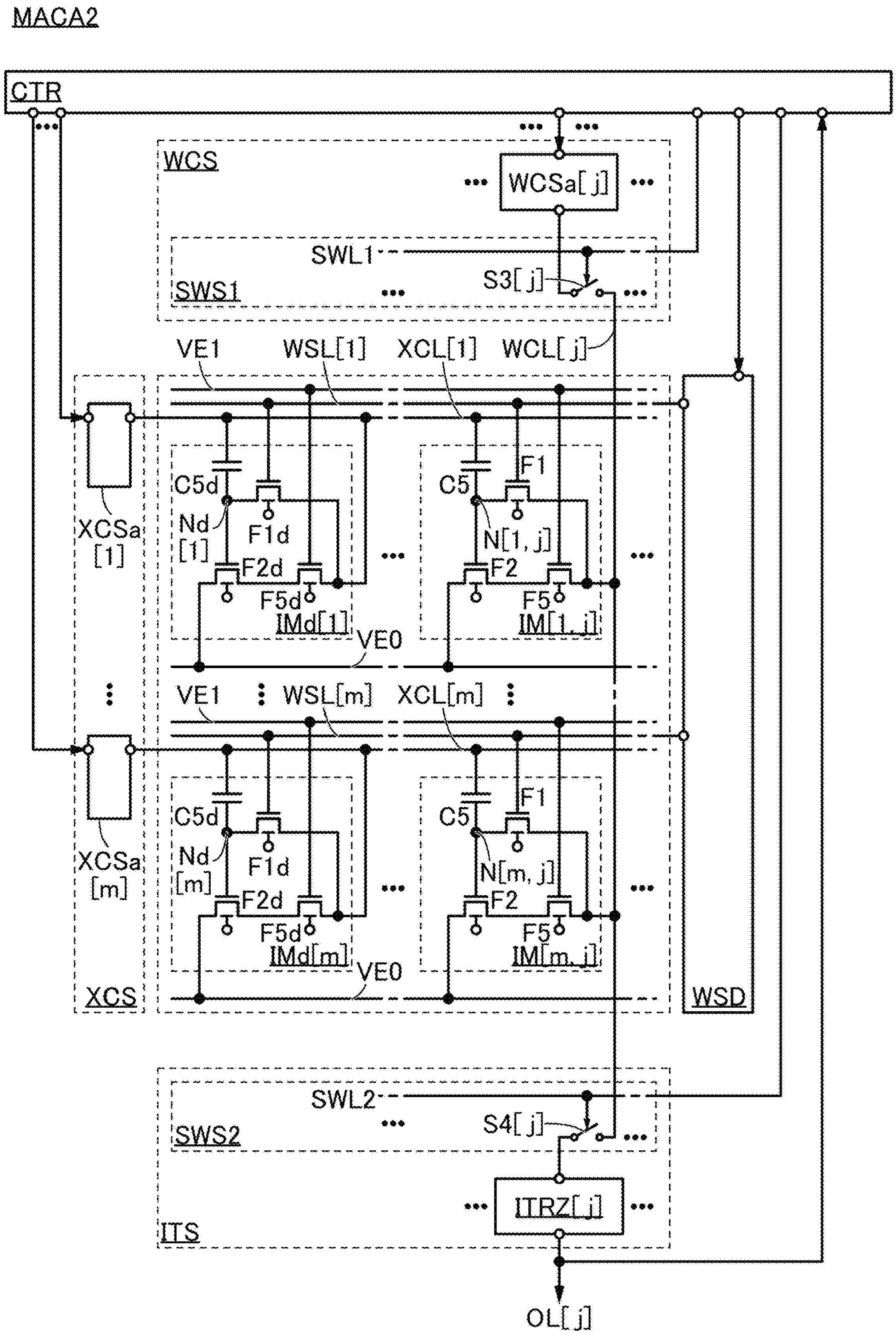
FIG. 10 is a circuit diagram illustrating a configuration example of an arithmetic circuit.

An arithmetic circuit MACA2 illustrated in FIG. 10 is a variation example of the arithmetic circuit MACA1 in FIG. 2 and differs from the arithmetic circuit MACA1 in that the circuit FB is not provided.

In the arithmetic circuit MACA2, the converter circuit ITRZ[j] illustrated in FIG. 5A or FIG. 5B is used as the converter circuit ITRZ[j] included in the circuit ITS.

The arithmetic circuit MACA2 illustrated in FIG. 10 is configured such that a signal output from the converter circuit ITRZ[j] is input to the control circuit CTR.

Example 3 of First Data Writing Operation Including Correction Processing

Next, the description is made on processing in which a potential written to the node N[i,j] of the cell IM[i,j] is corrected in order that the cell IM[i,j] to which the first data has been written in the arithmetic circuit MACA2 in FIG. 10 adequately outputs a current with an amount corresponding to the first data.

Figure 11:
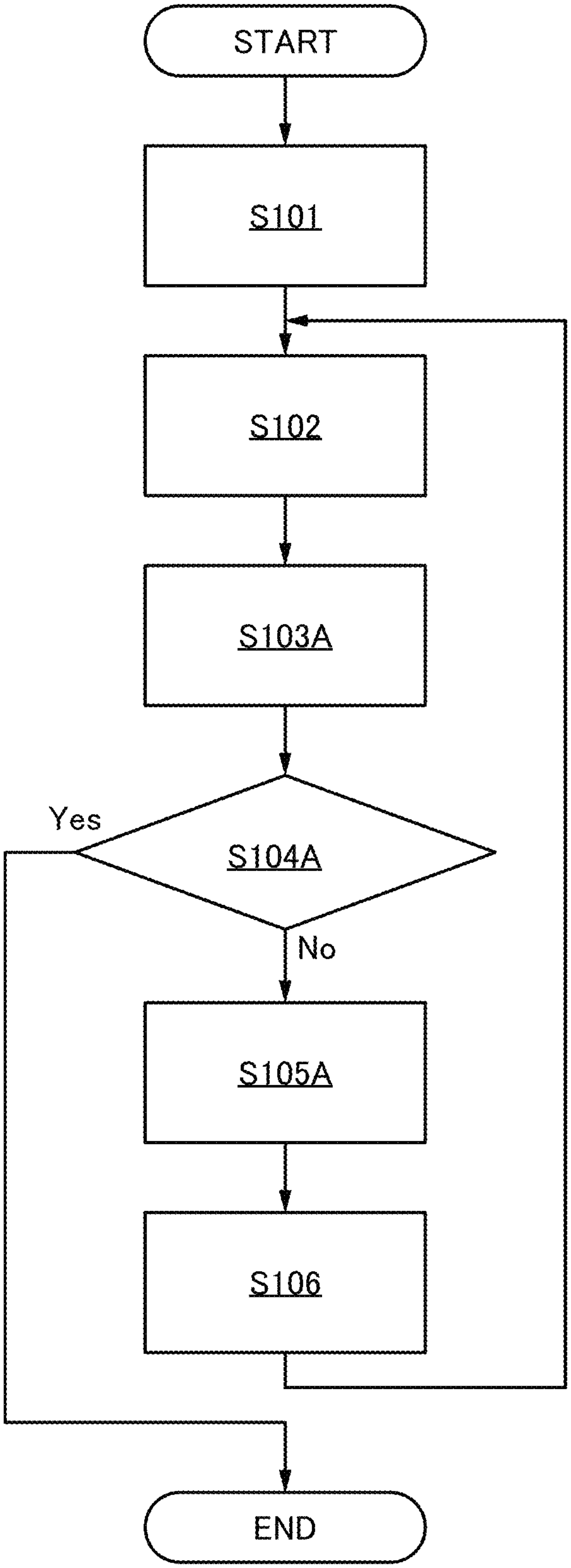
FIG. 11 is a flowchart illustrating an operation example of an arithmetic circuit.

FIG. 11 is a flowchart showing an example of the first data writing operation including correction processing. The writing operation includes Step S101, Step S102, Step S103A, Step S104A, and Step S106.

Note that the flowchart in FIG. 11 is a variation example of the flowchart in FIG. 7, and differs from the flowchart in FIG. 7 in that Step S103A is performed instead of Step S103, Step S104A is performed instead of Step S104, and Step S105A is performed instead of Step S105. In the operation method of the flowchart in FIG. 11, the description of the same portions as those in the operation method of the flowchart in FIG. 7 is omitted in some cases.

[Step S101]

In Step S101 in the flowchart of FIG. 11, the same operation as in Step S101 in the flowchart of FIG. 7 is performed.

[Step S102]

In Step S102 in the flowchart of FIG. 11, the same operation as in Step S102 in the flowchart of FIG. 7 is performed.

[Step S103A]

Step S103A includes, for example, an operation of continuously transmitting the write current with $I_{WR}$ generated in Step S102 to the wiring WCL[j], an operation of outputting a read current corresponding to the first data written to the cell IM[i,j], and an operation in which a difference current between the write current and the read current is input to the converter circuit ITRZ[j] and thus the converter circuit ITRZ[j] outputs a value corresponding to the difference current to the wiring OL[j].

Specifically, for example, a high-level potential is input to the wiring SWL1 to apply the high-level potential to the control terminal of the switch S3[*j*], whereby the switch S3[*j*] is turned on. Furthermore, a high-level potential is input to the wiring SWL2 to apply the high-level potential to the control terminal of the switch S4[*j*], whereby the switch S4[*j*] is turned on.

A low-level potential is continuously input to the wiring WSL[1] to the wiring WSL[m] to maintain the off state of the transistors F1 in the cell IM[i,j] to the cell IM[m,j] positioned in the j-th column.

In and after Step S102, the potential of the wiring XCL[i] is kept at $V_{gm}$, and the potentials of the wiring XCL[1] to the wiring XCL[m] in the rows other than the i-th row are kept at GND. This maintains the off state of the transistors F2 included in the cell IM[1,*j*] to the cell IM[m,j] positioned in the j-th column and the rows other than the i-th row.

In the cell IM[i,j], the potential written in Step S102 is retained at the node N[i,j]. Here, given that a potential supplied from the wiring VE0 is a ground potential, the source-drain current of the transistor F2 in the cell IM[i,j] is determined in accordance with the potential of the gate of the transistor F2. The source-drain current of the transistor F2 flows from the wiring WCL[j] through the cell IM[i,j] as the read current in Step S103A. Here, the amount of source-drain current of the transistor F2 in the cell IM[i,j] (read current) is denoted as $I_{RD}$. Note that when the potential of the node N[i,j] in the cell IM[i,j] is appropriate, the write current amount $I_{WR}$ and the read current amount $I_{RD}$ are equal to each other.

Since the switch S3[*j*] is in an on state, the switch S4[*j*] is in an on state, and the transistors F1 and the transistors F2 in the cell IM[1,*j*] to the cell IM[m,j] positioned in the j-th column and the rows other than the i-th row are in an off state as described above, the total sum of the current with $I_{WR}$ flowing from the circuit WCSa[j] and the current with $I_{RD}$ set in the cell IM[i,j] flows through the wiring WCL[j]; as a result, a difference current ($I_{WR}-I_{RD}$) between $I_{WR}$ and $I_{RD}$ is input to the converter circuit ITRZ[j] of the circuit ITS through the switch S4[*j*].

When the difference current of $I_{WR}-I_{RD}$ is input from the wiring WCL[j] to the converter circuit ITRZ[j] through the switch S4[*j*], the converter circuit ITRZ[j] outputs a potential corresponding to the current amount $I_{WR}-I_{RD}$. The potential is transmitted to the control circuit CTR as a difference value $W_{WR}-W_{RD}$ ($=\Delta W_2$) between the write current amount and the read current amount.

Specifically, the converter circuit ITRZ[j] converts the current amount $I_{WR}-I_{RD}$ into an analog potential by the current-voltage converter circuit (the operational amplifier OP1 and the load LE). Then, the converter circuit ITRZ[j] transmits the analog potential as a signal including the difference value $\Delta W_2$ to the control circuit CTR through the wiring OL[j].

The converter circuit ITRZ[j] may convert the analog potential into a digital signal by the analog-digital converter circuit and transmit the digital signal as a signal including the difference value $\Delta W_2$ to the control circuit CTR through the wiring OL[j].

[Step S104A]

Step S104A includes, for example, an operation in which the control circuit CTR obtains the difference value $\Delta W_2$ and determines whether a potential corresponding to the first data written to the cell IM[i,j] needs to be corrected.

Specifically, Step S104A includes an operation of terminating the writing operation including correction processing in the case where the control circuit CTR determines that the difference value $\Delta W_2$ is 0 (the case where $W_{WR}$ and $W_{RD}$ are equal to each other), and an operation of proceeding to Step S106 in the case where the control circuit CTR determines that the difference value $\Delta W_2$ is not 0 (the case where $W_{WR}$ and $W_{RD}$ are not equal to each other).

The case where $W_{WR}$ and $W_{RD}$ are equal to each other corresponds to the case where the write current amount $I_{WR}$ and the read current amount $I_{RD}$ are equal to each other. That is, in the case where $W_{TRG}$ and $W_{RD}$ are equal to each other, it can be determined that the first data is appropriately written to the cell IM[i,j].

[Step S105A]

Step S105A includes, for example, an operation in which the control circuit CTR generates the corrected first data to be written to the cell IM[i,j] again.

Specifically, Step S105 includes an operation in which the control circuit CTR obtains $\Delta W_2$ from the circuit ITRZ[j] included in the circuit ITS and generates $W_{WR}+\Delta W_2$ (hereinafter referred to as an update value) as the corrected first data.

[Step S106]

Like Step S106 in the flowchart of FIG. 7, Step S106 includes, for example, an operation of inputting a signal corresponding to $W_{WR}+\Delta W_2$ as the update value from the control circuit CTR to the circuit WCSa[j] included in the circuit WCS, and an operation of proceeding to Step S102.

That is, the value of the digital signal input to each of the wiring DW[1] to the wiring DW[K] in the circuit WCSa[j] in FIG. 3 is a value obtained by adding $\Delta W_2$ to the value of $W_{WR}$ previously input to the circuit WCSa[j].

Therefore, after the transition from Step S106 to Step S102, the description can be made by replacing $W_{WR}$ in Step S102 to Step S106 described above with $W_{WR}+\Delta W_2$.

After that, Step S102, Step S103A, Step S104A, and Step S106 are repeated until $W_{TRG}$ and $W_{RD}$ become equal to each other (the difference between the write current and the read current becomes 0) in Step S104A, whereby a potential corresponding to the first data can be appropriately written to the cell IM[i,j].

As described above, in the arithmetic circuit MACA2, variations at the time of writing the first data to the cell IM[i,j] can be inhibited by performing Step S101, Step S102, Step S103A, Step S104A, Step S105, and Step S106.

Although the above-described first data writing operations 1 to 3 including correction processing each show an example in which the first data is written to the cell IM[i,j], these writing operations may be performed row by row in the cell array CA instead of on each cell IM one by one. That is, the first data writing operation including correction processing may be performed successively on each row of the cells IM in the cell array CA in such a manner that the first data writing operation including correction processing is performed collectively on the cell IM[1,1] to the cell IM[1,*n*] positioned in the first row of the cell array CA, and after the writing operation on all of the cell IM[1,1] to the cell IM[1,*n*] is completed, the first data writing operation including correction processing is performed collectively on the cell IM[2,1] to the cell IM[2,*n*] positioned in the second row.

<Operation Example 1 of Arithmetic Circuit>

Next, an operation example of the arithmetic circuit MACA1 in FIG. 2, which is an example of the arithmetic circuit MACA0, is described.

Figure 9:
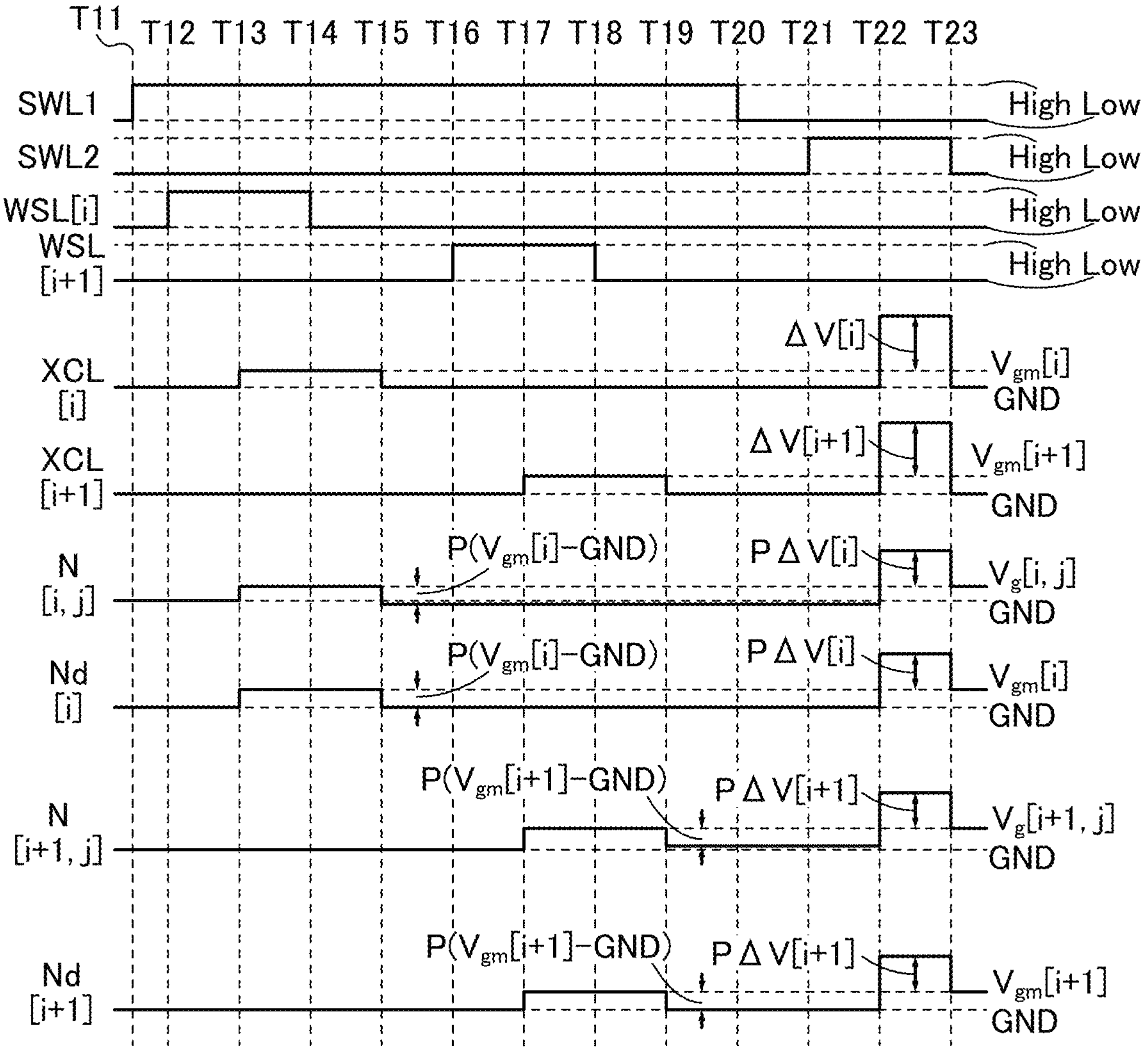
FIG. 9 is a timing chart illustrating an operation example of an arithmetic circuit.

FIG. 9 shows a timing chart of an operation example of the arithmetic circuit MACA0 in FIG. 1. The timing chart in FIG. 9 shows changes in the potentials of the wiring SWL1, the wiring SWL2, the wiring WSL[i] (i is an integer greater than or equal to 1 and less than or equal to m−1), the wiring WSL[i+1], the wiring XCL[i], the wiring XCL[i+1], the node N[i,j] (j is an integer greater than or equal to 1 and less than or equal to n−1), the node N[i+1,j], the node Nd[i], and the node Nd[i+1] in the period from Time T11 to Time T23 and the vicinity thereof. The timing chart in FIG. 9 also shows changes in a current amount $I_{F2}$[i,j] flowing between the first terminal and the second terminal of the transistor F2 included in the cell IM[i,j] and a current amount $I_{F2d}$[i] flowing between the first terminal and the second terminal of the transistor F2*d* included in the cell IMd[i].

The circuit WCS [j] in FIG. 3A is used as the circuit WCS of the arithmetic circuit MACA0, and the circuit XCS[i] in FIG. 3C is used as the circuit XCS of the arithmetic circuit MACA0.

Note that in this operation example, the potential of the wiring VE1 is a ground potential GND. Before Time T11, as an initial setting, the potentials of the node N[i,j], the node N[i+1,j], the node Nd[i], and the node Nd[i+1] are set to the ground potential GND. Specifically, for example, the initialization potential of the wiring VINIL1 in FIG. 3A is set to the ground potential GND, and the switch SWW, the switch S3[*j*], and the transistors F1 included in the cell IM[i,j] and the cell IM[i+1,j] are turned on, whereby the potentials of the node N[i,j] and the node N[i+1,j] can be set to the ground potential GND. For example, the initialization potential of the wiring VINIL2 in FIG. 3C is set to the ground potential GND, and the switch SWX and the transistors F1*d* included in the cell IMd[i] and the cell IMd[i+1] are turned on, whereby the potentials of the node Nd[i] and the node Nd[i+1] can be set to the ground potential GND.

[From Time T11 to Time T12]

In the period from Time T11 to Time T12, a high-level potential (shown as High in FIG. 9) is applied to the wiring SWL1, and a low-level potential (shown as Low in FIG. 9) is applied to the wiring SWL2. Accordingly, a high-level potential is applied to the control terminals of the switch S3[1] to the switch S3[*n*], whereby the switch S3[1] to the switch S3[*n*] are turned on; and a low-level potential is applied to the gates of the switch S4[1] to the switch S4[*n*], whereby the switch S4[1] to the switch S4[*n*] are turned off.

In the period from Time T11 to Time T12, a low-level potential is applied to the wiring WSL[i] and the wiring WSL[i+1]. Accordingly, in the i-th row in the cell array CA, a low-level potential is applied to the gates of the transistors F1 included in the cell IM[i,1] to the cell IM[in] and the gate of the transistor F1*d* included in the cell IMd[i], whereby the transistors F1 and the transistor F1*d* are turned off. In addition, in the (i+1)th row in the cell array CA, a low-level potential is applied to the gates of the transistors F1 included in the cell IM[i+1,1] to the cell IM[i+1,n] and the gate of the transistor F1*d* included in the cell IMd[i+1], whereby the transistors F1 and the transistor F1*d* are turned off.

In the period from Time T11 to Time T12, the ground potential GND is applied to the wiring XCL[i] and the wiring XCL[i+1]. Specifically, for example, in the case where the wiring XCL illustrated in FIG. 3C is the wiring XCL[i] and the wiring XCL[i+1], when the initialization potential of the wiring VINIL2 is set to the ground potential GND and the switch SWX is turned on, the potentials of the wiring XCL[i] and the wiring XCL[i+1] can be set to the ground potential GND.

In the period from Time T11 to Time T12, the first data is not input to the wiring DW[1] to the wiring DW[K] in the circuits WCSa[j] in FIG. 3A, which are electrically connected to the wiring WCL[1] to the wiring WCL[n] through the respective switches S3. In this case, a low-level potential is input to the wiring DW[1] to the wiring DW[K] in the circuit WCSa[j] in FIG. 3A. In the period from Time T11 to Time T12, the second data is not input to the wiring DX[1] to the wiring DX[L] in the circuits XCSa in FIG. 4C, which are electrically connected to the wiring XCL[1] to the wiring XCL[m]. In this case, a low-level potential is input to the wiring DX[1] to the wiring DX[L] in the circuit XCSa[i] in FIG. 4C.

In the period from Time T11 to Time T12, a current does not flow through the wiring WCL[j], the wiring XCL[i], and the wiring XCL[i+1]. Thus, $I_{F2}$[i,j], $I_{F2a}$[i], $I_{F2}$[i+1,j], and $I_{F2d}$[i+1] are each 0.

[From Time T12 to Time T13]

In the period from Time T12 to Time T13, a high-level potential is applied to the wiring WSL[i]. Accordingly, in the i-th row in the cell array CA, a high-level potential is applied to the gates of the transistors F1 included in the cell IM[i,1] to the cell IM[in] and the gate of the transistor F1*d* included in the cell IMd[i], so that the transistors F1 and the transistor F1*d* are turned on. Furthermore, in the period from Time T12 to Time T13, a low-level potential is applied to the wiring WSL[1] to the wiring WSL[m] other than the wiring WSL [i], and the transistors F1 included in the cell IM[1,1] to the cell IM[m,n] in the rows other than the i-th row and the transistors F1*d* included in the cell IMd[1] to the cell IMd[m] in the rows other than the i-th row are in an off state in the cell array CA.

The ground potential GND is continuously applied to the wiring XCL[1] to the wiring XCL[m] since before Time T12.

[From Time T13 to Time T14]

In the period from Time T13 to Time T14, a current with a current amount $I_0$[i,j] flows as the first data from the circuit WCSa[j] to the wiring WCL[j] through the switch S3[*j*]. Specifically, in the case where the wiring WCL illustrated in FIG. 3A is the wiring WCL[j], signals corresponding to the first data are input to the wiring DW[1] to the wiring DW[K], whereby the current $I_0$[i,j] flows from the circuit WCSa[j] to the second terminal of the switch S3[*j*]. That is, when the value of a K-bit signal input as the first data is α[i,j] (α[i,j] is an integer greater than or equal to 0 and less than or equal to $2^K-1$), $I_0$[i,j] is equal to α[i,j]×$I_{Wut}$.

Since $I_0$[i,j] is equal to 0 when α[i,j] is 0, a current does not flow from the circuit WCSa[j] to the cell array CA through the switch S3[*j*] in a strict sense; however, in this specification and the like, an expression such as "a current with $I_0$[i,j]=0 flows" is sometimes used.

In the period from Time T13 to Time T14, electrical continuity is established between the wiring WCL[j] and the first terminal of the transistor F1 included in the cell IM[i,j] in the i-th row of the cell array CA, and electrical continuity is not established between the wiring WCL[j] and the first terminals of the transistors F1 included in the cell IM[1,*j*] to the cell IM[m,j] in the rows other than the i-th row of the cell array CA; thus, a current with the current amount $I_0$[i,j] flows from the wiring WCL[j] to the cell IM[i,j].

When the transistor F1 included in the cell IM[i,j] is turned on, the transistor F2 included in the cell IM[i,j] has a diode-connected structure. Thus, when a current flows from the wiring WCL[j] to the cell IM[i,j], the potentials of the gate of the transistor F2 and the second terminal of the transistor F2 become substantially equal to each other. The potentials are determined by the amount of current flowing from the wiring WCL[j] to the cell IM[i,j], the potential of the first terminal of the transistor F2 (here, GND), and the like. In this operation example, a current with the current amount $I_0$[i,j] flows from the wiring WCL[j] to the cell IM[i,j], whereby the potential of the gate of the transistor F2 (the node N[i,j]) becomes $V_g$[i,j]. That is, the gate-source voltage of the transistor F2 becomes $V_g$[i,j]−GND, and the current amount $I_0$[i,j] is set as a current flowing between the first terminal and the second terminal of the transistor F2.

Here, when the threshold voltage of the transistor F2 is $V_{th}$[i,j], the current amount $I_0$[i,j] in the case where the transistor F2 operates in the subthreshold region can be expressed by the following formula.

[Formula 1]

$$I_0[i,j] = I_a\exp\{J(V_g[i,j] - V_{th}[i,j])\} \tag{1.1}$$

Note that $I_a$ is a drain current for the case where $V_g$[i,j] is $V_{th}$[i,j], and J is a correction coefficient determined by the temperature, the device structure, and the like.

In the period from Time T13 to Time T14, a current with the current amount $I_{ref0}$ flows as the reference data from the circuit XCS to the wiring XCL[i]. Specifically, a high-level potential is input to the wiring DX[1] and a low-level potential is input to the wiring DX[2] to the wiring DX[K], whereby the current $I_{ref0}$ flows from the circuit XCSa[i] to the wiring XCL[i]. In other words, $I_{ref0}$ becomes equal to $I_{Xut}$.

In the period from Time T13 to Time T14, since electrical continuity is established between the first terminal of the transistor F1*d* included in the cell IMd[i] and the wiring XCL[i], a current with the current amount $I_{ref0}$ flows from the wiring XCL[i] to the cell IMd[i].

As in the cell IM[i,j], when the transistor F1*d* included in the cell IMd[i] is turned on, the transistor F2*d* included in the cell IMd[i] has a diode-connected structure. Thus, when a current flows from the wiring XCL[i] to the cell IMd[i], the potentials of the gate of the transistor F2*d* and the second terminal of the transistor F2*d* become substantially equal to each other. The potentials are determined by the amount of current flowing from the wiring XCL[i] to the cell IMd[i], the potential of the first terminal of the transistor F2*d* (here, GND), and the like. In this operation example, a current with the current amount $I_{ref0}$ flows from the wiring XCL[i] to the cell IMd[i], whereby the potential of the gate of the transistor F2 (the node Nd[i]) becomes $V_{gm}$[i]; at this time, the potential of the wiring XCL[i] is also $V_{gm}$[i]. That is, the gate-source voltage of the transistor F2*d* becomes $V_{gm}$[i]−GND, and the current amount $I_{ref0}$ is set as a current flowing between the first terminal and the second terminal of the transistor F2*d*.

Here, when the threshold voltage of the transistor F2*d* is $V_{thm}$[i], the current amount $I_{ref0}$ in the case where the transistor F2*d* operates in the subthreshold region can be expressed by the following formula.

[Formula 2]

$$I_{ref0} = I_a\exp\{J(V_{gm}[i] - V_{thm}[i])\} \tag{1.2}$$

Note that the correction coefficient J is the same as that of the transistor F2 included in the cell IM[i,j]. For example, the same device structure and the same size (channel length and channel width) are employed for the transistors. Although variations in manufacturing cause variations in the correction coefficient J among the transistors, the variations are suppressed to the extent that the argument described later can be made with sufficient precision for practical purposes.

Here, a weight coefficient w[i,j] that is the first data is defined as follows.

[Formula 3]

$$w[i,j] = \exp\{J(V_g[i,j] - V_{th}[i,j] - V_{gm}[i] + V_{thm}[i])\} \tag{1.3}$$

Thus, Formula (1.1) can be rewritten into the following formula with the use of Formula (1.2), Formula (1.3), $I_0$[i,j]=α[i,j]×$I_{Wut}$, and $I_{ref0}$=$I_{Xut}$.

[Formula 4]

$$I_0[i,j] = w[i,j]I_{ref0} \tag{1.4}$$

$$\leftrightarrow \alpha[i,j]I_{Wut} = w[i,j]I_{Xut}$$

When the current $I_{Wut}$ output from the current source CS of the circuit WCSa[i] is equal to the current $I_{Xut}$ output from the current source CS of the circuit XCSa[i], w[i,j] is equal to α[i,j]. That is, when $I_{Wut}$ is equal to $I_{Xut}$, α[i,j] corresponds to the value of the first data; thus, $I_{Wut}$ and $I_{Xut}$ are preferably equal to each other.

[From Time T14 to Time T15]

In the period from Time T14 to Time T15, a low-level potential is applied to the wiring WSL[i]. Accordingly, in the i-th row in the cell array CA, a low-level potential is applied to the gates of the transistors F1 included in the cell IM[i,1] to the cell IM[i,n] and the gate of the transistor F1*d* included in the cell IMd[i], whereby the transistors F1 and the transistor F1*d* are turned off.

When the transistor F1 included in the cell IM[i,j] is turned off, $V_g$[i,j]−$V_{gm}$[i], which is a difference between the potential of the gate of the transistor F2 (the node N[i,j]) and the potential of the wiring XCL[i], is retained in the capacitor C5. When the transistor F1 included in the cell IMd[i] is turned off, 0, which is a difference between the potential of the gate of the transistor F2*d* (the node Nd[i]) and the potential of the wiring XCL[i], is retained in the capacitor C5*d*. In the operation from Time T13 to Time T14, the voltage retained in the capacitor C5*d* might be a voltage that is not 0 (e.g., Vas here) depending on the transistor characteristics of one or both of the transistor F1*d* and the transistor F2*d*. In that case, the potential of the node Nd[i] is regarded as a potential obtained by adding Vas to the potential of the wiring XCL[i].

By performing the operation from Time T12 to Time T15, a potential corresponding to the first data can be written to the cell IM[i,j]. Note that during this period, a potential corresponding to the first data retained in the cell IM[i,j] may be corrected by performing the first data writing operation including the correction processing.

[From Time T15 to Time T16]

In the period from Time T15 to Time T16, GND is applied to the wiring XCL[i]. Specifically, the initialization potential of the wiring VINIL2 is set to the ground potential GND to turn on the switch SWX, whereby the potential of the wiring XCL[i] can be set to the ground potential GND.

Thus, the potentials of the node N[i,1] to the node N[i,n] change because of capacitive coupling of the capacitors C5 included in the cell IM[i,1] to the cell IM[i,n] in the i-th row, and the potential of the node Nd[i] changes because of capacitive coupling of the capacitor C5*d* included in the cell IMd[i].

The amount of change in the potentials of the node N[i,1] to the node N[i,n] is a potential obtained by multiplying the amount of change in the potential of the wiring XCL[i] by a capacitive coupling coefficient determined by the configuration of the cell IM[i,1] to the cell IM[in] included in the cell array CA. The capacitive coupling coefficient is calculated using the capacitance of the capacitor C5, the gate capacitance of the transistor F2, and the parasitic capacitance, for example. When the capacitive coupling coefficient due to the capacitor C5 is P in each of the cell IM[i,1] to the cell IM[in], the potential of the node N[i,j] in the cell IM[i,j] decreases by P($V_{gm}$[i]−GND) from the potential in the period from Time T14 to Time T15.

Similarly, when the potential of the wiring XCL[i] changes, the potential of the node Nd[i] also changes because of capacitive coupling of the capacitor C5*d* included in the cell IMd[i]. In the case where the capacitive coupling coefficient due to the capacitor C5*d* is P as in the case of the capacitor C5, the potential of the node Nd[i] in the cell IMd[i] decreases by P($V_{gm}$[i]−GND) from the potential in the period from Time T14 to Time T15.

In the timing chart in FIG. 9, P is equal to 1 as an example. Thus, the potential of the node Nd[i] is GND in the period from Time T15 to Time T16.

Accordingly, the potential of the node N[i,j] of the cell IM[i,j] decreases, so that the transistor F2 is turned off; similarly, the potential of the node Nd[i] of the cell IMd[i] decreases, so that the transistor F2*d* is also turned off. Hence, $I_{F2}$[i,j] and/$F^{2d}$[i] are each 0 in the period from Time T15 to Time T16.

[From Time T16 to Time T17]

In the period from Time T16 to Time T17, a high-level potential is applied to the wiring WSL[i+1]. Accordingly, in the (i+1)th row in the cell array CA, a high-level potential is applied to the gates of the transistors F1 included in the cell IM[i+1,1] to the cell IM[i+1,n] and the gate of the transistor F1*d* included in the cell IMd[i+1], whereby the transistors F1 and the transistor F1*d* are turned on. Furthermore, in the period from Time T16 to Time T17, a low-level potential is applied to the wiring WSL[1] to the wiring WSL[m] other than the wiring WSL[i+1], and the transistors F1 included in the cell IM[1,1] to the cell IM[m,n] in the rows other than the (i+1)th row and the transistors F1*d* included in the cell IMd[1] to the cell IMd[m] in the rows other than the (i+1)th row are in an off state in the cell array CA.

The ground potential GND is continuously applied to the wiring XCL[1] to the wiring XCL[m] since before Time T16.

[From Time T17 to Time T18]

In the period from Time T17 to Time T18, a current with a current amount $I_0$[i+1,j] flows as the first data from the circuit WCS to the cell array CA through the switch S3[*j*]. Specifically, signals corresponding to the first data are input to the wiring DW[1] to the wiring DW[K] in the circuit WCSa[j] illustrated in FIG. 3A, whereby a current with the current amount $I_0$[i+1,j] flows from the wiring WCSa[j] to the second terminal of the switch S3[*j*]. That is, when the value of the K-bit signal input as the first data is α[i+1,j] (α[i+1,j] is an integer greater than or equal to 0 and less than or equal to $2^K$−1), $I_0$[i+1,j] is equal to α[i+1,j]×$I_{Wut}$.

Since $I_0$[i+1,j] is 0 when α[i+1,j] is 0, a current does not flow from the circuit WCSa to the cell array CA through the switch S3[*j*] in a strict sense; however, in this specification and the like, an expression such as "a current with $I_0$[i+1, j]=0 flows" is sometimes used, as in the case of $I_0$[i,j]=0.

At this time, electrical continuity is established between the wiring WCL[j] and the first terminal of the transistor F1 included in the cell IM[i+1,j] in the (i+1)th row of the cell array CA, and electrical continuity is not established between the wiring WCL[j] and the first terminals of the transistors F1 included in the cell IM[1,*j*] to the cell IM[m,j] in the rows other than the (i+1)th row of the cell array CA; accordingly, a current with the current amount $I_0$[i+1,j] flows from the wiring WCL[j] to the cell IM[i+1,j].

When the transistor F1 included in the cell IM[i+1,j] is turned on, the transistor F2 included in the cell IM[i+1,j] has a diode-connected structure. Thus, when a current flows from the wiring WCL[j] to the cell IM[i+1,j], the potentials of the gate of the transistor F2 and the second terminal of the transistor F2 become substantially equal to each other. The potentials are determined by the amount of current flowing from the wiring WCL[j] to the cell IM[i+1,j], the potential of the first terminal of the transistor F2 (here, GND), and the like. In this operation example, a current with the current amount $I_0$[i+1,j] flows from the wiring WCL[j] to the cell IM[i+1,j], whereby the potential of the gate of the transistor F2 (the node N[i+1,j]) becomes $V_g$[i+1,j]. That is, the gate-source voltage of the transistor F2 becomes $V_g$[i+1,j]−GND, and the current amount $I_0$[i+1,j] is set as a current flowing between the first terminal and the second terminal of the transistor F2.

Here, when the threshold voltage of the transistor F2 is $V_{th}$[i+1,j], the current amount $I_0$[i+1,j] in the case where the transistor F2 operates in the subthreshold region can be expressed by the following formula.

[Formula 5]

$$I_0[i+1,j] = I_a\exp\{J(V_g[i+1,j] - V_{th}[i+1,j])\} \quad (1.5)$$

Note that the correction coefficient is J, which is the same as those of the transistor F2 included in the cell IM[i,j] and the transistor F2*d* included in the cell IMd[i].

In the period from Time T17 to Time T18, a current with the current amount $I_{ref0}$ flows as the reference data from the circuit XCS[i+1] to the wiring XCL[i+1]. Specifically, as in the period from Time T13 to Time T14, when the circuit XCS[i] illustrated in FIG. 3C is the circuit XCS[i+1], a high-level potential is input to the wiring DX[1] and a low-level potential is input to the wiring DX[2] to the wiring DX[K], whereby the current $I_{ref0}=I_{Xut}$ flows from the circuit XCSa[i+1] to the wiring XCL[i+1].

In the period from Time T17 to Time T18, since electrical continuity is established between the first terminal of the transistor F1*d* included in the cell IMd[i+1] and the wiring XCL[i+1], a current with the current amount $I_{ref0}$ flows from the wiring XCL[i+1] to the cell IMd[i+1].

As in the cell IM[i+1,j], when the transistor F1*d* included in the cell IMd[i+1] is turned on, the transistor F2*d* included in the cell IMd[i+1,j] has a diode-connected structure. Thus, when a current flows from the wiring XCL[i+1] to the cell IMd[i+1], the potentials of the gate of the transistor F2*d* and the second terminal of the transistor F2*d* become substantially equal to each other. The potentials are determined by the amount of current flowing from the wiring XCL[i+1] to the cell IMd[i+1], the potential of the first terminal of the transistor F2*d* (here, GND), and the like. In this operation example, a current with the current amount $I_{ref0}$ flows from the wiring XCL[i+1] to the cell IMd[i+1], whereby the potential of the gate of the transistor F2*d* (the node Nd[i+1]) becomes $V_{gm}$[i+1]; at this time, the potential of the wiring XCL[i+1] is also $V_{gm}$[i+1]. That is, the gate-source voltage of the transistor F2*d* becomes $V_{gm}$[i+1]−GND, and the current amount $I_{ref0}$ is set as a current flowing between the first terminal and the second terminal of the transistor F2*d*.

Here, when the threshold voltage of the transistor F2*d* is $V_{thm}$[i+1,j], the current amount $I_{ref0}$ in the case where the transistor F2*d* operates in the subthreshold region can be expressed by the following formula.

[Formula 6]

$$I_{ref0} = I_a\exp\{J(V_{gm}[i+1] - V_{thm}[i+1])\} \quad (1.6)$$

Note that the correction coefficient J is the same as that of the transistor F2 included in the cell IM[i+1,j].

Here, a weight coefficient w[i+1,j] that is the first data is defined as follows.

[Formula 7]

$$w[i+1,j] = \exp\{J(V_g[i+1,j] - V_{th}[i+1,j] - V_{gm}[i+1] + V_{thm}[i+1])\} \quad (1.7)$$

Thus, Formula (1.5) can be rewritten into the following formula with the use of Formula (1.6), Formula (1.7), $I_0$[i+1,j]=α[i+1,j]×$I_{Wut}$, and $I_{ref0}=I_{Xut}$.

[Formula 8]

$$I_0[i+1,j] = w[i+1,j]I_{ref0} \quad (1.8)$$

$$\leftrightarrow \alpha[i+1,j]I_{Wut} = w[i+1,j]I_{Xut}$$

When the current $I_{Wut}$ output from the current source CS of the circuit WCSa[j] is equal to the current $I_{Xut}$ output from the current source CS of the circuit XCSa[i+1], w[i+1,j] is equal to [i+1,j]. That is, when $I_{Wut}$ is equal to $I_{Xut}$, α[i+1,j] corresponds to the value of the first data; accordingly, $I_{Wut}$ and $I_{Xut}$ are preferably equal to each other.

[From Time T18 to Time T19]

In the period from Time T18 to Time T19, a low-level potential is applied to the wiring WSL[i+1]. Accordingly, in the (i+1)th row in the cell array CA, a low-level potential is applied to the gates of the transistors F1 included in the cell IM[i+1,1] to the cell IM[i+1,n] and the gate of the transistor F1*d* included in the cell IMd[i+1], whereby the transistors F1 and the transistor F1*d* are turned off.

When the transistor F1 included in the cell IM[i+1,j] is turned off, $V_g$[i+1,j]−$V_{gm}$[i+1], which is a difference between the potential of the gate of the transistor F2 (the node N[i+1,j]) and the potential of the wiring XCL[i+1], is retained in the capacitor C5. When the transistor F1 included in the cell IMd[i+1] is turned off, 0, which is a difference between the potential of the gate of the transistor F2*d* (the node Nd[i+1]) and the potential of the wiring XCL[i+1], is retained in the capacitor C5*d*. In the operation from Time T18 to Time T19, the voltage retained in the capacitor C5*d* might be a voltage that is not 0 (e.g., Vas here) depending on the transistor characteristics of one or both of the transistor F1*d* and the transistor F2*d*. In that case, the potential of the node Nd[i+1] is regarded as a potential obtained by adding Vas to the potential of the wiring XCL[i+1].

[From Time T19 to Time T20]

In the period from Time T19 to Time T20, the ground potential GND is applied to the wiring XCL[i+1]. Specifically, for example, in the case where the circuit XCSa[i] illustrated in FIG. 3A is the circuit XCSa[i+1], the potential of the wiring XCL[i+1] can be set to the ground potential GND by setting the initialization potential of the wiring VINIL2 to the ground potential GND and turning on the switch SWX.

Thus, the potentials of the node N[i,1] to the node N[i+1,n] change because of capacitive coupling of the capacitors C5 included in the cell IM[i+1,1] to the cell IM[i+1,n] in the (i+1)th row, and the potential of the node Nd[i+1] changes because of capacitive coupling of the capacitor C5*d* included in the cell IMd[i+1].

The amount of change in the potentials of the node N[i+1,1] to the node N[i+1,n] is a potential obtained by multiplying the amount of change in the potential of the wiring XCL[i+1] by a capacitive coupling coefficient determined by the configuration of the cell IM[i+1,1] to the cell IM[i+1,n] included in the cell array CA. The capacitive coupling coefficient is calculated using the capacitance of the capacitor C5, the gate capacitance of the transistor F2, the parasitic capacitance, and the like. In the case where the capacitive coupling coefficient due to the capacitor C5 in each of the cell IM[i+1,1] to the cell IM[i+1,n] is P, which is the same as the capacitive coupling coefficient due to the capacitor C5 in each of the cell IM[i,1] to the cell IM[i,n], the potential of the node N[i+1,j] in the cell IM[i+1,j] decreases by $P(V_{gm}[i+1]-GND)$ from the potential in the period from Time T18 to Time T19.

Similarly, when the potential of the wiring XCL[i+1] changes, the potential of the node Nd[i+1] also changes because of capacitive coupling of the capacitor C5*d* included in the cell IMd[i+1]. In the case where the capacitive coupling coefficient due to the capacitor C5*d* is P as in the case of the capacitor C5, the potential of the node Nd[i+1] in the cell IMd[i+1] decreases by $P(V_{gm}[i+1]-GND)$ from the potential in the period from Time T18 to Time T19.

In the timing chart in FIG. 9, P is equal to 1 as an example. Thus, the potential of the node Nd[i+1] is GND in the period from Time T20 to Time T21.

Accordingly, the potential of the node N[i+1,j] of the cell IM[i+1,j] decreases, so that the transistor F2 is turned off; similarly, the potential of the node Nd[i+1] of the cell IMd[i+1] decreases, so that the transistor F2*d* is also turned off. Hence, $I_{F2}[i+1,j]$ and $I_{F2d}[i+1]$ are each 0 in the period from Time T19 to Time T20.

By performing the operation from Time T16 to Time T20, a potential corresponding to the first data can be written to the cell IM[i+1,j]. Note that during this period, a potential corresponding to the first data retained in the cell IM[i+1,j] may be corrected by performing the first data writing operation including the correction processing.

[From Time T20 to Time T21]

In the period from Time T20 to Time T21, a low-level potential is applied to the wiring SWL1. Accordingly, a low-level potential is applied to the control terminals of the switch S3[1] to the switch S3[*n*], whereby the switch S3[1] to the switch S3[*n*] are turned off.

[From Time T21 to Time T22]

In the period from Time T21 to Time T22, a high-level potential is applied to the wiring SWL2. Accordingly, a high-level potential is applied to the control terminals of the switch S4[1] to the switch S4[*n*], whereby the switch S4[1] to the switch S4[*n*] are turned on.

[From Time T22 to Time T23]

In the period from Time T22 to Time T23, a current $x[i]I_{ref0}$, which is x[i] times the current amount $I_{ref0}$, flows as the second data from the circuit XCS to the wiring XCL[i]. Specifically, for example, in the circuit XCSa[i] illustrated in FIG. 3C, a high-level potential or a low-level potential is input to the wiring DX[1] to the wiring DX[K] in accordance with the value of x[i], and a current amount $x[i]I_{ref0}=x[i]I_{Xut}$ flows from the circuit XCSa to the wiring XCL[i]. In this operation example, x[i] corresponds to the value of the second data. At this time, the potential of the wiring XCL[i] changes from 0 to $V_{gm}[i]+\Delta V[i]$.

When the potential of the wiring XCL[i] changes, the potentials of the node N[i,1] to the node N[i,n] also change because of the capacitive coupling of the capacitors C5 included in the cell IM[i,1] to the cell IM[in] in the i-th row in the cell array CA. Thus, the potential of the node N[i,j] in the cell IM[i,j] becomes $V_g[i,j]+P\Delta V[i]$.

Similarly, when the potential of the wiring XCL[i] changes, the potential of the node Nd[i] also changes because of capacitive coupling of the capacitor C5*d* included in the cell IMd[i]. Thus, the potential of the node Nd[i] in the cell IMd[i] becomes $V_{gm}[i]+P\Delta V[i]$.

Accordingly, a current amount $I_1[i,j]$ that flows between the first terminal and the second terminal of the transistor F2 and a current amount $I_{ref1}[i,j]$ that flows between the first terminal and the second terminal of the transistor F2*d* in the period from Time T22 to Time T23 can be expressed as follows.

[Formula 9]

$$\begin{aligned} I_1[i,j] &= I_a\exp\{J(V_g[i,j]+P\Delta V[i]-V_{th}[i,j])\} \\ &= I_0[i,j]\exp(JP\Delta V[i]) \end{aligned} \tag{1.9}$$

[Formula 10]

$$\begin{aligned} I_{ref1}[i] &= I_a\exp\{J(V_{gm}[i]+P\Delta V[i]-V_{thm}[i])\} \\ &= x[i]I_{ref0} \end{aligned} \tag{1.10}$$

Note that x[i] is as expressed by the following formula.

[Formula 11]

$$x[i]=\exp(JP\Delta V[i]) \tag{1.11}$$

Therefore, Formula (1.9) can be rewritten into the following formula with the use of Formula (1.4) and Formula (1.11).

[Formula 12]

$$I_1[i,j]=x[i]w[i,j]I_{ref0} \tag{1.12}$$

That is, the amount of current flowing between the first terminal and the second terminal of the transistor F2 included in the cell IM[i,j] is proportional to the product of the first data w[i,j] and the second data x[i].

In the period from Time T22 to Time T23, a current $x[i+1]I_{ref0}$, which is x[i+1] times the current amount $I_{ref0}$, flows as the second data from the circuit XCS to the wiring XCL[i+1]. Specifically, for example, in the case where the circuit XCSa[i] illustrated in FIG. 3C is the circuit XCSa [i+1], a high-level potential or a low-level potential is input to the wiring DX[1] to the wiring DX[K] in accordance with the value of x[i+1], and a current amount $x[i+1]\ I_{ref0}=x[i+1]I_{Xut}$ flows from the circuit XCSa[i+1] to the wiring XCL [i+1]. In this operation example, x[i+1] corresponds to the value of the second data. At this time, the potential of the wiring XCL[i+1] changes from 0 to $V_{gm}[i+1]+\Delta V[i+1]$.

When the potential of the wiring XCL[i+1] changes, the potentials of the node N[i+1,1] to the node N[i+1,n] also change because of the capacitive coupling of the capacitors C5 included in the cell IM[i+1,1] to the cell IM[i+1,n] in the (i+1)th row of the cell array CA. Thus, the potential of the node N[i+1,j] in the cell IM[i+1,j] becomes $V_g[i+1,j]+P\Delta V[i+1]$.

Similarly, when the potential of the wiring XCL[i+1] changes, the potential of the node Nd[i+1] also changes because of capacitive coupling of the capacitor C5*d* included in the cell IMd[i+1]. Thus, the potential of the node Nd[i+1] in the cell IMd[i+1] becomes $V_{gm}[i+1]+P\Delta V[i+1]$.

Accordingly, a current amount $I_1[i+1,j]$ that flows between the first terminal and the second terminal of the transistor F2 and a current amount $I_{ref1}[i+1,j]$ that flows between the first terminal and the second terminal of the transistor F2*d* in the period from Time T22 to Time T23 can be expressed as follows.

[Formula 13]

$$I_1[i+1,j] = I_a\exp\{J(V_g[i+1,j] + P\Delta V[i+1] - V_{th}[i+1,j])\} = I_0[i+1,j]\exp(JP\Delta V[i+1]) \quad (1.13)$$

[Formula 14]

$$I_{ref1}[i+1] = I_a\exp\{J(V_{gm}[i+1] + P\Delta V[i+1] - V_{thm}[i+1])\} = x[i+1]I_{ref0} \quad (1.14)$$

Note that x[i+1] is as expressed by the following formula.

[Formula 15]

$$x[i+1] = \exp(JP\Delta V[i+1]) \quad (1.15)$$

Therefore, Formula (1.13) can be rewritten into the following formula with the use of Formula (1.8) and Formula (1.15).

[Formula 16]

$$I_1[i+1,j] = x[i+1]w[i+1,j]I_{ref0} \quad (1.16)$$

That is, the amount of current flowing between the first terminal and the second terminal of the transistor F2 included in the cell IM[i+1,j] is proportional to the product of the first data w[i+1,j] and the second data x[i+1].

Here, the sum of the amounts of current flowing from the converter circuit ITRZ[j] to the cell IM[i,j] and the cell IM[i+1,j] through the switch S4[*j*] and the wiring WCL[j] is considered. When the sum of the amounts of current is $I_S$[j], $I_S$[j] can be expressed by the following formula according to Formula (1.12) and Formula (1.16).

[Formula 17]

$$I_S[j] = I_1[i,j] + I_1[i+1,j] = I_{ref0}(x[i]w[i,j] + x[i+1]w[i+1,j]) \quad (1.17)$$

Thus, the amount of current output from the converter circuit ITRZ[j] is the amount of current proportional to the sum of products of the weight coefficients w[i,j] and w[i+1,j], which are the first data, and the values x[i] and x[i+1] of neuron signals that are the second data.

Although the sum of the amounts of current flowing to the cell IM[i,j] and the cell IM[i+1,j] is described in the above-described operation example, the sum of the amounts of current flowing to a plurality of cells, the cell IM[1,*j*] to the cell IM[m,j], may also be dealt with. In this case, Formula (1.17) can be rewritten into the following formula.

[Formula 18]

$$I_S[j] = I_{ref0}\sum_{i=1}^{m} x[i]w[i,j] \quad (1.18)$$

Thus, even in the case of the arithmetic circuit MACA1 including the cell array CA with three or more rows and a plurality of columns, product-sum operation can be performed in the above-described manner. In the arithmetic circuit MACA1 of such a case, cells in one of the plurality of columns are used to retain $I_{ref0}$ and $xI_{ref0}$ as the amount of current; hence, product-sum operations, the number of which corresponds to the number of the rest of the columns among the plurality of columns, can be executed concurrently. That is, when the number of columns in a memory cell array increases, a semiconductor device that achieves high-speed product-sum operation can be provided.

Note that the arithmetic circuit MACA0, the arithmetic circuit MACA1, and the arithmetic circuit MACA2 described in this embodiment are configured such that the first data is retained in the cell IM in order to perform product-sum operation. Thus, the arithmetic circuit MACA0, the arithmetic circuit MACA1, and the arithmetic circuit MACA2 may each be treated as a memory device. To read the first data from the cell IM[i,j] in the arithmetic circuit MACA0, the arithmetic circuit MACA1, or the arithmetic circuit MACA2, a current corresponding to "1" flows from the circuit XCS to the wiring XCL[i] as the value of the second data and a current corresponding to "0" flows from the circuit XCS to the wiring XCL[1] to the wiring XCL[m] in the rows other than the i-th row, for example; thus, the first data retained in the cell IM[i,j] can be read. At this time, the converter circuit ITRZ[j] included in the circuit ITS is treated as a reading circuit that converts the current amount into an analog potential or a digital signal.

From the above, the arithmetic circuit MACA0, the arithmetic circuit MACA1, and the arithmetic circuit MACA2 described in this embodiment may each be referred to as a memory device in another embodiment.

Note that this embodiment can be combined with any of the other embodiments in this specification as appropriate.

Embodiment 2

In Embodiment 1, the arithmetic circuit that performs product-sum operation of positive or "0" first data and positive or "0" second data is described. In this embodiment, an arithmetic circuit that performs product-sum operation of positive, negative, or "0" first data and positive or "0" second data will be described.

Configuration Example 1 of Arithmetic Circuit

Figure 12:
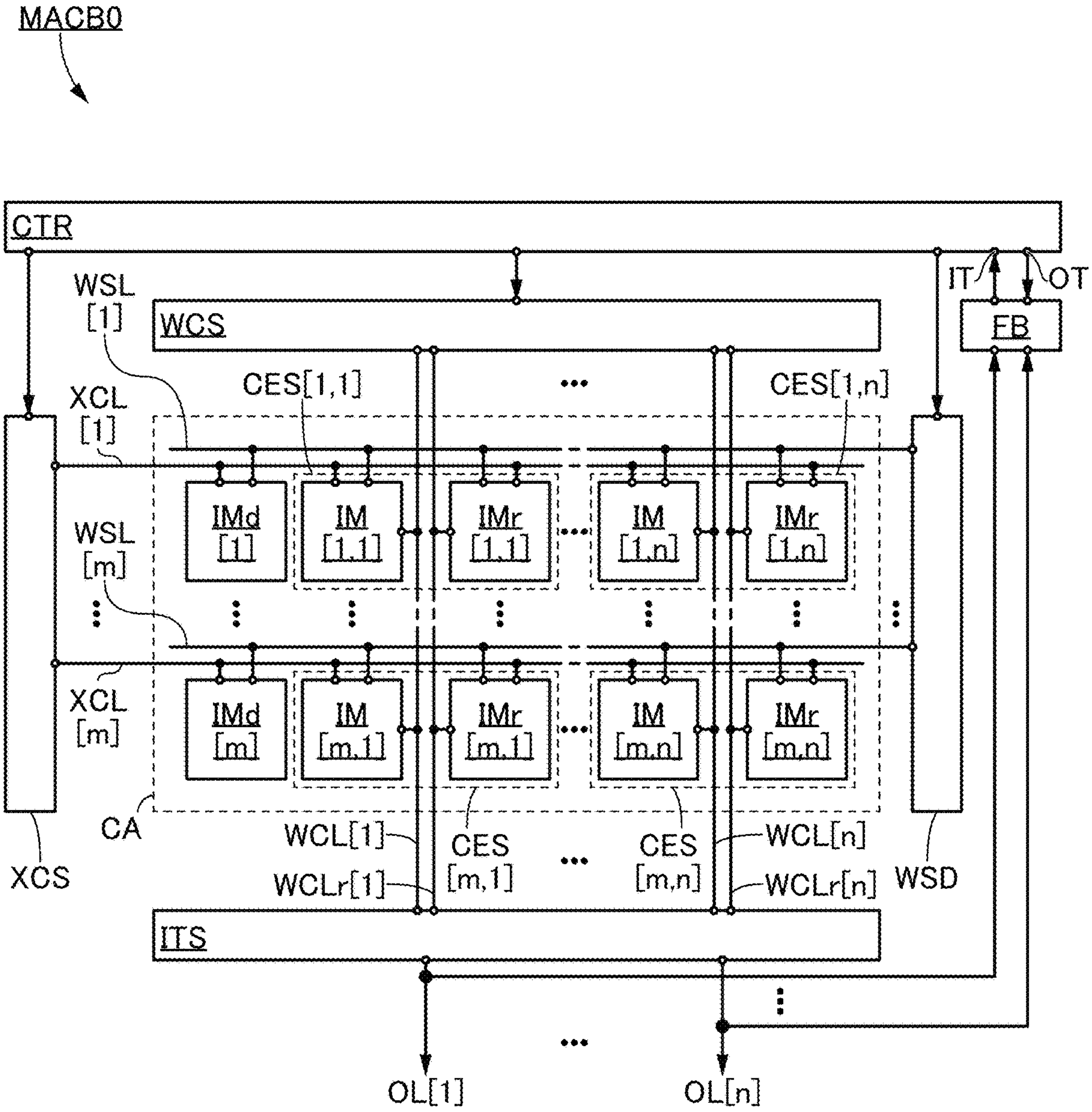
FIG. 12 is a block diagram illustrating a configuration example of an arithmetic circuit.

FIG. 12 illustrates a configuration example of an arithmetic circuit that performs product-sum operation of positive, negative, or "0" first data and positive or "0" second data. An arithmetic circuit MACB0 illustrated in FIG. 12 is a circuit that performs product-sum operation of a plurality of pieces of first data corresponding to potentials retained in cells and a plurality of pieces of input second data, and performs arithmetic operation of a function with the use of the product-sum operation result. The function can be, for example, an activation function in the case where arithmetic operation in a neural network is performed. Note that the first data and the second data can be, for example, analog data (e.g., a continuous analog potential) or multilevel data (a discrete analog potential or a digital signal).

The arithmetic circuit MACB0 includes the control circuit CTR, the circuit WCS, the circuit XCS, the circuit WSD, the circuit ITS, the circuit FB, and the cell array CA.

The cell array CA includes the cell IM[1,1] to the cell IM[m,n] (m is an integer greater than or equal to 1 and n is an integer greater than or equal to 1), a cell IMr[1,1] to a cell IMr[m,n], and the cell IMd[1] to the cell IMd[m]. Note that FIG. 12 selectively illustrates the cell IM[1,1], the cell IM[m,1], the cell IM[1,n], the cell IM[m,n], the cell IMr[1,1], the cell IMr[m,1], the cell IMr[1,n], the cell IMr[m,n], the cell IMd[1], and the cell IMd[m] among the cell IM[1,1] to the cell IM[m,n], the cell IMr[1,1] to the cell IMr[m,n], and the cell IMd[1] to the cell IMd[m].

In FIG. 12, the cell IM and the cell IMr positioned at the same address are collectively denoted as a circuit CES. In the arithmetic circuit MACB0, the circuit CES has a function of retaining the first data with a pair of the cell IM and the cell IMr positioned at the same address. Specifically, the cell IM[1,1] to the cell IM[m,n] and the cell IMr[1,1] to the cell IMr[m,n] each have a function of retaining a potential corresponding to the current amount corresponding to the first data, for example.

In the cell array CA in FIG. 12, the cells are arranged in a matrix of m rows and 2xn+1 columns; the cell array CA can have any configuration in which cells are arranged in a matrix of one or more rows and three or more columns.

<<Configuration Examples of Cell IM, Cell IMr, and Cell IMd>>

Figure 13:
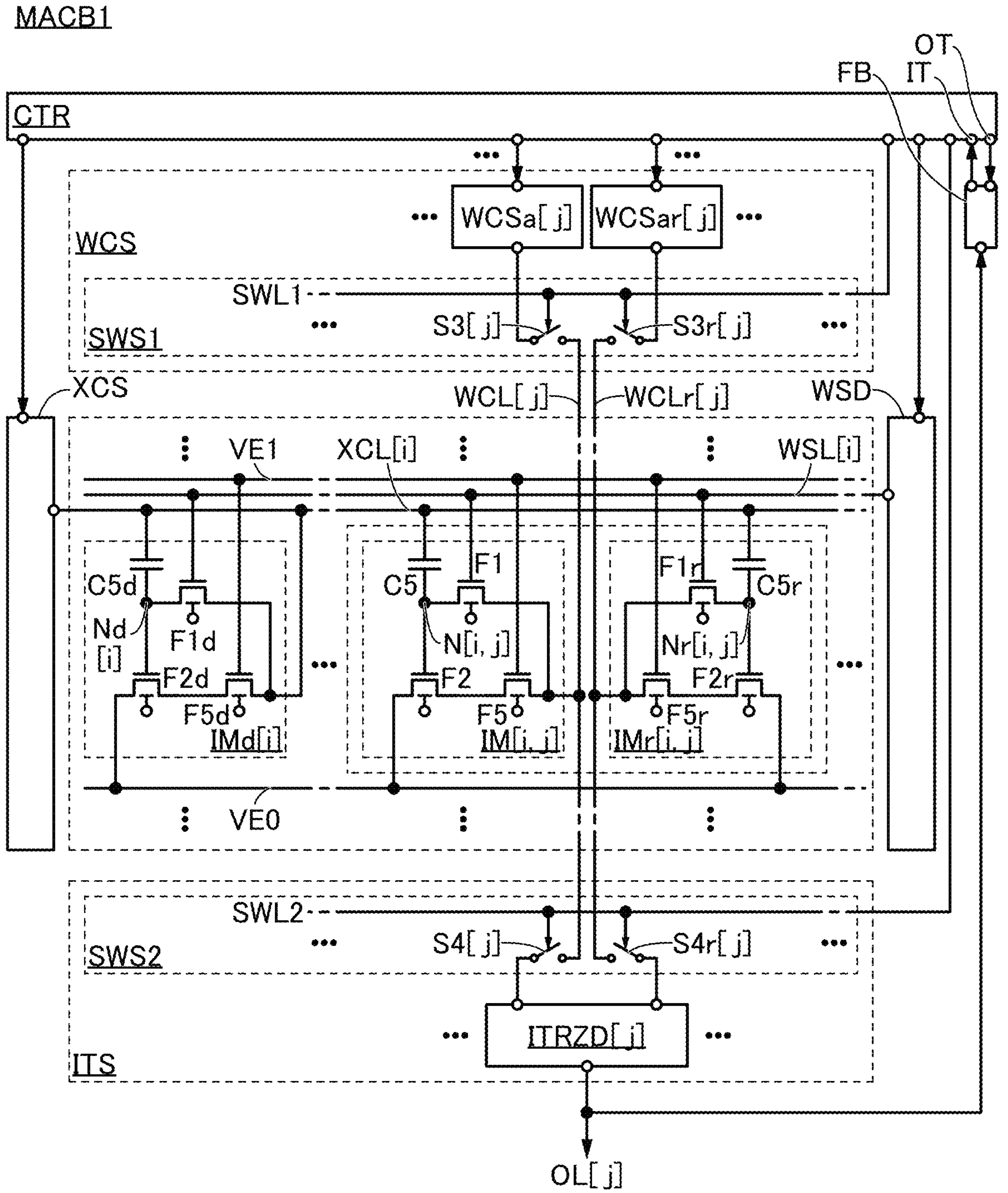
FIG. 13 is a circuit diagram illustrating a configuration example of an arithmetic circuit.

An arithmetic circuit MACB1 illustrated in FIG. 13 shows a configuration example of the arithmetic circuit MACB0 illustrated in FIG. 12, and FIG. 13 illustrates circuit configuration examples of the cell IM, the cell IMr, and the cell IMd.

As illustrated in FIG. 13, the cell IM[1,1] to the cell IM[m,n] and the cell IMd[1] to the cell IMd[m] have the same configurations as the cell IM[1,1] to the cell IM[m,n] and the cell IMd[1] to the cell IMd[m] of the arithmetic circuit MACA1 illustrated in FIG. 2. Therefore, the description of the cell IM[1,1] to the cell IM[m,n] and the cell IMd[1] to the cell IMd[m] described in Embodiment 1 is referred to for the cell IM[1,1] to the cell IM[m,n] and the cell IMd[1] to the cell IMd[m] in the arithmetic circuit MACB0 in FIG. 13.

The cell IMr[i,j] (i is an integer greater than or equal to 1 and less than or equal to m, and jis an integer greater than or equal to 1 and less than or equal to n) can have the same configuration as the cell IM[i,j]. As an example, FIG. 13 shows that the cell IMr[i,j] has the same configuration as the cell IM[i,j]. To distinguish the transistors, the capacitors, and the like included in the cell IM[i,j] and the cell IMr[i,j], "r" is added to the reference numerals representing the transistors and the capacitors included in the cell IMr[i,j].

Since the cell IMr[i,j] can have the same configuration as the cell IM[i,j], the transistor that can be used as the transistor F1 can be used as a transistor F1r. As a transistor F2r, the transistor that can be used as the transistor F2 can be used. As a transistor F5r, the transistor that can be used as the transistor F5 can be used.

Since the cell IMr[i,j] can have the same configuration as the cell IM[i,j], the size of the transistor F1r included in the cell IMr[i,j] is preferably equal to the size of the transistor F1 included in the cell IM[i,j]. The size of the transistor F2r included in the cell IMr[i,j] is preferably equal to the size of the transistor F2 included in the cell IM[i,j]. The size of the transistor F5r included in the cell IMr[i,j] is preferably equal to the size of the transistor F5 included in the cell IM[i,j].

Unless otherwise specified, the transistor F1r in the on state may operate in a linear region in the end, like the transistor F1 and the transistor F1d. In other words, the gate voltage, the source voltage, and the drain voltage of each of the above transistors may be appropriately biased to voltages in the range where the transistor operates in the linear region. However, one embodiment of the present invention is not limited thereto. For example, the transistor Fr1 in the on state may operate in a saturation region or may operate both in a linear region and a saturation region.

Unless otherwise specified, the transistor F2r may operate in a subthreshold region (i.e., the gate-source voltage may be lower than the threshold voltage in the transistor F2r, further preferably, the drain current may increase exponentially with respect to the gate-source voltage in the transistor F2r), like the transistor F2 and the transistor F2d. In other words, the gate voltage, the source voltage, and the drain voltage of each of the above transistors may be appropriately biased to voltages in the range where the transistor operates in the subthreshold region. Thus, the transistor F2r may operate such that the off-state current flows between a source and a drain.

Like the transistor F5 and the transistor F5d, the transistor F5r functions as a clamp transistor, for example. Thus, a constant voltage is preferably applied to a gate of the transistor F5r. In that case, drain-induced barrier lowering (DIBL) in the transistor F2r can be prevented.

In the cell IMr[i,j], a first terminal of the transistor F1r is electrically connected to a gate of the transistor F2r. A first terminal of the transistor F2r is electrically connected to the wiring VE0. A first terminal of the capacitor C5r is electrically connected to the gate of the transistor F2r. A second terminal of the transistor F2r is electrically connected to a first terminal of the transistor F5r. A second terminal of the transistor F5r is electrically connected to a second terminal of the transistor F1r, and the gate of the transistor F5r is electrically connected to the wiring VE1.

The wiring VE0 functions as a wiring for making a current flow between the first terminal and the second terminal of the transistor F2r in the cell IMr[i,j] in addition to between the first terminal and the second terminal of the transistor F2 in the cell IM[i,j] and between the first terminal and the second terminal of the transistor F2d in the cell IMd[i,j]. The wiring VE0 functions as a wiring for supplying a constant voltage, for example. The constant voltage can be, for example, a low-level potential, a ground potential, or the like.

The wiring VE1 functions as a wiring for applying a potential to the gate of the transistor F5 in the cell IM[i,j], the gate of the transistor F5r in the cell IMr[i,j], and the gate of the transistor F5d in the cell IMd[i]. Note that the potential is preferably a potential within a range where the transistor F5, the transistor F5r, and the transistor F5d function as clamp transistors.

In the cell IMr[i,j], the second terminal of the transistor F1r and the second terminal of the transistor F5r are electrically connected to a wiring WCLr[j], and the gate of the transistor F1r is electrically connected to the wiring WSL[i]. The second terminal of the transistor F2r is electrically connected to the wiring WCLr[j], and a second terminal of the capacitor C5r is electrically connected to the wiring XCL[i]. In the cell IMr[i,j] in FIG. 13, a connection portion of the first terminal of the transistor F1r, the gate of the transistor F2r, and the first terminal of the capacitor C5r is a node Nr[i,j].

Note that the node Nr[i,j] functions as a retention node of the cell, like the node N[i,j] and the node Nd[i].

<<Circuit WCS>>

The circuit WCS includes the circuit SWS1, the circuit WCSa[j], and a circuit WCSar[j], for example.

The circuit SWS1 includes the switch S3[j] and a switch S3r[j], for example.

The number of switches S3[j] is, for example, the number of columns of the matrix in which the cells IM of the cell array CA are arranged. The number of switches S3r[j] is, for example, the number of columns of the matrix in which the cells IMr of the cell array CA are arranged. That is, in the arithmetic circuit MACB1 illustrated in FIG. 13, the circuit SWS1 includes the switch S3[1] to the switch S3[*n*] (n switches in total) and a switch S3*r*[1] to a switch S3*r*[n] (n switches in total).

The first terminal of the switch S3[*j*] is electrically connected to the wiring WCL[j], the second terminal of the switch S3[*j*] is electrically connected to the circuit WCSa[j] included in the circuit WCS, and the control terminal of the switch S3[*j*] is electrically connected to the wiring SWL1. A first terminal of the switch S3*r*[j] is electrically connected to the wiring WCLr[j], a second terminal of the switch S3*r*[j] is electrically connected to the circuit WCSar[j] included in the circuit WCS, and a control terminal of the switch S3*r*[j] is electrically connected to the wiring SWL1.

As each of the switch S3[*j*] and the switch S3*r*[j], the switch that can be used as the switch S3[*j*] of the circuit SWS1 included in the circuit WCS described in Embodiment 1 can be used. In particular, as each of the switch S3[*j*] and the switch S3*r*[j], an OS transistor is preferably used.

Note that in this specification and the like, each of the switch S3[*j*] and the switch S3*r*[j] illustrated in FIG. 13 is turned on when a high-level potential is applied to the control terminal and is turned off when a low-level potential is applied to the control terminal.

The wiring SWL1 functions as a wiring for switching the on state and the off state of the switch S3[*j*] and the switch S3*r*[j], for example. Accordingly, the wiring SWL1 is supplied with a high-level potential or a low-level potential.

From the above, the circuit SWS1 functions as a circuit for establishing or breaking electrical continuity between the circuit WCSa[j] and the wiring WCL[j] and between the circuit WCSar[j] and the wiring WCLr[j].

For the circuit WCSa[j], refer to the description of the circuit WCSa[j] included in the circuit WCS of the arithmetic circuit MACA1 described in Embodiment 1. The circuit WCSar[j] is described as having the same configuration as the circuit WCSa[j].

That is, the circuit WCSa[j] has a function of supplying a current with an amount corresponding to the first data to the wiring WCL[j], like the circuit WCSa[j] included in the circuit WCS of the arithmetic circuit MACA1. The circuit WCSar[j] has a function of supplying a current with an amount corresponding to the first data to the wiring WCLr [j].

<<Circuit XCS>>

For the circuit XCS, refer to the description of the circuit XCS of the arithmetic circuit MACA1 described in Embodiment 1.

<<Circuit WSD>>

For the circuit WSD, refer to the description of the circuit WSD of the arithmetic circuit MACA1 described in Embodiment 1.

In the arithmetic circuit MACB1, when the circuit WSD supplies a high-level potential to the wiring WSL[1] and supplies a low-level potential to the wiring WSL[2] (not illustrated) to the wiring WSL[m], the transistor F1, the transistor F1*r*, and the transistor F1*d* each having the gate electrically connected to the wiring WSL[1] can be turned on and the transistors F1, the transistors F1*r*, and the transistors F1*d* each having the gate electrically connected to any of the wiring WSL[2] to the wiring WSL[m] can be turned off.

<<Circuit ITS>>

The circuit ITS includes the circuit SWS2 and a converter circuit ITRZD[j].

The circuit SWS2 includes the switch S4[*j*] and a switch S4*r*[j], for example.

The number of switches S4[*j*] is, for example, the number of columns of the matrix in which the cells IM of the cell array CA are arranged. The number of switches S4*r*[j] is, for example, the number of columns of the matrix in which the cells IMr of the cell array CA are arranged. That is, in the arithmetic circuit MACB1 illustrated in FIG. 13, the circuit SWS2 includes the switch S4[1] to the switch S4[*n*] (n switches in total) and a switch S4*r*[1] to a switch S4*r*[n] (n switches in total).

The first terminal of the switch S4[*j*] is electrically connected to the wiring WCL[j], the second terminal of the switch S4[*j*] is electrically connected to a first input terminal of the converter circuit ITRZD[j] included in the circuit ITS, and the control terminal of the switch S4[*j*] is electrically connected to the wiring SWL2. A first terminal of the switch S4*r*[j] is electrically connected to the wiring WCLr[j], a second terminal of the switch S4*r*[j] is electrically connected to a second terminal of the converter circuit ITRZD[j] included in the circuit ITS, and a control terminal of the switch S4*r*[j] is electrically connected to the wiring SWL2. Note that the circuit ITRZD[j] will be described later.

As each of the switch S4[*j*] and the switch S4*r*[j], the switch that can be used as the switch S4[*j*] of the circuit SWS2 included in the circuit ITS described in Embodiment 1 can be used. In particular, as each of the switch S4[*j*] and the switch S4*r*[j], an OS transistor is preferably used.

Note that in this specification and the like, the switch S4[*j*] and the switch S4*r*[j] illustrated in FIG. 13 are turned on when a high-level potential is applied to the control terminal and are turned off when a low-level potential is applied to the control terminal.

The wiring SWL2 functions as a wiring for switching the on state and the off state of the switch S4[*j*] and the switch S4*r*[j], for example. Accordingly, the wiring SWL2 is supplied with a high-level potential or a low-level potential.

From the above, the circuit SWS2 has a function of establishing or breaking electrical continuity between the wiring WCL[j] and the first terminal of the circuit ITRZD[j] and between the wiring WCLr[j] and the second terminal of the circuit ITRZD[j].

The converter circuit ITRZD[j] includes the first input terminal, the second input terminal, and an output terminal, for example.

As described above, the first input terminal of the converter circuit ITRZD[j] is electrically connected to the second terminal of the switch S4[*j*], and the second input terminal of the converter circuit ITRZD[j] is electrically connected to the second terminal of the switch S4*r*[j]. The output terminal of the converter circuit ITRZD[j] is electrically connected to the wiring OL[j].

The converter circuit ITRZD[j] has functions of acquiring a difference between the amounts of currents input from the wiring WCL[j] and the wiring WCLr[j] to the input terminals, converting the difference into a voltage corresponding to the difference, and outputting the voltage from the output terminal, for example. The voltage can be, for example, an analog voltage or a digital voltage. The converter circuit ITRZD[j] may include an arithmetic circuit of a function system. In this case, for example, the arithmetic circuit may perform arithmetic operation of a function with the use of the converted voltage, and the arithmetic operation result may be output to the wiring OL[j].

In particular, in the case of performing arithmetic operation of a hierarchical neural network, a sigmoid function, a tanh function, a softmax function, a ReLU function, or a threshold function can be used as the above-described function, for example.

Figure 14:
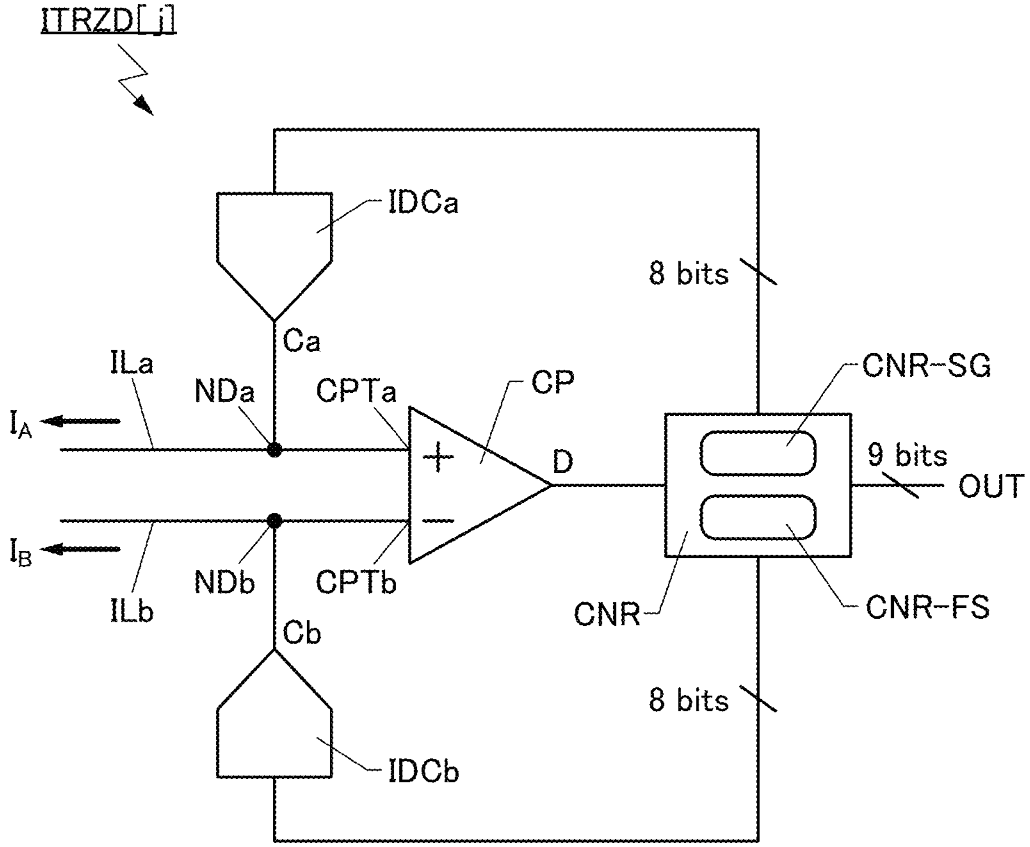
FIG. 14 is a circuit diagram illustrating a configuration example of a circuit included in an arithmetic circuit.

Here, a specific circuit configuration of the converter circuit ITRZD[j] is described. FIG. 14 is a block diagram of the converter circuit ITRZD[j] that can be used as the converter circuit ITRZD[j] included in the circuit ITS of the arithmetic circuit MACB1 in FIG. 13. The converter circuit ITRZD[j] includes a comparison portion CP, a control portion CNR, a digital-analog converter circuit IDCa, and a digital-analog converter circuit IDCb. A wiring ILa is electrically connected to an input terminal CPTa of the comparison portion CP, and a wiring ILb is electrically connected to an input terminal CPTb of the comparison portion CP. Note that the converter circuit ITRZD[j] here has a function of performing AD (analog-to-digital) conversion.

The wiring ILa is electrically connected to the first input terminal of the converter circuit ITRZD[j], for example. That is, the wiring ILa is electrically connected to the wiring WCL[j] in the arithmetic circuit MACB1 in FIG. 13. The wiring ILb is electrically connected to the second input terminal of the converter circuit ITRZD[j], for example. That is, the wiring ILb is electrically connected to the wiring WCLr[j] in the arithmetic circuit MACB1 in FIG. 13.

The comparison portion CP has a function of comparing the value of a current flowing to the input terminal CPTa with the value of a current flowing to the input terminal CPTb and supplying one of two potentials to an output terminal D. As an example, the case is considered in which a current with a current amount Ia flows to the input terminal CPTa through the wiring ILa and a current with a current amount Ib flows to the input terminal CPTb through the wiring ILb. When the current amount Ia exceeds the current amount Ib, the comparison portion CP supplies the output terminal D with a high-level potential (hereinafter referred to as a potential H) as the output. When the current amount Ia is smaller than or equal to the current amount Ib, the comparison portion CP supplies the output terminal D with a low-level potential (hereinafter referred to as a potential L) as the output. The output of the comparison portion CP is input to the control portion CNR through the output terminal D.

The control portion CNR includes a sign generation portion CNR-FS and a digital signal generation portion CNR-SG. The sign generation portion CNR-FS has a function of generating a sign bit in accordance with the output of the comparison portion CP. For example, in the case where the output of the comparison portion CP is the potential H, "0" is generated as a sign bit. In the case where the output of the comparison portion CP is the potential L, "1" is generated as a sign bit. Note that the sign bit may be "1" when the output of the comparison portion CP is the potential H and may be "0" when the output of the comparison portion CP is the potential L.

The digital signal generation portion CNR-SG has a function of generating a digital signal that is a digital value having a resolution greater than or equal to eight bits and less than or equal to 16 bits, for example. Lower resolution leads to lower AD conversion accuracy but leads to a higher AD conversion speed. Higher resolution leads to higher AD conversion accuracy but leads to a lower AD conversion speed. Note that the resolution of the digital signal generation portion CNR-SG is not limited to greater than or equal to eight bits and less than or equal to 16 bits. The resolution of a digital value output from the digital signal generation portion CNR-SG may be less than or equal to seven bits and may be greater than or equal to 17 bits. The resolution can be set as appropriate in accordance with the purpose and the intended use.

In this embodiment, the digital signal generation portion CNR-SG generates a digital signal with a resolution of eight bits. Note that in this specification and the like, the digits of a digital signal represented in binary form are sometimes referred to as bits.

The control portion CNR has a function of supplying a digital signal generated by the digital signal generation portion CNR-SG to a digital-analog converter circuit IDC (one or both of the digital-analog converter circuit IDCa and the digital-analog converter circuit IDCb). The control portion CNR has a function of outputting, to the outside (OUT), a signal obtained by adding a sign bit to a digital signal. When a digital signal has a resolution of eight bits, a 9-bit signed digital signal obtained by adding one bit of a sign bit can be output to the outside. The control portion CNR functions as a successive approximation register (SAR).

The digital-analog converter circuit IDC functions as a current output DAC (Digital to Analog Converter). That is, the digital-analog converter circuit IDC has a function of outputting a current with a value corresponding to a digital signal supplied from the control portion CNR, to an output terminal C (one or both of an output terminal Ca and an output terminal Cb). The digital-analog converter circuit IDC may employ a circuit configuration similar to that of the circuit WCSa[j] illustrated in FIG. 3A and FIG. 3B.

In FIG. 14, the output terminal Ca of the digital-analog converter circuit IDCa is electrically connected to the input terminal CPTa of the comparison portion CP through a node NDa. Thus, an output current of the digital-analog converter circuit IDCa is input to the input terminal CPTa of the comparison portion CP. That is, a current with a current amount $I_A$ and the output current of the digital-analog converter circuit IDCa flow to the input terminal CPTa. In other words, a current obtained by adding the output current of the digital-analog converter circuit IDCa to the current with the current amount $I_A$ flows to the input terminal CPTa.

In FIG. 14, the output terminal Cb of the digital-analog converter circuit IDCb is electrically connected to the input terminal CPTb of the comparison portion CP through a node NDb. Thus, the output current of the digital-analog converter circuit IDCb is added to the input terminal CPTb of the comparison portion CP. That is, a current with a current amount $I_B$ and the output current of the digital-analog converter circuit IDCb flow to the input terminal CPTb. In other words, a current obtained by adding the output current of the digital-analog converter circuit IDCb to the current with the current amount IB flows to the input terminal CPTb.

Note that the node NDa is a node where the output terminal of the digital-analog converter circuit IDCa, the wiring ILa, and the input terminal CPTa are electrically connected to each other. The node NDb is a node where the output terminal of the digital-analog converter circuit IDCb, the wiring ILb, and the input terminal CPTb are electrically connected to each other.

<<Operation Example of Converter Circuit ITRZD[j]>>

Figure 15:
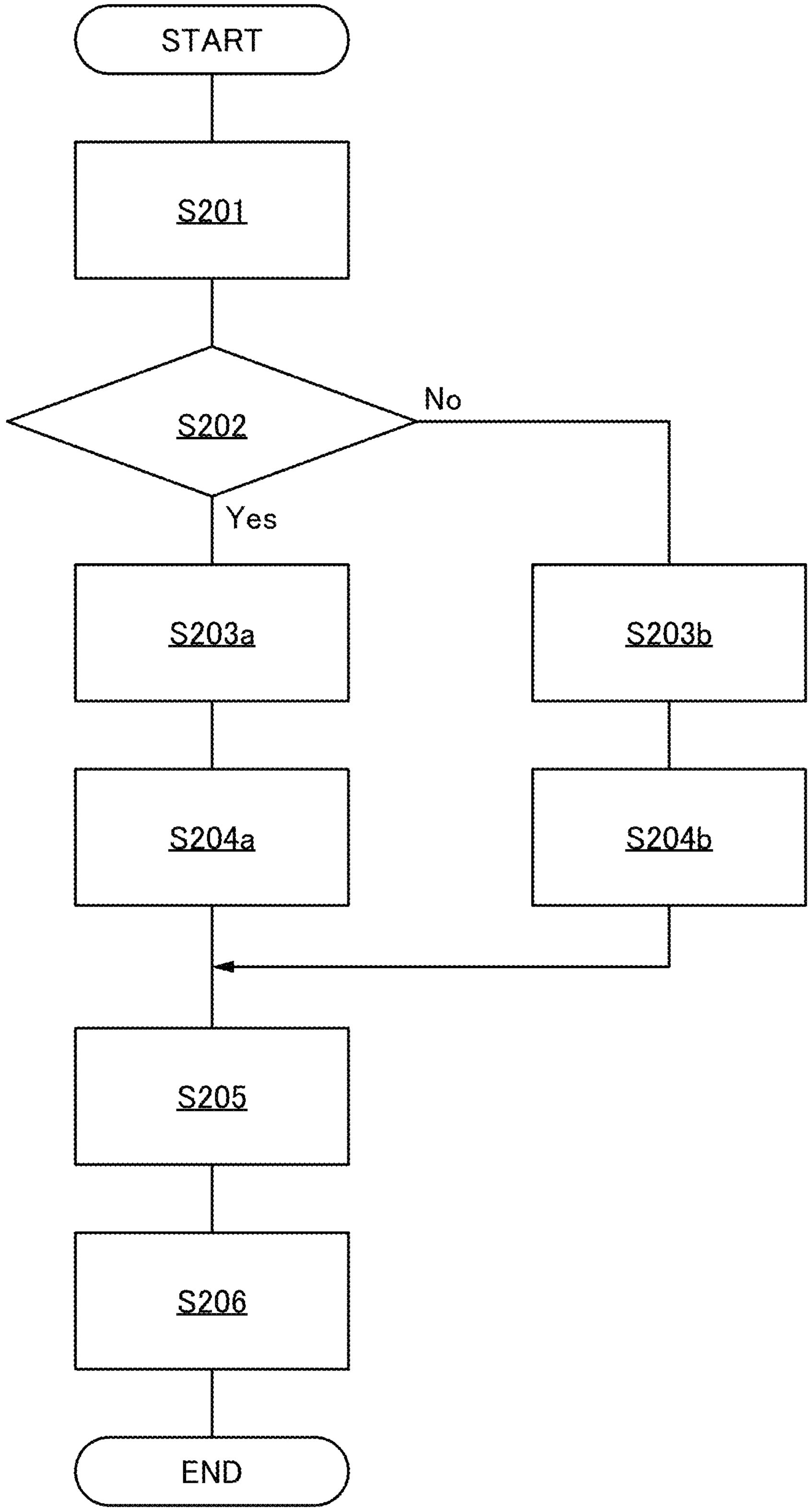
FIG. 15 is a flowchart illustrating an operation example of an arithmetic circuit.

FIG. 15 is a flowchart illustrating an operation example of the converter circuit ITRZD[j]. In this embodiment, a digital signal generated in the digital signal generation portion CNR-SG has a resolution of eight bits, and the output current of the digital-analog converter circuit IDC is in the steps of 1 nA. Here, an operation is described in which a difference value (also referred to as a difference current) between the current amount $I_A$ and the current amount IB is converted into a signed digital signal.

[Step S201]

An operation of resetting the control portion CNR is performed. Specifically, an 8-bit digital signal is set to $(00000000)_2$. Then, the digital signal is supplied to the digital-analog converter circuit IDCa and the digital-analog converter circuit IDCb. Thus, outputs of the digital-analog converter circuit IDCa and the digital-analog converter circuit IDCb stop.

[Step S202]

The comparison portion CP compares current values of the current amount $I_A$ and the current amount IB. In this embodiment, in the case where the current amount $I_A$ is larger than the current amount IB, the comparison portion CP supplies the potential H to the output terminal D. In the case where the current amount $I_A$ is smaller than or equal to the current amount IB, the comparison portion CP supplies the potential L to the output terminal D.

[Step S203*a*]

In the case where the comparison portion CP outputs the potential H in Step S202, "0" is set as a sign bit.

[Step S204*a*]

In the case where the sign bit is "0", successive approximation (SA) is performed with the digital-analog converter circuit IDCb. During the SA period, $(00000000)_2$ as a digital signal keeps being supplied to the digital-analog converter circuit IDCa. Alternatively, power supply to the digital-analog converter circuit IDCa may be stopped. When power supply to the digital-analog converter circuit IDCa is stopped, power consumption can be reduced. Note that the SA operation will be described later.

[Step S203*b*]

In the case where the comparison portion CP outputs the potential L in Step S202, "1" is set as the sign bit.

[Step S204*b*]

In the case where the sign bit is "1", SA is performed with the digital-analog converter circuit IDCa. During the SA period, $(00000000)_2$ as a digital signal keeps being supplied to the digital-analog converter circuit IDCb. Alternatively, power supply to the digital-analog converter circuit IDCb may be stopped. When power supply to the digital-analog converter circuit IDCb is stopped, power consumption can be reduced.

[Step S205]

After Step S204*a* or Step S204*b* ends, the obtained digital signal and the sign bit are combined to generate a signed digital signal. The sign bit may be the most significant bit or the least significant bit of the signed digital signal.

For example, in the case where the sign bit is "1" and the digital signal obtained through SA is $(01001011)_2$, the signed digital signal may be $(101001011)_2$ with the sign bit used as the most significant bit (MSB). Alternatively, the signed digital signal may be $(010010111)_2$ with the sign bit used as the least significant bit (LSB).

[Step S206]

The generated signed digital signal is output to the outside. In the case where the sign bit "0" is positive and the sign bit "1" is negative, the converter circuit ITRZD[j] can output a positive digital signal and a negative digital signal. Alternatively, the converter circuit ITRZD[j] of one embodiment of the present invention can output, as a digital signal, the magnitude relation and difference current between the current amount $I_A$ and the current amount $I_B$.

<<Example of Successive Approximation Operation>>

Figure 16:
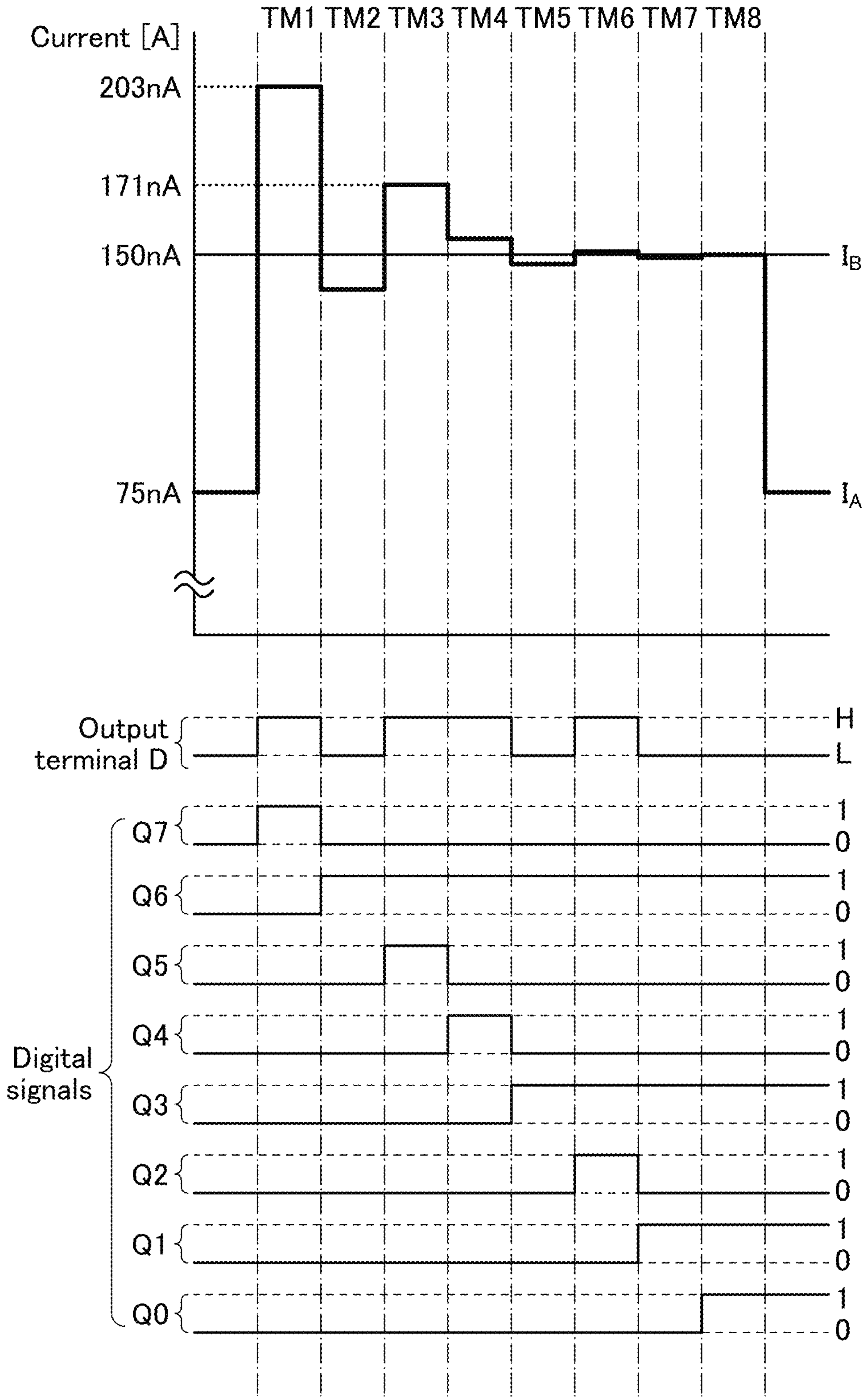
FIG. 16 is a timing chart illustrating an operation example of a circuit included in a semiconductor device.

A successive approximation operation corresponding to Step S204*b* is described with reference to FIG. 16. FIG. 16 shows the states of the current amount $I_A$, the current amount $I_B$, the output terminal D, and the digits (a Q0 bit to a Q7 bit) of a digital signal from Period TM1 to Period TM8. As described above, a digital signal generated in the digital signal generation portion CNR-SG has a resolution of eight bits, and the output current of the digital-analog converter circuit IDC is in the steps of 1 nA. Here, the case where the current amount $I_A$ is 75 nA and the current amount $I_B$ is 150 nA is described. Note that the potential of the output terminal D before the successive approximation operation (in the initial state) is the potential L. The digital signal in the initial state is (00000000) 2.

[Period TM1]

In Period TM1, the Q7 bit, which is the MSB of the digital signal, is set to "1". In other words, a digital signal $(10000000)_2$ is generated. The digital signal is input to the digital-analog converter circuit IDCa, and 128 nA is output from the digital-analog converter circuit IDCa. This output is supplied to the input terminal CPTa through the node NDa. Thus, a current of 203 nA (75+128 nA) flows to the input terminal CPTa. Since 150 nA flows to the input terminal CPTb, the potential of the output terminal D becomes the potential H.

In the case where the potential of the output terminal D changes in Period TM1 from the potential in the initial state, the Q7 bit keeps being "0" after Period TM1 until the control portion CNR is reset. In the case where the potential of the output terminal D does not change from the potential in the initial state, the Q7 bit keeps being "1" after Period TM1 until the control portion CNR is reset. In this embodiment, the Q7 bit is "0" after Period TM1.

[Period TM2]

In Period TM2, the Q6 bit, which is lower than the MSB of the digital signal by one bit, is set to "1". In other words, a digital signal $(01000000)_2$ is generated. The digital signal is input to the digital-analog converter circuit IDCa, and 64 nA is output from the digital-analog converter circuit IDCa. This output is supplied to the input terminal CPTa through the node NDa. Thus, a current of 139 nA (75+64 nA) flows to the input terminal CPTa, and the potential of the output terminal D is the potential L as in the initial state.

In the case where the potential of the output terminal D changes in Period TM2 from the potential in the initial state, the Q6 bit keeps being "0" after Period TM2 until the control portion CNR is reset. In the case where the potential of the output terminal D does not change from the potential in the initial state, the Q6 bit keeps being "1" after Period TM2 until the control portion CNR is reset. In this embodiment, the Q6 bit is "1" after Period TM2.

[Period TM3]

In Period TM3, the Q5 bit, which is lower than the MSB of the digital signal by two bits, is set to "1". In other words, a digital signal $(01100000)_2$ is generated. The digital signal is input to the digital-analog converter circuit IDCa, and 96 nA (64+32 nA) is output from the digital-analog converter circuit IDCa. This output is supplied to the input terminal CPTa through the node NDa. Thus, a current of 171 nA (75+64+32 nA) flows to the input terminal CPTa, and the potential of the output terminal D becomes the potential H.

In the case where the potential of the output terminal D changes in Period TM3 from the potential in the initial state, the Q5 bit keeps being "0" after Period TM3 until the control portion CNR is reset. In the case where the potential of the output terminal D does not change from the potential in the initial state, the Q5 bit keeps being "1" after Period TM3 until the control portion CNR is reset. In this embodiment, the Q5 bit is "0" after Period TM3.

[Period TM4]

In Period TM4, the Q4 bit, which is lower than the MSB of the digital signal by three bits, is set to "1". In other words, a digital signal $(01010000)_2$ is generated. The digital signal is input to the digital-analog converter circuit IDCa, and 80 nA (64+16 nA) is output from the digital-analog converter circuit IDCa. This output is supplied to the input terminal CPTa through the node NDa. Thus, a current of 155 nA (75+64+16 nA) flows to the input terminal CPTa, and the potential of the output terminal D becomes the potential H.

In the case where the potential of the output terminal D changes in Period TM4 from the potential in the initial state, the Q4 bit keeps being "0" after Period TM4 until the control portion CNR is reset. In the case where the potential of the output terminal D does not change from the potential in the initial state, the Q4 bit keeps being "1" after Period TM4 until the control portion CNR is reset. In this embodiment, the Q4 bit is "0" after Period TM4.

[Period TM5]

In Period TM5, the Q3 bit, which is lower than the MSB of the digital signal by four bits, is set to "1". In other words, a digital signal $(01001000)_2$ is generated. The digital signal is input to the digital-analog converter circuit IDCa, and 72 nA (64+8 nA) is output from the digital-analog converter circuit IDCa. This output is supplied to the input terminal CPTa through the node NDa. Thus, a current of 147 nA (75+64+8 nA) flows to the input terminal CPTa, and the potential of the output terminal D becomes the potential L.

In the case where the potential of the output terminal D changes in Period TM5 from the potential in the initial state, the Q3 bit keeps being "0" after Period TM5 until the control portion CNR is reset. In the case where the potential of the output terminal D does not change from the potential in the initial state, the Q3 bit keeps being "1" after Period TM5 until the control portion CNR is reset. In this embodiment, the Q3 bit is "1" after Period TM5.

[Period TM6]

In Period TM6, the Q2 bit, which is lower than the MSB of the digital signal by five bits, is set to "1". In other words, a digital signal $(01001100)_2$ is generated. The digital signal is input to the digital-analog converter circuit IDCa, and 76 nA (64+8+4 nA) is output from the digital-analog converter circuit IDCa. This output is supplied to the input terminal CPTa through the node NDa. Thus, a current of 151 nA (75+64+8+4 nA) flows to the input terminal CPTa, and the potential of the output terminal D becomes the potential H.

In the case where the potential of the output terminal D changes in Period TM6 from the potential in the initial state, the Q2 bit keeps being "0" after Period TM6 until the control portion CNR is reset. In the case where the potential of the output terminal D does not change from the potential in the initial state, the Q2 bit keeps being "1" after Period TM6 until the control portion CNR is reset. In this embodiment, the Q2 bit is "0" after Period TM6. [Period TM7]

In Period TM7, the Q1 bit, which is lower than the MSB of the digital signal by six bits, is set to "1". In other words, a digital signal $(01001010)_2$ is generated. The digital signal is input to the digital-analog converter circuit IDCa, and 74 nA (64+8+2 nA) is output from the digital-analog converter circuit IDCa. This output is supplied to the input terminal CPTa through the node NDa. Thus, a current of 149 nA (75+64+8+2 nA) flows to the input terminal CPTa, and the potential of the output terminal D becomes the potential L.

In the case where the potential of the output terminal D changes in Period TM7 from the potential in the initial state, the Q1 bit keeps being "0" after Period TM7 until the control portion CNR is reset. In the case where the potential of the output terminal D does not change from the potential in the initial state, the Q1 bit keeps being "1" after Period TM7 until the control portion CNR is reset. In this embodiment, the Q1 bit is "1" after Period TM7.

[Period TM8]

In Period TM8, the Q0 bit, which is the LSB of the digital signal, is set to "1". In other words, a digital signal $(01001011)_2$ is generated. The digital signal is input to the digital-analog converter circuit IDCa, and 75 nA (64+8+2+1 nA) is output from the digital-analog converter circuit IDCa. This output is supplied to the input terminal CPTa through the node NDa. Thus, a current of 150 nA (75+64+8+2+1 nA) flows to the input terminal CPTa, and the potential of the output terminal D becomes the potential L.

In the case where the potential of the output terminal D changes in Period TM8 from the potential in the initial state, the Q0 bit keeps being "0" after Period TM8 until the control portion CNR is reset. In the case where the potential of the output terminal D does not change from the potential in the initial state, the Q0 bit keeps being "1" after Period TM8 until the control portion CNR is reset. In this embodiment, the Q0 bit is "1" after Period TM8.

In this manner, comparison is sequentially performed from the MSB to the LSB, whereby 75 nA, which is a difference current between the current amount $I_A$ and the current amount $I_B$, can be converted into the digital signal (01001011) 2.

Note that a successive approximation operation corresponding to Step S204*b* can be understood when the potential H is replaced with the potential L and the digital-analog converter circuit IDCa is replaced with the digital-analog converter circuit IDCb, for example, in the above description.

Since the output current of the digital-analog converter circuit IDC is in the steps of 1 nA in this embodiment, a difference current of 255 nA at a maximum can be converted into a digital signal. When the step of the output current of the digital-analog converter circuit IDC is made larger, a higher difference current can be converted. For example, when the step of the output current of the digital-analog converter circuit IDC is 2 nA, a difference current of 510 nA at a maximum can be converted into a digital signal.

<<Circuit FB>>

For the circuit FB, refer to the description of the circuit FB of the arithmetic circuit MACA1 described in Embodiment 1, for example.

<<Control Circuit CTR>>

For the control circuit CTR, refer to the description of the control circuit CTR of the arithmetic circuit MACA1 described in Embodiment 1, for example.

<Operation Example 1 of Arithmetic Circuit>

Here, an operation example of the arithmetic circuit MACB1 illustrated in FIG. 13 is described.

First, differences between the arithmetic circuit MACB1 and the arithmetic circuit MACA1 described in Embodiment 1 are described.

The arithmetic circuit MACA1 has a configuration of an arithmetic circuit that performs product-sum operation of positive or "0" first data and positive or "0" second data. Meanwhile, the arithmetic circuit MACB1 has a configuration of an arithmetic circuit that performs product-sum operation of positive, negative, or "0" first data and positive or "0" second data. Accordingly, unlike the arithmetic cell included in the arithmetic circuit MACA1, the arithmetic cell included in the arithmetic circuit MACB1 has a configuration capable of retaining positive, negative, or "0" first data. Note that a circuit CES[i,j] included in the arithmetic circuit MACB1 functions as an arithmetic cell that can retain positive, negative, or "0" first data.

As described in the configuration examples of the cell IM and the cell IMr, the circuit CES[i,j] has a function of retaining the first data with a pair of the cell IM[i,j] and the cell IMr[i,j] positioned at the same address. In this circuit configuration example, the amount of current flowing between the source and the drain of the transistor F2 included in the cell IM and the amount of current flowing between the source and the drain of the transistor F2*r* included in the cell IMr in the circuit CES[i,j] are set in accordance with the retained first data. The relation between the first data with a positive value, a negative value, or a value of 0 and the amount of current flowing between the source and the drain of the transistor F2 and the amount of current flowing between the source and the drain of the transistor F2*r*, which are set in accordance with the first data, are defined as follows.

In the case where α[i,j] is written to the circuit CES[i,j] as a positive value of first data, the amount of current flowing between the source and the drain of the transistor F2 in the cell IM[i,j] included in the circuit CES[i,j] is set to $|\alpha[i,j]|\times I_{Wut}$, and the amount of current flowing between the source and the drain of the transistor F2*r* in the cell IMr[i,j] is set to 0. Note that $I_{Wut}$ denotes the amount of current that flows when the first data (α[i,j] in this case) has an absolute value of 1.

In the case where α[i,j] is written to the circuit CES[i,j] as a negative value of first data, the amount of current flowing between the source and the drain of the transistor F2 in the cell IM[i,j] included in the circuit CES[i,j] is set to 0, and the amount of current flowing between the source and the drain of the transistor F2*r* in the cell IMr[i,j] is set to $|\alpha[i,j]|\times I_{Wut}$.

In the case where a value "0" of first data is written to the circuit CES[i,j], the amount of current flowing between the source and the drain of the transistor F2 in the cell IM[i,j] included in the circuit CES[i,j] is set to 0, and the amount of current flowing between the source and the drain of the transistor F2*r* in the cell IMr[i,j] is set to 0.

Note that in the case where one or both of the amount of current flowing between the source and the drain of the transistor F2 in the cell IM[i,j] and the amount of current flowing between the source and the drain of the transistor F2*r* in the cell IMr[i,j] are set to 0, no current flows between the source and the drain of one or both of the transistor F2 and the transistor F2*r*; in this specification and the like, the expression "zero current flows between the source and the drain of one or both of the transistor F2 and the transistor F2*r*" is sometimes used.

From the above, two currents corresponding to one first data are set in the cell IM[i,j] and the cell IMr[i,j] included in the circuit CES[i,j].

Here, the current set in the cell IM[i,j] is expressed as in Formula (1.5) in Embodiment 1. The current set in the cell IMr[i,j] can be expressed by the following formula using $w_r$[i,j], in a manner similar to Formula (1.5) in Embodiment 1.

[Formula 19]

$$I_0[i,j] = w_r[i,j]I_{ref0} \leftrightarrow \alpha[i,j]I_{Wut} = w_r[i,j]I_{Xut} \quad (2.1)$$

Note that $w_r$[i,j] is a value corresponding to first data (a weight coefficient), like w[i,j] in Formula (1.5) in Embodiment 1. In this embodiment, w[i,j] is defined as a positive value and $w_r$[i,j] is defined as 0 when the first data is positive; w[i,j] is defined as 0 and $w_r$[i,j] is defined as a positive value when the first data is negative; w[i,j] and $w_r$[i,j] are defined as 0 when the first data is 0.

For example, when the first data is −2,−1, 0, 1, and 2, the amounts of current set in the cell IM[i,j] and the cell IMr[i,j] are as shown in the following table.

TABLE 1

| First data | Current amount set in cell IM | Current amount set in cell IMr |
|---|---|---|
| 2 | $2I_{Wut}$ | 0 |
| 1 | $I_{Wut}$ | 0 |
| 0 | 0 | 0 |
| −1 | 0 | $I_{Wut}$ |
| −2 | 0 | $2I_{Wut}$ |

When the first data (w[1,*j*] to w[m,j]) is written to the cell IM[1,*j*] to the cell IM[m,j] positioned in the j-th column of the cell array CA and the second data flows to the wiring XCL[1] to the wiring XCL[m], the total amount of current output from the cell IM[1,*j*] to the cell IM[m,j] can be described as follows according to the operation example of the arithmetic circuit in Embodiment 1.

[Formula 20]

$$I_S[i] = I_{ref0}\sum_{i=1}^{m} x[i]w[i,j] \quad (2.2)$$

Note that in Formula (2.2), setting w[i,j]=0 when the first data α[i,j] is negative and setting w[i,j]=0 when the first data α[i,j] is 0 can express the current amount $I_S$[j].

When the first data ($w_r$[1,*j*] to $w_r$[m,j]) is written to the cell IMr[1,*j*] to the cell IMr[m,j] positioned in the j-th column of the cell array CA and the second data flows to the wiring XCL[1] to the wiring XCL[m], the total amount of current output from the cell IMr[1,*j*] to the cell IMr[m,j] can be described as follows, as in Formula (2.2).

[Formula 21]

$$I_{Sr}[j] = I_{ref0}\sum_{i=1}^{m} x[i]w_r[i,j] \quad (2.3)$$

Note that in Formula (2.3), setting $w_r$[i,j]=0 when the first data α[i,j] is positive and setting $w_r$[i,j]=0 when the first data α[i,j] is 0 can express a current amount $I_{Sr}$[j].

Here, a difference current between the current in Formula (2.2) and the current in Formula (2.3) is obtained by using the converter circuit ITRZD[j]. The difference current can be described as follows.

[Formula 22]

$$I_S[j] - I_{Sr}[j] = I_{ref0}\sum_{i=1}^{m} x[i](w[i,j] - w_r[i,j]) \quad (2.4)$$

That is, the amount of the difference current expressed by Formula (2.4) has a value corresponding to the sum of products of positive, negative, or "0" first data and positive or "0" second data. Accordingly, the result of the sum of products of the first data and the second data can be obtained from the difference current.

Thus, even in the case of the arithmetic circuit MACB1 including the cell array CA with three or more rows and two or more columns, product-sum operation can be performed in the above-described manner. In the arithmetic circuit MACB1 of such a case, cells in one column (here, the i-th column) among the plurality of columns are used to retain $I_{ref0}$[i] and x[i]×$I_{ref0}$[i] as the current amount; hence, product-sum operations, the number of which corresponds to the number of the rest of the columns among the plurality of columns, can be executed concurrently. That is, when the number of columns in a memory cell array increases, a semiconductor device that achieves high-speed product-sum operation can be provided.

Example 1 of First Data Writing Operation Including Correction Processing

The description is made on processing in which a potential written to the node N[i,j] of the cell IM[i,j] is corrected in order that the cell IM[i,j] to which the first data has been written in the arithmetic circuit MACB1 in FIG. 13 adequately outputs a current with an amount corresponding to the first data.

Figure 17:
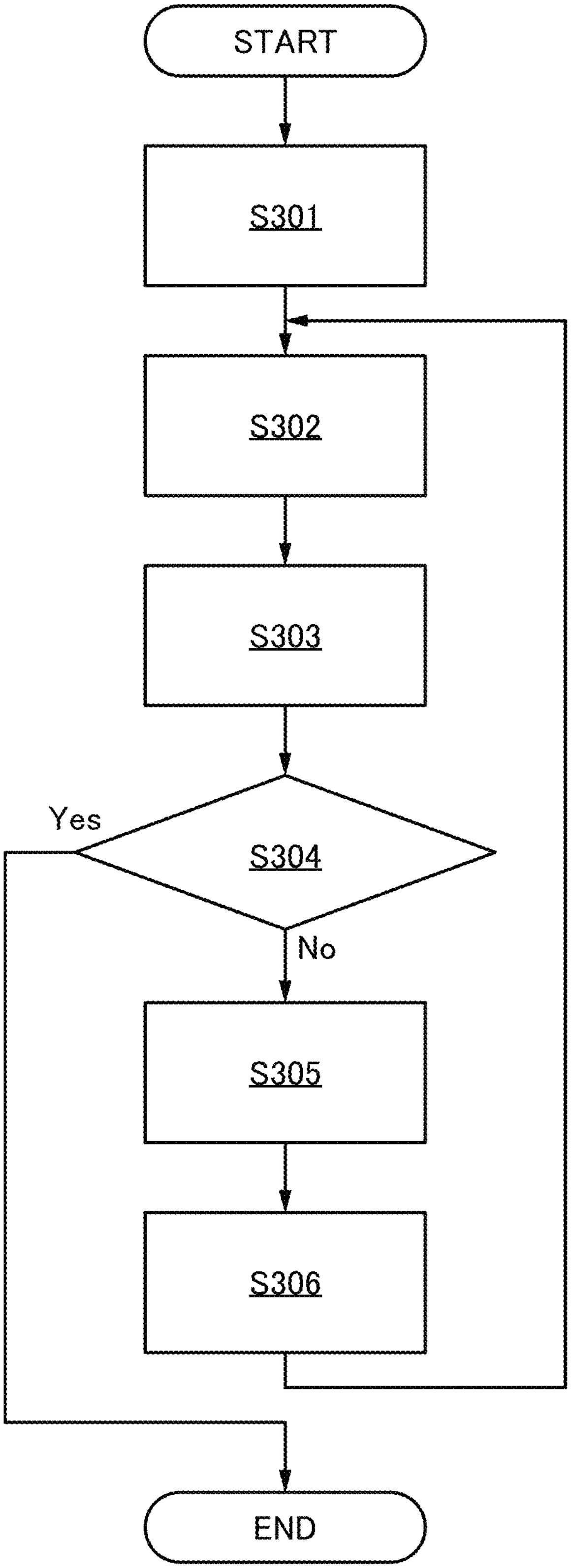
FIG. 17 is a flowchart illustrating an operation example of an arithmetic circuit.

FIG. 17 is a flowchart showing an example of the first data writing operation including correction processing. The writing operation includes Step S301 to Step S306.

Note that the flowchart in FIG. 17 is a variation example of the flowchart in FIG. 7 described in Embodiment 1. Therefore, the description of some operations of the flowchart in FIG. 17 that are common to the operations of the flowchart in FIG. 7 is omitted in some cases.

[Step S301]

Like Step S101, Step S301 includes, for example, an operation of inputting a signal corresponding to $W_{TRG}$ as the value of the first data from the control circuit CTR to the circuit WCSa[j] included in the circuit WCS. Furthermore, Step S301 includes an operation of inputting a signal corresponding to a value of 0 from the control circuit CTR to the circuit WCSar[j] included in the circuit WCS.

In the circuit WCSa[j], a signal corresponding to $W_{TRG}$ can be a digital signal input to each of the wiring DW[1] to the wiring DW[K] in the circuit WCSa in FIG. 3, for example.

Hereinafter, the value of a digital signal input to each of the wiring DW[1] to the wiring DW[K] of the wiring WCSa[j] is referred to as $W_{WR}$. For example, $W_{WR}$=$W_{TRG}$ at the stage of Step S301.

In the circuit WCSar[j], a signal corresponding to a value of 0 can be, for example, a low-level potential input to the wiring DW[1] to the wiring DW[K] in the circuit WCSa in FIG. 3.

[Step S302]

Like Step S102, Step S302 includes, for example, an operation in which the circuit WCSa[j] generates a current (referred to as a write current) with an amount $I_{WR}$ corresponding to the value $W_{WR}$ of a digital signal input to each of the wiring DW[1] to the wiring DW[K], and transmits the current with $I_{WR}$ to the wiring WCL[j]; and an operation in which a write current with $I_{WR}$ flows through the cell IM[i,j], and a potential corresponding to the write current with $I_{WR}$ is written to the first terminal of the capacitor C5 (the node N[i,j]) of the cell IM[i,j]. The description of the operations in Step S102 is referred to for specific operations in Step S302.

Moreover, Step S302 includes an operation in which the circuit WCSar[j] supplies a ground potential (GND) to the wiring WCLr[j], for example.

For example, in the case where the circuit WCSa in FIG. 3 is used as the circuit WCSar[j] in FIG. 13, a potential supplied to the wiring VINIL1 is set to the ground potential (GND) to turn on the switch SWW. Then, a high-level potential is input to the wiring SWL1 to apply the high-level potential to the control terminal of the switch S3*r*[j], whereby the switch S3*r*[j] is turned on; thus, the ground potential supplied to the wiring VINIL1 can be input to the wiring WCLr[j].

To set a current to flow to the cell IM[i,j], a high-level potential is input to the wiring WSL[i] among the wiring WSL[1] to the wiring WSL[m], and a low-level potential is input to the wiring WSL[1] to the wiring WSL[m] in the rows other than the i-th row. Thus, the transistor F1*r* of the cell IMr[i,j] among the cell IMr[1,*j*] to the cell IMr[m,j] positioned in the j-th column is turned on, and the transistors F1 of the cell IM[1,*j*] to the cell IM[m,j] in the rows other than the i-th row are turned off.

At this time, a ground potential from the wiring WCLr[j] is input to the node Nr[i] (the first terminal of the capacitor C5*r*) and the second terminal of the transistor F2*r* in the cell IM[i,j]. When a potential supplied from the wiring VE0 is a ground potential, the gate-source voltage of the transistor F2*r* becomes 0 V; hence, the transistor F2*r* is turned off when the threshold voltage of the transistor F2*r* is appropriate.

To set a current to flow to the cell IM[i,j], since the transistors F1*r* included in the cell IMr[1,*j*] to the cell IMr[m,j] positioned in the j-th column and the rows other than the i-th row are also in an off state, the node Nr[1,*j*] to the node Nr[m,j] in the rows other than the i-th row are in a floating state. At this time, the potentials of the wiring XCL[1] to the wiring XCL[m] in the rows other than the i-th row becoming GND result in changes of the potentials of the node Nr[1,*j*] to the node Nr[m,j] in the rows other than the i-th row. At this time, the transistors F2 included in the cell IMr[1,*j*] to the cell IMr[m,j] positioned in the j-th column and the rows other than the i-th row are turned off.

At this time, a low-level potential is input to the wiring SWL2, so that the low-level potential is applied to the control terminal of the switch S4*r*[j]. Thus, the switch S4*r*[j] is turned off.

Since the switch S3*r*[j] is in an on state, the switch S4*r*[j] is in an off state, and the transistors F1*r* and the transistors F2*r* in the cell IMr[1,*j*] to the cell IMr[m,j] positioned in the j-th column and the rows other than the i-th row are in an off state as described above, the ground potential output from the circuit WCSar[j] is input only to the cell IMr[i,j]. At this time, the gate-source voltage of the transistor F2*r* in the cell IMr[i,j] becomes 0 V. A low-level potential is input to the wiring WSL[i] to turn off the transistor F1*r* in the cell IMr[i,j], whereby the potential of the node Nr[i,j] can be retained by the capacitor C5. That is, the gate-source voltage of the transistor F2*r* in the cell IMr[i,j] can be kept at 0 V.

[Step S303]

Like Step S103, Step S303 includes, for example, an operation of reading the first data written to the cell IM[i,j]. In other words, Step S303 includes an operation in which the cell IM[i,j] outputs a read current corresponding to the potential of the capacitor C5 (the node N[i,j]), and an operation in which the read current is input to the converter circuit ITRZD[j] and thus the converter circuit ITRZD[j] outputs a value corresponding to the read current to the wiring OL[j].

Specifically, for example, a low-level potential is input to the wiring SWL1 to apply the low-level potential to the control terminal of the switch S3[*j*], whereby the switch S3[*j*] is turned off. Furthermore, a high-level potential is input to the wiring SWL2 to apply the high-level potential to the control terminal of the switch S4[*j*], whereby the switch S4[*j*] is turned on.

A low-level potential is continuously input to the wiring WSL[1] to the wiring WSL[m] to maintain the off state of the transistors F1 in the cell IM[i,j] to the cell IM[m,j] positioned in the j-th column.

In and after Step S102, the potential of the wiring XCL[i] is kept at $V_{gm}$, and the potentials of the wiring XCL[1] to the wiring XCL[m] in the rows other than the i-th row are kept at GND. This maintains the off state of the transistors F2 included in the cell IM[1,*j*] to the cell IM[m,j] positioned in the j-th column and the rows other than the i-th row.

In the cell IM[i,j], the potential written in Step S302 is retained at the node N[i,j]. Here, since the potential supplied from the wiring VE0 is a ground potential, the source-drain current of the transistor F2 in the cell IM[i,j] is determined in accordance with the potential of the gate of the transistor F2. The source-drain current of the transistor F2 flows from the wiring WCL[j] through the cell IM[i,j] as a first read current in Step S303. Here, the amount of source-drain current of the transistor F2 in the cell IM[i,j] (read current) is denoted as $I_{RD}$. Note that when the potential of the node N[i,j] in the cell IM[i,j] is appropriate, the write current amount $I_{WR}$ and the read current amount $I_{RD}$ are equal to each other.

In the cell IMr[i,j], the ground potential written in Step S302 is retained at the node Nr[i,j]. Here, since the potential supplied from the wiring VE0 is the ground potential, the transistor F1*r* in the cell IMr[i,j] is turned off. Thus, the source-drain current of the transistor F2 (referred to as a read current for convenience) becomes 0. Accordingly, as a second read current in Step S303, a current with a current amount of 0 flows from the wiring WCLr[j] to the cell IMr[i,j].

Since the switch S3[*j*] is in an off state, the switch S4[*j*] is in an on state, and the transistors F1 and the transistors F2 in the cell IM[1,*j*] to the cell IM[m,j] positioned in the j-th column and the rows other than the i-th row are in an off state as described above, the current with $I_{RD}$ set in the cell IM[i,j] is output from the converter circuit ITRZ[j] of the circuit ITS through the switch S4[*j*].

When a current with the current amount $I_{RD}$ flows from the converter circuit ITRZD[j] to the wiring WCL[j] through the switch S4[*j*] and a current with a current amount of 0 flows from the converter circuit ITRZD[j] to the wiring WCLr[j] through the switch S4*r*[j], the converter circuit ITRZD[j] outputs a potential corresponding to a difference between the current amount $I_{RD}$) and the current amount of 0 (i.e., the current amount $I_{RD}$). The potential is transmitted to the circuit FB as the value $W_{RD}$ read from the cell IM[i,j].

Specifically, according to the description of FIG. 14 and FIG. 15, the converter circuit ITRZD[j] converts the difference in the amount of current flowing through the wiring WCL and the wiring WCLr into a digital signal. Then, the converter circuit ITRZD[j] transmits the digital signal to the circuit FB as the value $W_{RD}$ read from the cell IM[i,j].

Alternatively, the converter circuit ITRZD[j] may perform conversion into an analog potential by using a digital-analog converter circuit and transmit, to the circuit FB, the analog potential, instead of a digital signal, as a signal including the value $W_{RD}$ read from the cell IM[i,j]. In this case, a circuit configuration in which the digital-analog converter circuit is added to the converter circuit ITRZD[j] is employed, for example.

[Step S304]

Like Step S104, Step S304 includes, for example, an operation in which the circuit FB compares the value $W_{TRG}$ as the first data and the value $W_{RD}$ read from the cell IM[i,j].

Specifically, Step S304 includes an operation of terminating the writing operation including correction processing in the case where $W_{TRG}$ and $W_{RD}$ are equal to each other, and an operation of proceeding to Step S305 in the case where $W_{TRG}$ and $W_{RD}$ are not equal to each other.

Note that the description of Step S104 in the flowchart of FIG. 7 is referred to for the comparison operation between $W_{TRG}$ and $W_{RD}$ in Step S304.

[Step S305]

Like Step S105, Step S305 includes, for example, an operation in which the control circuit CTR generates the corrected first data (an update value) to be written to the cell IM[i,j] again. Therefore, the description of Step S105 in the flowchart of FIG. 7 is referred to for a specific operation in Step S305.

[Step S306]

Like Step S105, Step S306 includes, for example, an operation of inputting a signal corresponding to $W_{WR}+\Delta W$ as the update value from the control circuit CTR to the circuit WCSa[j] included in the circuit WCS, and an operation of proceeding to Step S302.

That is, in the case where the circuit WCSa[j] in FIG. 3 is used as the circuit WCSa[j] in the arithmetic circuit MACB1 in FIG. 13, the value of the digital signal input to each of the wiring DW[1] to the wiring DW[K] is a value obtained by adding ΔW to the value of $W_{WR}$ previously input to the circuit WCSa[j].

Therefore, after the transition from Step S306 to Step S302, the description can be made by replacing $W_{WR}$ in Step S302 to Step S306 described above with $W_{WR}+\Delta W$.

Like Step S301, Step S306 includes an operation in which the circuit WCSar[j] supplies a ground potential (GND) to the wiring WCLr[j], for example.

After that, Step S302 to Step S306 are repeated until $W_{TRG}$ and $W_{RD}$ become equal to each other (the difference between the write current and the read current becomes 0) in Step S304, whereby a potential corresponding to the first data can be appropriately written to the cell IM[i,j].

As described above, performing Step S301 to Step S306 can inhibit the variation at the time of writing the first data to the cell IM[i,j].

As an example, the flowchart in FIG. 17 shows an operation of writing first data with a positive value including correction processing. For example, when $W_{TRG}$, which is the first data, is a negative value in the above operation, changing the writing destination from the cell IM[i,j] to the cell IMr[i,j] enables an operation of writing first data with a negative value including correction processing.

The first data writing operation including correction processing in the arithmetic circuit MACB1 of FIG. 16 is not limited to the operation method shown in the flowchart of FIG. 17. For example, the arithmetic circuit MACB1 of FIG. 16 may employ the operation method in the flowchart of FIG. 8 as appropriate.

In the case where the arithmetic circuit MACB1 of FIG. 16 employs the operation method in the flowchart of FIG. 8 to appropriately correct a potential to be written to the cell IM[i,j], a ground potential supplied from the wiring VINIL1 is preferably supplied to the node Nr[i,j] in the cell IMr[i,j] to turn off the transistor F2*r* in the cell IMr[i,j], as in the flowchart of FIG. 17. Accordingly, the amount of current flowing from the wiring WCLr[j] to the cell IMr[i,j] can be 0; thus, the arithmetic circuit MACB1 of FIG. 16 can perform the first data writing operation including correction processing with reference to the operation method in the flowchart of FIG. 8.

As in Embodiment 1, the arithmetic circuit MACB0 and the arithmetic circuit MACB1 described in this embodiment can each be treated as a memory device. To read the first data from the circuit CES[i,j] in the arithmetic circuit MACB0 or the arithmetic circuit MACB1, a current corresponding to "1" flows from the circuit XCS to the wiring XCL[i] as the value of the second data and a current corresponding to "0" flows from the circuit XCS to the wiring XCL[1] to the wiring XCL[m] in the rows other than the i-th row, for example; thus, the first data retained in the circuit CES[i,j] can be read. At this time, the converter circuit ITRZ[j] included in the circuit ITS is treated as a reading circuit that converts the current amount into an analog potential or a digital signal. Since the circuit CES[i,j] treats the cell IM[i,j] and the cell IMr[i,j] as one memory element, the arithmetic circuit MACB0 and the arithmetic circuit MACB1 can possibly have a larger number of threshold voltages as a multilevel memory than the arithmetic circuit MACA0, the arithmetic circuit MACA1, and the arithmetic circuit MACA2 each treating the cell IM[i,j] as one memory element. Therefore, each of the arithmetic circuit MACB0 and the arithmetic circuit MACB1 may also be referred to as a memory device in another embodiment.

Note that this embodiment can be combined with any of the other embodiments in this specification as appropriate.

Embodiment 3

In this embodiment, a configuration example of the arithmetic circuit described in the above embodiment will be described.

Since the arithmetic circuit described in the above embodiment has a function of retaining first data, the arithmetic circuit is sometimes referred to as a memory device in this embodiment.

Figure 18A:
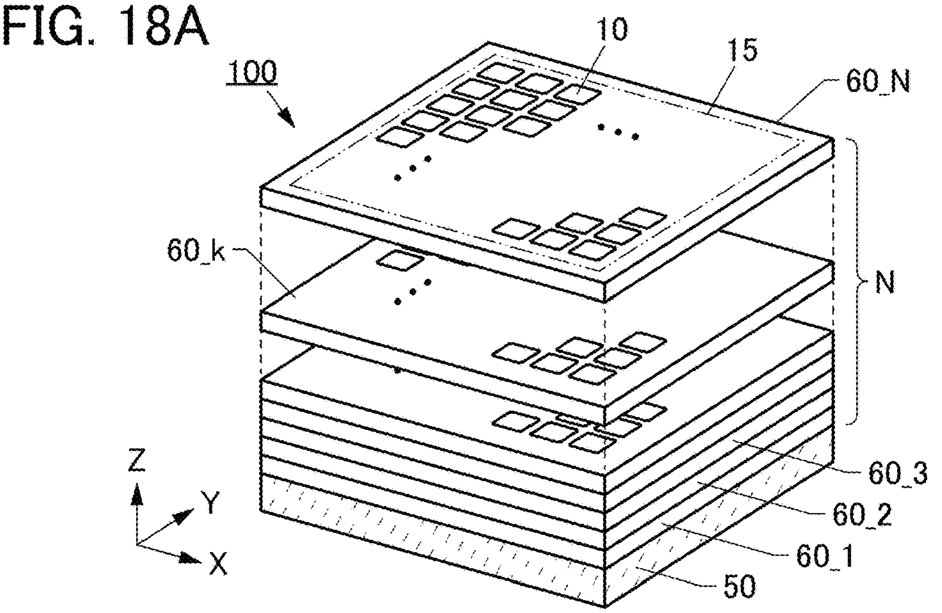
FIG. 18A is a perspective view illustrating a configuration example of a semiconductor device.
Figure 18B:
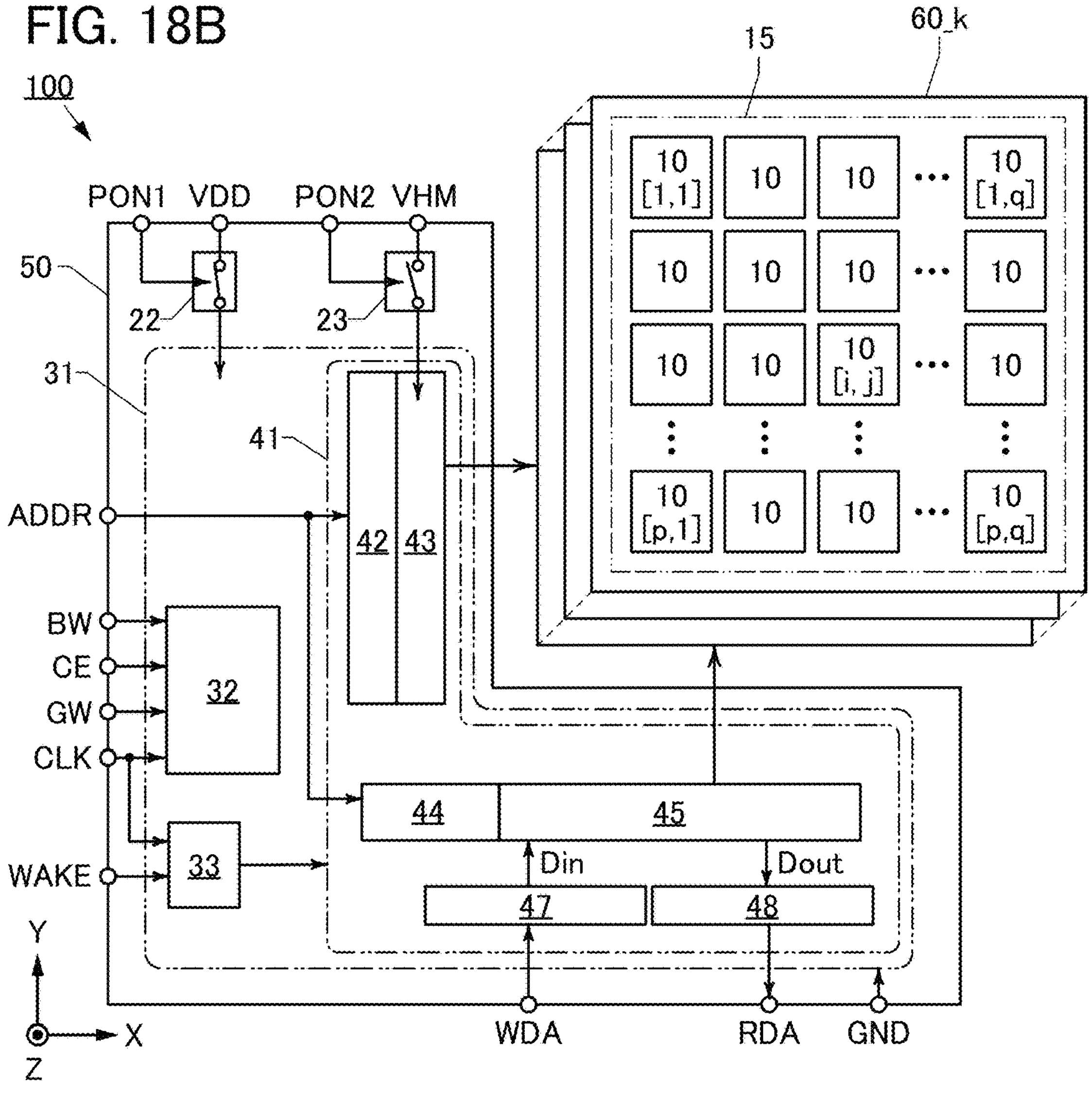
FIG. 18B is a block diagram illustrating a configuration example of a semiconductor device.

FIG. 18A is a schematic perspective view illustrating a configuration example of a memory device 100. FIG. 18B is a block diagram illustrating a configuration example of the memory device 100. The memory device 100 includes a driver circuit layer 50 and N memory layers 60 (N is an integer greater than or equal to 1).

The N memory layers 60 are provided over the driver circuit layer 50. Providing the N memory layers 60 over the driver circuit layer 50 can reduce the area occupied by the memory device 100. Furthermore, storage capacity per unit area can be increased.

In this embodiment and the like, the first memory layer 60 is denoted by a memory layer 60_1, the second memory layer 60 is denoted by a memory layer 60_2, and the third memory layer 60 is denoted by a memory layer 60_3. Furthermore, the k-th memory layer 60 (k is an integer greater than or equal to 1 and less than or equal to N) is denoted by a memory layer 60_*k*, and the N-th memory layer 60 is denoted by a memory layer 60_N. Note that in this embodiment and the like, "memory layer 60" is simply stated in some cases to describe a matter related to all the N memory layers 60 or show a matter common to the N memory layers 60.

<Configuration Example of Driver Circuit Layer 50>

The driver circuit layer 50 includes a PSW 22 (power switch), a PSW 23, and a peripheral circuit 31. The peripheral circuit 31 includes a peripheral circuit 41, a control circuit 32, and a voltage generation circuit 33.

In the memory device 100, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 32.

The control circuit 32 is a logic circuit having a function of controlling the overall operation of the memory device 100. For example, the control circuit 32 performs logical operation on the signal CE, the signal GW, and the signal BW to determine an operation mode of the memory device 100 (e.g., a writing operation and a reading operation). The control circuit 32 generates a control signal for the peripheral circuit 41 so that the operation mode is executed.

The voltage generation circuit 33 has a function of generating a negative voltage. The signal WAKE has a function of controlling the input of the signal CLK to the voltage generation circuit 33. For example, when an H-level signal is supplied as the signal WAKE, the signal CLK is input to the voltage generation circuit 33, and the voltage generation circuit 33 generates a negative voltage.

The peripheral circuit 41 is a circuit for writing and reading data to/from memory cells 10. The peripheral circuit 41 includes a row decoder 42, a column decoder 44, a row driver 43, a column driver 45, an input circuit 47, and an output circuit 48.

The row decoder 42 and the column decoder 44 have a function of decoding the signal ADDR. The row decoder 42 is a circuit for specifying a row to be accessed, and the column decoder 44 is a circuit for specifying a column to be accessed.

The row driver 43 has a function of selecting a wiring WWL (write word line) or a wiring RWL (read word line) specified by the row decoder 42. Note that the row driver 43 can be one or both of the circuit WSD and the circuit XCS described in the above embodiment, for example.

The column driver 45 has a function of writing data to the memory cells 10, a function of reading data from the memory cells 10, and a function of retaining the read data. The column driver 45 has a function of selecting a wiring BL (write and read bit line) specified by the column decoder 44. Note that the column driver 45 can be one or both of the circuit WCS and the circuit ITS described in the above embodiment, for example.

The input circuit 47 has a function of retaining the signal WDA. Data retained by the input circuit 47 (the first data in the above embodiment) is output to the column driver 45. Data output from the input circuit 47 is data (Din) to be written to the memory cells 10. Data (Dout) read from the memory cells 10 by the column driver 45 is output to the output circuit 48. Note that the read data (Dout) is treated as arithmetic result data in the above embodiment. The output circuit 48 has a function of retaining Dout. The output circuit

48 also has a function of outputting Dout to the outside of the memory device 100. Data output from the output circuit 48 is the signal RDA.

The PSW 22 has a function of controlling supply of VDD to the peripheral circuit 31. The PSW 23 has a function of controlling supply of VHM to the row driver 43. Here, in the memory device 100, a high power supply voltage is VDD and a low power supply voltage is GND (a ground potential). In addition, VHM is a high power supply voltage used to set the word line at high level and is higher than VDD. The on state and the off state of the PSW 22 are switched by the signal PON1, and the on state and the off state of the PSW 23 are switched by the signal PON2. The number of power domains to which VDD is supplied is one in the peripheral circuit 31 in FIG. 1B but can be more than one. In that case, a power switch is provided for each power domain.

<Configuration Example of Memory Layer 60>

A configuration example of the N memory layers 60 is described. The N memory layers 60 each include a memory array 15. The memory array 15 includes a plurality of memory cells 10. FIG. 18A and FIG. 18B illustrate an example in which the memory array 15 includes a plurality of memory cells 10 arranged in a matrix of p rows and q columns (each of p and q is an integer greater than or equal to 2). The memory cell 10 is sometimes replaced with the term "memory element" in other descriptions, for example.

Note that the memory cell 10 corresponds to the cell IM in Embodiment 1, for example. Note that the rows and the columns extend in directions orthogonal to each other. In this embodiment, the X direction is referred to as a "row" and the Y direction is referred to as a "column"; however, the X direction may be referred to as a "column" and the Y direction may be referred to as a "row".

In FIG. 18B, the memory cell 10 provided in the first row and the first column is denoted as a memory cell 10[1,1], and the memory cell 10 provided in the p-th row and the q-th column is denoted as a memory cell 10[*p*,*q*]. The memory cell 10 provided in the i-th row and the j-th column (here, i is an integer greater than or equal to 1 and less than or equal to p, and j is an integer greater than or equal to 1 and less than or equal to q) is denoted as a memory cell 10[*i*,*j*].

Figure 19A:
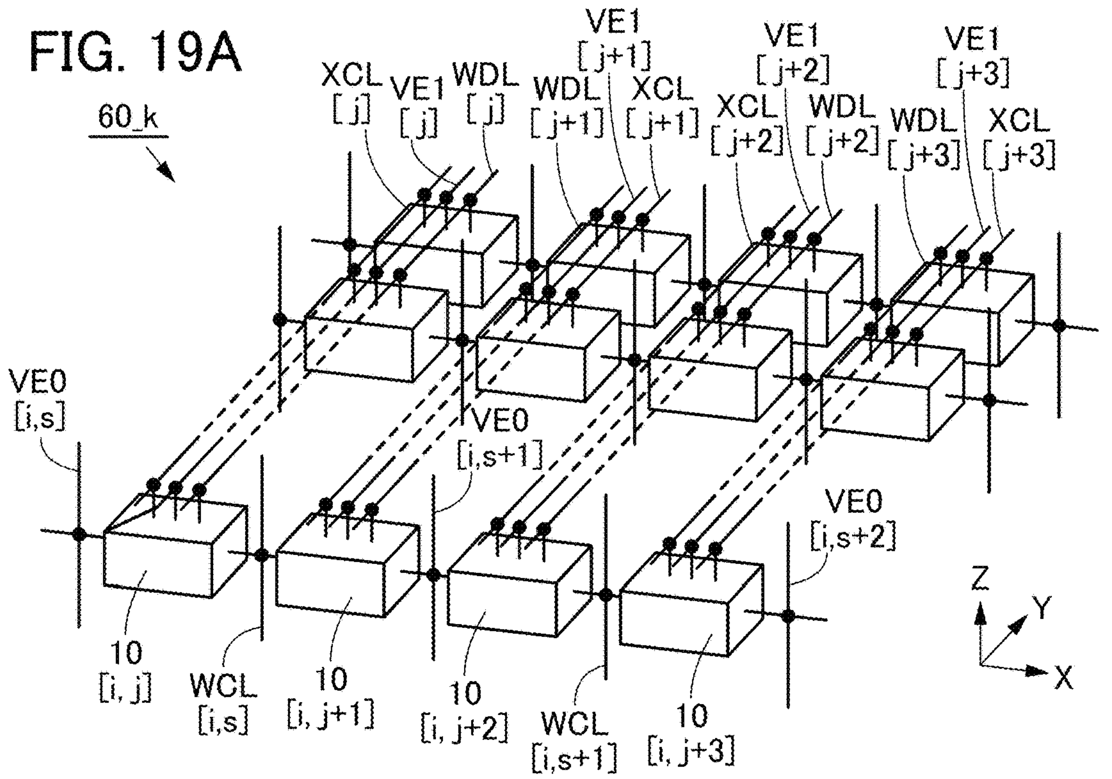
FIG. 19A is an enlarged perspective block diagram of part of a memory layer.
Figure 19B:
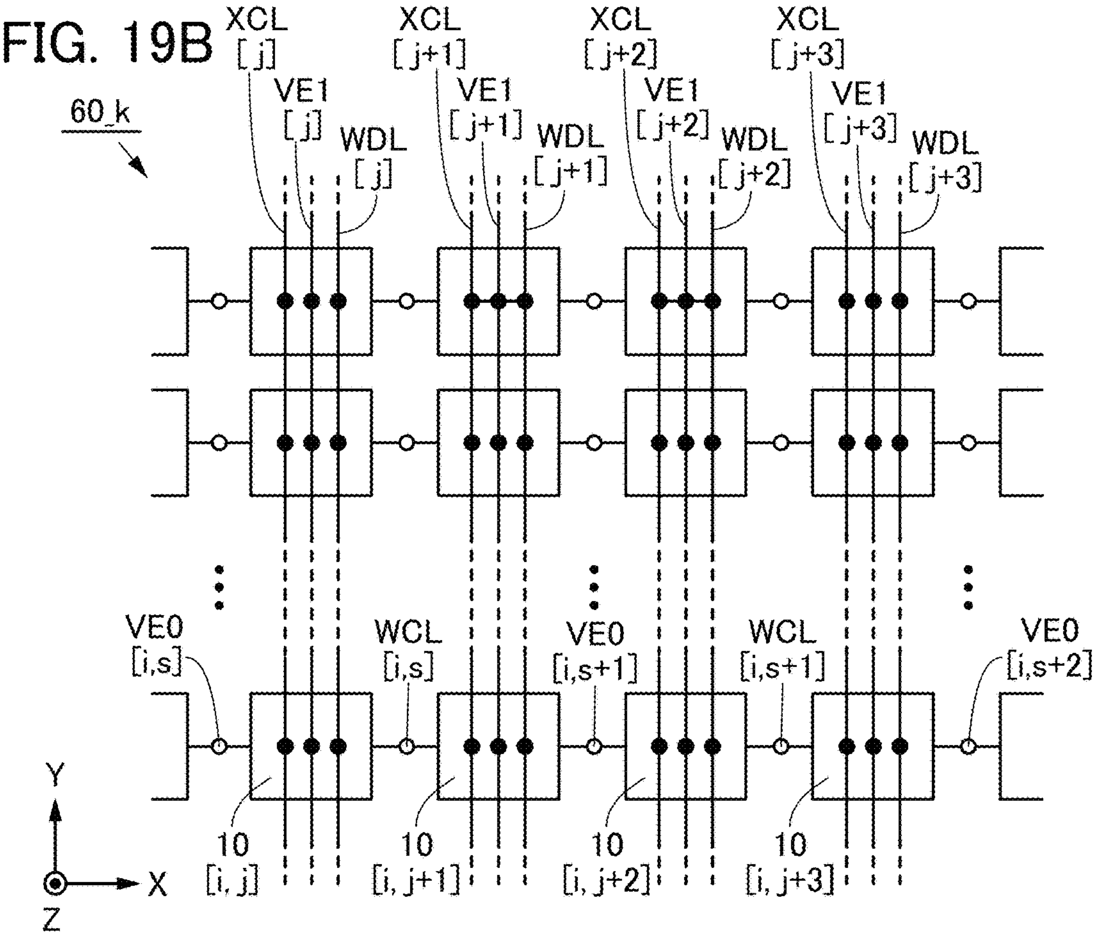
FIG. 19B is a plan view of part of a memory layer seen from the Z direction.

FIG. 19A is an enlarged perspective block diagram of part of the memory layer 60_*k*. FIG. 19B is a plan view of the portion corresponding to FIG. 19A seen from the Z direction. Each of the memory layers 60 includes q wirings WDL extending in the Y direction (column direction), q wirings XCL extending in the Y direction (column direction), and q wirings VE1 extending in the Y direction (column direction). In FIG. 19A and FIG. 19B, the wiring WDL provided in the j-th column is denoted as a wiring WDL[j], the wiring XCL provided in the j-th column is denoted as a wiring XCL[j], and the wiring VE1 provided in the j-th column is denoted as a wiring VE1[*j*]. The wiring WDL[j], the wiring XCL[j], and the wiring VE1[*j*] are electrically connected to the memory cells 10 provided in the j-th row.

Note that in this embodiment, the wiring WDL illustrated in FIG. 19A and FIG. 19B functions as a first write word line. The wiring WDL illustrated in FIG. 19A and FIG. 19B corresponds to the wiring WDL[1] to the wiring WDL[m] extended in the cell array CA of Embodiment 1.

In this embodiment, the wiring XCL illustrated in FIG. 19A and FIG. 19B functions as a first read word line. In Embodiment 1 and Embodiment 2, the wiring XCL illustrated in FIG. 19A and FIG. 19B corresponds to the wiring XCL[1] to the wiring XCL[m] extended in the cell array CA of Embodiment 1.

In this embodiment, the wiring VE1 illustrated in FIG. 19A and FIG. 19B functions as a wiring for supplying a constant potential. The wiring VE1 illustrated in FIG. 19A and FIG. 19B corresponds to the wiring VE1 extended in the cell array CA of Embodiment 1. Note that the wiring VE1 illustrated in FIG. 19A and FIG. 19B may be a wiring for supplying a high-level potential or a low-level potential instead of a constant potential. In that case, the wiring VE1 functions as the first write word line or the first read word line.

The memory layer 60 includes the wirings WCL and wirings VE0. The wirings WCL and the wirings VE0 extend in the Z direction (perpendicular direction), and are each provided in a matrix of p rows and R columns (R is an integer depending on q and will be described later in detail) in the plan view. In FIG. 19A and FIG. 19B, the wiring WCL and the wiring VE0 provided in the i-th row and the s-th column (s is an integer greater than or equal to 1 and less than or equal to R) are denoted as a wiring WCL[i,s] and a wiring VE0[*i*,*s*].

In this embodiment, the wiring WCL illustrated in FIG. 19A and FIG. 19B functions as a write and read bit line. The wiring WCL illustrated in FIG. 19A and FIG. 19B corresponds to the wiring WCL[1] to the wiring WCL[n] extended in the cell array CA of Embodiment 1.

In this embodiment, the wiring VE0 illustrated in FIG. 19A and FIG. 19B functions as a wiring for supplying a constant potential. The wiring VE0 illustrated in FIG. 19A and FIG. 19B corresponds to the wiring VE0 extended in the cell array CA of Embodiment 1.

In the memory layer 60_*k*, one wiring WCL is electrically connected to two memory cells 10. One wiring VE0 is electrically connected to two memory cells 10. Two adjacent memory cells 10 share one wiring WCL and one wiring VE0, whereby the area occupied by the memory array 15 can be reduced. In addition, the integration degree of the memory cells 10 is increased, so that the storage capacity of the memory device 100 can be increased.

In FIG. 19A and FIG. 19B, the wiring WCL[i,s] is electrically connected to the memory cell 10[*i*,*j*] and the memory cell 10[*i*,*j*+1]. Specifically, the wiring WCL[i,s] is electrically connected to the memory cell 10[*i*,2×s−1]_k and the memory cell 10[*i*,2×s]_k.

In FIG. 19A and FIG. 19B, the wiring VE0[*i*,*s*+1] is electrically connected to the memory cell 10[*i*,*j*+1] and the memory cell 10[*i*,*j*+2]. Note that the memory cell [i,j] is electrically connected to the wiring VE0[*i*,*s*], and the memory cell [i,j+3] is electrically connected to the wiring VE0[*i*,*s*+2].

The relation between R and q, which represent the positions of columns, can be expressed by (3.1) or (3.2) below in the case where q is an odd number.

[Formula 23]

$$R = \frac{q+1}{2} \tag{3.1}$$

[Formula 24]

$$q = 2R - 1 \tag{3.2}$$

The relation between R and q, which represent the positions of columns, can be expressed by (3.3) or (3.4) below in the case where q is an even number.

[Formula 25]

$$R = \frac{q}{2} \tag{3.3}$$

[Formula 26]

$$q = 2R \tag{3.4}$$

In the case where j is an odd number, s and j, which represent the positions of columns, can be expressed by (3.5) or (3.6) below.

[Formula 27]

$$s = \frac{j+1}{2} \tag{3.5}$$

[Formula 28]

$$j = 2s - 1 \tag{3.6}$$

In the case where j is an even number, s and j, which represent the positions of columns, can be expressed by (3.7) or (3.8) below.

[Formula 29]

$$s = \frac{j}{2} \tag{3.7}$$

[Formula 30]

$$j = 2s \tag{3.8}$$

Figure 20A:
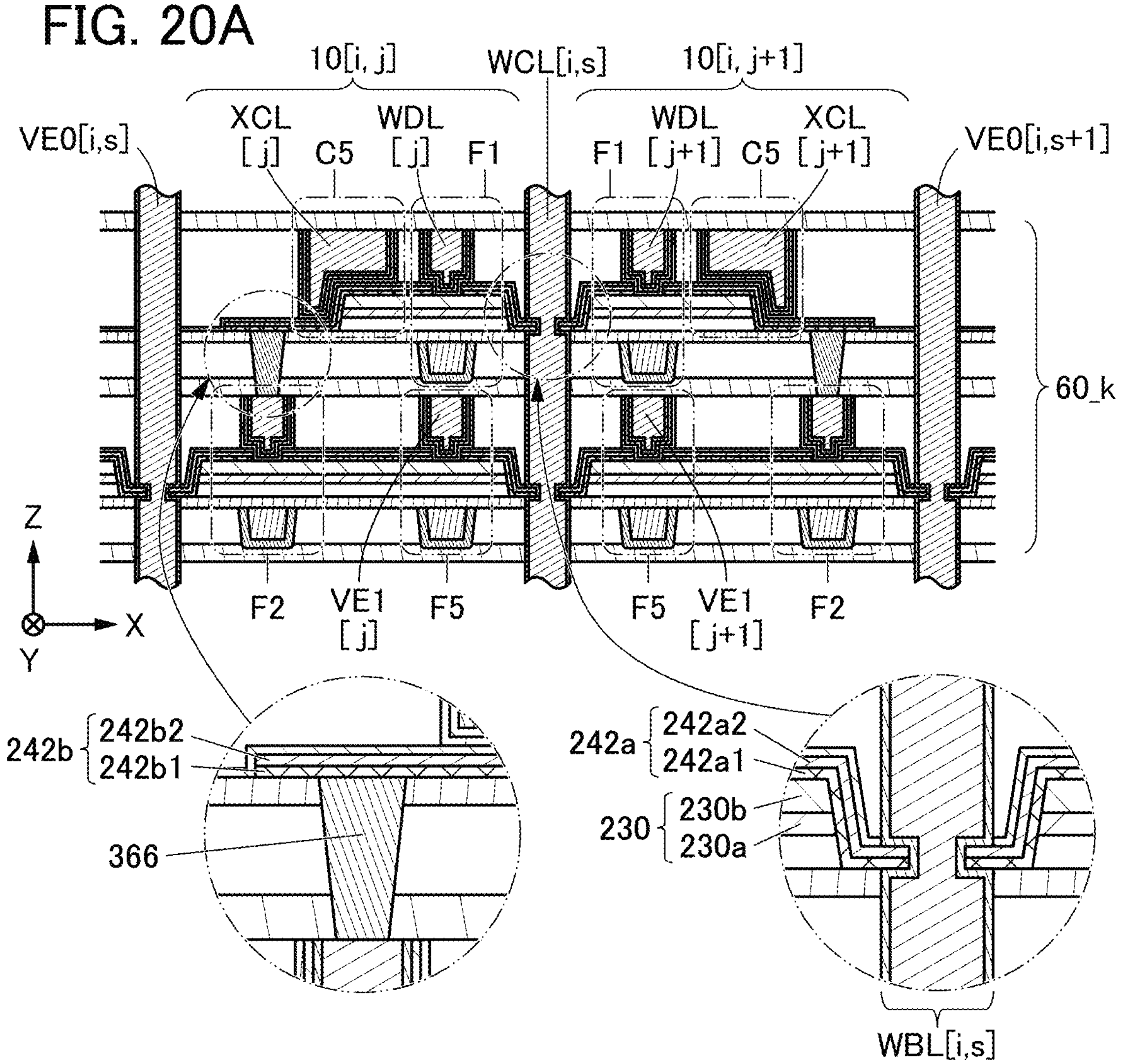
FIG. 20A is a schematic cross-sectional view of memory cells.
Figure 20B:
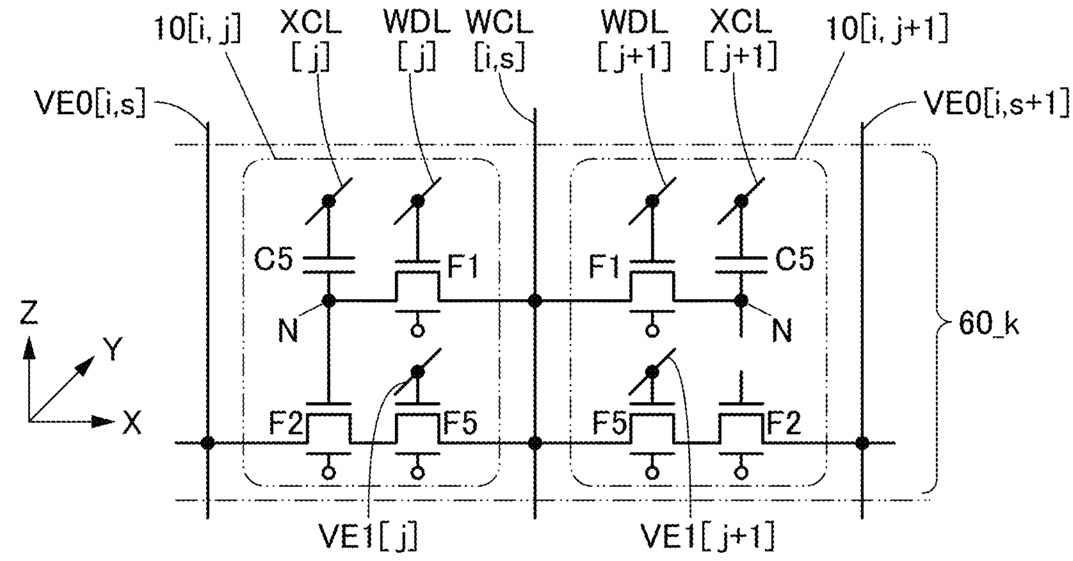
FIG. 20B illustrates a circuit configuration example of memory cells.

FIG. 20A is a schematic cross-sectional view of the memory cell 10[*i,j*] and the memory cell 10[*i,j*+1] in the memory layer 60_*k*. FIG. 20B illustrates a circuit configuration example of FIG. 20A. Note that FIG. 20A shows enlarged parts of the schematic cross-sectional view.

Like the cell IM described in Embodiment 1, the memory cell 10[*i,j*] includes the transistor F1, the transistor F2, the transistor F5, and the capacitor C5. A memory cell composed of three transistors and one capacitor is also referred to as a 3Tr1C memory cell. Thus, the memory cell 10 shown in this embodiment is a 3Tr1C memory cell.

In the memory cell 10[*i,j*], the gate of the transistor F1 is electrically connected to the wiring WDL[j], and the first terminal of the transistor F1 is electrically connected to the wiring WCL[i,s]. Note that FIG. 20A illustrates a structure example in which part of the wiring WDL[j] functions as the gate of the transistor F1. The gate of the transistor F2 is electrically connected to the first terminal of the capacitor C5, the first terminal of the transistor F2 is electrically connected to the first terminal of the transistor F5, and the second terminal of the transistor F2 is electrically connected to the wiring VE0[*i,s*]. The first terminal of the transistor F5 is electrically connected to the wiring WCL[i,s]. The second terminal of the capacitor C5 is electrically connected to the wiring XCL[j]. Note that FIG. 20A and the like illustrate a structure example in which part of the wiring XCL[j] functions as the second terminal of the capacitor C5. The gate of the transistor F5 is electrically connected to the wiring VE1[*j*]. Note that FIG. 20A and the like illustrate a structure example in which part of the wiring VE1[*j*] functions as the gate of the transistor F5.

In the memory cell 10[*i,j*+1], the gate of the transistor F1 is electrically connected to the wiring WDL[j+1], and the first terminal of the transistor F1 is electrically connected to the wiring WCL[i,s]. Note that FIG. 20A illustrates a structure example in which part of the wiring WDL[j+1] functions as the gate of the transistor F1. The gate of the transistor F2 is electrically connected to the first terminal of the capacitor C5, the first terminal of the transistor F2 is electrically connected to the first terminal of the transistor F5, and the second terminal of the transistor F2 is electrically connected to the wiring VE0[*i,s*+1]. The first terminal of the transistor F5 is electrically connected to the wiring WCL[i,s]. The second terminal of the capacitor C5 is electrically connected to the wiring XCL[j+1]. Note that FIG. 20A and the like illustrate a structure example in which part of the wiring XCL[j+1] functions as the second terminal of the capacitor C5. The gate of the transistor F5 is electrically connected to the wiring VE1[*j*+1]. Note that FIG. 20A and the like illustrate a structure example in which part of the wiring VE1[*j*+1] functions as the gate of the transistor F5.

In the memory cell 10[*i,j*] and the memory cell 10[*i,j*+1], a region in which the first terminal of the capacitor C5, the first terminal of the transistor F1, and the gate of the transistor F2 are electrically connected to each other and which always has the same potential is referred to as the "node N".

As illustrated in FIG. 20A and FIG. 20B, a transistor having a back gate may be used as the transistor F1, the transistor F2, and the transistor F5. The gate and the back gate are placed such that a channel formation region of a semiconductor is sandwiched between the gate and the back gate. The gate and the back gate are formed using conductors. The back gate can function like the gate. By changing the potential of the back gate, the threshold voltage of the transistor can be changed. The potential of the back gate may be the same as the potential of the gate or may be a ground potential or a given potential.

The gate and the back gate are formed using conductors and thus also have a function of preventing an electric field generated outside the transistor from affecting the semiconductor in which a channel is formed (in particular, a function of preventing static electricity). That is, it is possible to prevent a variation in the electrical characteristics of the transistor due to the influence of an external electric field such as static electricity. Moreover, providing the back gate enables a reduction in the amount of change in the threshold voltage of the transistor before and after a bias-temperature stress test (sometimes referred to as a BT test).

For example, when a transistor including a back gate is used as the transistor F1, the transistor F1 is less affected by an external electric field and can be stably maintained in the off state. Thus, data written to the node N can be stably retained. Providing the back gate stabilizes the operation of the memory cell 10, so that the reliability of a memory device including the memory cells 10 can be increased.

For a semiconductor layer in which the channel of the transistor F1, the transistor F2, and the transistor F5 is formed, a single crystal semiconductor, a polycrystalline semiconductor, a microcrystalline semiconductor, or an amorphous semiconductor can be used alone, or two or more of them can be used in combination. As a semiconductor material, silicon, germanium, or the like can be used, for example, as has been described in Embodiment 1. Alternatively, a compound semiconductor such as silicon germanium, silicon carbide, gallium arsenide, an oxide semiconductor, or a nitride semiconductor may be used.

Each of the transistor F1, the transistor F2, and the transistor F5 is preferably a transistor using an oxide semiconductor, which is a kind of metal oxide, in a semiconductor layer where a channel is formed (such a transistor is also referred to as an OS transistor). An oxide semiconductor has a band gap higher than or equal to 2 eV, achieving an extremely low off-state current. Thus, power consumption of the memory cells 10 can be reduced. Accordingly, power consumption of the memory device 100 including the memory cells 10 can be reduced.

A memory cell including an OS transistor can be referred to as an "OS memory". The memory device 100 including the memory cell can also be referred to as an "OS memory".

The OS transistor operates stably even in a high-temperature environment and has small fluctuation in characteristics. For example, the off-state current hardly increases even in a high-temperature environment. Specifically, the off-state current hardly increases even at an environmental temperature higher than or equal to room temperature and lower than or equal to 200° C. Furthermore, the on-state current is less likely to decrease even in a high-temperature environment. Thus, the OS memory can operate stably and have high reliability even in a high-temperature environment.

In the cross-sectional structure example illustrated in FIG. 20A, a conductor 242*a* (a conductor 242*al* and a conductor 242*a*2) including a region functioning as one of the source electrode and the drain electrode of the transistor F1 extends beyond an oxide 230 (an oxide 230*a* and an oxide 230*b*) functioning as a semiconductor layer. Thus, a conductor 242 functions also as a wiring. In FIG. 20A, part of the top surface, part of a side surface, and part of the bottom surface of the conductor 242*a* are in electrical contact with the wiring WCL[i,s], which extends in the Z direction.

When the wiring WCL[i,s] is directly in contact with one or more selected from the top surface, the side surface, and the bottom surface of the conductor 242*a*, an electrode for connection does not need to be provided separately; thus, the area occupied by the memory array 15 can be reduced. In addition, the integration degree of the memory cells 10 is increased, so that the storage capacity of the memory device 100 can be increased. Note that the wiring WCL[i,s] is preferably in contact with two or more of the top surface, the side surface, and the bottom surface of the conductor 242*a*. When the wiring WCL[i,s] is in contact with a plurality of surfaces of the conductor 242*a*, the contact resistance between the wiring WCL[i,s] and the conductor 242*a* can be reduced.

A conductor 242*b* (a conductor 242*b*1 and a conductor 242*b*2) including a region functioning as the second terminal of the transistor F1 extends beyond the oxide 230 (the oxide 230*a* and the oxide 230*b*) functioning as the semiconductor layer. In the cross-sectional structure example illustrated in FIG. 20A, a conductor 366 is provided in contact with the bottom surface of the conductor 242*b*. The conductor 242*b* and the gate of the transistor F2 are electrically connected to each other through the conductor 366.

When the conductor 366 is provided in a region overlapping with the conductor 242*b* to electrically connect the conductor 242*b* and a conductor in a lower layer, their connection distance can be shortened. Moreover, the number of wirings needed to configure the memory cell 10 can be reduced. Thus, the area occupied by the memory cell 10 can be reduced. Accordingly, the storage capacity and memory density of the memory device can be increased.

The second terminal of the transistor F5 is electrically connected to the wiring WCL[is] with a structure similar to that of the second terminal of the transistor F1. Specifically, the second terminal of the transistor F5 is electrically connected to the wiring WCL[i,s] through a conductor including a region functioning as the second terminal of the transistor F5. As in the transistor F1, part of one or more selected from the top surface, a side surface, and the bottom surface of the conductor is preferably in contact with the wiring WCL[i,s].

The second terminal of the transistor F2 is electrically connected to the wiring VE0[*i,s*] with a structure similar to that of the first terminal of the transistor F1. Specifically, the second terminal of the transistor F2 is electrically connected to the wiring VE0[*i,s*] through a conductor including a region functioning as the second terminal of the transistor F2. Part of one or more selected from the top surface, a side surface, and the bottom surface of the conductor is preferably in contact with the wiring VE0[*i,s*].

Figure 21:
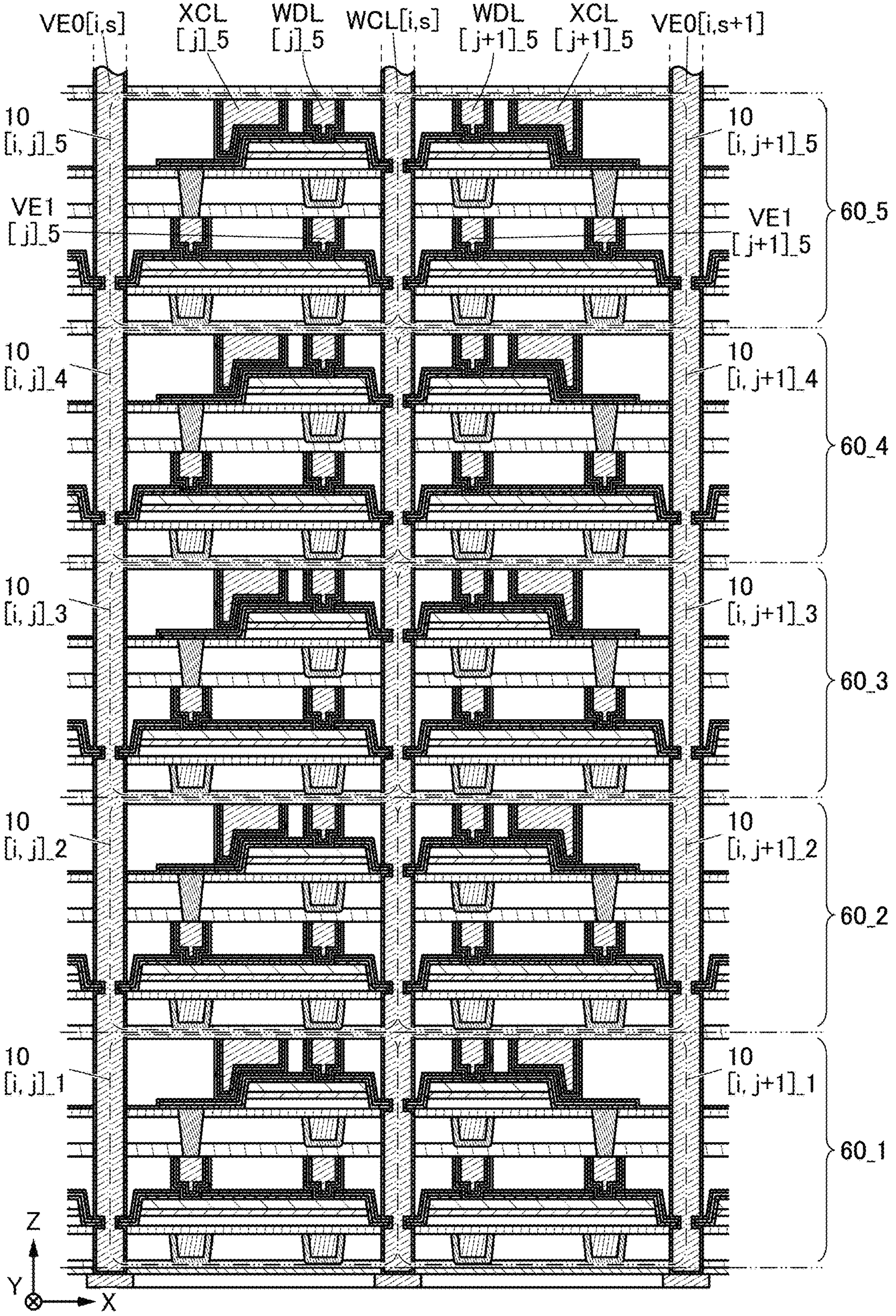
FIG. 21 is a diagram illustrating a cross-sectional structure example of memory layers.
Figure 22:
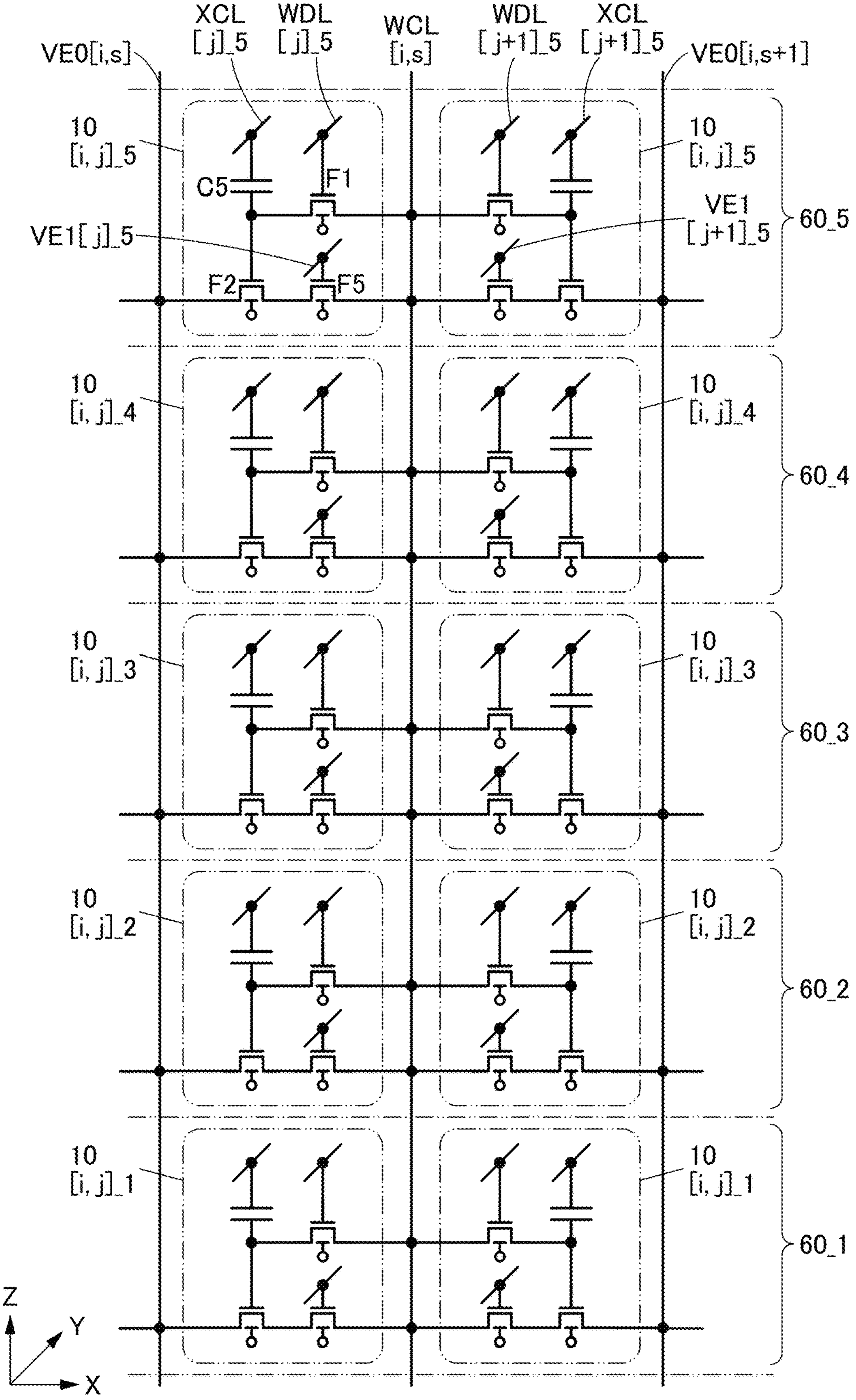
FIG. 22 is a diagram illustrating a circuit configuration example of memory layers.

FIG. 21 illustrates an example of a cross-sectional structure in which the memory layer 60_1 to the memory layer 60_5 are stacked. FIG. 22 illustrates a circuit configuration example of FIG. 21. In FIG. 21 and FIG. 22, the memory cells 10[*i,j*] included in the memory layer 60_1 to the memory layer 60_5 are respectively denoted as a memory cell 10[*i,j*]_1 to a memory cell 10[*i,j*]_5. The wiring WDL[j] included in the memory layer 60_5 is denoted as a wiring WDL[j]_5, the wiring XCL[j] included in the memory layer 60_5 is denoted as a wiring XCL[j]_5, and the wiring VE0[*j*] included in the memory layer 60_5 is denoted as a wiring VE0[*j*]_5. The wiring WDL[j+1] included in the memory layer 60_5 is denoted as a wiring WDL[j+1]_5, the wiring XCL[j+1] included in the memory layer 60_5 is denoted as a wiring XCL[j+1]_5, and the wiring VE0[*j*+1] included in the memory layer 60_5 is denoted as a wiring VE0[*j*+1]_5.

Although FIG. 21 and FIG. 22 illustrate a structure example in which five memory layers 60 are stacked, the number of stacked memory layers 60 is not limited to five. Increasing the number of stacked memory layers 60 can increase the storage capacity of the memory device 100 without an increase in the area occupied by the memory cells 10. Thus, the area per bit is reduced, so that a small-sized memory device with large storage capacity can be achieved.

Note that in the case where the memory device 100 is used as the arithmetic circuit described in Embodiment 1, the sum of products can be calculated with the circuit configuration illustrated in FIG. 22. Specifically, in FIG. 22, the memory cell 10[*i,j*]_1 to the memory cell 10[*i,j*]_5 and the memory cell 10[*i,j*+1]_1 to the memory cell 10[*i,j*+1]_5 serve as arithmetic cells, and a current with an amount corresponding to the sum of products flows through the wiring WCL[i,s]; hence, the memory device 100 can be used as an arithmetic circuit like the arithmetic circuit described in Embodiment 1.

Next, structure examples of the transistors and the capacitor included in the memory cell 10 will be described in detail in another embodiment.

Note that this embodiment can be combined with any of the other embodiments in this specification as appropriate.

Embodiment 4

In this embodiment, a structure example of a semiconductor device that can be used for the memory cell 10 of one embodiment of the present invention will be described with reference to drawings. The semiconductor device described in this embodiment includes transistors and capacitors.

<Structure Example of Semiconductor Device>

A structure example of a semiconductor device including transistors and capacitors is described with reference to FIG. 23. FIG. 23A to FIG. 23D are a top view and cross-sectional views of a semiconductor device including a transistor 200*a*, a transistor 200*b*, a capacitor 150*a*, and a capacitor 150*b*.

The transistor 200*a* or the transistor 200*b* can be used as the transistor F1 and the transistor F2 described in the above embodiment. The capacitor 150*a* and the capacitor 150*b* can be used as the capacitor C5 described in the above embodiment.

Figure 23A:
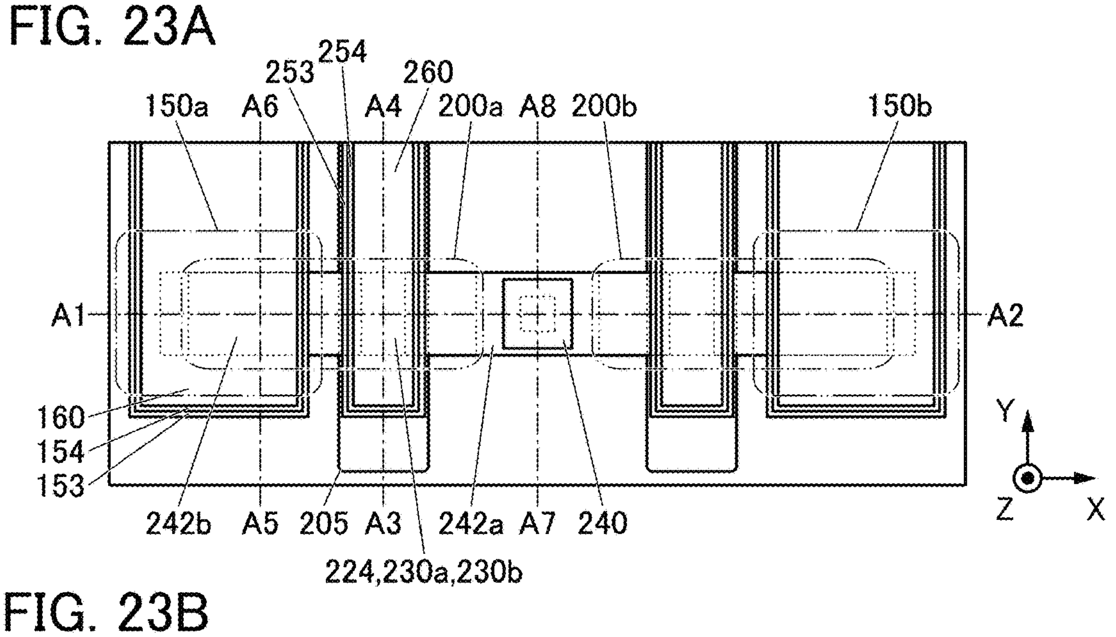
FIG. 23A to FIG. 23D are diagrams illustrating structure examples of a semiconductor device.
Figure 23B:
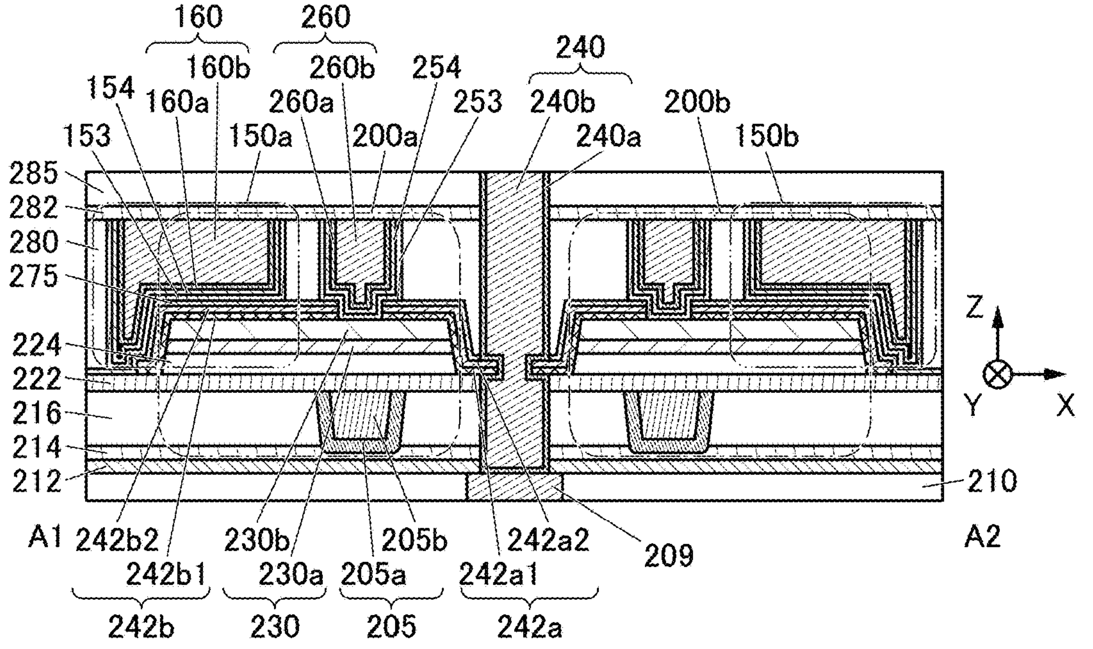
Figure 23C:
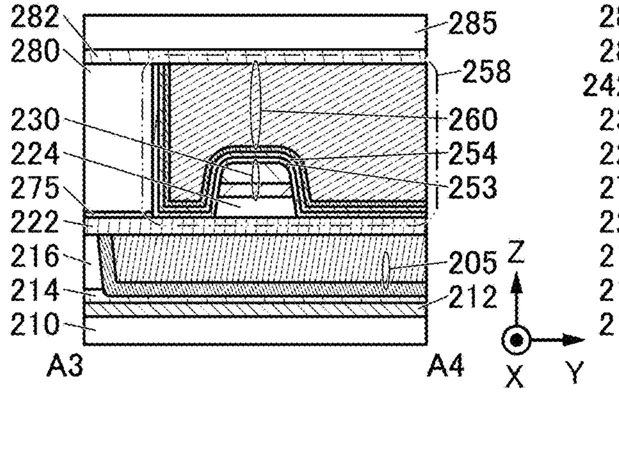
Figure 23D:
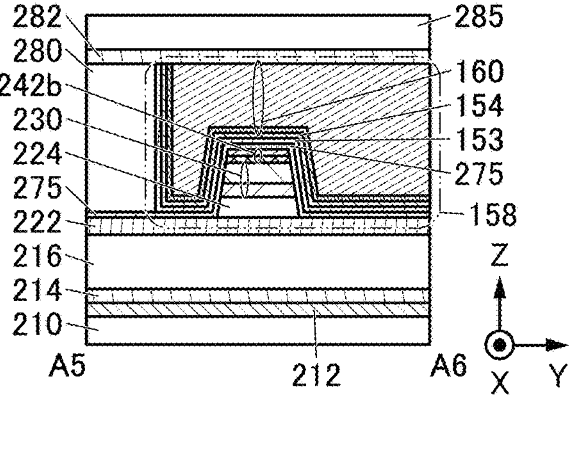

FIG. 23A is a plan view of the semiconductor device. FIG. 23B to FIG. 23D are cross-sectional views of the semiconductor device. Here, FIG. 23B is a cross-sectional view of a portion indicated by the dashed-dotted line A1-A2 in FIG. 23A, is a cross-sectional view of the transistor 200*a* and the transistor 200*b* in the channel length direction, and is also a cross-sectional view of the capacitor 150*a* and the capacitor 150*b*. FIG. 23C is a cross-sectional view of a portion indicated by the dashed-dotted line A3-A4 in FIG. 23A, and is a cross-sectional view of the transistor 200*a* in the channel width direction. FIG. 23D is a cross-sectional view of a portion indicated by the dashed-dotted line A5-A6 in FIG. 23A, and is a cross-sectional view of the transistor 200*a* and the capacitor 150*a* in the channel width direction. Note that for simplification of the drawing, some components are not illustrated in the plan view of FIG. 23A.

The X direction illustrated in FIG. 23A is a direction parallel to the channel length direction of the transistor 200*a* and the channel length direction of the transistor 200*b*.

The semiconductor device of one embodiment of the present invention includes an insulator 214 over a substrate (not illustrated); the transistor 200*a*, the transistor 200*b*, the capacitor 150*a*, and the capacitor 150*b* over the insulator 214; an insulator 280 over an insulator 275 provided in the transistor 200*a* and the transistor 200*b*; an insulator 282 over the capacitor 150*a*, the capacitor 150*b*, and the insulator 280; an insulator 285 over the insulator 282; and a conductor 240 (a conductor 240*a* and a conductor 240*b*). The insulator 214, the insulator 280, the insulator 282, and the insulator 285 each function as an interlayer film. As illustrated in FIG. 23B, at least parts of the transistor 200*a*, the transistor 200*b*, the capacitor 150*a*, and the capacitor 150*b* are placed to be embedded in the insulator 280.

Here, the transistor 200*a* and the transistor 200*b* each include the oxide 230 functioning as a semiconductor layer, a conductor 260 functioning as a first gate (also referred to as top gate) electrode, a conductor 205 functioning as a second gate (also referred to as back gate) electrode, the conductor 242*a* functioning as one of a source electrode and a drain electrode, and the conductor 242*b* functioning as the other of the source electrode and the drain electrode. An insulator 253 and an insulator 254 functioning as a first gate insulator are also included. An insulator 222 and an insulator 224 functioning as a second gate insulator are also included. Note that the gate insulator is also referred to as a gate insulating layer or a gate insulating film in some cases.

Since the transistor 200*a* and the transistor 200*b* have the same structure, to describe a matter common to the transistor 200*a* and the transistor 200*b* in the following description, the alphabets are omitted from the reference numerals and the term "transistor 200" is used in some cases.

The first gate electrode and the first gate insulating film are placed in an opening 258 formed in the insulator 280 and the insulator 275. That is, the conductor 260, the insulator 254, and the insulator 253 are placed in the opening 258.

The capacitor 150*a* and the capacitor 150*b* each include the conductor 242*b* functioning as a lower electrode; the insulator 275, an insulator 153, and an insulator 154 functioning as a dielectric; and a conductor 160 functioning as an upper electrode. In other words, the capacitor 150*a* and the capacitor 150*b* each form a MIM (Metal-Insulator-Metal) capacitor.

Since the capacitor 150*a* and the capacitor 150*b* have the same structure, to describe a matter common to the capacitor 150*a* and the capacitor 150*b* in the following description, the alphabets are omitted from the reference numerals and the term "capacitor 150" is used in some cases.

The upper electrode and part of the dielectric of the capacitor 150 are placed in an opening 158 formed in the insulator 280. That is, the conductor 160, the insulator 154, and the insulator 153 are placed in the opening 158.

The semiconductor device of one embodiment of the present invention also includes the conductor 240 (the conductor 240*a* and the conductor 240*b*) that is electrically connected to the transistor 200 and functions as a plug. The conductor 240 includes a region in contact with the conductor 242*a*.

The semiconductor device of one embodiment of the present invention also includes an insulator 210 and a conductor 209 between the substrate (not illustrated) and the insulator 214. The conductor 209 is placed to be embedded in the insulator 210. The conductor 209 includes a region in contact with the conductor 240.

The semiconductor device of one embodiment of the present invention may include an insulator 212 between the insulator 214 and each of the insulator 210 and the conductor 209.

The semiconductor device including the transistor 200 and the capacitor 150 described in this embodiment can be used as a memory cell of a memory device. In this case, the conductor 240 may be electrically connected to a sense amplifier. Here, as illustrated in FIG. 23A, at least part of the capacitor 150 is provided to overlap with the oxide 230 included in the transistor 200. In such a manner, the capacitor 150 can be provided without a large increase in the area in the plan view; thus, the semiconductor device according to this embodiment can be miniaturized or highly integrated.

The semiconductor device described in this embodiment has a line-symmetric structure with respect to the dashed-dotted line A7-A8 illustrated in FIG. 23A. The conductor 242*a* serves as both one of the source electrode and the drain electrode of the transistor 200*a* and one of the source electrode and the drain electrode of the transistor 200*b*. With the above connection structure between the two transistors, the two capacitors, and the plug, a semiconductor device that can be miniaturized or highly integrated can be provided.

[Transistor 200]

As illustrated in FIG. 23A to FIG. 23D, the transistor 200 includes an insulator 216 over the insulator 214, the conductor 205 (a conductor 205*a* and a conductor 205*b*) placed to be embedded in the insulator 216, the insulator 222 over the insulator 216 and the conductor 205, the insulator 224 over the insulator 222, the oxide 230*a* over the insulator 224, the oxide 230*b* over the oxide 230*a*, the conductor 242*a* (the conductor 242*al* and the conductor 242*a*2) and the conductor 242*b* (the conductor 242*b*1 and the conductor 242*b*2) over the oxide 230*b*, the insulator 253 over the oxide 230*b*, the insulator 254 over the insulator 253, the conductor 260 (a conductor 260*a* and a conductor 260*b*) placed over the insulator 254 and overlapping with part of the oxide 230*b*, and the insulator 275 placed over the insulator 222, the insulator 224, the oxide 230*a*, the oxide 230*b*, the conductor 242*a*, and the conductor 242*b*.

Note that in this specification and the like, the oxide 230*a* and the oxide 230*b* are collectively referred to as the oxide 230 in some cases. The conductor 242*a* and the conductor 242*b* are collectively referred to as the conductor 242 in some cases.

The opening 258 reaching the oxide 230*b* is provided in the insulator 280 and the insulator 275. In other words, the opening 258 includes a region overlapping with the oxide 230*b*. Moreover, it can be said that the insulator 275 includes an opening overlapping with an opening included in the insulator 280. The insulator 253, the insulator 254, and the conductor 260 are placed in the opening 258. That is, the conductor 260 includes a region overlapping with the oxide 230*b* with the insulator 253 and the insulator 254 therebetween. The conductor 260, the insulator 253, and the insulator 254 are provided between the conductor 242*a* and the conductor 242*b* in the channel length direction of the transistor 200. The insulator 254 includes a region in contact with a side surface of the conductor 260 and a region in contact with the bottom surface of the conductor 260. As illustrated in FIG. 23C, the top surface of the insulator 222 is exposed in a region of the opening 258 that does not overlap with the oxide 230.

The oxide 230 preferably includes the oxide 230*a* placed over the insulator 224 and the oxide 230*b* placed over the oxide 230*a*. Including the oxide 230*a* under the oxide 230*b* makes it possible to inhibit diffusion of impurities into the oxide 230*b* from components formed below the oxide 230*a*.

Although a structure in which two layers, the oxide 230*a* and the oxide 230*b*, are stacked as the oxide 230 in the transistor 200 is described, the present invention is not limited thereto. For example, the oxide 230 may be provided as a single layer of the oxide 230*b* or to have a stacked-layer structure of three or more layers, or the oxide 230*a* and the oxide 230*b* may each have a stacked-layer structure.

The conductor 260 functions as the first gate electrode, and the conductor 205 functions as the second gate electrode. The insulator 253 and the insulator 254 function as the first gate insulator, and the insulator 222 and the insulator 224 function as the second gate insulator. The conductor 242*a* functions as one of the source electrode and the drain electrode, and the conductor 242*b* functions as the other of the source electrode and the drain electrode. At least part of a region of the oxide 230 overlapping with the conductor 260 functions as a channel formation region.

Figure 25A:
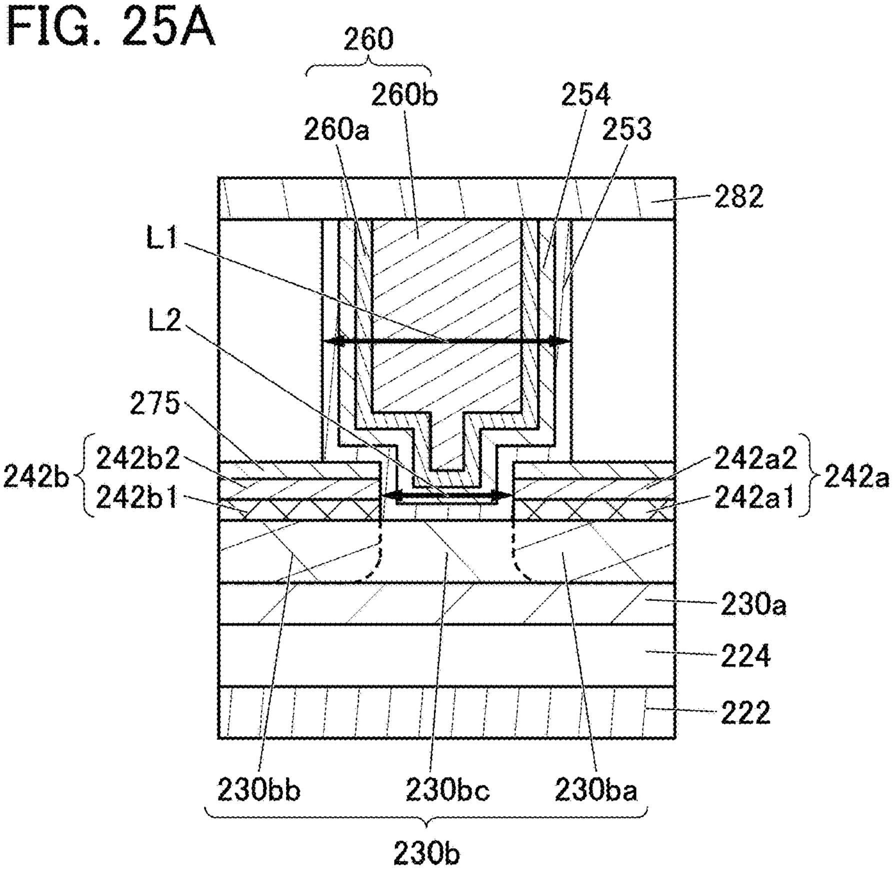
FIG. 25A to FIG. 25C are diagrams illustrating structure examples of a semiconductor device.

FIG. 25A is an enlarged view of the vicinity of the channel formation region in FIG. 23B. As illustrated in FIG. 25A, in the cross-sectional view of the transistor 200 in the channel length direction, a distance L2 between the conductor 242*a* and the conductor 242*b* is preferably smaller than the width of the opening 258. Here, the width of the opening 258 corresponds to a distance L1 between the interface between the insulator 280 and the insulator 253 on the conductor 242*a* side and the interface between the insulator 280 and the insulator 253 on the conductor 242*b* side, which is illustrated in FIG. 25A. In this embodiment, channel etching for the conductor 242*a* and the conductor 242*b* is performed after the formation of the opening 258, which will be described later in detail. With such a structure, an extremely small distance L2 between the conductor 242*a* and the conductor 242*b* (e.g., less than or equal to 60 nm, less than or equal to 50 nm, less than or equal to 40 nm, less than or equal to 30 nm, less than or equal to 20 nm, or less than or equal to 10 nm, and greater than or equal to 1 nm or greater than or equal to 5 nm) can be relatively easily achieved. Since the conductor 260 includes a region having the distance L1 larger than the distance L2, a reduction in the conductivity of the conductor 260 positioned in the region having the distance L1 can be inhibited and the conductor 260 can function as a wiring.

As illustrated in FIG. 25A and FIG. 23C, the opening 258 can be regarded as having a shape in which part of a component including the insulator 224, the oxide 230, the conductor 242, and the insulator 275 protrudes in an opening having the insulator 222 as its bottom surface and the insulator 280 as its side surface. Furthermore, it can be regarded that the region of the oxide 230 sandwiched between the conductor 242*a* and the conductor 242*b* is exposed in the component including the insulator 224, the oxide 230, the conductor 242, and the insulator 275.

As illustrated in FIG. 25A and FIG. 23C, the insulator 253 is provided in contact with the bottom surface and the inner wall of the opening 258. Accordingly, the insulator 253 is in contact with at least parts of the top surface of the insulator 222, a side surface of the insulator 224, a side surface of the oxide 230*a*, the top surface and a side surface of the oxide 230*b*, side surfaces of the conductor 242*a* and the conductor 242*b*, a side surface of the insulator 275, a side surface of the insulator 280, and the bottom surface of the insulator 254. The insulator 254 and the conductor 260 are stacked over the insulator 253. Thus, the insulator 253, the insulator 254, and the conductor 260 are provided to cover the parts of the conductor 242 and the insulator 275 that protrude in the opening 258.

The channel formation region is formed in a region corresponding to the distance L2 in the oxide 230*b*. Thus, the channel formation region of the transistor 200 is extremely minute. Hence, the on-state current of the transistor 200 increases, improving frequency characteristics.

Figure 25B:
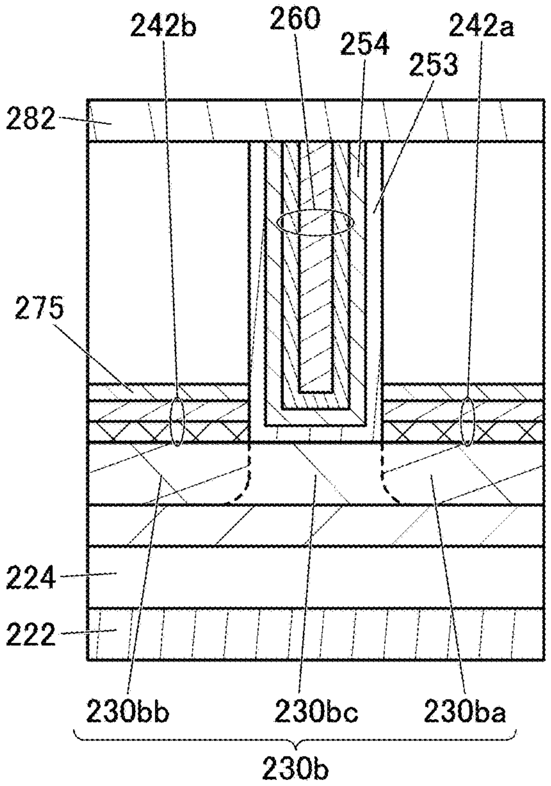

Note that the shape of the opening 258 is not limited to the shape illustrated in FIG. 25A. As illustrated in FIG. 25B, the opening 258 may have a shape such that the distance L1 and the distance L2 are equal to each other. In this case, as illustrated in FIG. 25B, the side surface of the conductor 242*a* and the side surface of the insulator 275 are substantially aligned with the side surface of the insulator 280. The side surface of the conductor 242*b* and the side surface of the insulator 275 are substantially aligned with the side surface of the insulator 280. With this structure, the manufacturing process of the semiconductor device can be simplified, and the productivity can be improved. Moreover, a plurality of transistors 200 can be provided with high density in a small area.

Figure 25C:
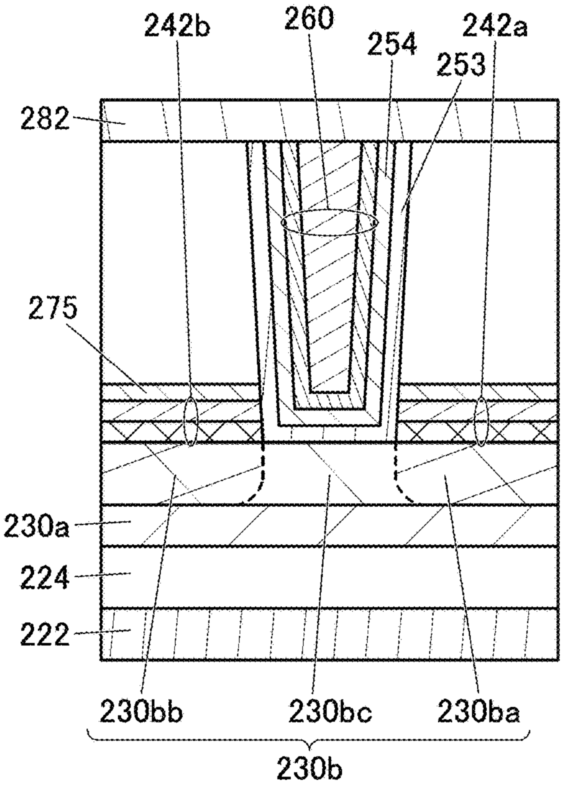

Although FIG. 25B illustrates a structure in which the sidewall of the opening 258 is substantially perpendicular to the top surface of the insulator 222, the present invention is not limited thereto. As illustrated in FIG. 25C, the sidewall of the opening 258 may have a tapered shape. When the sidewall of the opening 258 has a tapered shape, the coverage with the insulator 253 and the like can be improved in a later step, so that defects such as a void can be reduced.

In this specification and the like, a tapered shape indicates a shape in which at least part of a side surface of a component is inclined to a substrate surface. For example, a component preferably includes a region where the angle formed between the inclined side surface of the component and the substrate surface (the bottom surface) (hereinafter such an angle is sometimes referred to as a taper angle) is less than 90°. Note that the side surface of the component and the substrate surface (the bottom surface) are not necessarily completely flat and may be substantially flat with a slight curvature or substantially flat with slight unevenness.

As illustrated in FIG. 25A, the oxide 230*b* includes a region 230*bc* functioning as the channel formation region of the transistor 200, and a region 230*ba* and a region 230*bb* that are provided to sandwich the region 230*bc* and function as a source region and a drain region. At least part of the region 230*bc* overlaps with the conductor 260. In other words, the region 230*bc* is provided in a region between the conductor 242*a* and the conductor 242*b*. The region 230*ba* is provided to overlap with the conductor 242*a*, and the region 230*bb* is provided to overlap with the conductor 242*b*.

The region 230*bc* functioning as the channel formation region has a smaller amount of oxygen vacancies or a lower impurity concentration than those of the region 230*ba* and the region 230*bb*, and thus is a high-resistance region with a low carrier concentration. Thus, the region 230*bc* can be regarded as being i-type (intrinsic) or substantially i-type.

The region 230*ba* and the region 230*bb* functioning as the source region and the drain region include a large amount of oxygen vacancies or have a high concentration of impurities such as hydrogen, nitrogen, and a metal element, and thus are each a low-resistance region with an increased carrier concentration. In other words, the region 230*ba* and the region 230*bb* are each an n-type region having a higher carrier concentration and a lower resistance than the region 230*bc*. Here, as illustrated in FIG. 25A, side surfaces of the conductor 242*a* and the conductor 242*b* that face each other are preferably substantially perpendicular to the top surface of the oxide 230*b*. With such a structure, a side end portion of the region 230*ba* on the region 230*bc* side that is formed under the conductor 242*a* can be inhibited from excessively receding from a side end portion of the conductor 242*a* on the region 230*bc* side. Similarly, a side end portion of the region 230*bb* on the region 230*bc* side that is formed under the conductor 242*b* can be inhibited from excessively receding from a side end portion of the conductor 242*b* on the region 230*bc* side. This can inhibit formation of what is called an Loff region between the region 230*ba* and the region 230*bc* and between the region 230*bb* and the region 230*bc*. Here, recession of the side end portion of the region 230*ba* on the region 230*bc* side means that the side end portion of the region 230*ba* is positioned closer to the conductor 240 than the side surface of the conductor 242*a* on the region 230*bc* side is. In addition, recession of the side end portion of the region 230*bb* on the region 230*bc* side means that the side end portion of the region 230*bb* is positioned closer to the conductor 160 than the side surface of the conductor 242*b* on the region 230*bc* side is.

Accordingly, the frequency characteristics of the transistor 200 can be improved, and the operating speed of the semiconductor device of one embodiment of the present invention can be increased. For example, in the case where the semiconductor device of one embodiment of the present invention is used as a memory cell of a memory device, the writing speed and the reading speed can be increased.

Note that the carrier concentration of the region 230*bc* functioning as the channel formation region is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{-3}$. The lower limit of the carrier concentration of the region 230*bc* functioning as the channel formation region is not particularly limited and can be, for example, $1\times10^{-9}$ $cm^{-3}$.

Between the region 230*bc* and the region 230*ba* or between the region 230*bc* and the region 230*bb*, a region having a carrier concentration that is lower than or substantially equal to the carrier concentration of the region 230*ba* and the region 230*bb* and higher than or substantially equal to the carrier concentration of the region 230*bc* may be formed. That is, the region functions as a junction region between the region 230*bc* and the region 230*ba* or between the region 230*bc* and the region 230*bb*. The hydrogen concentration of the junction region is lower than or substantially equal to the hydrogen concentration of the region 230*ba* and the region 230*bb* and higher than or substantially equal to the hydrogen concentration of the region 230*bc* in some cases. The amount of oxygen vacancies in the junction region is smaller than or substantially equal to the amount of oxygen vacancies in the region 230*ba* and the region 230*bb* and larger than or substantially equal to the amount of oxygen vacancies in the region 230*bc* in some cases.

Although FIG. 25A illustrates an example in which the region 230*ba*, the region 230*bb*, and the region 230*bc* are formed in the oxide 230*b*, the present invention is not limited thereto. For example, the above regions may be formed not only in the oxide 230*b* but also in the oxide 230*a*.

In the oxide 230, the boundaries between the regions are difficult to detect clearly in some cases. The concentrations of a metal element and impurity elements such as hydrogen and nitrogen, which are detected in each region, may be gradually changed not only between the regions but also in each region. That is, the region closer to the channel formation region preferably has lower concentrations of a metal element and impurity elements such as hydrogen and nitrogen.

In the transistor 200, a metal oxide functioning as a semiconductor (such a metal oxide is hereinafter also referred to as an oxide semiconductor) is preferably used for the oxide 230 (the oxide 230*a* and the oxide 230*b*) including the channel formation region.

The metal oxide functioning as a semiconductor preferably has a band gap of 2 eV or higher, further preferably 2.5 eV or higher. With the use of a metal oxide having a wide band gap, the off-state current of the transistor can be reduced.

For the oxide 230, a metal oxide such as indium oxide, gallium oxide, or zinc oxide is preferably used, for example. Alternatively, for the oxide 230, a metal oxide containing one or two or more selected from indium, an element M, and zinc is preferably used, for example. The element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium. Specifically, the element M is preferably one or more kinds selected from aluminum, gallium, yttrium, and tin. Note that a metal oxide containing indium, the element M, and zinc is referred to as In-M-Zn oxide in some cases.

The oxide 230 preferably has a stacked-layer structure of a plurality of oxide layers with different chemical compositions. For example, the atomic ratio of the element M to a metal element that is a main component of the metal oxide used as the oxide 230*a* is preferably greater than the atomic ratio of the element M to a metal element that is a main component of the metal oxide used as the oxide 230*b*. Moreover, the atomic ratio of the element M to In in the metal oxide used as the oxide 230*a* is preferably greater than the atomic ratio of the element M to In in the metal oxide used as the oxide 230*b*. With this structure, impurities and oxygen can be inhibited from diffusing into the oxide 230*b* from the components formed below the oxide 230*a*.

Furthermore, the atomic ratio of In to the element M in the metal oxide used as the oxide 230*b* is preferably greater than the atomic ratio of In to the element M in the metal oxide used as the oxide 230*a*. With this structure, the transistor 200 can have a high on-state current and excellent frequency characteristics.

When the oxide 230*a* and the oxide 230*b* contain a common element as the main component besides oxygen, the density of defect states at the interface between the oxide 230*a* and the oxide 230*b* can be reduced. The density of defect states at the interface between the oxide 230*a* and the oxide 230*b* can be reduced. Thus, the influence of interface scattering on carrier conduction is reduced, and the transistor 200 can have a high on-state current and excellent frequency characteristics.

Specifically, as the oxide 230*a*, a metal oxide with In:M:Zn=1:3:4 [atomic ratio] or a composition in the neighborhood thereof, or In:M:Zn=1:1:0.5 [atomic ratio] or a composition in the neighborhood thereof can be used. As the oxide 230*b*, a metal oxide with In:M:Zn=1:1:1 [atomic ratio] or a composition in the neighborhood thereof, In:M:Zn=1:1:1.2 [atomic ratio] or a composition in the neighborhood thereof, In:M:Zn=1:1:2 [atomic ratio] or a composition in the neighborhood thereof, or In:M:Zn=4:2:3 [atomic ratio] or a composition in the neighborhood thereof can be used. Note that a composition in the neighborhood includes the range of +30% of an intended atomic ratio. Gallium is preferably used as the element M. In the case where a single layer of the oxide 230*b* is provided as the oxide 230, a metal oxide that can be used as the oxide 230*a* may be used as the oxide 230*b*.

When a film of the metal oxide is formed by a sputtering method, the above atomic ratio is not limited to the atomic ratio of the formed metal oxide and may be the atomic ratio of a sputtering target used for forming the metal oxide film.

The oxide 230*b* preferably has crystallinity. It is particularly preferable to use a CAAC-OS (c-axis aligned crystalline oxide semiconductor) as the oxide 230*b*.

The CAAC-OS is a metal oxide having a dense structure with high crystallinity and a small amount of impurities and defects (e.g., oxygen vacancies). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is further increased in such a manner, diffusion of impurities or oxygen in the CAAC-OS can be further reduced.

A clear grain boundary is difficult to observe in the CAAC-OS; thus, it can be said that a reduction in electron mobility due to the grain boundary is less likely to occur. Thus, a metal oxide including a CAAC-OS is physically stable. Therefore, the metal oxide including a CAAC-OS is resistant to heat and has high reliability.

When an oxide having crystallinity, such as CAAC-OS, is used as the oxide 230*b*, oxygen extraction from the oxide 230*b* by the source electrode or the drain electrode can be inhibited. This can reduce oxygen extraction from the oxide 230*b* even when heat treatment is performed; thus, the transistor 200 is stable with respect to high temperatures in a manufacturing process (what is called thermal budget).

If impurities and oxygen vacancies exist in a region of an oxide semiconductor where a channel is formed, a transistor using the oxide semiconductor may have variable electrical characteristics and poor reliability. In some cases, hydrogen in the vicinity of an oxygen vacancy forms a defect that is the oxygen vacancy into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and a current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of i-type (intrinsic) or substantially i-type.

As a countermeasure to the above, an insulator containing oxygen that is released by heating (hereinafter sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 200. Furthermore, a variation of the amount of oxygen supplied to the source region or the drain region in the substrate plane leads to a variation in characteristics of semiconductor devices including the transistors. When oxygen supplied from the insulator to the oxide semiconductor is diffused into a conductor such as the gate electrode, the source electrode, or the drain electrode, the conductor might be oxidized and the conductivity might be impaired, for example, so that electrical characteristics and reliability of the transistor might be adversely affected.

Therefore, the region 230*bc* functioning as the channel formation region in the oxide semiconductor is preferably an i-type or substantially i-type region with a reduced carrier concentration, whereas the region 230*ba* and the region 230*bb* functioning as the source region and the drain region are preferably n-type regions with a high carrier concentration. That is, the amounts of oxygen vacancies and VoH in the region 230*bc* of the oxide semiconductor are preferably reduced. Furthermore, it is preferable that the region 230*ba* and the region 230*bb* not be supplied with an excessive amount of oxygen and the amount of VoH in the region 230*ba* and the region 230*bb* not be excessively reduced. It is preferable to employ a structure that inhibits a reduction in the conductivity of the conductor 260, the conductor 242*a*, and the conductor 242*b*. For example, it is preferable to employ a structure that inhibits oxidation of the conductor 260, the conductor 242*a*, and the conductor 242*b*. Note that hydrogen in an oxide semiconductor can form VoH; thus, the hydrogen concentration needs to be reduced in order to reduce the amount of VoH.

In view of the above, in this embodiment, the semiconductor device has a structure in which the hydrogen concentration of the region 230*bc* is reduced, oxidation of the conductor 242*a*, the conductor 242*b*, and the conductor 260 is inhibited, and a reduction in hydrogen concentration of the region 230*ba* and the region 230*bb* is inhibited.

In order to reduce the hydrogen concentration of the region 230*bc*, the insulator 253 preferably has a function of capturing hydrogen and fixing hydrogen. As illustrated in FIG. 23C, the insulator 253 includes a region in contact with the region 230*bc* of the oxide 230*b*. With this structure, the hydrogen concentration of the region 230*bc* in the oxide 230*b* can be reduced. Accordingly, VoH in the region 230*bc* can be reduced, so that the region 230*bc* can be an i-type or substantially i-type region.

Examples of an insulator having a function of capturing and fixing hydrogen include a metal oxide having an amorphous structure. For example, it is preferable to use a metal oxide such as magnesium oxide or an oxide containing one or both of aluminum and hafnium. In such a metal oxide having an amorphous structure, an oxygen atom has a dangling bond and sometimes has a property of capturing hydrogen with the dangling bond or a property of fixing hydrogen. That is, the metal oxide having an amorphous structure is highly capable of capturing or fixing hydrogen.

The insulator 253 and the insulator 153 that is included in the capacitor 150 are formed using the same insulating film. That is, the insulator 253 and the insulator 153 contain the same material. The insulator 153 functions as the dielectric of the capacitor 150. Thus, a high dielectric constant (high-k) material is preferably used for the insulator 153. At this time, the insulator 253 contains the high-k material. An example of the high-k material is an oxide containing one or both of aluminum and hafnium. When the high-k material is used for the insulator 253, a gate potential applied during the operation of the transistor can be reduced while the physical thickness of the gate insulator is maintained. In addition, the equivalent oxide thickness (EOT) of the insulator functioning as the gate insulator can be reduced.

As described above, for the insulator 253, it is preferable to use an oxide containing one or both of aluminum and hafnium, it is further preferable to use an oxide that has an amorphous structure and contains one or both of aluminum and hafnium, and it is still further preferable to use hafnium oxide having an amorphous structure. In this embodiment, hafnium oxide is used for the insulator 253. In this case, the insulator 253 contains at least oxygen and hafnium. The hafnium oxide has an amorphous structure. In this case, the insulator 253 has an amorphous structure.

In order to inhibit oxidation of the conductor 242*a*, the conductor 242*b*, and the conductor 260, a barrier insulator against oxygen is preferably provided in the vicinity of each of the conductor 242*a*, the conductor 242*b*, and the conductor 260. In the semiconductor device described in this embodiment, the insulator corresponds to the insulator 253, the insulator 254, and the insulator 275, for example.

Note that in this specification and the like, a barrier insulator refers to an insulator having a barrier property. A barrier property in this specification and the like means a function of inhibiting diffusion of a targeted substance (also referred to as having low permeability). Alternatively, a barrier property means a function of capturing and fixing (also referred to as gettering) a targeted substance.

Examples of a barrier insulator against oxygen include an oxide containing one or both of aluminum and hafnium, magnesium oxide, gallium oxide, indium gallium zinc oxide, silicon nitride, and silicon nitride oxide. Examples of the oxide containing one or both of aluminum and hafnium include aluminum oxide, hafnium oxide, an oxide containing aluminum and hafnium (hafnium aluminate), and an oxide containing hafnium and silicon (hafnium silicate). For example, each of the insulator 253, the insulator 254, and the insulator 275 may be a single layer or stacked layers of the barrier insulator against oxygen.

The insulator 253 preferably has a barrier property against oxygen. Note that the insulator 253 is less permeable to oxygen than at least the insulator 280 is. The insulator 253 includes a region in contact with the side surface of the conductor 242*a* and the side surface of the conductor 242*b*. When the insulator 253 has a barrier property against oxygen, it is possible to inhibit formation of oxide films on the side surfaces of the conductor 242*a* and the conductor 242*b* due to oxidation of the side surfaces. Accordingly, a reduction in on-state current or a reduction in field-effect mobility of the transistor 200 can be inhibited.

The insulator 253 is provided in contact with the top surface and the side surface of the oxide 230*b*, the side surface of the oxide 230*a*, the side surface of the insulator 224, and the top surface of the insulator 222. When the insulator 253 has a barrier property against oxygen, it is possible to inhibit release of oxygen from the region 230*bc* of the oxide 230*b* when heat treatment or the like is performed. This can reduce formation of oxygen vacancies in the oxide 230*a* and the oxide 230*b*.

Even when an excess amount of oxygen is contained in the insulator 280, oxygen can be inhibited from being excessively supplied to the oxide 230*a* and the oxide 230*b*. Thus, the region 230*ba* and the region 230*bb* are inhibited from being excessively oxidized; hence, a reduction in on-state current or a reduction in field-effect mobility of the transistor 200 can be inhibited.

An oxide containing one or both of aluminum and hafnium has a barrier property against oxygen and thus can be suitably used for the insulator 253.

The insulator 254 preferably has a barrier property against oxygen. The insulator 254 is provided between the region 230*bc* of the oxide 230 and the conductor 260 and between the insulator 280 and the conductor 260. This structure can inhibit oxygen contained in the region 230*bc* of the oxide 230 from diffusing into the conductor 260 and thus can inhibit formation of oxygen vacancies in the region 230*bc* of the oxide 230. Moreover, oxygen contained in the oxide 230 and oxygen contained in the insulator 280 can be inhibited from diffusing into the conductor 260 and oxidizing the conductor 260. Note that the insulator 254 is less permeable to oxygen than at least the insulator 280 is. For example, silicon nitride is preferably used for the insulator 254. In this case, the insulator 254 contains at least nitrogen and silicon.

The insulator 275 preferably has a barrier property against oxygen. The insulator 275 is provided between the insulator 280 and the conductor 242*a* and between the insulator 280 and the conductor 242*b*. This structure can inhibit diffusion of oxygen contained in the insulator 280 into the conductor 242*a* and the conductor 242*b*. As a result, the conductor 242*a* and the conductor 242*b* can be inhibited from being oxidized by oxygen contained in the insulator 280, so that an increase in resistivity a reduction in on-state current can be inhibited. The insulator 275 is less permeable to oxygen than at least the insulator 280 is. For example, silicon nitride is preferably used for the insulator 275. In this case, the insulator 275 contains at least nitrogen and silicon.

In order to inhibit a reduction in the hydrogen concentration in the region 230*ba* and the region 230*bb*, a barrier insulator against hydrogen is preferably provided in the vicinity of the region 230*ba* and the region 230*bb*. In the semiconductor device described in this embodiment, the barrier insulator against hydrogen corresponds to, for example, the insulator 275.

Examples of the barrier insulator against hydrogen include an oxide such as aluminum oxide, hafnium oxide, and tantalum oxide and a nitride such as silicon nitride. For example, the insulator 275 is a single layer or a stacked layers of the barrier insulator against hydrogen.

The insulator 275 preferably has a barrier property against hydrogen. The insulator 275 is placed in contact with a side surface of the region 230*ba* in the oxide 230*b* and a side surface of the region 230*bb* in the oxide 230*b*. The insulator 275 is placed between the insulator 253 and the side surface of the region 230*ba* in the oxide 230*b* and between the insulator 253 and the side surface of the region 230*bb* in the oxide 230*b*. When the insulator 275 has a barrier property against hydrogen, capturing and fixing of hydrogen in the region 230*ba* and the region 230*bb* by the insulator 253 can be inhibited. Accordingly, the region 230*ba* and the region 230*bb* can each be an n-type region.

With the above structure, the region 230*bc* functioning as the channel formation region can be an i-type or substantially i-type region, the region 230*ba* and the region 230*bb* functioning as the source region and the drain region can be n-type regions, and thus a semiconductor device with favorable electrical characteristics can be provided. The semiconductor device with the above structure can have favorable electrical characteristics even when being miniaturized or highly integrated. For example, the semiconductor device can have favorable electrical characteristics even when the distance L2 illustrated in FIG. 25A is less than or equal to 20 nm, less than or equal to 15 nm, less than or equal to 10 nm, or less than or equal to 7 nm and greater than or equal to 2 nm, greater than or equal to 3 nm, or greater than or equal to 5 nm.

Miniaturization of the transistor 200 can improve high-frequency characteristics. Specifically, a cutoff frequency can be improved. When the gate length is within any of the above ranges, the cutoff frequency of the transistor can be greater than or equal to 50 GHz or greater than or equal to 100 GHz in a room temperature environment, for example.

The insulator 253 functions as part of the gate insulator. As illustrated in FIG. 23B, the insulator 253 is provided in contact with a side surface and part of the top surface of the insulator 275 and a side surface of the insulator 280.

The insulator 253 needs to be provided in an opening formed in the insulator 280 and the like, together with the insulator 254 and the conductor 260. The thickness of the insulator 253 is preferably small for miniaturization of the transistor 200. The thickness of the insulator 253 is greater than or equal to 0.1 nm and less than or equal to 5.0 nm, preferably greater than or equal to 0.5 nm and less than or equal to 5.0 nm, further preferably greater than or equal to 1.0 nm and less than 5.0 nm, still further preferably greater than or equal to 1.0 nm and less than or equal to 3.0 nm. In this case, at least part of the insulator 253 preferably includes a region having the above-described thickness.

To form the insulator 253 having a small thickness like the above-described thickness, an atomic layer deposition (ALD) method is preferably used for the film formation. Examples of an ALD method include a thermal ALD method, in which a precursor and a reactant react with each other only by a thermal energy, and a PEALD method, in which a reactant excited by plasma is used. A PEALD method is sometimes preferable because film formation at lower temperatures is possible due to the use of plasma.

An ALD method, which enables an atomic layer to be deposited one by one, has advantages such as formation of an extremely thin film, film formation on a component with a high aspect ratio, formation of a film with a small number of defects such as pinholes, film formation with excellent coverage, and low-temperature film formation. Therefore, the insulator 253 can be formed on a side surface of the opening formed in the insulator 280 and the like and a side end portion of the conductor 242, for example, with favorable coverage and a small thickness like the above-described thickness.

Note that some of precursors used in an ALD method contain carbon or the like. Thus, in some cases, a film provided by an ALD method contains impurities such as carbon in a larger amount than a film provided by another film formation method. Note that impurities can be quantified by secondary ion mass spectrometry (SIMS), X-ray photoelectron spectroscopy (XPS), or Auger electron spectroscopy (AES).

The insulator 254 functions as part of the gate insulator. The insulator 254 preferably has a barrier property against hydrogen. This can prevent diffusion of impurities such as hydrogen contained in the conductor 260 into the oxide 230*b*.

The insulator 254 needs to be provided in the opening formed in the insulator 280 and the like, together with the insulator 253 and the conductor 260. The thickness of the insulator 254 is preferably small for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 254 preferably includes a region having the above-described thickness.

For example, a film of silicon nitride formed by a PEALD method can be used as the insulator 254.

Note that when an insulator having a function of inhibiting passage of oxygen and impurities such as hydrogen, e.g., hafnium oxide, is used as the insulator 253, the insulator 253 can also have the function of the insulator 254. In such a case, the structure without the insulator 254 enables simplification of the manufacturing process and the improvement in productivity of the semiconductor device.

The insulator 275 is provided to cover the insulator 224, the oxide 230*a*, the oxide 230*b*, and the conductor 242. Specifically, the insulator 275 includes a region in contact with the side surface of the oxide 230*b*, the side surface of the conductor 242*a*, and the side surface of the conductor 242*b*.

In the opening 258, the insulator 275 overlaps with the conductor 242. With this structure, the physical distance between the conductor 242 and the conductor 260 is increased, so that the parasitic capacitance between the conductor 242 and the conductor 260 can be reduced. Thus, a semiconductor device with favorable electrical characteristics can be provided.

A conductive material that is less likely to be oxidized, a conductive material having a function of inhibiting diffusion of oxygen, or the like is preferably used for the conductor 242*a*, the conductor 242*b*, and the conductor 260. Examples of such a conductive material include a conductive material containing nitrogen and a conductive material containing oxygen. This can inhibit a reduction in the conductivity of the conductor 242*a*, the conductor 242*b*, and the conductor 260. In the case where a conductive material containing metal and nitrogen is used for the conductor 242*a*, the conductor 242*b*, and the conductor 260, the conductor 242*a*, the conductor 242*b*, and the conductor 260 contain at least metal and nitrogen.

One or both of the conductor 242 and the conductor 260 may have a stacked-layer structure. For example, as illustrated in FIG. 23B, the conductor 242*a* and the conductor 242*b* may each have a stacked-layer structure of two layers. In this case, for a layer (the conductor 242*al* and the conductor 242*b*1) in contact with the oxide 230*b*, a conductive material that is less likely to be oxidized, a conductive material having a function of inhibiting diffusion of oxygen, or the like is preferably used. For example, in the case where the conductor 260 has a stacked-layer structure of the conductor 260*a* and the conductor 260*b* as illustrated in FIG. 23B, a conductive material that is less likely to be oxidized, a conductive material having a function of inhibiting diffusion of oxygen, or the like is preferably used for the conductor 260*a*.

To inhibit a decrease in the conductivity of the conductor 242, an oxide having crystallinity, such as a CAAC-OS, is preferably used as the oxide 230*b*. As the oxide, a metal oxide that can be used as the oxide 230 described above is preferably used. Specifically, a metal oxide containing indium, zinc, and one or more selected from gallium, aluminum, and tin is preferably used. The CAAC-OS is an oxide including a crystal, and the c-axis of the crystal is substantially perpendicular to the surface of the oxide or a formation surface. This can inhibit the conductor 242*a* or the conductor 242*b* from extracting oxygen from the oxide 230*b*. Furthermore, it is possible to inhibit a reduction in the conductivity of the conductor 242*a* and the conductor 242*b*.

In this embodiment, microwave treatment is performed in an oxygen-containing atmosphere in a state where the conductor 242*a* and the conductor 242*b* are provided over the oxide 230*b*, in order to reduce oxygen vacancies and VoH in the region 230*bc*. Here, the microwave treatment refers to, for example, treatment using an apparatus including a power source that generates high-density plasma with the use of a microwave.

The microwave treatment in an oxygen-containing atmosphere converts an oxygen gas into plasma by using a high-frequency wave such as a microwave or RF and activates the oxygen plasma. At this time, the region 230*bc* can be irradiated with the high-frequency wave such as a microwave or RF. By the effect of the plasma, the microwave, or the like, VoH in the region 230*bc* can be divided into an oxygen vacancy and hydrogen; the hydrogen can be removed from the region 230*bc* and the oxygen vacancy can be filled with oxygen. As a result, the hydrogen concentration, oxygen vacancies, and VoH in the region 230*bc* can be reduced to lower the carrier concentration.

In the microwave treatment in an oxygen-containing atmosphere, the effect of the high-frequency wave such as the microwave or RF, the oxygen plasma, or the like is blocked by the conductor 242*a* and the conductor 242*b* and does not reach the region 230*ba* and the region 230*bb*. In addition, the effect of the oxygen plasma can be reduced by the insulator 275 and the insulator 280 that are provided to cover the oxide 230*b* and the conductor 242. Hence, a reduction in VoH and supply of an excess amount of oxygen do not occur in the region 230*ba* and the region 230*bb* in the microwave treatment, so that a decrease in carrier concentration can be prevented.

After an insulating film to be the insulator 253 is formed, microwave treatment is preferably performed in an oxygen-containing atmosphere. By performing the microwave treatment in an oxygen-containing atmosphere through the insulator 253 in such a manner, oxygen can be efficiently supplied into the region 230*bc*. In addition, the insulator 253 is placed to be in contact with a side surface of the conductor 242 and the surface of the region 230*bc*, thereby inhibiting supply of oxygen more than necessary to the region 230*bc* and inhibiting oxidation of the side surface of the conductor 242.

The oxygen supplied into the region 230*bc* has any of a variety of forms such as an oxygen atom, an oxygen molecule, and an oxygen radical (also referred to as an O radical, which is an atom or a molecule having an unpaired electron, or an ion). Note that the oxygen supplied into the region 230*bc* has any one or more of the above forms, and is particularly preferably an oxygen radical. Furthermore, the film quality of the insulator 253 can be improved, leading to higher reliability of the transistor 200.

In the above manner, oxygen vacancies and VoH can be selectively removed from the region 230*bc* of the oxide semiconductor, whereby the region 230*bc* can be an i-type or substantially i-type region. Furthermore, supply of an excess amount of oxygen to the region 230*ba* and the region 230*bb* functioning as the source region and the drain region can be inhibited, and the state of the n-type regions before the microwave treatment is performed can be maintained. As a result, a change in the electrical characteristics of the transistor 200 can be inhibited, and thus a variation in the electrical characteristics of the transistors 200 in the substrate plane can be inhibited.

With the above structure, a semiconductor device with a small variation in transistor characteristics can be provided. A semiconductor device with favorable frequency characteristics can be provided. A semiconductor device with high operating speed can be provided. A semiconductor device with favorable reliability can be provided. A semiconductor device having favorable electrical characteristics can be provided. A semiconductor device that can be miniaturized or highly integrated can be provided.

As illustrated in FIG. 23C, a curved surface may be provided between the side surface of the oxide 230*b* and the top surface of the oxide 230*b* in a cross-sectional view of the transistor 200 in the channel width direction. In other words, an end portion of the side surface and an end portion of the top surface may be curved (hereinafter also referred to as rounded).

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230*b* with the insulator 253, the insulator 254, and the conductor 260.

In the manufacturing process of the transistor 200, heat treatment is preferably performed with a surface of the oxide 230 exposed. The heat treatment is performed at a temperature higher than or equal to 100° C. and lower than or equal to 600° C., preferably higher than or equal to 350° C. and lower than or equal to 550° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, heat treatment may be performed in an atmosphere containing an oxidizing gas at 10 ppm or more, 1% or more, or 10% or more in order to compensate for oxygen released, after heat treatment in a nitrogen gas or inert gas atmosphere. Alternatively, heat treatment may be performed in a nitrogen gas or inert gas atmosphere successively after heat treatment is performed in an atmosphere containing an oxidizing gas at 10 ppm or more, 1% or more, or 10% or more.

Note that by oxygen adding treatment performed on the oxide 230, oxygen vacancies in the oxide 230 can be repaired with supplied oxygen. Furthermore, hydrogen remaining in the oxide 230 reacts with supplied oxygen, so that the hydrogen can be removed as $H_2O$ (dehydration can be caused). This can inhibit recombination of hydrogen remaining in the oxide 230 with oxygen vacancies and formation of VoH.

As illustrated in FIG. 23C and the like, the insulator 253 is provided in contact with the top surface and the side surface of the oxide 230, whereby indium contained in the oxide 230 is unevenly distributed in some cases at the interface between the oxide 230 and the insulator 253 and in its vicinity. Accordingly, the vicinity of the surface of the oxide 230 has an atomic ratio close to that of indium oxide or that of In—Zn oxide. Such an increase in the atomic ratio of indium in the vicinity of the surface of the oxide 230, especially the vicinity of a surface of the oxide 230*b*, can increase the field-effect mobility of the transistor 200.

In addition to the above structure, the semiconductor device of this embodiment preferably has a structure that inhibits entry of hydrogen into the transistor 200. For example, an insulator having a function of inhibiting diffusion of hydrogen is preferably provided to cover the transistor 200. In the semiconductor device described in this embodiment, the insulator corresponds to, for example, the insulator 212.

As the insulator 212, an insulator having a function of inhibiting diffusion of hydrogen is preferably used. This can inhibit diffusion of hydrogen into the transistor 200 from below the insulator 212. Note that an insulator that can be used as the insulator 275 described above can be used as the insulator 212.

One or more selected from the insulator 212, the insulator 214, the insulator 282, and the insulator 285 preferably function as a barrier insulating film that inhibits diffusion of impurities such as water and hydrogen from the substrate side or from above the transistor 200 into the transistor 200. Thus, one or more selected from the insulator 212, the insulator 214, the insulator 282, and the insulator 285 are preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the above oxygen is less likely to pass).

An insulator having a function of inhibiting diffusion of oxygen and impurities such as water and hydrogen is preferably used for the insulator 212, the insulator 214, the insulator 282, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212. For example, aluminum oxide or magnesium oxide, which has a function of capturing hydrogen well or fixing hydrogen well, is preferably used for the insulator 214, the insulator 282, and the insulator 285. In such a case, impurities such as water and hydrogen can be inhibited from diffusing to the transistor 200 side from the substrate side through the insulator 212 and the insulator 214. Alternatively, impurities such as water and hydrogen can be inhibited from diffusing to the transistor 200 side from an interlayer insulating film and the like that are positioned outward from the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from being diffused above the transistor 200 through the insulator 282 and the like. In this manner, the transistor 200 is preferably surrounded by the insulator 212, the insulator 214, the insulator 282, and the insulator 285, which have a function of inhibiting diffusion of oxygen and impurities such as water and hydrogen.

Here, an oxide having an amorphous structure is preferably used as the insulator 212, the insulator 214, the insulator 282, and the insulator 285. For example, a metal oxide such as $AlO_x$-(x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided around the transistor 200, hydrogen contained in the transistor 200 or hydrogen around the transistor 200 can be captured or fixed. In particular, hydrogen contained in the channel formation region of the transistor 200 is preferably captured or fixed. When the metal oxide having an amorphous structure is used as the component of the transistor 200 or provided around the transistor 200, the transistor 200 and the semiconductor device with favorable characteristics and high reliability can be manufactured.

Although the insulator 212, the insulator 214, the insulator 282, and the insulator 285 preferably have an amorphous structure, they may partly include a region with a polycrystalline structure. Alternatively, the insulator 212, the insulator 214, the insulator 282, and the insulator 285 may each have a multilayer structure where a layer having an amorphous structure and a layer having a polycrystalline structure are stacked. For example, a stacked-layer structure in which a layer having a polycrystalline structure is formed over a layer having an amorphous structure may be employed.

The insulator 212, the insulator 214, the insulator 282, and the insulator 285 can be formed by a sputtering method, for example. Since a sputtering method does not need to use a molecule containing hydrogen as a deposition gas, the hydrogen concentrations in the insulator 212, the insulator 214, the insulator 282, and the insulator 285 can be reduced. Note that the film formation method is not limited to a sputtering method, and a chemical vapor deposition (CVD) method, a molecular beam epitaxy (MBE) method, a pulsed laser deposition (PLD) method, an ALD method, or the like may be used as appropriate.

The resistivity of the insulator 212 is preferably low in some cases. For example, by setting the resistivity of the insulator 212 to approximately $1\times10^{13}$ Ωcm, the insulator 212 can sometimes reduce charge up of the conductor 205, the conductor 242, the conductor 260, or the conductor 240 in treatment using plasma or the like in the manufacturing process of the semiconductor device. The resistivity of the insulator 212 is preferably higher than or equal to $1\times10^{10}$ Ωcm and lower than or equal to $1\times10^{15}$ Ωcm.

The dielectric constants of the insulator 216, the insulator 280, and the insulator 285 are preferably lower than that of the insulator 214. When a material with a low dielectric constant is used for an interlayer film, parasitic capacitance generated between wirings can be reduced. For the insulator 216, the insulator 280, and the insulator 285, silicon oxide, silicon oxynitride, silicon oxide to which fluorine is added, silicon oxide to which carbon is added, silicon oxide to which carbon and nitrogen are added, or porous silicon oxide is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205*a* and the conductor 205*b*. The conductor 205*a* is provided in contact with the bottom surface and the sidewall of the opening. The conductor 205*b* is provided to be embedded in a recessed portion formed by the conductor 205*a*. Here, the top surface of the conductor 205*b* is substantially level with the top surface of the conductor 205*a* and the top surface of the insulator 216.

Here, for the conductor 205*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom. Alternatively, it is preferable to use a conductive material having a function of inhibiting diffusion of oxygen (e.g., one or both of an oxygen atom and an oxygen molecule).

When the conductor 205*a* is formed using a conductive material having a function of inhibiting diffusion of hydrogen, impurities such as hydrogen contained in the conductor 205*b* can be prevented from being diffused into the oxide 230 through the insulator 216 and the insulator 224. When the conductor 205*a* is formed using a conductive material having a function of inhibiting diffusion of oxygen, the conductivity of the conductor 205*b* can be inhibited from being lowered because of oxidation. As the conductive material having a function of inhibiting diffusion of oxygen, titanium, titanium nitride, tantalum, tantalum nitride, ruthenium, or ruthenium oxide is preferably used, for example. Thus, the conductor 205*a* can be a single layer or stacked layers of the above conductive materials. For example, titanium nitride is used for the conductor 205*a*.

The conductor 205*b* is preferably formed using a conductive material containing tungsten, copper, or aluminum as its main component. For example, tungsten is used for the conductor 205*b*.

The conductor 205 sometimes functions as the second gate electrode. In that case, by changing a potential applied to the conductor 205 out of synchronization with and independently of a potential applied to the conductor 260, the threshold voltage ($V_{th}$) of the transistor 200 can be controlled. In particular, by applying a negative potential to the conductor 205, $V_{th}$ of the transistor 200 can be higher, and its off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, inhibiting diffusion of the impurities into the oxide 230.

As illustrated in FIG. 23A, the conductor 205 is preferably provided to be larger than a region of the oxide 230 that does not overlap with the conductor 242*a* or the conductor 242*b*. As illustrated in FIG. 23C, it is particularly preferable that the conductor 205 extend to a region beyond end portions of the oxide 230*a* and the oxide 230*b* in the channel width direction. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as the first gate electrode and the electric field of the conductor 205 functioning as the second gate electrode.

In this specification and the like, a transistor structure in which a channel formation region is electrically surrounded by the electric field of at least the first gate electrode is referred to as a surrounded channel (S-channel) structure. The S-channel structure disclosed in this specification and the like has a structure that is different from a Fin-type structure and a planar structure. Meanwhile, the S-channel structure disclosed in this specification and the like can also be regarded as a kind of the Fin-type structure. Note that in this specification and the like, the Fin-type structure refers to a structure in which a gate electrode is placed so as to cover at least two or more surfaces (specifically, two surfaces, three surfaces, or four or more surfaces, for example) of a channel. With the Fin-type structure and the S-channel structure, resistance to a short-channel effect can be enhanced, that is, a transistor in which a short-channel effect is less likely to occur can be provided.

When the transistor 200 has the above-described S-channel structure, the channel formation region can be electrically surrounded. The S-channel structure is a structure with the electrically surrounded channel formation region, and thus is, in a sense, equivalent to a GAA (Gate All Around) structure or an LGAA (Lateral Gate All Around) structure. When the transistor 200 has the S-channel structure, the GAA structure, or the LGAA structure, the channel formation region that is formed at the interface between the oxide 230 and the gate insulator or in the vicinity of the interface can be formed in the entire bulk of the oxide 230. Accordingly, the density of current flowing in the transistor can be increased, which can be expected to increase the on-state current of the transistor or increase the field-effect mobility of the transistor.

Although a transistor with the S-channel structure is exemplified as the transistor 200 illustrated in FIG. 23B, the semiconductor device of one embodiment of the present invention is not limited thereto. For example, a transistor structure that can be used in one embodiment of the present invention is one or more selected from a planar structure, a Fin-type structure, and a GAA structure.

As illustrated in FIG. 23C, the conductor 205 is extended to function as a wiring as well. However, without limitation to this, a structure may be employed in which a conductor functioning as a wiring is provided below the conductor 205. The conductor 205 is not necessarily provided in each transistor. For example, the conductor 205 may be shared by a plurality of transistors.

Although the transistor 200 having a structure in which the conductor 205 is a stack of the conductor 205*a* and the conductor 205*b* is illustrated, the present invention is not limited thereto. For example, the conductor 205 may be provided to have a single-layer structure or a stacked-layer structure of three or more layers.

The insulator 222 and the insulator 224 function as a gate insulator.

The insulator 222 preferably has a function of inhibiting diffusion of hydrogen (e.g., one or both of a hydrogen atom and a hydrogen molecule). In addition, the insulator 222 preferably has a function of inhibiting diffusion of oxygen (e.g., one or both of an oxygen atom and an oxygen molecule). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. As the insulator, aluminum oxide, hafnium oxide, an oxide containing aluminum and hafnium (hafnium aluminate), or the like is preferably used. Alternatively, an oxide containing hafnium and zirconium, e.g., a hafnium-zirconium oxide is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of the insulator and any of silicon oxide, silicon oxynitride, and silicon nitride may be used for the insulator 222.

For example, a single layer or stacked layers of an insulator(s) containing what is called a high-k material such as aluminum oxide, hafnium oxide, tantalum oxide, zirconium oxide, or an hafnium-zirconium oxide may be used for the insulator 222. As miniaturization or high integration of a transistor proceeds, a problem such as leakage current may arise because of a reduction in the thickness of the gate insulator. When a high-k material is used for the insulator functioning as a gate insulator, a gate potential at the time of the operation of the transistor can be lowered while the physical thickness is maintained. Furthermore, a substance with a high dielectric constant, such as lead zirconate titanate (PZT), strontium titanate ($SrTiO_3$), or (Ba,Sr) $TiO_3$ (BST), for example, can be used for the insulator 222 in some cases.

Silicon oxide or silicon oxynitride, for example, can be used as appropriate for the insulator 224 that is in contact with the oxide 230.

Note that the insulator 222 and the insulator 224 may each have a stacked-layer structure of two or more layers. In that case, the stacked-layer structure may be a structure of stacked layers including different materials without limitation to a structure of stacked layers including the same material. The insulator 224 may be formed into an island shape so as to overlap with the oxide 230*a*. In this case, the insulator 275 is in contact with side surfaces of the insulator 224 and the top surface of the insulator 222. Note that in this specification and the like, the term "island shape" refers to a state where two or more layers formed using the same material in the same step are physically separated from each other.

The conductor 242*a* and the conductor 242*b* are provided in contact with the top surface of the oxide 230*b*. Each of the conductor 242*a* and the conductor 242*b* functions as the source electrode or the drain electrode of the transistor 200.

For the conductor 242 (the conductor 242*a* and the conductor 242*b*), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, an oxide containing lanthanum and nickel, or the like may be used. These materials are preferable because they are each a conductive material that is not easily oxidized or a material that maintains the conductivity even after absorbing oxygen.

Note that hydrogen contained in the oxide 230*b* or the like is diffused into the conductor 242*a* or the conductor 242*b* in some cases. In particular, when a nitride containing tantalum is used for the conductor 242*a* and the conductor 242*b*, hydrogen contained in the oxide 230*b* or the like is likely to diffuse into the conductor 242*a* or the conductor 242*b*, and the hydrogen that has diffused is bonded to nitrogen contained in the conductor 242*a* or the conductor 242*b* in some cases. That is, hydrogen contained in the oxide 230*b* or the like is absorbed by the conductor 242*a* or the conductor 242*b* in some cases.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 23D. Accordingly, the conductivity of the conductor 242 is increased, so that the on-state current of the transistor 200 can be increased.

As illustrated in FIG. 23A, the conductor 242*a* includes an opening in a region between the transistor 200*a* and the transistor 200*b*. The conductor 240 is placed to overlap with the opening. With this structure, the conductor 242*a* and the conductor 240 include a region where they are in contact with each other. Thus, the conductor 242*a* and the conductor 240 are electrically connected to each other.

When heat treatment is performed in the state where the conductor 242*a* (conductor 242*b*) and the oxide 230*b* are in contact with each other, the sheet resistance of the oxide 230*b* in a region overlapping with the conductor 242*a* (conductor 242*b*) is decreased in some cases. Furthermore, the carrier concentration is sometimes increased. Thus, the resistance of the oxide 230*b* in the region overlapping with the conductor 242*a* (conductor 242*b*) can be lowered in a self-aligned manner.

The conductor 242*a* and the conductor 242*b* are preferably formed using a conductive film having compressive stress. This can form distortion extended in the tensile direction (hereinafter, such distortion is sometimes referred to as tensile distortion) in the region 230*ba* and the region 230*bb*. When VoH is stably formed by the tensile distortion, the region 230*ba* and the region 230*bb* can be stable n-type regions. The compressive stress of the conductor 242*a* refers to stress for relaxing the compressive shape of the conductor 242*a* that has a vector in a direction from a center portion to an end portion of the conductor 242*a*. The same applies to the compressive stress of the conductor 242*b*.

The level of the compressive stress of the conductor 242*a* is, for example, preferably higher than or equal to 500 MPa, further preferably higher than or equal to 1000 MPa, still further preferably higher than or equal to 1500 MPa, yet still further preferably higher than or equal to 2000 MPa. The level of the stress of the conductor 242*a* may be determined from the measured stress of a sample fabricated by forming a conductive film to be used for the conductor 242*a* on a substrate. The same applies to the level of the compressive stress of the conductor 242*b*. An example of a conductor having the above level of compressive stress includes a nitride containing tantalum.

Due to the action of the compressive stress of the conductor 242*a* and the conductor 242*b*, distortion is generated in each of the region 230*ba* and the region 230*bb*. The distortion is distortion extended in the tensile direction (tensile distortion) by the action of the compressive stress of each of the conductor 242*a* and the conductor 242*b*. In the case where the region 230*ba* and the region 230*bb* have a CAAC structure, the distortion corresponds to extension in the direction perpendicular to the c-axis of the CAAC structure. When the CAAC structure is extended in the direction perpendicular to the c-axis of the CAAC structure, oxygen vacancies are likely to be formed in the distortion. Furthermore, hydrogen is likely to be taken in the distortion, so that VoH is likely to be formed. Thus, oxygen vacancies and VoH are easily formed in the distortion, and they are likely to have a stable structure. Accordingly, the region 230*ba* and the region 230*bb* are stable n-type regions with a high carrier concentration.

Note that although the distortion formed in the oxide 230*b* is described above, the present invention is not limited thereto. In some cases, similar distortion is formed in the oxide 230*a*.

In the semiconductor device illustrated in FIG. 23A to FIG. 23D, the conductor 242 has a stacked-layer structure of two layers. Specifically, the conductor 242*a* includes the conductor 242*al* and the conductor 242*a*2 over the conductor 242*al*. Similarly, the conductor 242*b* includes the conductor 242*b*1 and the conductor 242*b*2 over the conductor 242*b*1. At this time, the conductor 242*al* and the conductor 242*b*1 are placed on the side in contact with the oxide 230*b*.

Hereinafter, the conductor 242*al* and the conductor 242*b*1 are collectively referred to as a lower layer of the conductor 242 in some cases. The conductor 242*a*2 and the conductor 242*b*2 are collectively referred to as an upper layer of the conductor 242 in some cases.

The lower layer (the conductor 242*al* and the conductor 242*b*1) of the conductor 242 is preferably formed using a conductive material having a property of oxidation resistance. This can inhibit oxidation of the lower layer of the conductor 242 and a reduction in the conductivity of the conductor 242. Note that the lower layer of the conductor 242 may have a property of readily absorbing (readily extracting) hydrogen. In this case, hydrogen in the oxide 230 is diffused into the lower layer of the conductor 242, so that the hydrogen concentration in the oxide 230 can be reduced. Thus, the transistor 200 can have stable electrical characteristics. The lower layer of the conductor 242 preferably has high compressive stress as described above, and preferably has higher compressive stress than the upper layer of the conductor 242. In such a case, the region 230*ba* and the region 230*bb* that are in contact with the lower layer of the conductor 242 can be stable n-type regions with a high carrier concentration, as described above.

The upper layer (the conductor 242*a*2 and the conductor 242*b*2) of the conductor 242 preferably has higher conductivity than the lower layer (the conductor 242*al* and the conductor 242*b*1) of the conductor 242. For example, the thickness of the upper layer of the conductor 242 is made larger than the thickness of the lower layer of the conductor 242. Note that at least part of the upper layer of the conductor 242 includes a region having higher conductivity than the lower layer of the conductor 242. Alternatively, the upper layer of the conductor 242 is preferably formed using a conductive material with lower resistivity than that of the lower layer of the conductor 242. As a result, a semiconductor device with reduced wiring delay can be manufactured.

Note that the upper layer of the conductor 242 may have a property of readily absorbing hydrogen. In this case, hydrogen absorbed by the lower layer of the conductor 242 is also diffused into the upper layer of the conductor 242, so that the hydrogen concentration in the oxide 230 can be further reduced. As a result, the transistor 200 can have stable electrical characteristics.

In the case where the conductor 242 has a stacked-layer structure of two layers, one or more selected from the constituent elements, chemical composition, and film formation conditions may be different between the lower layer of the conductor 242 and the upper layer of the conductor 242.

For example, tantalum nitride or titanium nitride can be used for the lower layer (the conductor 242*al* and the conductor 242*b*1) of the conductor 242, and tungsten can be used for the upper layer (the conductor 242*a*2 and the conductor 242*b*2) of the conductor 242. In such a case, the conductor 242*al* and the conductor 242*b*1 each contain tantalum or titanium and nitrogen. This structure can inhibit oxidation of the lower layer of the conductor 242 and a reduction in the conductivity of the conductor 242. Moreover, with this structure, the conductor 242*a*2 can be surrounded by the insulator 275 having a barrier property against oxygen and the conductor 242*al* having a property of oxidation resistance, and the conductor 242*b*2 can be surrounded by the insulator 275 having a barrier property against oxygen and the conductor 242*b*1 having a property of oxidation resistance. Thus, a semiconductor device in which oxidation of the conductor 242*a*2 and the conductor 242*b*2 is inhibited and thus wiring delay is inhibited can be manufactured.

As another example, a nitride containing tantalum (e.g., tantalum nitride) may be used for the lower layer of the conductor 242, and a nitride containing titanium (e.g., titanium nitride) may be used for the upper layer of the conductor 242. Titanium nitride can have higher conductivity than tantalum nitride; thus, the conductivity of the upper layer of the conductor 242 can be higher than that of the lower layer of the conductor 242. Thus, the contact resistance between the conductor 242 and the conductor 240 provided in contact with the top surface of the conductor 242 can be reduced, so that a semiconductor device with reduced wiring delay can be manufactured.

Although the example of using different conductive materials for the lower layer of the conductor 242 and the upper layer of the conductor 242 is described, the present invention is not limited thereto.

For the lower layer of the conductor 242 and the upper layer of the conductor 242, conductive materials that contain the same constituent elements and have different chemical compositions may be used. In this case, the lower layer of the conductor 242 and the upper layer of the conductor 242 can be formed successively without being exposed to an atmospheric environment. By the formation without exposure to the atmosphere, impurities or moisture from the atmospheric environment can be prevented from being attached onto the surface of the lower layer of the conductor 242, so that the vicinity of the interface between the lower layer of the conductor 242 and the upper layer of the conductor 242 can be kept clean.

A nitride containing tantalum with a high atomic ratio of nitrogen to tantalum is preferably used for the lower layer of the conductor 242, and a nitride containing tantalum with a low atomic ratio of nitrogen to tantalum is preferably used for the upper layer of the conductor 242. For example, a nitride containing tantalum with an atomic ratio of nitrogen to tantalum being greater than or equal to 1.0 and less than or equal to 2.0, preferably greater than or equal to 1.1 and less than or equal to 1.8, further preferably greater than or equal to 1.2 and less than or equal to 1.5 is used for the lower layer of the conductor 242. For example, a nitride containing tantalum with an atomic ratio of nitrogen to tantalum being greater than or equal to 0.3 and less than or equal to 1.5, preferably greater than or equal to 0.5 and less than or equal to 1.3, further preferably greater than or equal to 0.6 and less than or equal to 1.0 is used for the upper layer of the conductor 242.

A high atomic ratio of nitrogen to tantalum in a nitride containing tantalum can inhibit oxidation of the nitride containing tantalum. In addition, the oxidation resistance of the nitride containing tantalum can be improved. Moreover, diffusion of oxygen into the nitride containing tantalum can be inhibited. Hence, the nitride containing tantalum with a high atomic ratio of nitrogen to tantalum is preferably used for the lower layer of the conductor 242. It is thus possible to prevent an oxide layer from being formed between the lower layer of the conductor 242 and the oxide 230 or reduce the thickness of the oxide layer.

A low atomic ratio of nitrogen to tantalum in a nitride containing tantalum can reduce the resistivity of the nitride. Hence, the nitride containing tantalum with a low atomic ratio of nitrogen to tantalum is preferably used for the upper layer of the conductor 242. As a result, a semiconductor device with reduced wiring delay can be manufactured.

Note that the boundary between the upper layer and the lower layer of the conductor 242 is difficult to clearly detect in some cases. In the case where a nitride containing tantalum is used for the conductor 242, the tantalum concentration and the nitrogen concentration detected in each layer may gradually change within each layer and may also change continuously (or in a gradation manner) in a region between the upper layer and the lower layer. That is, the atomic ratio of nitrogen to tantalum is preferably higher in the region of the conductor 242 that is closer to the oxide 230. Thus, the atomic ratio of nitrogen to tantalum in a lower region of the conductor 242 is preferably higher than the atomic ratio of nitrogen to tantalum in an upper region of the conductor 242.

Note that although the conductor 242 in the transistor 200 is a stack of two layers, the present invention is not limited thereto. For example, the conductor 242 may have a single-layer structure or a stacked-layer structure of three or more layers. In the case where a component has a stacked-layer structure, layers may be distinguished by ordinal numbers given corresponding to the formation order.

The conductor 260 is placed so that its top surface is substantially level with the uppermost portion of the insulator 254, the uppermost portion of the insulator 253, and the top surface of the insulator 280.

The conductor 260 functions as the first gate electrode of the transistor 200. The conductor 260 preferably includes the conductor 260*a* and the conductor 260*b* placed over the conductor 260*a*. For example, the conductor 260*a* is preferably placed to cover the bottom surface and a side surface of the conductor 260*b*. Although the conductor 260 is illustrated to have a two-layer structure of the conductor 260*a* and the conductor 260*b* in FIG. 23B and FIG. 23C, the conductor 260 may have a single-layer structure or a stacked-layer structure of three or more layers.

For the conductor 260*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., one or both of an oxygen atom and an oxygen molecule).

When the conductor 260*a* has a function of inhibiting diffusion of oxygen, the conductivity of the conductor 260*b* can be inhibited from being lowered because of oxidation due to oxygen diffused from the insulator 280 side. As the conductive material having a function of inhibiting diffusion of oxygen, for example, titanium, titanium nitride, tantalum, tantalum nitride, ruthenium, or ruthenium oxide is preferably used.

The conductor 260 is formed to fill the opening 258 provided to extend in the channel width direction, and the conductor 260 is also provided to extend in the channel width direction. Thus, when a plurality of transistors 200 are provided, the conductor 260 can function as a wiring. In this case, the insulator 253 and the insulator 254 are also provided to extend together with the conductor 260.

The conductor 260 also functions as a wiring and thus is preferably formed using a conductor having high conductivity. For example, a conductive material containing tungsten, copper, or aluminum as its main component can be used for the conductor 260*b*. The conductor 260*b* may have a stacked-layer structure; for example, a stacked-layer structure of the conductive material and titanium or titanium nitride may be employed.

In the transistor 200, the conductor 260 is formed in a self-aligned manner to fill the opening 258 formed in the insulator 280 and the like. The formation of the conductor 260 in this manner allows the conductor 260 to be placed properly in a region between the conductor 242*a* and the conductor 242*b* without alignment.

As illustrated in FIG. 23C, in the channel width direction of the transistor 200, with reference to the bottom surface of the insulator 222, the level of the bottom surface of the conductor 260 in a region where the conductor 260 and the oxide 230*b* do not overlap with each other is preferably lower than the level of the bottom surface of the oxide 230*b*. When the conductor 260 functioning as the gate electrode covers the side surface and the top surface of the channel formation region of the oxide 230*b* with the insulator 253 and the like therebetween, the electric field of the conductor 260 is likely to affect the entire channel formation region in the oxide 230*b*. Thus, the on-state current of the transistor 200 can be increased, and the frequency characteristics of the transistor 200 can be improved. With reference to the bottom surface of the insulator 222, the difference between the level of the bottom surface of the conductor 260 in a region where the conductor 260 does not overlap with the oxide 230*a* or the oxide 230*b* and the level of the bottom surface of the oxide 230*b* is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 253, the insulator 254, and the conductor 260 are to be provided. The top surface of the insulator 280 may be planarized.

The insulator 280 functioning as an interlayer film preferably has a low dielectric constant. When a material with a low dielectric constant is used for an interlayer film, the parasitic capacitance generated between wirings can be reduced. The insulator 280 is preferably provided using a material similar to that for the insulator 216, for example. In particular, silicon oxide and silicon oxynitride, which are thermally stable, are preferable. In particular, materials such as silicon oxide, silicon oxynitride, and porous silicon oxide are preferably used, in which case a region containing oxygen to be released by heating can be easily formed.

The concentration of impurities such as water and hydrogen in the insulator 280 is preferably reduced. Oxide containing silicon, such as silicon oxide or silicon oxynitride, is used as appropriate for the insulator 280, for example.

The insulator 282 is placed to be in contact with at least parts of the top surfaces of the conductor 260, the insulator 253, the insulator 254, and the insulator 280.

The insulator 282 preferably functions as a barrier insulating film that inhibits impurities such as water and hydrogen from being diffused into the insulator 280 from above and preferably has a function of capturing impurities such as hydrogen. The insulator 282 preferably functions as a barrier insulating film that inhibits passage of oxygen. For the insulator 282, a metal oxide having an amorphous structure, for example, an insulator such as aluminum oxide is used. In this case, the insulator 282 contains at least oxygen and aluminum. When the insulator 282 having a function of capturing impurities such as hydrogen is provided in contact with the insulator 280, impurities such as hydrogen contained in the insulator 280 and the like can be captured. It is particularly preferable to use aluminum oxide having an amorphous structure for the insulator 282, because hydrogen can be captured or fixed more effectively in some cases. Accordingly, the transistor 200 and a semiconductor device each of which has favorable characteristics and high reliability can be manufactured.

As the insulator 282, a film of aluminum oxide is preferably formed by a sputtering method, and a film of aluminum oxide is further preferably formed by a pulsed DC sputtering method using an aluminum target in an atmosphere containing an oxygen gas. The use of a pulsed DC sputtering method can achieve more uniform film thickness and improve the sputtering rate and film quality. Here, RF (Radio Frequency) power may be applied to the substrate. The amount of oxygen implanted into a layer below the insulator 282 can be controlled in accordance with on the amount of the RF power applied to the substrate. For example, the amount of oxygen implanted into the layer below the insulator 282 is smaller as the RF power is lower, and the amount of oxygen is easily saturated even when the insulator 282 has a small thickness.

Moreover, the amount of oxygen implanted into the layer below the insulator 282 is larger as the RF power is higher.

The RF power is higher than or equal to 0 $W/cm^2$ and lower than or equal to 1.86 $W/cm^2$, for example. In other words, the amount of oxygen to be implanted can be changed to be appropriate for the characteristics of the transistor, with the RF power used at the time of forming the insulator 282. Accordingly, an appropriate amount of oxygen for improving the reliability of the transistor can be implanted.

The RF frequency is preferably greater than or equal to 10 MHz. The typical frequency is 13.56 MHz. The higher the RF frequency is, the less damage the substrate gets.

Although FIG. 23A to FIG. 23D and the like illustrate the structure where the insulator 282 is a single layer, the present invention is not limited thereto, and the insulator 282 may have a stacked-layer structure of two or more layers. For example, the insulator 282 may have a stacked-layer structure of two layers.

An upper layer and a lower layer of the insulator 282 are preferably formed using the same material by different methods. For example, when a film of aluminum oxide is formed as the insulator 282 by a pulsed DC sputtering method with the use of an aluminum target in an atmosphere containing an oxygen gas, RF power applied to the substrate at the time of forming the lower layer of the insulator 282 and RF power applied to the substrate at the time of forming the upper layer of the insulator 282 are preferably different from each other, and the RF power applied to the substrate at the time of forming the lower layer of the insulator 282 is preferably lower than the RF power applied to the substrate at the time of forming the upper layer of the insulator 282. Specifically, the lower layer of the insulator 282 is formed with the RF power applied to the substrate of 0 $W/cm^2$ to 0.62 $W/cm^2$ inclusive, and the upper layer of the insulator 282 is formed with the RF power applied to the substrate of 1.86 $W/cm^2$ or lower. More specifically, the lower layer of the insulator 282 is formed with the RF power applied to the substrate of 0 $W/cm^2$, and the upper layer of the insulator 282 is formed with the RF power applied to the substrate of 0.31 $W/cm^2$. With such a structure, the insulator 282 can have an amorphous structure, and the amount of oxygen supplied to the insulator 280 can be controlled.

Note that the RF power applied to the substrate at the time of forming the lower layer of the insulator 282 may be higher than the RF power applied to the substrate at the time of forming the upper layer of the insulator 282. Specifically, the lower layer of the insulator 282 is formed with the RF power applied to the substrate of 1.86 $W/cm^2$ or lower, and the upper layer of the insulator 282 is formed with the RF power applied to the substrate of 0 $W/cm^2$ to 0.62 $W/cm^2$ inclusive. More specifically, the lower layer of the insulator 282 is formed with the RF power applied to the substrate of 1.86 $W/cm^2$, and the upper layer of the insulator 282 is formed with the RF power applied to the substrate of 0.62 $W/cm^2$. With such a structure, the amount of oxygen supplied to the insulator 280 can be increased.

The thickness of the lower layer of the insulator 282 is greater than or equal to 1 nm and less than or equal to 20 nm, preferably greater than or equal to 1.5 nm and less than or equal to 15 nm, further preferably greater than or equal to 2 nm and less than or equal to 10 nm, still further preferably greater than or equal to 3 nm and less than or equal to 8 nm. With such a structure, the lower layer of the insulator 282 can have an amorphous structure regardless of the RF power. When the lower layer of the insulator 282 has an amorphous structure, the upper layer of the insulator 282 easily has an amorphous structure, so that the insulator 282 can have an amorphous structure.

Although the lower layer of the insulator 282 and the upper layer of the insulator 282 described above form the structure of the stacked layers including the same material, the present invention is not limited thereto. The lower layer of the insulator 282 and the upper layer of the insulator 282 may form a structure of stacked layers including different materials.

The above is the description of the transistor 200.

[Capacitor 150]

Figure 26A:
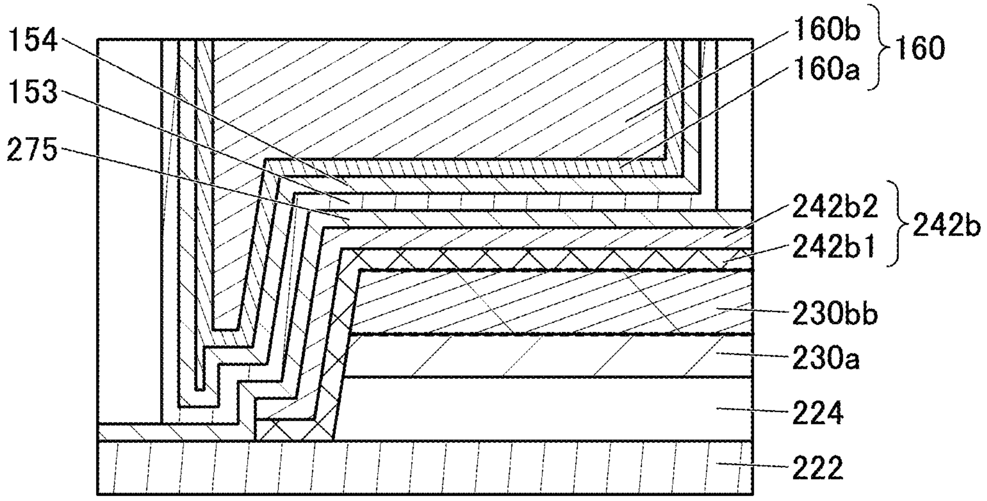
FIG. 26A and FIG. 26B are diagrams illustrating structure examples of a semiconductor device.
Figure 26B:
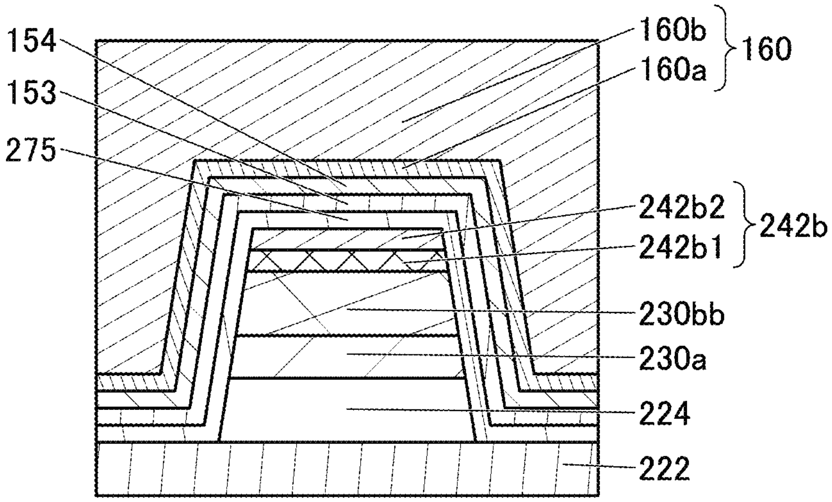

FIG. 26A is an enlarged view of the capacitor 150 and its vicinity in FIG. 23B, and FIG. 26B is an enlarged view of the capacitor 150 and its vicinity in FIG. 23D.

The capacitor 150 includes the conductor 242*b*, the insulator 275, the insulator 153, the insulator 154, and the conductor 160 (a conductor 160*a* and a conductor 160*b*). The conductor 242*b* functions as one of a pair of electrodes (also referred to as a lower electrode) of the capacitor 150; the conductor 160 functions as the other of the pair of electrodes (also referred to as an upper electrode) of the capacitor 150; and the insulator 275, the insulator 153, and the insulator 154 function as the dielectric of the capacitor 150.

The insulator 153, the insulator 154, the conductor 160*a*, and the conductor 160*b* are placed in the opening 158 provided in the insulator 280. The insulator 153 is provided over the insulator 275, the insulator 154 is provided over the insulator 153, the conductor 160*a* is provided over the insulator 154, and the conductor 160*b* is provided over the conductor 160*a*.

Although the details will be described later, the insulator 153, the insulator 154, the conductor 160*a*, and the conductor 160*b* included in the capacitor 150 can be formed using the same materials and the same steps as those for the insulator 253, the insulator 254, the conductor 260*a*, and the conductor 260*b* included in the transistor 200. Thus, the insulator 153 preferably includes the same insulating material as the insulator 253, and the description of the insulator 253 can be referred to for the details. The insulator 154 preferably includes the same insulating material as the insulator 254, and the description of the insulator 254 can be referred to for the details. The conductor 160*a* preferably includes the same conductive material as the conductor 260*a*, and the description of the conductor 260*a* can be referred to for the details. The conductor 160*b* preferably includes the same conductive material as the conductor 260*b*, and the description of the conductor 260*b* can be referred to for the details.

When the insulator 153, the insulator 154, the conductor 160*a*, and the conductor 160*b* are formed using the same materials and the same steps as those for the insulator 253, the insulator 254, the conductor 260*a*, and the conductor 260*b*, respectively, the number of steps in the manufacturing process of the semiconductor device can be reduced.

The opening 158 is provided in the insulator 280 to reach the insulator 275. In other words, the opening 158 includes a region overlapping with the insulator 275.

As illustrated in FIG. 23A, a region where the conductor 160 in the opening 158 intersects with the conductor 242*b* in the plan view functions as the capacitor 150. The region includes a region overlapping with the oxide 230*b* functioning as the transistor 200. That is, the capacitor 150 can be provided without an excessive increase in the occupied area, compared to the area occupied by the transistor 200. Accordingly, miniaturization or high integration of the semiconductor device can be achieved. For example, in the case where the semiconductor device of one embodiment of the present invention is used as a memory cell of a memory device, the storage capacity per unit area can be increased.

The conductor 242*b* can serve as both the lower electrode of the capacitor 150 and the other of the source electrode and the drain electrode of the transistor 200. Accordingly, the manufacturing process of the capacitor 150 and the manufacturing process of the transistor 200 can share some of the steps; therefore, a semiconductor device with high productivity can be provided.

As illustrated in FIG. 26A, an end portion of the conductor 242*b* on the capacitor 150 side is preferably positioned outward from an end portion of the oxide 230. In other words, the conductor 242*b* covers a side surface of the oxide 230 on the capacitor 150 side. Since the conductor 242*b* functions as the one of the pair of electrodes of the capacitor 150, this structure can increase the area where the pair of electrodes of the capacitor 150 overlap with each other. Thus, the capacitance of the capacitor 150 can be increased.

As illustrated in FIG. 26A and FIG. 26B, the opening 158 can also be regarded as having a shape in which part of a component including the insulator 224, the oxide 230, the conductor 242, and the insulator 275 protrudes in an opening having the insulator 222 as its bottom surface and the insulator 280 as its side surface. In the opening 158, the top surface of the oxide 230*b* is covered with the conductor 242*b* and the insulator 275 unlike in the opening 258; thus, the top surface of the oxide 230*b* is not exposed in the opening 158.

As illustrated in FIG. 26A and FIG. 26B, the insulator 153 is provided in contact with the bottom surface and the inner wall of the opening 158. Accordingly, the insulator 153 is in contact with the top surface of the insulator 275 and a side surface of the insulator 280. Over the insulator 153, the insulator 154 is provided in contact with the top surface of the insulator 153, and the conductor 160 is provided in contact with the top surface of the insulator 154. Thus, the insulator 153, the insulator 154, and the conductor 160 are provided to cover the parts of the conductor 242*b* and the insulator 275 that protrude in the opening 158.

When the capacitor 150 has the above-described structure, the conductor 160 is provided to face the top surface of the conductor 242*b*, a side surface of the conductor 242*b* facing away from the conductor 242*a* (a side surface of the conductor 242*b* on the A1 side in the capacitor 150*a* and a side surface thereof on the A2 side in the capacitor 150*b*), a side surface of the conductor 242*b* on the A5 side, and a side surface of the conductor 242*b* on the A6 side with the insulator 153 and the insulator 154 therebetween, as illustrated in FIG. 26A and FIG. 26B. Accordingly, the capacitor 150 can be formed with the above-described four surfaces of the conductor 242*b*; thus, the electrostatic capacitance per unit area of the capacitor 150 can be increased. As a result, miniaturization or high integration of the semiconductor device can be achieved.

Figure 27A:
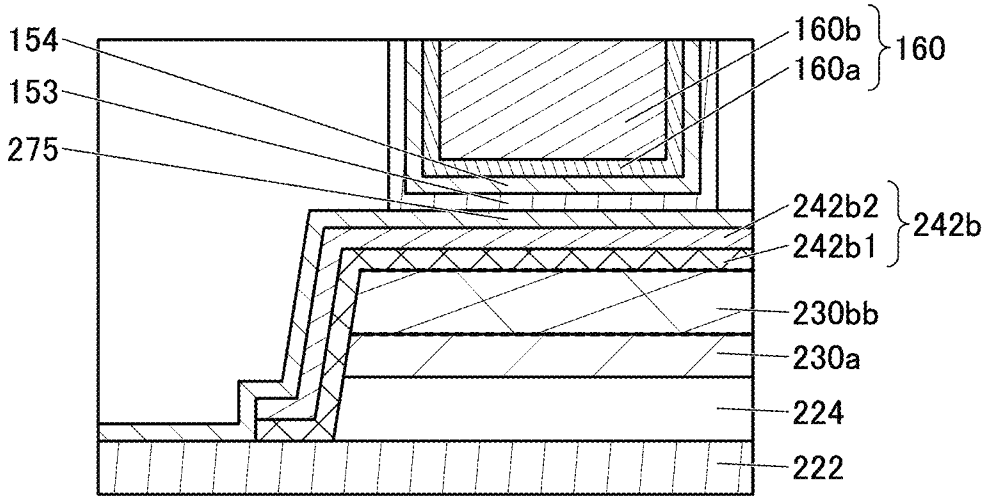
FIG. 27A and FIG. 27B are diagrams illustrating structure examples of a semiconductor device.

Note that the capacitor 150 may have a shape illustrated in FIG. 27A, for example, by optimizing materials used for the insulators functioning as the dielectric, the thickness of the insulator 280, and the like. Specifically, a side surface of the opening 158 facing away from the conductor 242*a* (a side surface of the opening 158 on the A1 side in the capacitor 150*a* and a side surface thereof on the A2 side in the capacitor 150*b*) may overlap with the oxide 230*b*. The conductor 160 may be provided to face the top surface of the conductor 242*b*, the side surface of the conductor 242*b* on the A5 side, and the side surface of the conductor 242*b* on the A6 side with the insulator 153 and the insulator 154 therebetween. In this case, the capacitor 150 can be formed with the above-described three surfaces of the conductor 242*b*. Alternatively, the capacitor 150 may have a shape illustrated in FIG. 27B, for example. Specifically, the opening 158 may be provided in a region not overlapping with the oxide 230*b*.

Figure 27B:
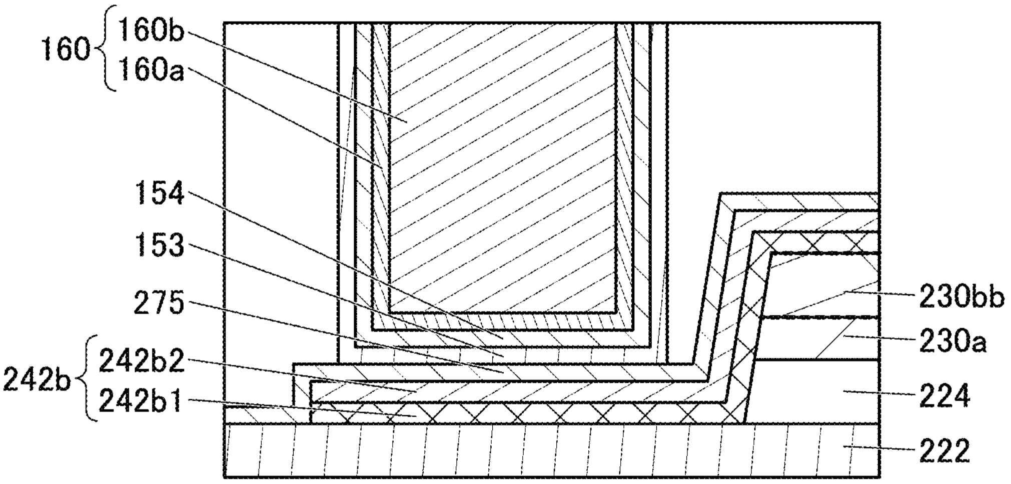

Although FIG. 26A, FIG. 27A, and FIG. 27B illustrate the structure in which the sidewall of the opening 158 is substantially perpendicular to the top surface of the insulator 222, the present invention is not limited thereto. The sidewall of the opening 158 may have a tapered shape. Although the details will be described later, the opening 258 and the opening 158 are formed in the same step. For example, in the case where the sidewall of the opening 258 has a tapered shape as illustrated in FIG. 25C, the sidewall of the opening 158 also has a tapered shape. When the sidewall of the opening 158 has a tapered shape, the coverage with the insulator 153 and the like can be improved in a later step, so that defects such as a void can be reduced.

The conductor 160 is formed to fill the opening 158 provided to extend in the channel width direction of the transistor 200, and the conductor 160 is also provided to extend in the channel width direction of the transistor 200. Thus, when a plurality of transistors 200 and a plurality of capacitors 150 are provided, the conductor 160 can function as a wiring. In this case, the insulator 153 and the insulator 154 are also provided to extend together with the conductor 160. The insulator 275, the insulator 153, and the insulator 154 function as the dielectric of the capacitor 150. A region of the insulator 153 that functions as the dielectric of the capacitor 150 is sandwiched between the insulator 275 and the insulator 154.

The region 230*bb* of the oxide 230*b* is a low-resistance region. Thus, the region 230*bb* of the oxide 230*b* can function as the lower electrode of the capacitor 150 in some cases. In this case, the area where the pair of electrodes of the capacitor 150 overlap with each other can be increased. As a result, the capacitance of the capacitor 150 can be increased.

The above is the description of the capacitor 150.

The conductor 240 is provided in contact with the inner wall of an opening in the insulator 285, the insulator 282, the insulator 280, the insulator 275, the conductor 242*a*, the insulator 222, the insulator 216, the insulator 214, and the insulator 212. The conductor 240 includes a region in contact with the top surface of the conductor 209.

The conductor 240 functions as a plug or a wiring for electrically connecting the transistor 200 to a circuit element such as a switch, a transistor, a capacitor, an inductor, a resistor, or a diode, a wiring, an electrode, or a terminal.

The conductor 240 preferably has a stacked-layer structure of the conductor 240*a* and the conductor 240*b*. For example, as illustrated in FIG. 23B, the conductor 240 can have a structure in which the conductor 240*a* is provided in contact with the inner wall of the above-described opening and the conductor 240*b* is provided on the inner side. That is, the conductor 240*a* is positioned in the vicinity of the insulator 285, the insulator 282, the insulator 280, the insulator 275, the conductor 242*a*, the insulator 222, the insulator 216, the insulator 214, and the insulator 212.

A conductive material having a function of inhibiting passage of impurities such as water and hydrogen is preferably used for the conductor 240*a*. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Impurities such as water and hydrogen contained in a layer above the insulator 282 can be inhibited from entering the oxide 230 through the conductor 240.

The conductor 240 also functions as a wiring and thus is preferably formed using a conductor having high conductivity. For example, a conductive material containing tungsten, copper, or aluminum as its main component can be used for the conductor 240*b*.

Although the transistor 200 having a structure in which the conductor 240 is a stack of the conductor 240*a* and the conductor 240*b* is illustrated, the present invention is not limited thereto. For example, the conductor 240 may have a single-layer structure or a stacked-layer structure of three or more layers. In the case where a component has a stacked-layer structure, layers may be distinguished by ordinal numbers given corresponding to the formation order. Although not illustrated in FIG. 23B, the level of the top surface of the conductor 240 is higher than the level of the top surface of the insulator 285 in some cases.

Figure 24:
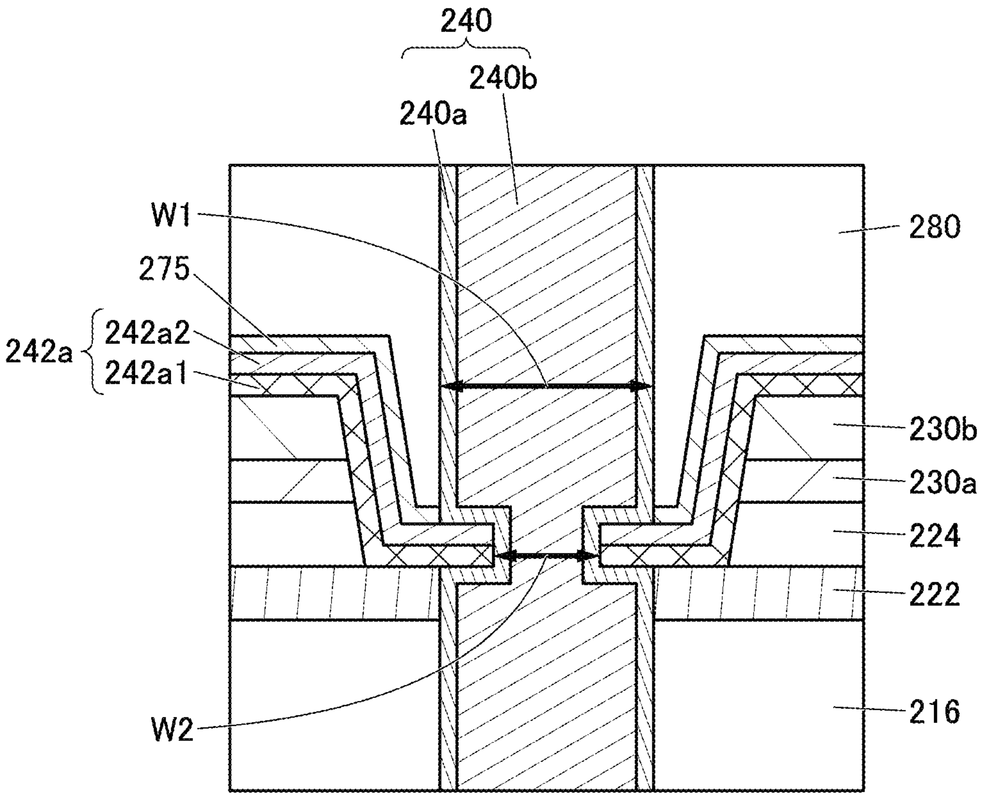
FIG. 24 is a diagram illustrating a structure example of a semiconductor device.

FIG. 24 is an enlarged view of a region where the conductor 240 and the conductor 242*a* are in contact with each other and its vicinity. As illustrated in FIG. 24, in the A1-A2 direction, the conductor 240 includes a region having a width $W_1$ and a region having a width $W_2$. The width $W_1$ corresponds to, for example, a distance from the interface between the insulator 280 and the conductor 240*a* on the transistor 200*a* side to the interface between the insulator 280 and the conductor 240*a* on the transistor 200*b* side. The width $W_2$ corresponds to the width of the opening of the conductor 242*a*.

As illustrated in FIG. 24, the width $W_1$ is preferably larger than the width $W_2$. In this structure, the conductor 240 is in contact with at least part of the top surface and part of a side surface of the conductor 242*a*. Accordingly, the area of the region where the conductor 240 and the conductor 242*a* are in contact with each other can be increased. Note that in this specification and the like, a contact between the conductor 240 and the conductor 242*a* is referred to as a top-side contact in some cases. As illustrated in FIG. 24, the conductor 240 may be in contact with part of the bottom surface of the conductor 242*a*. This structure can further increase the area of the region where the conductor 240 and the conductor 242*a* are in contact with each other.

The conductor 209 functions as part of a circuit element such as a switch, a transistor, a capacitor, an inductor, a resistor, or a diode, a wiring, an electrode, or a terminal.

The insulator 210 functions as an interlayer film. As the insulator 210, an insulator that can be used as the insulator 214, the insulator 216, and the like described above can be used.

<Constituent Materials for Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is the above-described semiconductor substrate including an insulator region, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization or high integration of transistors progress, for example, a problem such as a leakage current may arise because of a thinner gate insulator. When a high-k material is used for the insulator functioning as a gate insulator, the voltage at the time of the operation of the transistor can be lowered while the physical thickness is maintained. By contrast, when a material with a low relative permittivity is used for the insulator functioning as an interlayer film, parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded by an insulator having a function of inhibiting passage of oxygen and impurities such as hydrogen, the transistor can have stable electrical characteristics. For the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, it is possible to use a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride.

The insulator functioning as the gate insulator is preferably an insulator including a region containing oxygen to be released by heating. For example, when a structure is employed in which silicon oxide or silicon oxynitride including a region containing oxygen released by heating is in contact with the oxide 230, oxygen vacancies included in the oxide 230 can be filled.

<<Conductor>>

As the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

In the case where an oxide is used for the channel formation region of the transistor, the conductor functioning as a gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Moreover, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, an element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M. In particular, the element M is preferably one or more kinds selected from gallium, aluminum, yttrium, and tin.

It is particularly preferable to use an oxide containing indium (In), gallium (Ga), and zinc (Zn) (also referred to as IGZO) for the semiconductor layer of the transistor. Alternatively, an oxide containing indium (In), aluminum (Al), and zinc (Zn) (also referred to as IAZO) may be used for the semiconductor layer of the transistor. Alternatively, an oxide containing indium (In), aluminum (Al), gallium (Ga), and zinc (Zn) (IAGZO or IGAZO) may be used for the semiconductor layer.

Note that in this specification and the like, a metal oxide containing nitrogen is also collectively referred to as a metal oxide in some cases. A metal oxide containing nitrogen may be referred to as a metal oxynitride.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structures>

Examples of a crystal structure of an oxide semiconductor include amorphous (including completely amorphous), CAAC (c-axis-aligned crystalline), nc (nanocrystalline), CAC (cloud-aligned composite), single crystal, and polycrystalline (poly crystal) structures.

Note that a crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method. An XRD spectrum obtained by GIXD measurement may be hereinafter simply referred to as an XRD spectrum.

For example, the XRD spectrum of a quartz glass substrate shows a peak with a substantially bilaterally symmetrical shape. Meanwhile, the peak of the XRD spectrum of an In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as an amorphous state unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of a quartz glass substrate, which indicates that the quartz glass is in an amorphous state. Furthermore, not a halo pattern but a spot-like pattern is observed in the diffraction pattern of an In—Ga—Zn oxide film formed at room temperature. Thus, it is suggested that the In—Ga—Zn oxide film formed at room temperature is in an intermediate state, which is neither a single crystal nor polycrystal nor an amorphous state, and it cannot be concluded that the In—Ga—Zn oxide film is in an amorphous state.

<<Structure of Oxide Semiconductor>>

Oxide semiconductors might be classified in a manner different from the above-described one when classified in terms of the structure. For example, oxide semiconductors are classified into a single crystal oxide semiconductor and a non-single-crystal oxide semiconductor. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example. When the CAAC-OS film is subjected to structural analysis by Out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Hence, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the transistor including a metal oxide in its channel formation region (referred to as an OS transistor in some cases) can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods in some cases. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

The CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic proportions of In, Ga, and Zn in the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

Meanwhile, the second region has a higher insulating property than the first region. In other words, when the second regions are distributed in a metal oxide, leakage current can be inhibited.

Thus, in the case where the CAC-OS is used for a transistor, the complementary action of the conductivity due to the first region and the insulating property due to the second region enables the CAC-OS to have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current $I_{on}$), high field-effect mobility (μ), and excellent switching operation can be achieved.

A transistor including the CAC-OS has high reliability. Thus, the CAC-OS is most suitable for a variety of semiconductor devices such as display apparatuses.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the oxide semiconductor is set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When the oxide semiconductor contains nitrogen, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor including an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered substance functioning as a semiconductor (also referred to as an atomic layer material or a two-dimensional material) is preferably used as a semiconductor material. In particular, a layered substance functioning as a semiconductor is favorably used as a semiconductor material.

Here, in this specification and the like, the layered substance generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered substance has high electrical conductivity in a unit layer, that is, high two-dimensional electrical conductivity. When a material that functions as a semiconductor and has high two-dimensional electrical conductivity is used for a channel formation region, a transistor having a high on-state current can be provided.

Examples of the layered substance include graphene, silicene, and a chalcogenide. A chalcogenide is a compound containing a chalcogen. Chalcogen is a general term of elements belonging to Group 16, which includes oxygen, sulfur, selenium, tellurium, polonium, and livermorium. Examples of chalcogenides include transition metal chalcogenides and chalcogenides of Group 13 elements.

For the oxide 230, a transition metal chalcogenide functioning as a semiconductor is preferably used, for example. Specific examples of the transition metal chalcogenide that can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$). When the above-described transition metal chalcogenide is used for the oxide 230, a semiconductor device with a high on-state current can be provided.

<Variation Example of Semiconductor Device>

An example of the semiconductor device of one embodiment of the present invention will be described below with reference to FIG. 28A to FIG. 28D.

Figure 28A:
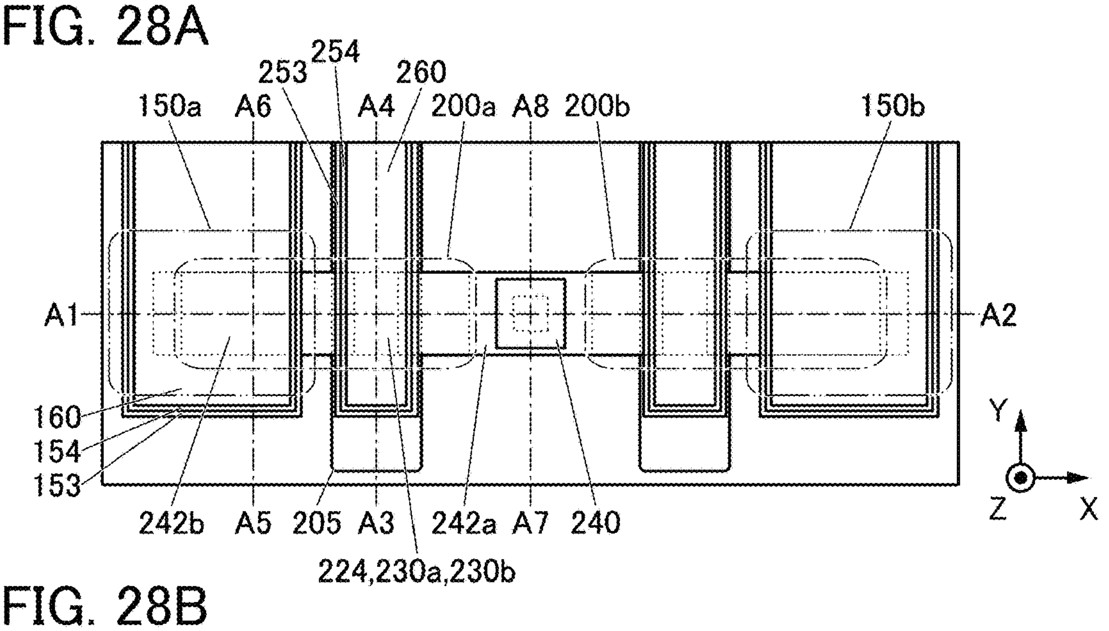
FIG. 28A to FIG. 28D are diagrams illustrating structure examples of a semiconductor device.
Figure 28B:
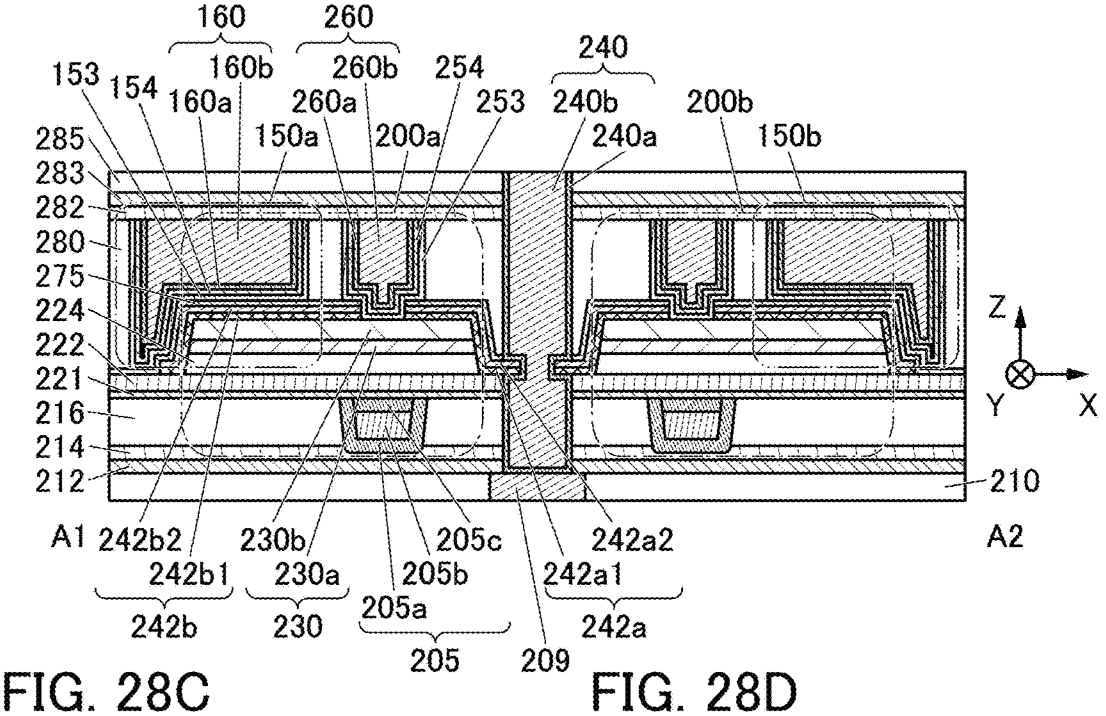
Figure 28C:
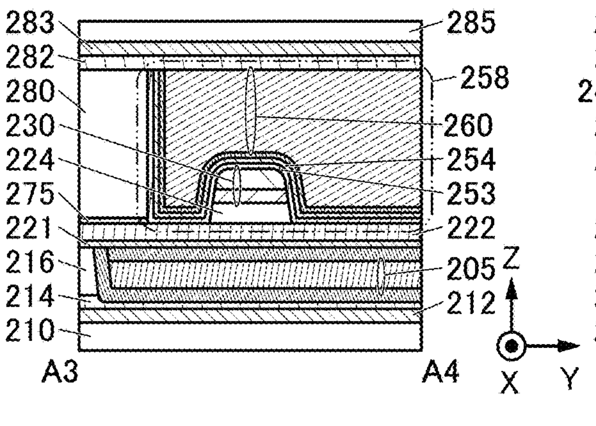
Figure 28D:
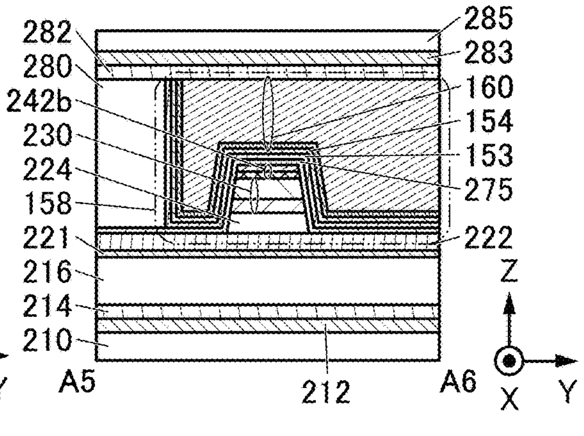

FIG. 28A is a top view of the semiconductor device. FIG. 28B is a cross-sectional view corresponding to a portion indicated by the dashed-dotted line A1-A2 illustrated in FIG. 28A. FIG. 28C is a cross-sectional view corresponding to a portion indicated by the dashed-dotted line A3-A4 in FIG. 28A. FIG. 28D is a cross-sectional view corresponding to a portion indicated by the dashed-dotted line A5-A6 in FIG. 28A. Note that for clarity of the drawing, some components are omitted in the top view of FIG. 28A.

Note that in the semiconductor device illustrated in FIG. 28A to FIG. 28D, components having the same functions as the components in the semiconductor device described in <Structure example of semiconductor device> are denoted by the same reference numerals. Note that the materials described in detail in <Structure example of semiconductor device> can be used as constituent materials of the semiconductor device in this section.

The semiconductor device illustrated in FIG. 28A to FIG. 28D is a variation example of the semiconductor device illustrated in FIG. 23A to FIG. 23D. The semiconductor device illustrated in FIG. 28A to FIG. 28D differs from the semiconductor device illustrated in FIG. 23A to FIG. 23D in including an insulator 283 and an insulator 221.

The insulator 283 is provided between the insulator 282 and the insulator 285. As the insulator 283, an insulator having a function of inhibiting diffusion of hydrogen is preferably used. This can inhibit diffusion of hydrogen into the transistor 200 from above the insulator 283. Note that as the insulator 283, an insulator that can be used as the insulator 275 described above can be used. For example, a film of silicon nitride formed by a sputtering method can be used for the insulator 283. When the insulator 283 is formed by a sputtering method, a high-density silicon nitride film can be formed. As the insulator 283, a film of silicon nitride formed by a PEALD method or a CVD method may be stacked over a film of silicon nitride formed by a sputtering method.

The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be constant. It is particularly preferable to use aluminum oxide having an amorphous structure for the insulator 282, because hydrogen can be captured or fixed more effectively in some cases. Accordingly, the transistor 200 and a semiconductor device each of which has favorable characteristics and high reliability can be manufactured.

Although FIG. 28A to FIG. 28D illustrate the transistor 200 having a structure in which the insulator 283 is provided as a single layer, the present invention is not limited thereto. For example, the insulator 283 may have a stacked-layer structure of two or more layers.

For example, in the case where the insulator 283 has a stacked-layer structure of two layers, a film of silicon nitride may be formed by a sputtering method as the lower layer of the insulator 283 and a film of silicon nitride may be formed by an ALD method as the upper layer of the insulator 283. By using a sputtering method, which does not need to use a molecule containing hydrogen as a deposition gas, the hydrogen concentration in the lower layer of the insulator 282 can be reduced. Furthermore, in the case where a pinhole, disconnection, or the like is formed in the film formed by a sputtering method, a portion of the pinhole or the disconnection can be filled with the ALD-deposited film with excellent coverage.

Note that in the case where the insulator 283 has a stacked-layer structure of two layers, part of the top surface of the upper layer of the insulator 283 is removed in some cases. The boundary between the upper layer and the lower layer of the insulator 283 is difficult to clearly detect in some cases.

The insulator 221 is provided between the insulator 222 and each of the insulator 216 and the conductor 205. The insulator 221 preferably has a function of inhibiting diffusion of hydrogen. This can inhibit diffusion of hydrogen into the transistor 200 from below the insulator 221. Note that the insulator 221 can also have the function of the insulator 212. In that case, the structure without the insulator 212 enables simplification of the manufacturing process and the improvement in productivity of the semiconductor device.

Note that as the insulator 221, an insulator that can be used as the insulator 275 described above can be used. For the insulator 221, a film of silicon nitride formed by an ALD method (especially a PEALD method) is preferably used, for example. By using an ALD method for the formation of the insulator 221, the insulator 221 can be formed with favorable coverage even when unevenness is formed by the insulator 216 and the conductor 205. This can inhibit formation of a pinhole or disconnection in the insulator 222 formed over the insulator 221.

An insulator having a function of inhibiting diffusion of hydrogen may be provided between the insulator 222 and the insulator 224. This can inhibit diffusion of hydrogen into the transistor 200 from below the insulator.

As illustrated in FIG. 28B and FIG. 28C, the conductor 205 may have a three-layer stacked structure of the conductor 205*a*, the conductor 205*b*, and a conductor 205*c*. The conductor 205*c* is provided in contact with the top surface of the conductor 205*b*. A side surface of the conductor 205*c* may be in contact with the conductor 205*a*. The top surface of the conductor 205*c* and the uppermost portion of the conductor 205*a* may be substantially level with each other.

Like the conductor 205*a*, the conductor 205*c* is preferably formed using a conductive material having a function of inhibiting diffusion of hydrogen. Thus, the conductor 205*b* can be surrounded by the conductor 205*a* and the conductor 205*c*, so that impurities such as hydrogen contained in the conductor 205*b* can be prevented from diffusing into the oxide 230 through the insulator 216 and the insulator 224. When the conductor 205*a* and the conductor 205*c* are formed using a conductive material having a function of inhibiting diffusion of oxygen, the conductivity of the conductor 205*b* can be inhibited from being lowered because of oxidation.

A change in electrical characteristics of an OS transistor such as the transistor 200 due to exposure to radiation is small, i.e., an OS transistor has high tolerance to radiation; thus, an OS transistor can be suitably used even in an environment where radiation might enter. For example, OS transistors can be suitably used in outer space. Specifically, OS transistors can be used as transistors in semiconductor devices provided in a space shuttle, an artificial satellite, a space probe, and the like. Examples of radiation include X-rays and neutron rays. Outer space refers to, for example, space at an altitude greater than or equal to 100 km, and outer space in this specification may also include the thermosphere, mesosphere, and stratosphere.

Alternatively, for example, OS transistors can be used as transistors included in semiconductor devices provided in working robots in a nuclear power plant and a treatment plant or a disposal plant for radioactive wastes. Examples of specific operations include demolishment of a reactor facility, taking out of a nuclear fuel or a fuel debris, and a field investigation on a space with a large amount of radioactive substance. OS transistors can be suitably used as transistors included in semiconductor devices provided in working robots that perform such operations by remote control.

According to one embodiment of the present invention, a novel transistor can be provided. Alternatively, a semiconductor device that can be miniaturized or highly integrated can be provided. Alternatively, a semiconductor device with favorable frequency characteristics can be provided. Alternatively, a semiconductor device with high operating speed can be provided. Alternatively, a semiconductor device with a small variation in transistor characteristics can be provided. Alternatively, a semiconductor device having favorable electrical characteristics can be provided. Alternatively, a semiconductor device with favorable reliability can be provided. Alternatively, a semiconductor device with a high on-state current can be provided. Alternatively, a semiconductor device with high field-effect mobility can be provided. Alternatively, a semiconductor device with low power consumption can be provided.

The structure described in this embodiment can be used in an appropriate combination with any of the structures described in the other embodiments.

Embodiment 5

Figure 29:
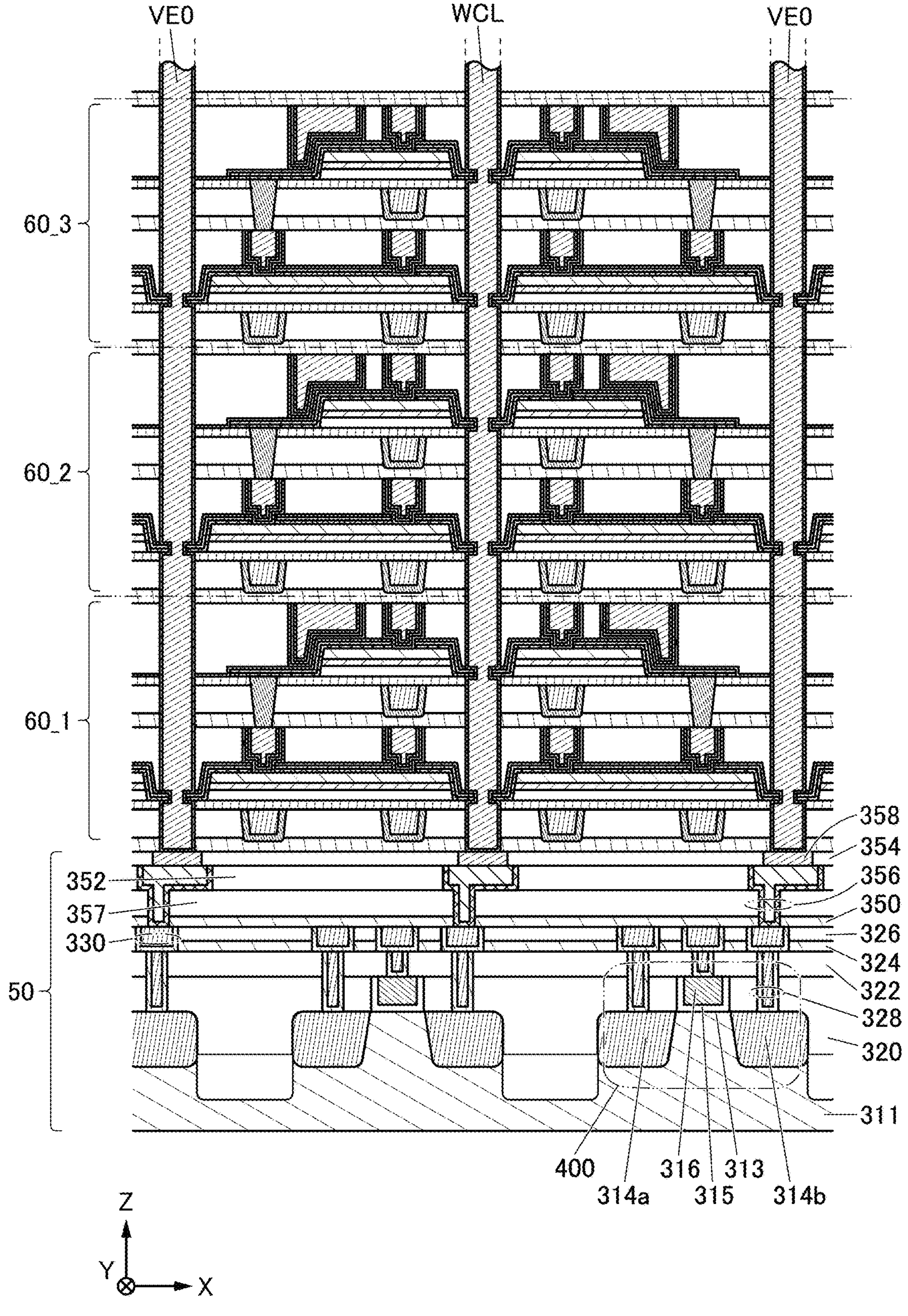
FIG. 29 is a diagram illustrating a structure example of a semiconductor device.

FIG. 29 illustrates a cross-sectional structure example of the memory device 100 of one embodiment of the present invention. The memory device 100 illustrated in FIG. 29 includes a plurality of memory layers 60 above the driver circuit layer 50. The description of the memory layers 60 in this embodiment is omitted in order to reduce repeated description.

FIG. 29 illustrates a transistor 400 included in the driver circuit layer 50 as an example. The transistor 400 is provided on a substrate 311 and includes a conductor 316 functioning as a gate, an insulator 315 functioning as a gate insulator, a semiconductor region 313 including part of the substrate 311, and a low-resistance region 314*a* and a low-resistance region 314*b* functioning as a source region and a drain region. The transistor 400 may be a p-channel transistor or an n-channel transistor. As the substrate 311, a single crystal silicon substrate can be used, for example.

Here, in the transistor 400 illustrated in FIG. 29, the semiconductor region 313 (part of the substrate 311) where a channel is formed has a protruding shape. The conductor 316 is provided to cover side surfaces and the top surface of the semiconductor region 313 with the insulator 315 therebetween. Note that a material adjusting the work function may be used for the conductor 316. Such a transistor 400 is also referred to as a FIN-type transistor because it utilizes a protruding portion of a semiconductor substrate. Note that an insulator functioning as a mask for forming the protruding portion may be included in contact with an upper portion of the protruding portion. Although the case where the protruding portion is formed by processing part of the semiconductor substrate is described here, a semiconductor film having a protruding shape may be formed by processing an SOI (Silicon on Insulator) substrate.

Note that the transistor 400 illustrated in FIG. 29 is an example and the structure is not limited thereto; an appropriate transistor is used in accordance with a circuit configuration or a driving method.

A wiring layer provided with an interlayer film, a wiring, and a plug may be provided between the components. A plurality of wiring layers can be provided in accordance with the design. In this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are sequentially stacked over the transistor 400 as interlayer films. A conductor 328 and the like are embedded in the insulator 320 and the insulator 322. A conductor 330 and the like are embedded in the insulator 324 and the insulator 326. Note that the conductor 328 and the conductor 330 function as a contact plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to have improved planarity.

A wiring layer may be provided over the insulator 326 and the conductor 330. For example, in FIG. 29, an insulator 350, an insulator 357, an insulator 352, and an insulator 354 are sequentially stacked over the insulator 326 and the conductor 330. A conductor 356 is formed in the insulator 350, the insulator 357, and the insulator 352. The conductor 356 functions as a contact plug or a wiring.

The insulator 354 is provided over the insulator 352 and the conductor 356. A conductor 358 is embedded in the insulator 354. The conductor 358 functions as a contact plug or a wiring. For example, a wiring SL and the transistor 400 are electrically connected to each other through the conductor 358, the conductor 356, the conductor 330, and the like.

This embodiment can be combined as appropriate with any of the other embodiments and the like described in this specification.

Embodiment 6

This embodiment will describe a semiconductor wafer where the arithmetic circuit or the memory device described in the above embodiment is formed and electronic components incorporating the memory device.

<Semiconductor Wafer>

First, an example of a semiconductor wafer where a memory device or the like is formed is described with reference to FIG. 30A.

Figure 30A:
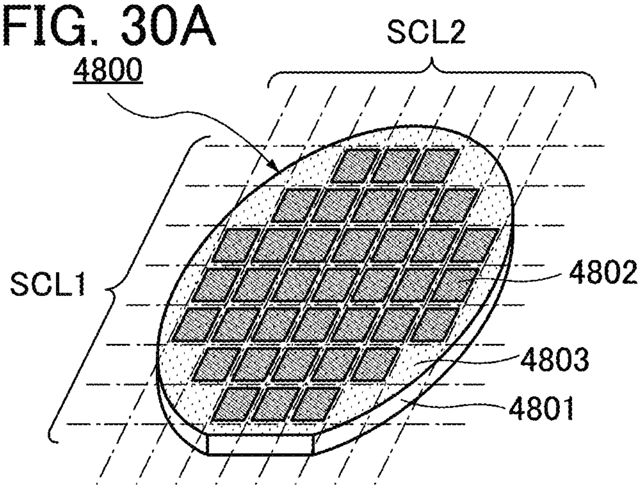
FIG. 30A is a perspective view illustrating an example of a semiconductor wafer.

A semiconductor wafer 4800 illustrated in FIG. 30A includes a wafer 4801 and a plurality of circuit portions 4802 provided on the top surface of the wafer 4801. Note that a portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. The dicing is performed along scribe lines SCL1 and scribe lines SCL2 (sometimes referred to as dicing lines or cutting lines) indicated by dashed-dotted lines. Note that to perform the dicing step easily, the spacing 4803 is preferably provided so that the plurality of scribe lines SCL1 are parallel to each other, the plurality of scribe lines SCL2 are parallel to each other, and the scribe lines SCL1 are perpendicular to the scribe lines SCL2.

Figure 30B:
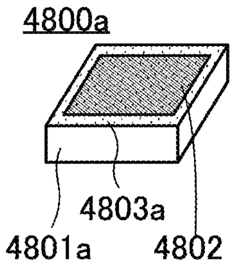
FIG. 30B is a perspective view illustrating an example of a chip.

With the dicing step, a chip 4800*a* illustrated in FIG. 30B can be cut out from the semiconductor wafer 4800. The chip 4800*a* includes a wafer 4801*a*, the circuit portion 4802, and a spacing 4803*a*. Note that it is preferable to make the spacing 4803*a* small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 30A. The element substrate may be a rectangular semiconductor wafer, for example. The shape of the element substrate can be changed as appropriate, depending on a manufacturing process of an element and an apparatus for manufacturing the element.

<Electronic Components>

Figure 30C:
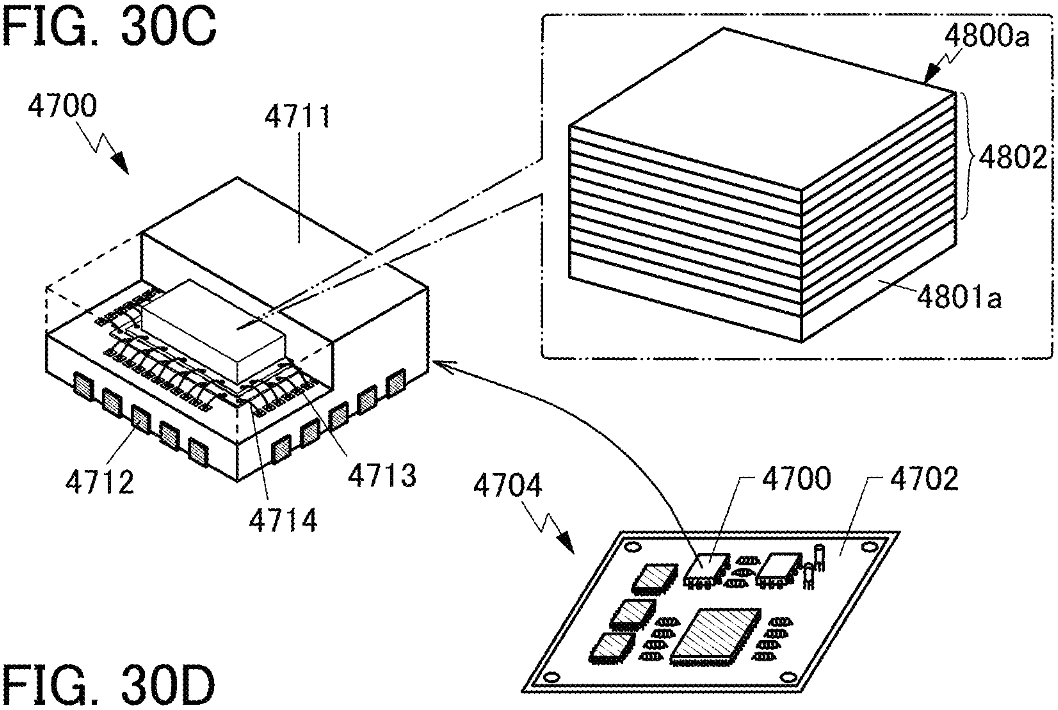
FIG. 30C and FIG. 30D are perspective views illustrating examples of electronic components.

FIG. 30C illustrates a perspective view of an electronic component 4700 and a substrate (a mounting board 4704) on which the electronic component 4700 is mounted. The electronic component 4700 illustrated in FIG. 30C includes the chip 4800*a* in a mold 4711. Note that the chip 4800*a* illustrated in FIG. 30C is shown to have a structure where the circuit portions 4802 are stacked. That is, the memory device described in the above embodiment can be used for the circuit portion 4802. To illustrate the inside of the electronic component 4700, some portions are omitted in FIG. 30C. The electronic component 4700 includes a land 4712 outside the mold 4711. The land 4712 is electrically connected to an electrode pad 4713, and the electrode pad 4713 is electrically connected to the chip 4800*a* through a wire 4714. The electronic component 4700 is mounted on a printed circuit board 4702, for example. A plurality of such electronic components are combined and electrically connected to each other on the printed circuit board 4702, so that the mounting board 4704 is completed.

Figure 30D:
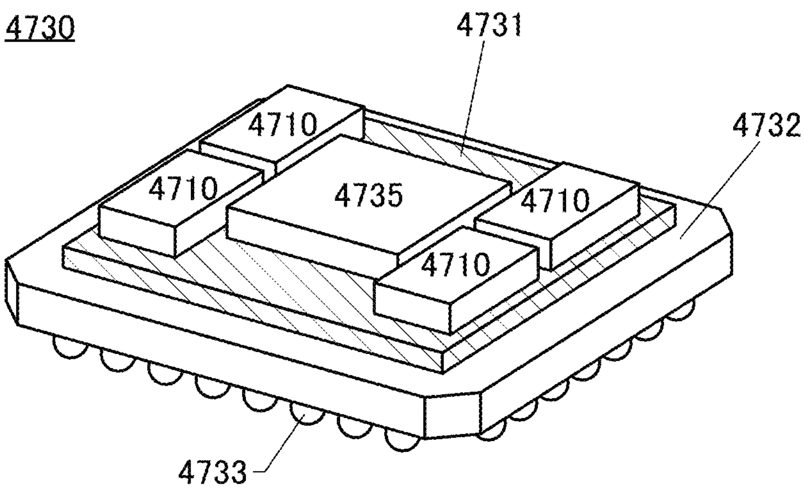

FIG. 30D is a perspective view of an electronic component 4730. The electronic component 4730 is an example of a SiP(System in Package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the memory device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used, for example.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". In some cases, a through electrode is provided in the interposer 4731 and the through electrode is used to electrically connect an integrated circuit and the package substrate 4732. In the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP or an MCM using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 30D illustrates an example where the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP(Quad Flat Package), QFJ (Quad Flat J-leaded package), or QFN (Quad Flat Non-leaded package) can be employed.

Note that this embodiment can be combined with any of the other embodiments in this specification as appropriate.

In this embodiment, a CPU that can include the arithmetic circuit or the memory device of the above embodiment will be described.

Embodiment 7

Figure 31:
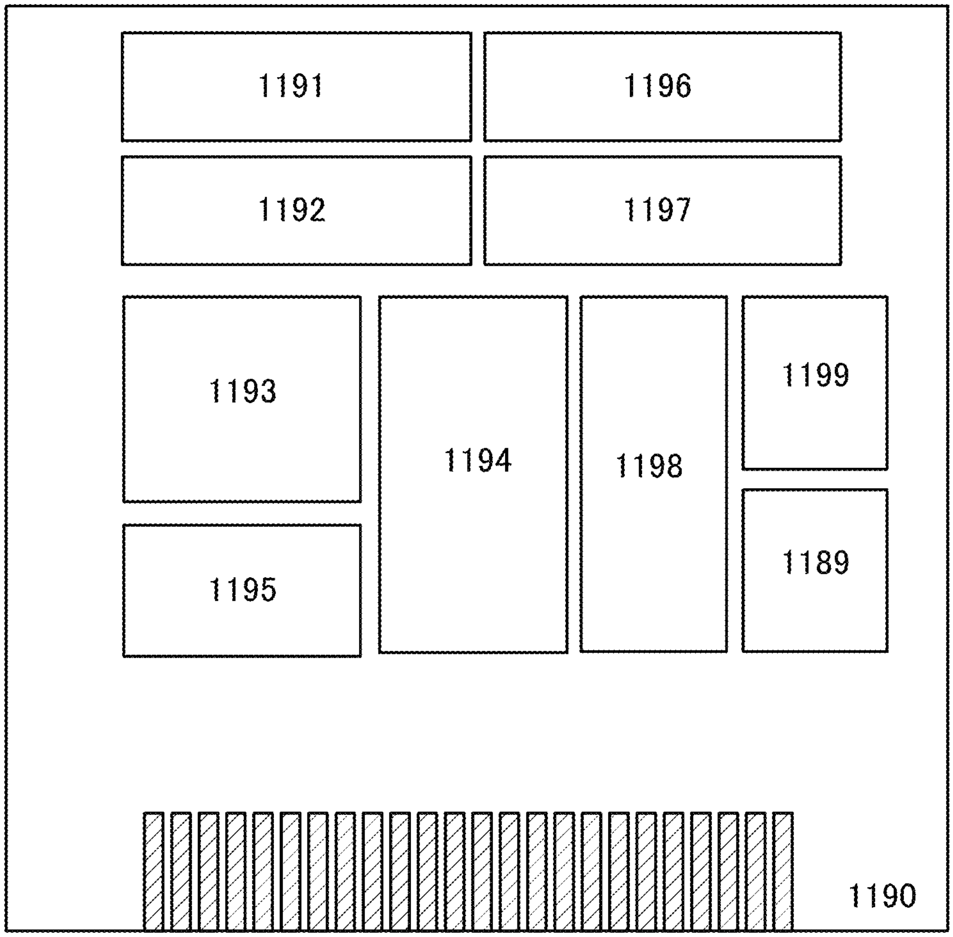
FIG. 31 is a block diagram illustrating a CPU.

FIG. 31 is a block diagram illustrating a configuration example of a CPU part of which employs the arithmetic circuit or the memory device described in the above embodiment.

The CPU illustrated in FIG. 31 includes an ALU 1191 (ALU: Arithmetic logic unit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) on a substrate 1190. A semiconductor substrate, an SOI substrate, a glass substrate, or the like is used as the substrate 1190. The ROM 1199 and the ROM interface 1189 may be provided on a separate chip. It is needless to say that the CPU illustrated in FIG. 31 is just an example of the simplified configuration, and an actual CPU has various configurations depending on applications. For example, a CPU may have a configuration in which a plurality of cores each including the CPU illustrated in FIG. 31 or an arithmetic circuit are included and operate in parallel, that is, a GPU-like configuration. The number of bits that the CPU can process in an internal arithmetic circuit, a data bus, or the like can be 8, 16, 32, or 64 or more, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads or writes data from/to the register 1196 in accordance with the state of the CPU.

Note that one or more selected from the ALU controller 1192, the interrupt controller 1194, the register controller 1197, and the timing controller 1195 may include the arithmetic circuit described in the above embodiment, for example.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above various circuits.

In the CPU illustrated in FIG. 31, a memory cell is provided in the register 1196. The register 1196 may include the memory device described in the above embodiment, for example.

In the CPU illustrated in FIG. 31, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. When data retention by the flip-flop is selected, a power supply voltage is supplied to the memory cell in the register 1196. When data retention by the capacitor is selected, the data is rewritten into the capacitor, and supply of a power supply voltage to the memory cell in the register 1196 can be stopped.

Note that this embodiment can be combined with any of the other embodiments in this specification as appropriate.

Embodiment 8

In this embodiment, examples of electronic devices each including the arithmetic circuit or the memory device described in the above embodiment will be described. FIG.

32A to FIG. 32J and FIG. 34A to FIG. 34E illustrate electronic devices each of which includes the electronic component 4700 including the arithmetic circuit or the memory device.

[Mobile Phone]

Figure 32A:
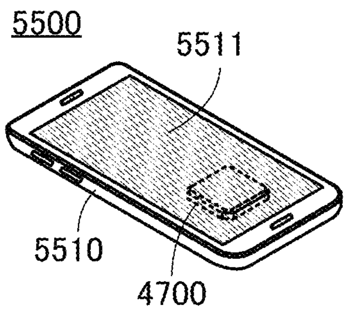
FIG. 32A to FIG. 32J are each a perspective view or a schematic view illustrating an example of an electronic device.

An information terminal 5500 illustrated in FIG. 32A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the memory device described in the above embodiment, the information terminal 5500 can retain a temporary file generated at the time of executing an application (e.g., a web browser's cache).

[Wearable Terminal]

Figure 32B:
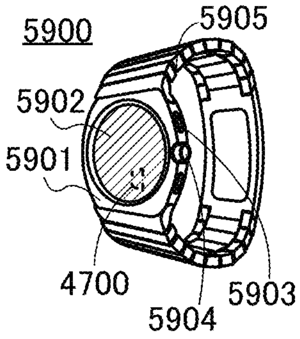

FIG. 32B illustrates an information terminal 5900 that is an example of a wearable terminal. The information terminal 5900 includes a housing 5901, a display portion 5902, an operation button 5903, an operator 5904, a band 5905, and the like.

Like the information terminal 5500 described above, the wearable terminal can retain a temporary file generated at the time of executing an application by using the memory device described in the above embodiment.

[Information Terminal]

Figure 32C:
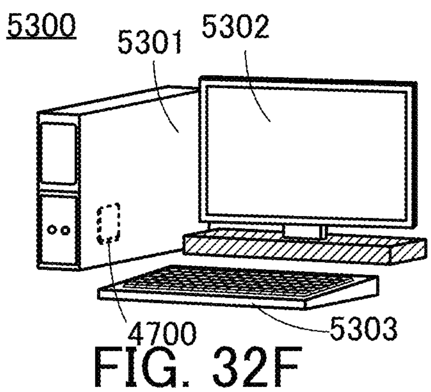

FIG. 32C illustrates a desktop information terminal 5300. The desktop information terminal 5300 includes a main body 5301 of the information terminal, a display 5302, and a keyboard 5303.

Like the information terminal 5500 described above, the desktop information terminal 5300 can retain a temporary file generated at the time of executing an application by using the memory device described in the above embodiment.

Although the smartphone, the wearable terminal, and the desktop information terminal are respectively illustrated in FIG. 32A to FIG. 32C as examples of the electronic device, one embodiment of the present invention can be applied to information terminals other than a smartphone, a wearable terminal, and a desktop information terminal. Examples of an information terminal other than a smartphone, a wearable terminal, and a desktop information terminal include a PDA (Personal Digital Assistant), a laptop information terminal, and a workstation.

[Household Appliance]

Figure 32D:
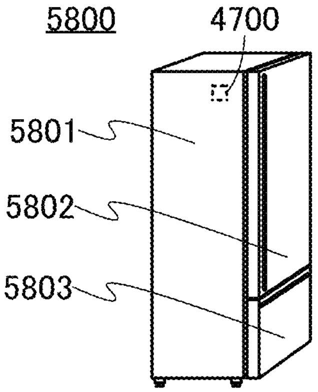

FIG. 32D illustrates an electric refrigerator-freezer 5800 as an example of a household appliance. The electric refrigerator-freezer 5800 includes a housing 5801, a refrigerator door 5802, a freezer door 5803, and the like.

When the memory device described in the above embodiment is used in the electric refrigerator-freezer 5800, the electric refrigerator-freezer 5800 can be used for IoT (Internet of Things), for example. With the use of IoT, the electric refrigerator-freezer 5800 can send and receive information on food stored in the electric refrigerator-freezer 5800 and food expiration dates, for example, to/from the above-described information terminal and the like via the Internet. When sending the information, the electric refrigerator-freezer 5800 can retain the information as a temporary file in the memory device.

Although the electric refrigerator-freezer is described in this example as a household appliance, other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 32E:
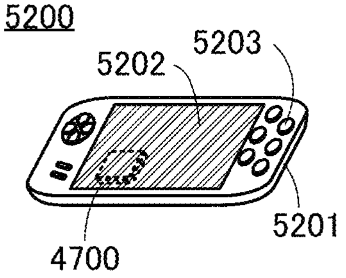

FIG. 32E illustrates a portable game machine 5200 that is an example of a game machine. The portable game machine 5200 includes a housing 5201, a display portion 5202, and a button 5203.

Figure 32F:
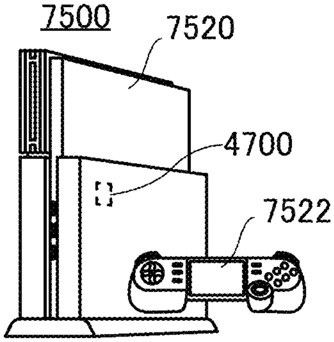

FIG. 32F illustrates a stationary game machine 7500 that is another example of a game machine. The stationary game machine 7500 includes a main body 7520 and a controller 7522. Note that the controller 7522 can be connected to the main body 7520 with or without a wire. Although not illustrated in FIG. 32F, the controller 7522 can include one or two or more selected from a display portion that displays a game image, and an input interface besides a button, such as a touch panel, a stick, a rotating knob, and a sliding knob. The shape of the controller 7522 is not limited to that illustrated in FIG. 32F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using one or both of a gesture and a voice instead of a controller.

Videos displayed on the game machine can be output with a display apparatus such as a television device, a personal computer display, a game display, or a head-mounted display.

When the memory device described in the above embodiment is used in the portable game machine 5200 and the stationary game machine 7500, the portable game machine 5200 with low power consumption can be achieved. Moreover, heat generation from a circuit can be reduced owing to low power consumption; thus, the influence of heat generation on the circuit itself, a peripheral circuit, and a module can be reduced.

Moreover, with the use of the memory device described in the above embodiment, the portable game machine 5200 and the stationary game machine 7500 can retain a temporary file necessary for arithmetic operation that occurs during game play.

Although FIG. 32E and FIG. 32F illustrate a portable game machine and a stationary game machine, respectively, as examples of game machines, the electronic device of one embodiment of the present invention is not limited thereto. Examples of the electronic device of one embodiment of the present invention include an arcade game machine installed in entertainment facilities (e.g., a game center and an amusement park) and a throwing machine for batting practice installed in sports facilities.

[Moving Vehicle]

The memory device described in the above embodiment can be used for an automobile, which is a moving vehicle, and around the driver's seat in an automobile.

Figure 32G:
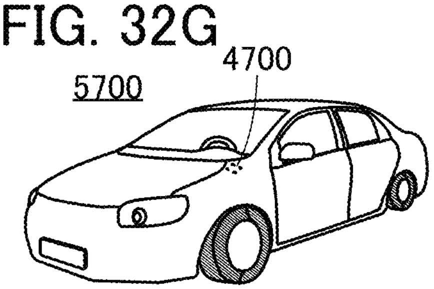

FIG. 32G illustrates an automobile 5700 that is an example of a moving vehicle.

Various kinds of information such as a speedometer, a tachometer, a mileage, a fuel meter, a gearshift indicator, and air-conditioning settings can be displayed on an instrument panel provided around the driver's seat of the automobile 5700. In addition, a display apparatus showing the above information may be provided around the driver's seat.

In particular, the display apparatus can compensate for the view obstructed by a pillar or the like, blind areas for the driver's seat, and the like by displaying a video from an imaging device (not illustrated) provided for the automobile 5700, which can increase safety.

The memory device described in the above embodiment can temporarily retain data; thus, the memory device can be used to retain temporary data necessary in an automatic driving system for the automobile 5700 and a system for navigation and risk prediction, for example. The display apparatus may be configured to display temporary information regarding navigation, risk prediction, or the like. Moreover, the memory device may be configured to retain a video of a driving recorder provided in the automobile 5700.

Note that although an automobile is described above as an example of a moving vehicle, the moving vehicle is not limited to an automobile. Other examples of moving vehicles include a train, a monorail train, a ship, and a flying object (a helicopter, an unmanned aircraft (a drone), an airplane, and a rocket).

[Camera]

The memory device described in the above embodiment can be used in a camera.

Figure 32H:
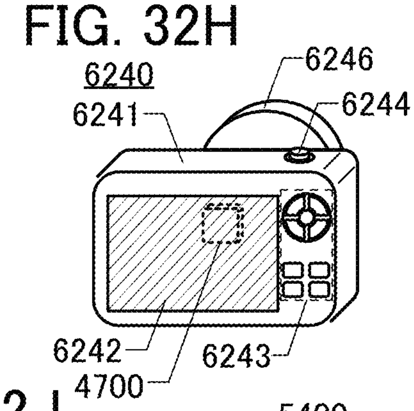

FIG. 32H illustrates a digital camera 6240 that is an example of an imaging device. The digital camera 6240 includes a housing 6241, a display portion 6242, operation buttons 6243, a shutter button 6244, and the like, and a detachable lens 6246 is attached to the digital camera 6240. Note that here, the camera 6240 is configured such that the lens 6246 is detachable from the housing 6241 for replacement; alternatively, the lens 6246 may be integrated with the housing 6241. In addition, the digital camera 6240 may be configured to be additionally equipped with a stroboscope or a viewfinder.

When the memory device described in the above embodiment is used in the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The memory device described in the above embodiment can be used in a video camera.

Figure 32I:
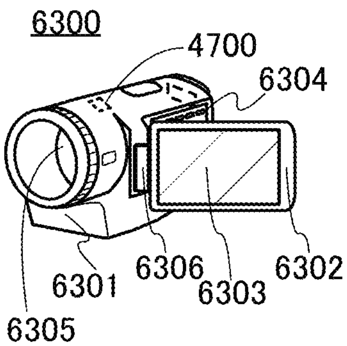

FIG. 32I illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Videos displayed on the display portion 6303 may be changed in accordance with the angle at the joint 6306 between the first housing 6301 and the second housing 6302.

When videos taken by the video camera 6300 are recorded, the videos need to be encoded in accordance with a data recording format. By using the above memory device, the video camera 6300 can retain a temporary file generated in encoding.

[ICD]

The memory device described in the above embodiment can be used in an implantable cardioverter-defibrillator (ICD).

Figure 32J:
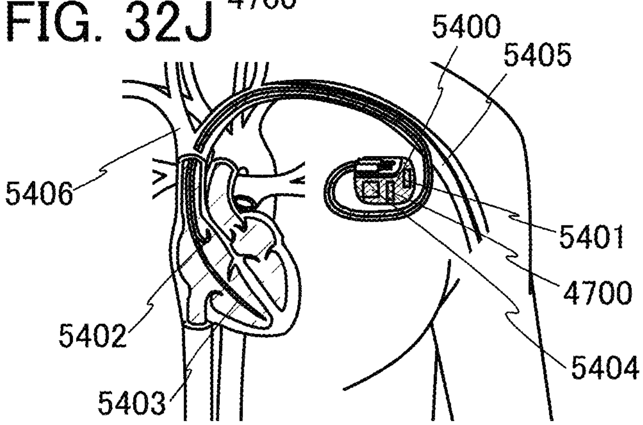

FIG. 32J is a schematic cross-sectional diagram illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor or the like, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, safety can be increased. Specifically, even when some of the batteries in the ICD main unit 5400 are dead, the other batteries can function properly; thus, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

[Head-Mounted Displays]

The memory device described in the above embodiment can be used in electronic devices for XR such as AR (augmented reality) and VR (virtual reality).

Figure 33A:
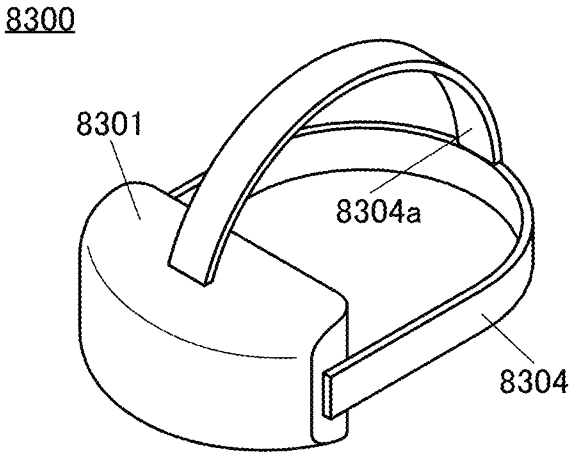
FIG. 33A to FIG. 33D are diagrams illustrating structure examples of electronic devices.
Figure 33B:
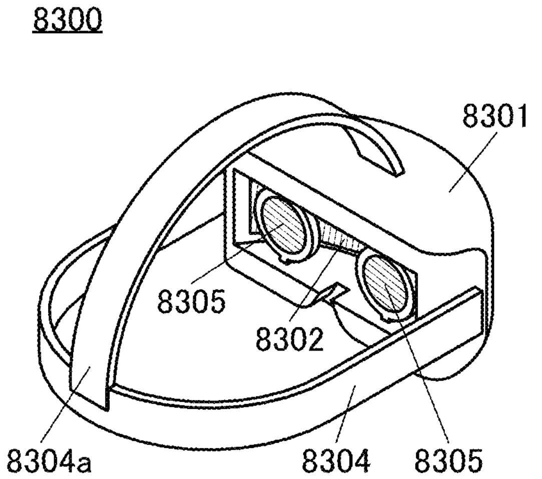
Figure 33C:
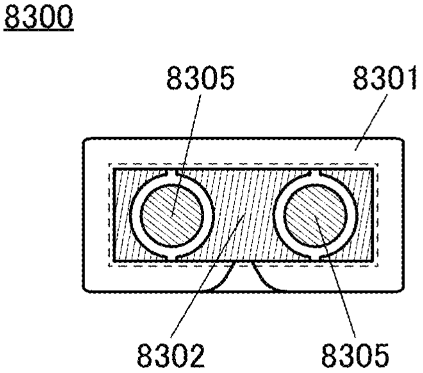

FIG. 33A to FIG. 33C are diagrams illustrating the appearance of an electronic device 8300 that is a head-mounted display. The electronic device 8300 illustrated in FIG. 33A to FIG. 33C includes a housing 8301, a display portion 8302, a band-like fixing member 8304, a fixing member 8304*a* worn on a head, and a pair of lenses 8305. Note that the electronic device 8300 may include an operation button.

A user can see display on the display portion 8302 through the lenses 8305. Note that the display portion 8302 is preferably placed to be curved, in which case the user can feel a high realistic sensation. When another image displayed in a different region of the display portion 8302 is viewed through the lenses 8305, three-dimensional display using parallax or the like can also be performed. Note that the structure is not limited to the structure in which one display portion 8302 is provided; two display portions 8302 may be provided so that one display portion is provided for one eye of the user.

For the display portion 8302, an extremely high-resolution display apparatus is preferably used, for example. When a high-resolution display apparatus is used for the display portion 8302, it is possible to display a more realistic video that does not allow the user to perceive pixels even when the image is magnified using the lenses 8305 as illustrated in FIG. 33C.

Figure 33D:
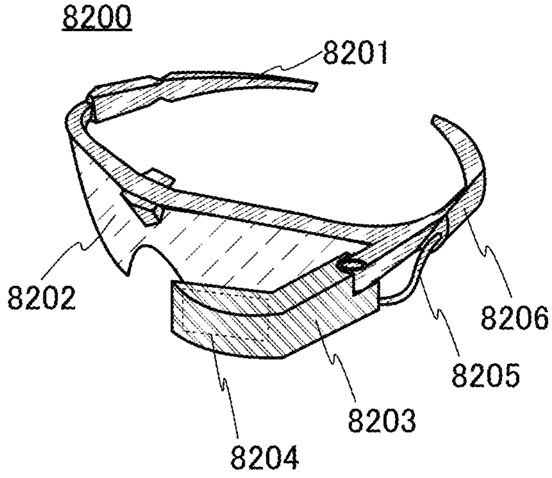

The head-mounted display, which is an electronic device of one embodiment of the present invention, may have a structure of an electronic device 8200 that is a glasses-type head-mounted display illustrated in FIG. 33D.

The electronic device 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 includes a camera, and information on the movement of the eyeballs or the eyelids of the user can be used as an input means.

The mounting portion 8201 may include a plurality of electrodes capable of sensing current flowing in response to the movement of the user's eyeball in a position in contact with the user, to have a function of recognizing the user's line of sight. The mounting portion 8201 may also have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

[Expansion Device for PC]

The memory device described in the above embodiment can be used in a calculator such as a PC (Personal Computer) and an expansion device for an information terminal.

Figure 34A:
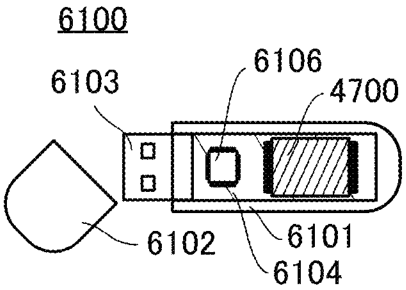
FIG. 34A to FIG. 34E are each a perspective view or a schematic view illustrating an example of an electronic device.

FIG. 34A illustrates, as an example of the expansion device, a portable expansion device 6100 that is externally attached to a PC and includes a chip capable of storing information. The expansion device 6100 can store information using the chip when connected to a PC with a USB (Universal Serial Bus) or the like, for example. FIG. 34A illustrates the portable expansion device 6100; however, the expansion device of one embodiment of the present invention is not limited thereto and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving, for example, the memory device described in the above embodiment. For example, the substrate 6104 is provided with the electronic component 4700 and a controller chip 6106. The USB connector 6103 functions as an interface for connection to an external device.

[Sd Card]

The memory device described in the above embodiment can be used in an SD card that can be attached to an electronic device such as an information terminal or a digital camera.

Figure 34B:
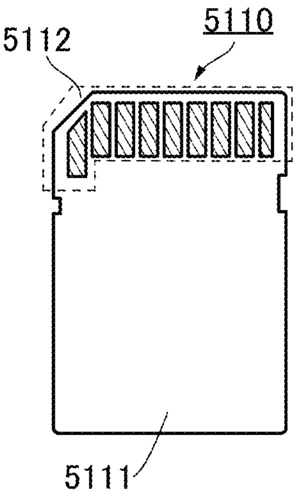
Figure 34C:
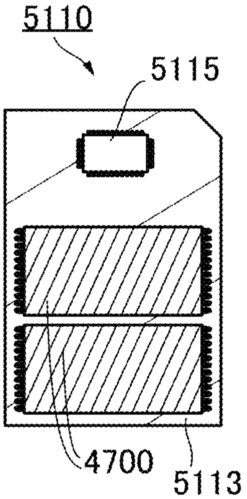

FIG. 34B is a schematic external view of an SD card, and FIG. 34C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the electronic components 4700 and a controller chip 5115 are attached to the substrate 5113. Note that the circuit configurations of the electronic components 4700 and the controller chip 5115 are not limited to those described above, and the circuit configurations may be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on the rear surface side of the substrate 5113, the capacity of the SD card 5110 can be increased. In addition, a wireless chip with a wireless communication function may be provided on the substrate 5113. This allows wireless communication between an external device and the SD card 5110 and enables data reading and writing from/to the electronic components 4700.

[SSD]

The memory device described in the above embodiment can be used in an SSD (Solid State Drive) that can be attached to an electronic device such as an information terminal.

Figure 34D:
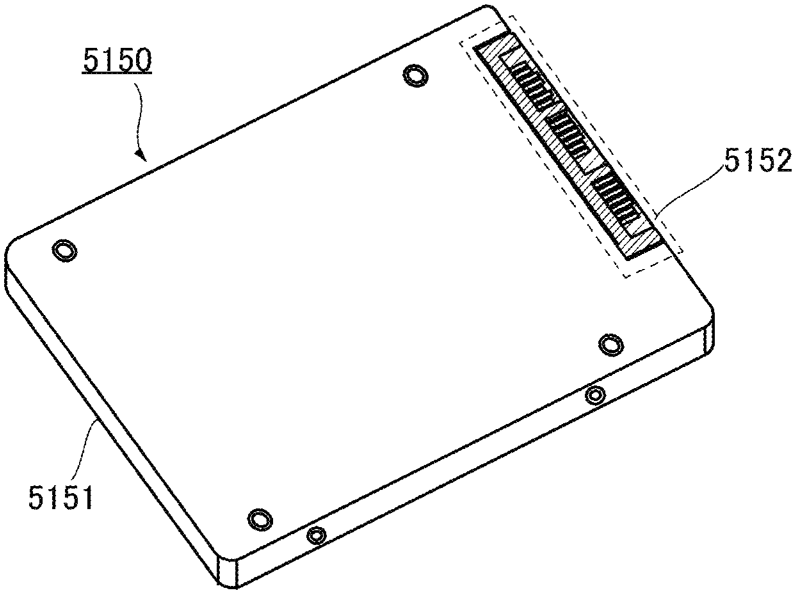
Figure 34E:
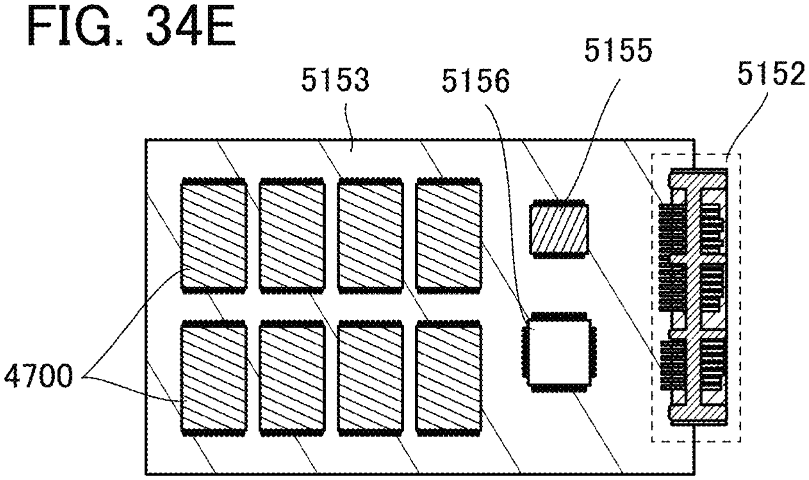

FIG. 34D is a schematic external view of an SSD, and FIG. 34E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are also provided on the rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit configurations of the electronic components 4700, the memory chip 5155, and the controller chip 5156 are not limited to those described above, and the circuit configurations may be changed as appropriate according to circumstances. For example, a memory functioning as a work memory may also be provided in the controller chip 5156.

Note that this embodiment can be combined with any of the other embodiments in this specification as appropriate.

Example 1

This example will describe results of fabricating an arithmetic circuit and performing a writing operation in the arithmetic circuit and results of performing simulation on the basis of the obtained results.

Figure 35:
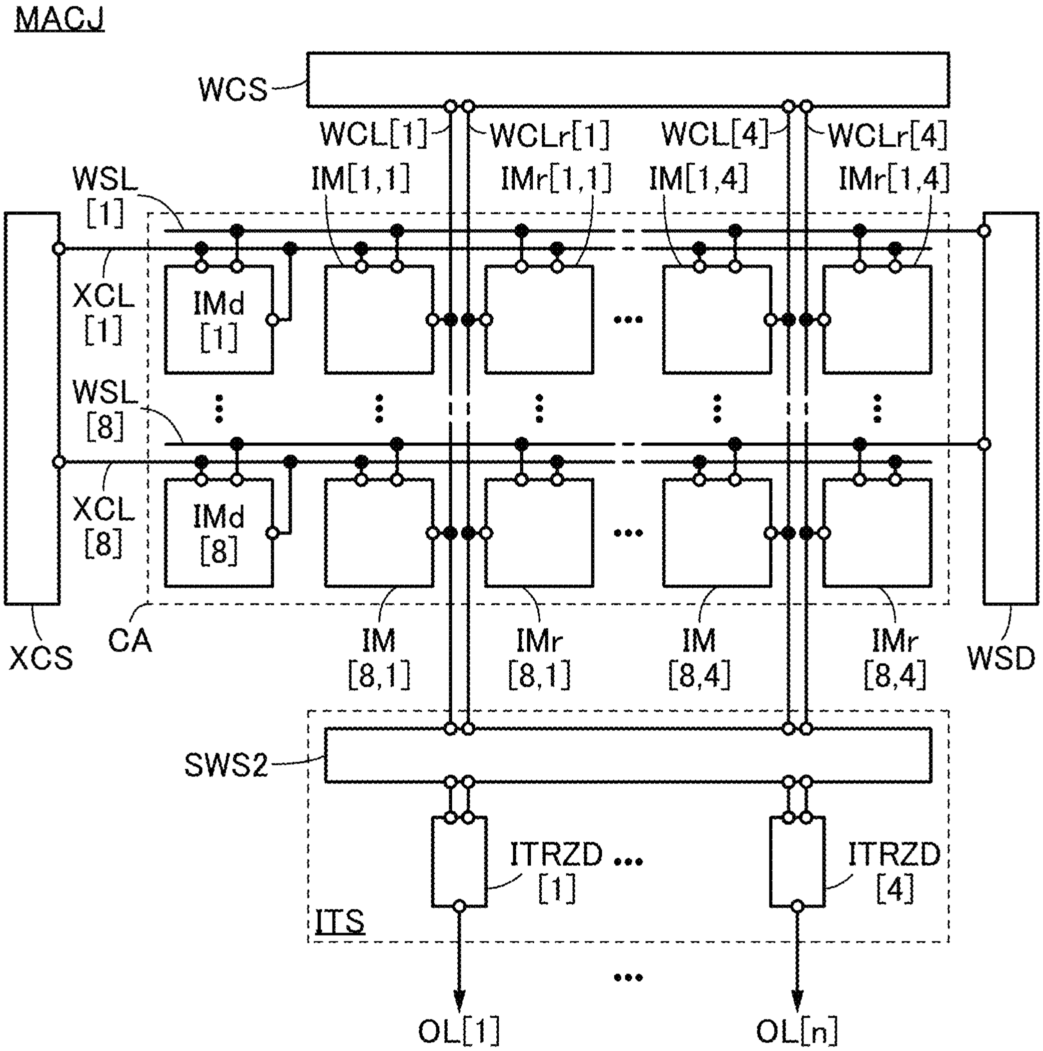
FIG. 35 is a block diagram illustrating a configuration of a semiconductor device described in Example.

First, a block diagram of the fabricated arithmetic circuit is shown in FIG. 35. Like the arithmetic circuit MACB1 described in Embodiment 2, an arithmetic circuit MACJ includes the cell array CA, the circuit WCS, the circuit XCS, and the circuit WSD, and the cell array CA includes the cells IM, the cells IMr, and the cells IMd.

Specifically, the cell array CA includes the cell IM[1,1] to the cell IM[8,4], the cell IMr[1,1] to the cell IMr[8,4], and the cell IMd[1] to the cell IMd[8]. That is, the cell IM[1,1] to the cell IM[8,4] and the cell IMr[1,1] to the cell IMr[8,4] are arranged in a matrix of 8×8 in the cell array CA. The cell IMd[1] to the cell IMd[8] are arranged in a column at the left end in the top view of the above-described matrix of 8×8.

The arithmetic circuit MACJ includes the circuit WCS, the circuit XCS, the circuit WSD, and the circuit ITS. Like the circuit ITS described in Embodiment 2, the circuit ITS of the arithmetic circuit MACJ includes the circuit SWS2 and the converter circuit ITRZD[1] to the converter circuit ITRZD[4].

In the cell array CA, the wiring WCL[1] to the wiring WCL[4] and the wiring WCLr[1] to the wiring WCLr[4] extend in the column direction. In the cell array CA, the wiring WSL[1] to the wiring WSL[8] and the wiring XCL[1] to the wiring XCL[8] extend in the row direction.

The cell IM[1,1] to the cell IM[8,1] are electrically connected to the wiring WCL[1], and the cell IMr[1,1] to the cell IMr[8,1] are electrically connected to the wiring WCLr [1]. The cell IM[1,4] to the cell IM[8,4] are electrically connected to the wiring WCL[4], and the cell IMr[1,4] to the cell IMr[8,4] are electrically connected to the wiring WCLr [4].

The circuit WCS is electrically connected to the wiring WCL[1] to the wiring WCL[4] and the wiring WCLr[1] to the wiring WCLr[4]. The circuit XCS is electrically connected to the wiring XCL[1] to the wiring XCL[8]. The circuit WSD is electrically connected to the wiring WSL[1] to the wiring WSL[8]. The wiring WCL[1] is electrically connected to the first input terminal of the converter circuit ITRZD[1] through the circuit SWS2, and the wiring WCLr [1] is electrically connected to the second input terminal of the converter circuit ITRZD[1] through the circuit SWS2. The wiring WCL[4] is electrically connected to the first input terminal of the converter circuit ITRZD[4] through the circuit SWS2, and the wiring WCLr[4] is electrically connected to the second input terminal of the converter circuit ITRZD[4] through a circuit SWX2. The output terminals of the converter circuit ITRZD[1] to the converter circuit ITRZD[4] are electrically connected to the circuit FB.

The control circuit CTR is electrically connected to the circuit WCS, the circuit XCS, and the circuit FB.

Like the circuit WCS described in Embodiment 2, the circuit WCS of the arithmetic circuit MACJ has a function of supplying a current with an amount corresponding to first data. Like the circuit XCS described in Embodiment 2, the circuit XCS of the arithmetic circuit MACJ has a function of supplying a current with an amount corresponding to reference data or a current with an amount corresponding to second data. Like the circuit WSD described in Embodiment 2, the circuit WSD of the arithmetic circuit MACJ has a function of selecting a row of the cell array CA to which the first data is to be written, by supplying a predetermined signal to the wiring WSL[1] to the wiring WSL[8] at the time of writing the first data to each of the cells included in the cell array CA. The converter circuit ITRZD[1] to the converter circuit ITRZD[4] of the arithmetic circuit MACJ each have a function of obtaining a difference value between a current flowing through the first input terminal and a current flowing through the second input terminal and outputting the difference value to the circuit FB. The circuit FB of the arithmetic circuit MACJ has a function of comparing the difference value and a predetermined reference value and transmitting the result of their magnitude relation to the control circuit CTR.

Figure 36A:
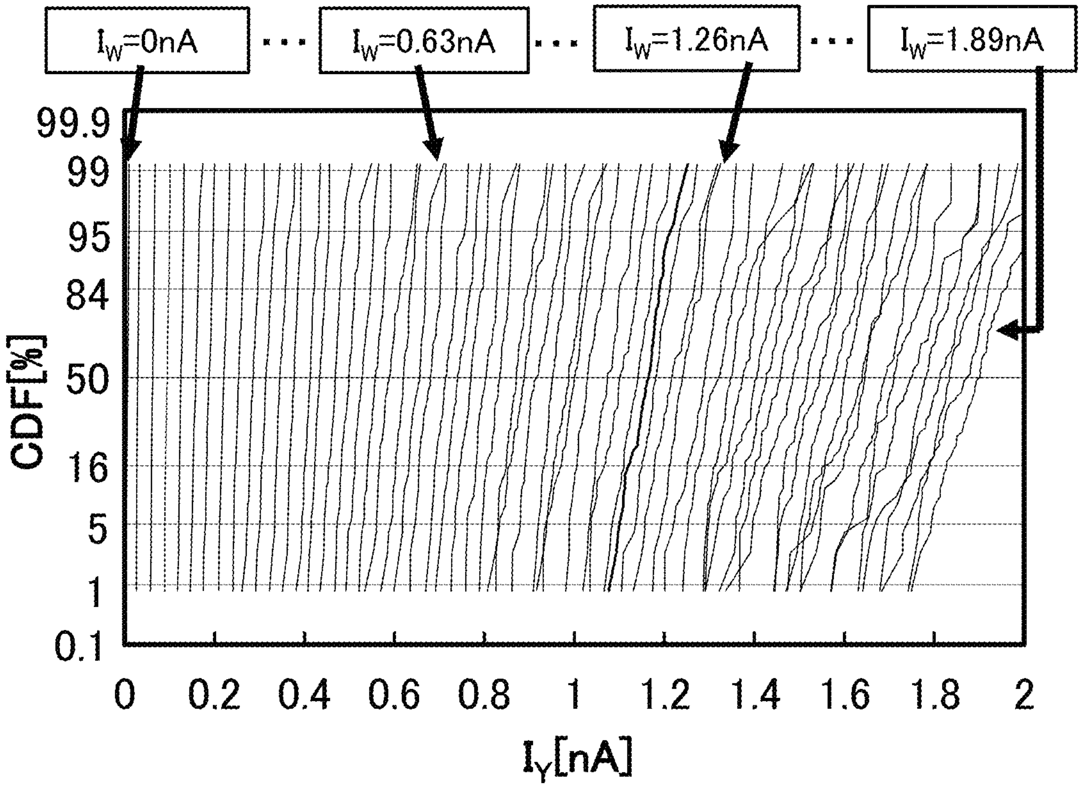
FIG. 36A and FIG. 36B are graphs showing distribution of the amount of current output from a semiconductor device described in Example.

FIG. 36A is a graph showing distribution of current amounts $I_Y$ output from a plurality of the cells IM electrically connected to one wiring WCL. Note that a current amount $I_X$ flowing from the circuit XCS to the cell IMd through the wiring XCL in each row is 1 nA. The horizontal axis represents the current amount $I_Y$ output from each of the cells IM, and the vertical axis represents the cumulant (the value of a cumulative distribution function (CDF)) of the number of cells IM that output a current with an amount smaller than or equal to the current amount $I_Y$. Note that at this time, a current amount $I_W$ corresponding to first data W, which is set in each of the plurality of cells IM electrically connected to one wiring WCL, is any of values (64 values) ranging from 0 nA to 1.89 nA in the steps of 0.03 nA; FIG. 36A shows the case with each current amount that can be set in the cell IM. Note that the cell IM retains a potential corresponding to the current amount $I_W$.

FIG. 36A shows the CDF results of the case where a potential corresponding to the first data W is retained in the plurality of cells IM electrically connected to one wiring WCL without correction processing at room temperature.

Figure 36B:
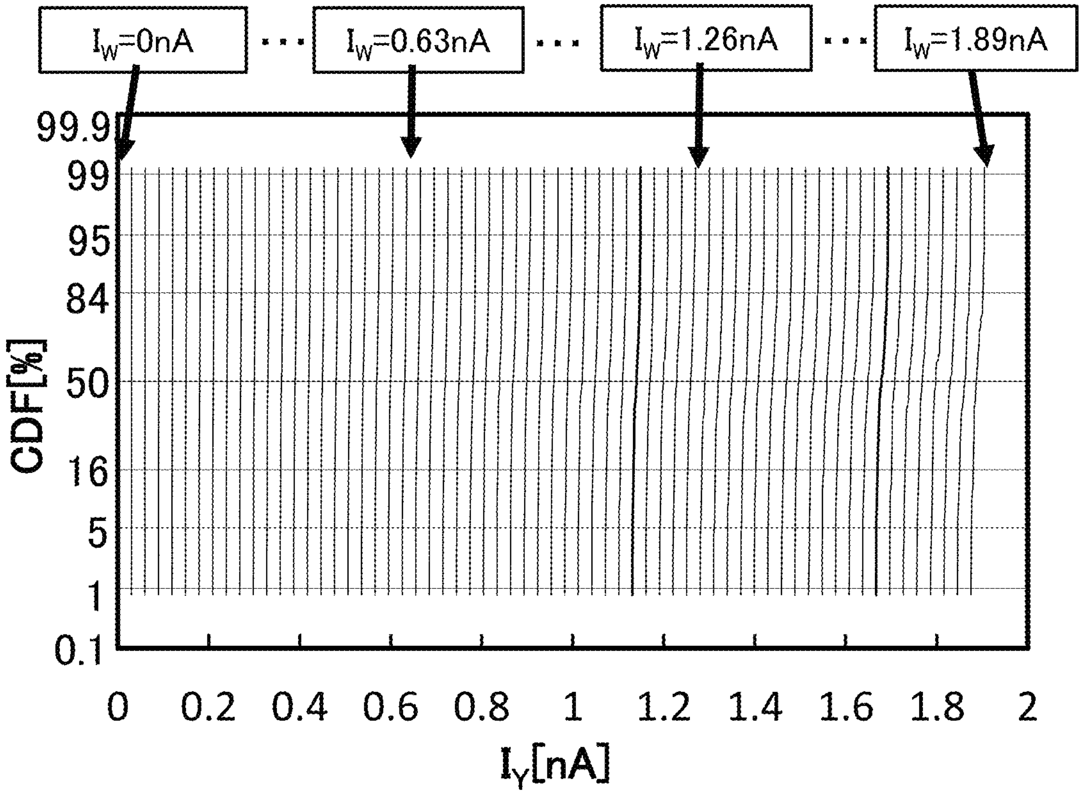

Here, the correction processing described in Embodiment 2 was simulated using the obtained data in FIG. 36A. FIG. 36B shows the CDF results of the case where a potential corresponding to the first data W is retained in the plurality of cells IM electrically connected to one wiring WCL with the correction processing at room temperature.

Figure 37:
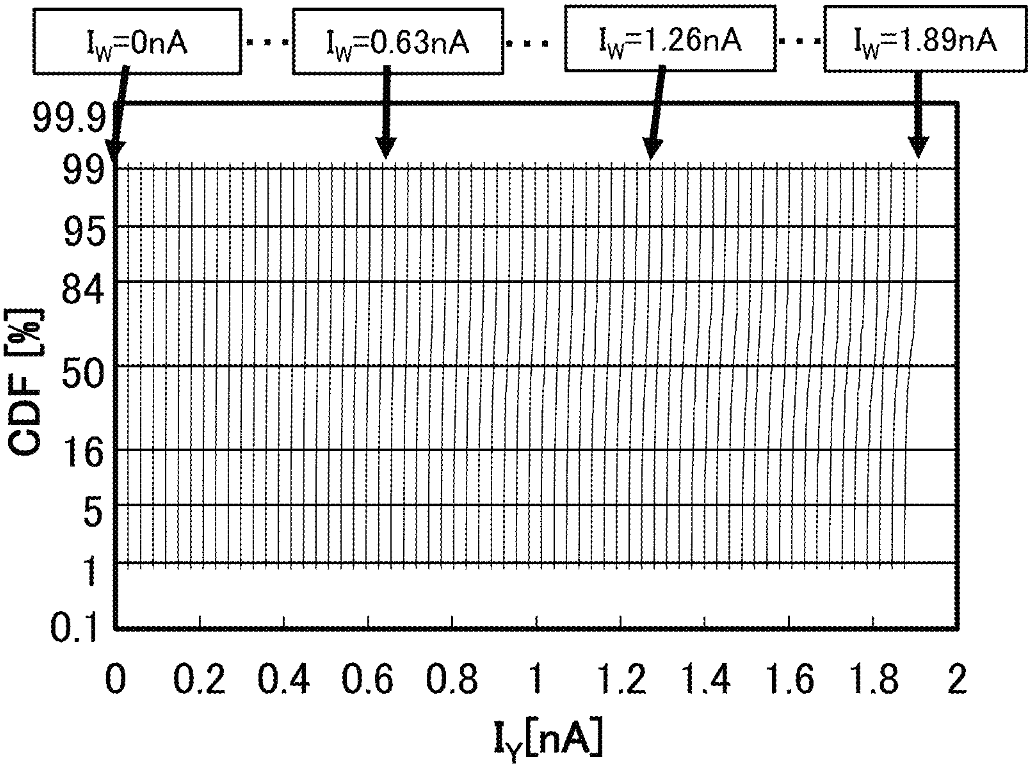
FIG. 37 is a graph showing distribution of the amount of current output from a semiconductor device described in Example.

FIG. 37 shows results of performing simulation similar to that in FIG. 36B on CDF results of the case where a potential corresponding to the first data W is retained in the plurality of cells IM electrically connected to one wiring WCL without correction processing at 85° C. That is, FIG. 36B shows the CDF results of the case where a potential corresponding to the first data W is retained in the plurality of cells IM electrically connected to one wiring WCL with the correction processing at 85° C.

Specifically, the operation example of the flowchart in FIG. 8 is employed for the operation of writing the first data W with the correction processing in FIG. 36B and FIG. 37. In particular, in the operation example of the flowchart in FIG. 8, Step S108 is assumed to include not a step of determining whether $|\Delta W_1|$ is smaller than the reference value δ and terminating the procedure when $|\Delta W_1|$ is smaller than the reference value δ, but a step of terminating the procedure when processing from Step S105 to Step S106 is performed a predetermined number of times. Specifically, the number (N) of times of performing the processing from Step S105 to Step S106 is nine. This assumes the case where the reference value δ is set to 0.015 nA and $|\Delta W_1|$ becomes smaller than the reference value δ by the ninth processing.

It is confirmed from FIG. 36A, FIG. 36B, and FIG. 37 that a variation in the current amount $I_Y$ output from the plurality of cells IM electrically connected to one wiring WCL can be significantly reduced by the correction processing. It is found from FIG. 36B and FIG. 37 that there is no variation in the current amount $I_Y$ due to the influence of heat.

Example 2

This example will describe an arithmetic circuit that was actually prototyped and has been described in the above embodiment and results of a variety of measurement.

Figure 38:
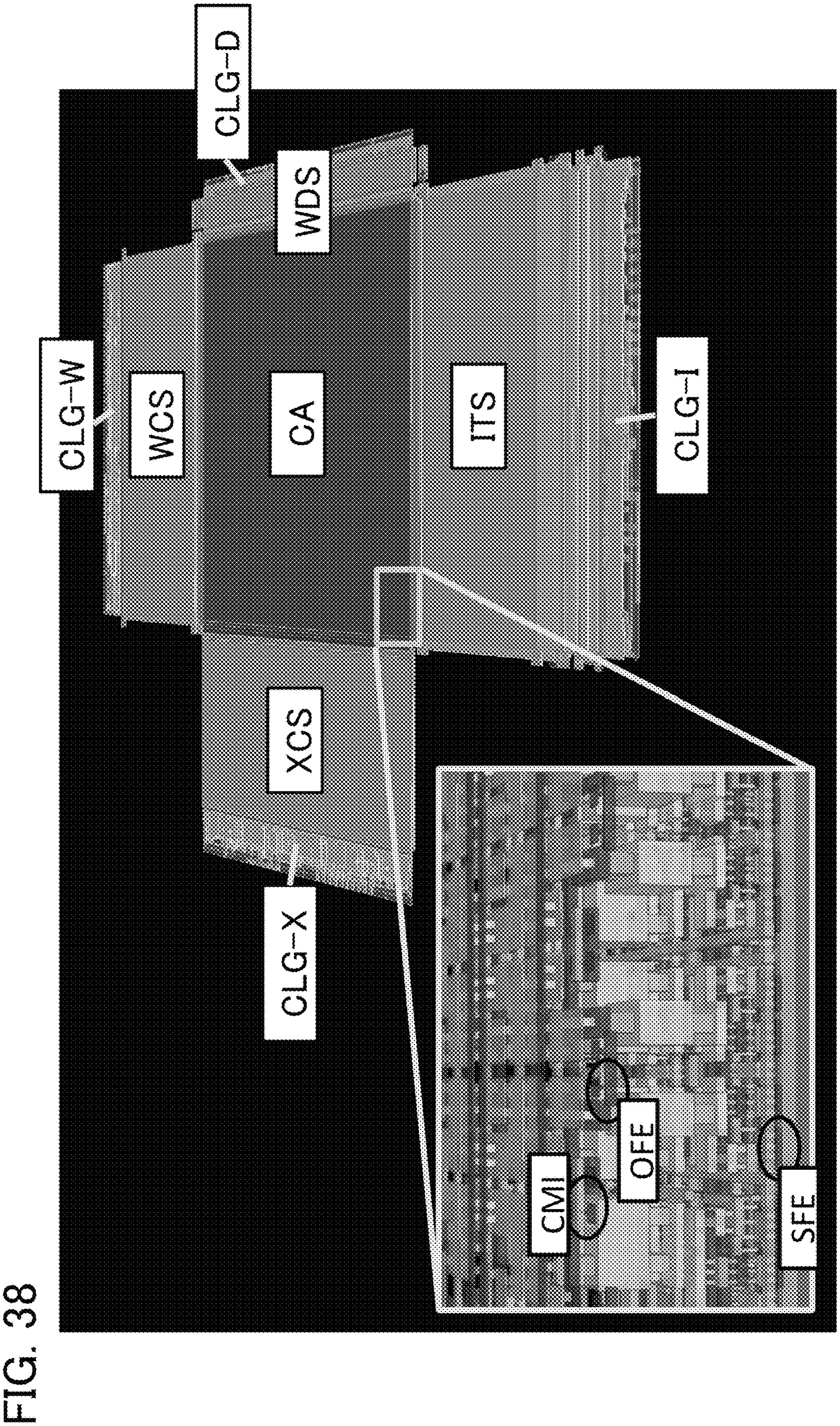
FIG. 38 is a schematic view illustrating a configuration example of a semiconductor device described in Example.

FIG. 38 is a schematic view of an arithmetic circuit that was prototyped this time and employed a monolithic 3D structure. The arithmetic circuit is configured such that a transistor SFE is formed as a Si transistor over a semiconductor substrate including silicon as a material, and a transistor OFE is formed as an OS transistor above the transistor SFE.

The circuit WCS, a circuit WDS, the circuit XCS, the circuit ITS, and the cell array CA shown in FIG. 38 correspond to the circuit WCS, the circuit WDS, the circuit XCS, the circuit ITS, and the cell array CA described in Embodiment 1. Note that a logic circuit CLG-D, a logic circuit CLG-W, a logic circuit CLG-X, and a logic circuit CLG-I shown in FIG. 38 function as logic circuits for driving the circuit WDS, the circuit WCS, the circuit XCS, and the circuit ITS, respectively. Specifically, the logic circuit CLG-D, the logic circuit CLG-W, the logic circuit CLG-X, and the logic circuit CLG-I are formed over the semiconductor substrate including silicon as a material. That is, the logic circuit CLG-D, the logic circuit CLG-W, the logic circuit CLG-X, and the logic circuit CLG-I include Si transistors.

Figure 39:
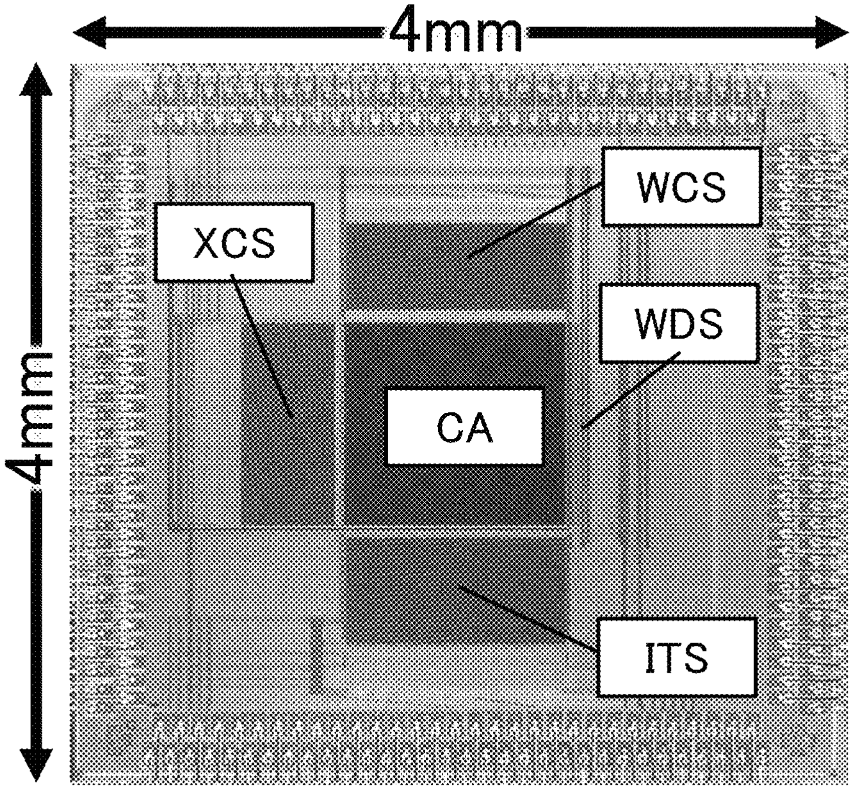
FIG. 39 is an image of a semiconductor device described in Example.

FIG. 39 is an image of the actually fabricated arithmetic circuit employing the monolithic 3D structure in FIG. 38.

In the cell array CA in FIG. 38 and FIG. 39, arithmetic cells are arranged in a matrix of 512×512. Specifically, m=512 and n=256 in the cell array CA illustrated in FIG. 1, and the cell array CA includes the cell IM[1,1] to the cell IM[512,256], the cell IMr[1,1] to the cell IMr[512,256], and the cell IMd[1] to the cell IMd[256].

Figure 40:
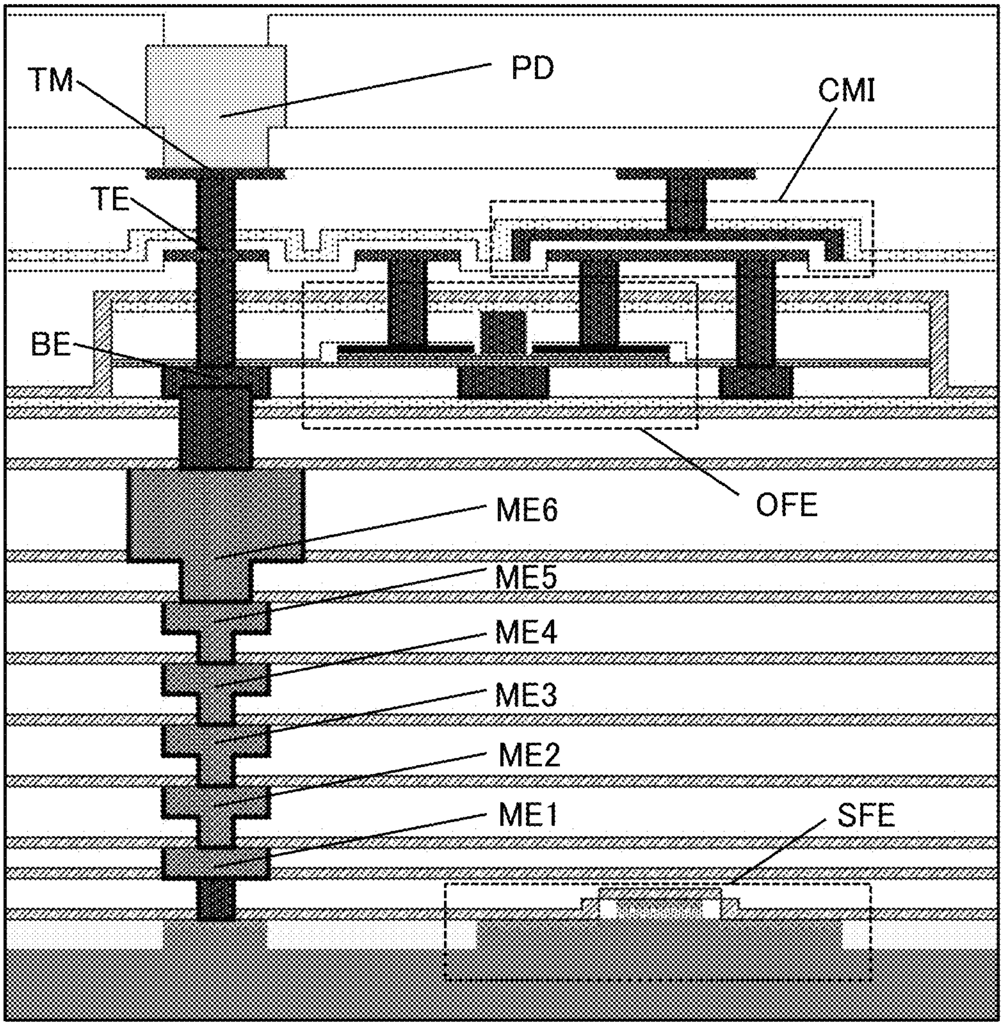
FIG. 40 is a schematic cross-sectional view of a semiconductor device described in Example.
Figure 41:
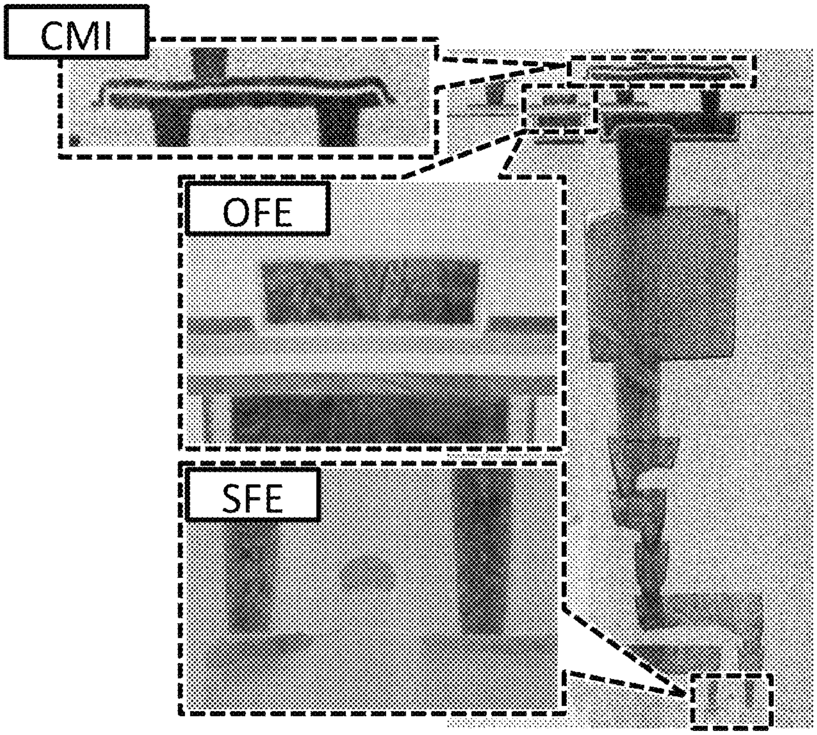
FIG. 41 is a cross-sectional STEM image of a semiconductor device described in Example.

FIG. 40 is a schematic cross-sectional view of part of the prototyped arithmetic circuit, and FIG. 41 is a cross-sectional image of part of the arithmetic circuit taken with a scanning transmission electron microscope (STEM).

In the prototyped arithmetic circuit, the transistor SFE, which is a Si transistor, is formed over the semiconductor substrate including silicon as a material in the FEOL (substrate process). In the BEOL (wiring process), a plurality of insulators are stacked over the transistor SFE, and a conductor ME1, a conductor ME2, a conductor ME3, a conductor ME4, a conductor ME5, and a conductor ME6 are embedded as wirings (or plugs).

The transistor OFE, which is an OS transistor, is formed above the plurality of insulators and the conductor ME1 to the conductor ME6. Note that the structure of the transistor OFE is similar to the structure of the transistor 200 described in the above embodiment.

A conductor BE is formed above the conductor ME6. Note that the conductor BE is formed using the same material as a back gate of the transistor OFE concurrently with the back gate of the transistor OFE.

A capacitor CMI is provided above the transistor OFE. The capacitor CMI includes a lower electrode and an upper electrode as a pair of electrodes. The lower electrode is covered with the upper electrode with an insulator functioning as a dielectric therebetween.

A conductor TE is provided above the conductor BE. The conductor TE is formed using the same material as the lower electrode of the capacitor CMI concurrently with the lower electrode of the capacitor CMI.

A conductor TM is provided above the conductor TE. A conductor PD functioning as an electrode pad of the arithmetic circuit is provided above the conductor TM.

Table 2 shows specifications of the arithmetic circuit shown in FIG. 38 to FIG. 41.

TABLE 2

| Specifications | |
|---|---|
| Technology | 55-nm CMOS + OSLSI |
| Die area | 4 mm × 4 mm |
| Storage capacity | 256 kb |
| Power | 1.5 V |
| Driving frequency | Logic portion: 8 MHz<br>Arithmetic circuit portion: 20 kHz |

TABLE 2-continued

| Specifications | |
|---|---|
| Throughput | 5.4 GOPS |
| Power consumption | 2.6 μW |
| Arithmetic efficiency | 201 TOP/W |

Figure 42:
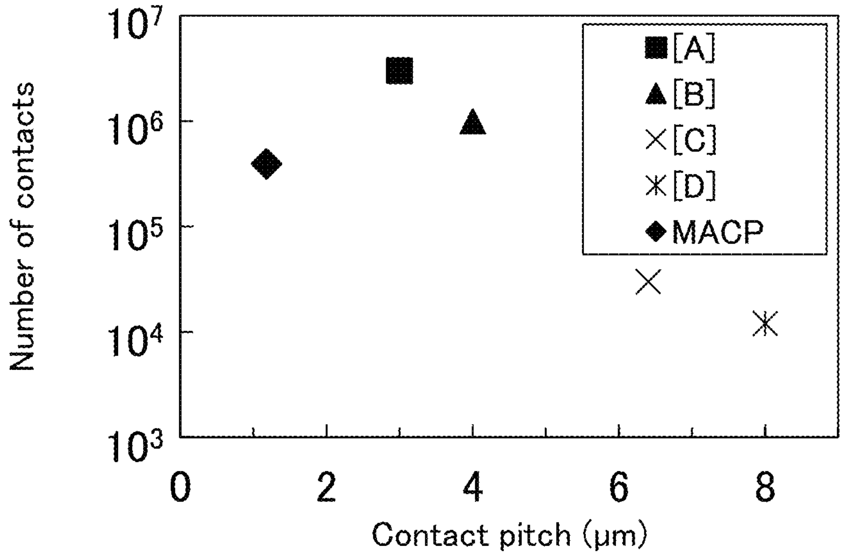
FIG. 42 is a graph showing the relation between a contact pitch and the number of contacts of a semiconductor device described in Example.

FIG. 42 is a graph showing the relation between a contact pitch and the number of contacts in arithmetic circuits having a three-dimensional stacked-layer structure, such as the prototyped arithmetic circuit (hereinafter referred to as MACP) and known arithmetic circuits.

Note that in FIG. 42, [A] is cited from Y. Kagawa et al., EDTM, 2019; [B] is cited from Y. Kagawa et al., IEDM, 2016; [C] is cited from S. Lhostis et al., ECTC, 2016; [D] is cited from J. P. Gambino et al., IITC, 2017.

Figure 43:
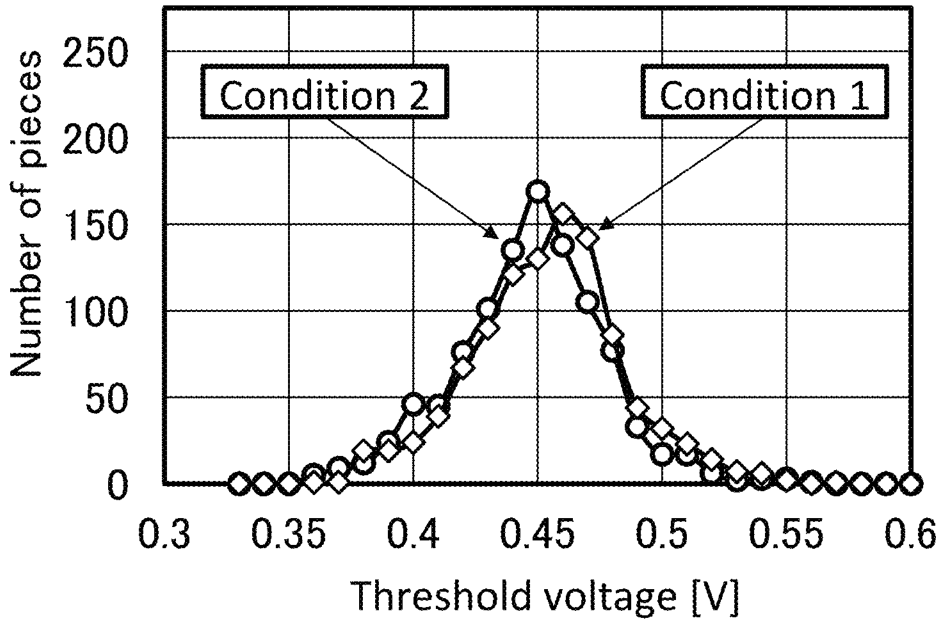
FIG. 43 is a graph showing distribution of threshold voltages of a plurality of Si transistors described in Example.

FIG. 43 shows distribution of the threshold voltages of a plurality of Si transistors (transistors SFE). Note that FIG. 43 shows Condition 1 of Si transistors over which OS transistors are not stacked and Condition 2 of Si transistors over which OS transistors are stacked. The number of transistors measured in each condition is 1024. As shown in FIG. 43, it is found that the Si transistors over which the OS transistors are stacked had substantially the same characteristics as the Si transistors over which the OS transistors are not stacked.

Figure 44:
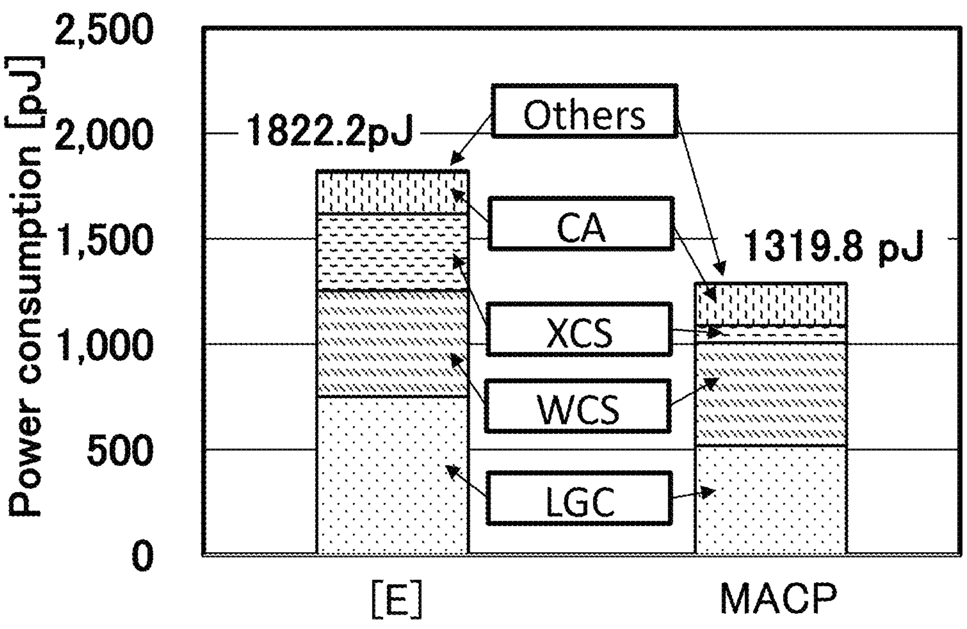
FIG. 44 is a graph showing power consumption of a semiconductor device described in Example.

FIG. 44 is a graph showing power consumption of the prototyped arithmetic circuit (MACP) and an arithmetic circuit ([E]) that was prototyped by the applicant of the present invention before. Note that [E] is cited from H. Baba et al., IEDM, 2021. Furthermore, LGC shown in FIG. 44 is the sum of power consumption of the logic circuit CLG-D, the logic circuit CLG-W, the logic circuit CLG-X, and the logic circuit CLG-I shown in FIG. 38. The power consumption of the prototyped arithmetic circuit was found to be reduced by 28% compared to [E].

Figure 45:
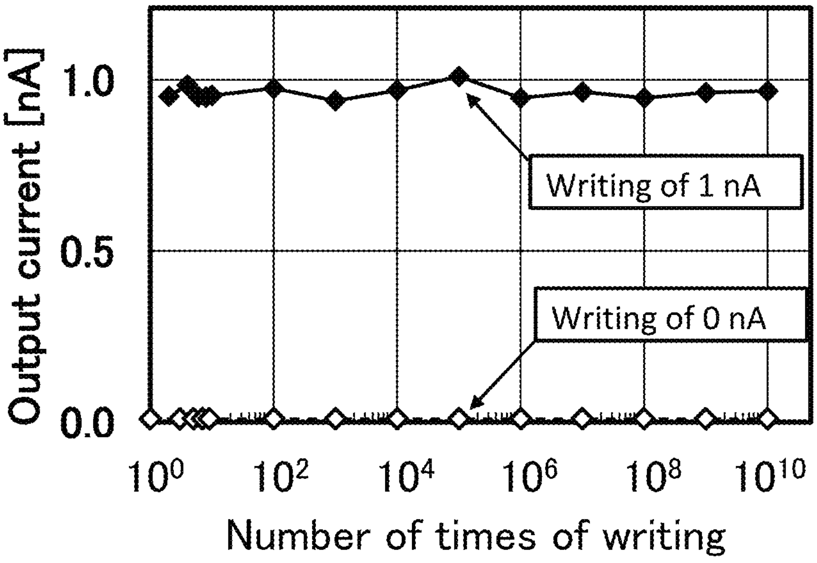
FIG. 45 is a graph showing the relation between the number of times of writing and output current of a semiconductor device described in Example.

FIG. 45 is a graph showing the relation between the number of times of writing data to the arithmetic cell and the amount of read current at the time of reading the written data from the arithmetic cell in the prototyped arithmetic circuit. Note that writing was performed on the arithmetic cell in two conditions of data corresponding to 0 nA and data corresponding to 1 nA. Performing writing operations 1010 times or more proved that the read current flowed appropriately in either condition.

Figure 46:
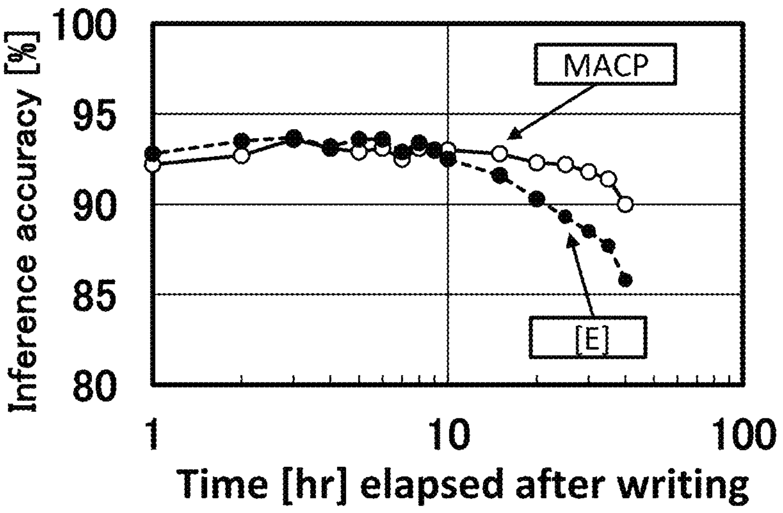
FIG. 46 is a graph showing data retention time and inference accuracy of a semiconductor device described in Example.

FIG. 46 is a graph showing the time elapsed after writing and the inference accuracy of handwritten digits in the arithmetic cells of the prototyped arithmetic circuit (MACP) and the arithmetic circuit ([E]) that was prototyped by the applicant of the present invention before. Note that MNIST (a dataset of handwritten digits) was used for learning necessary before inference was executed. Furthermore, [E] is the same as [E] cited in the description of FIG. 44. In [E], the inference accuracy fell below 90% after 20 hours elapsed; meanwhile, in the prototyped arithmetic circuit (MACP), the inference accuracy fell below 90% after 30 hours elapsed.

Figure 47:
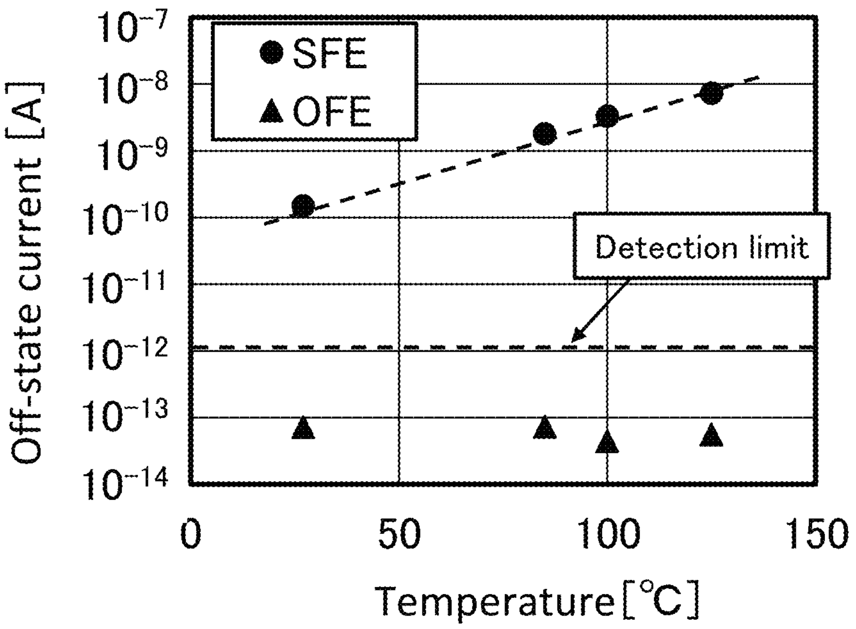
FIG. 47 is a graph showing temperature dependence of off-state current of a Si transistor and an OS transistor described in Example.

FIG. 47 is a graph showing the relation between temperature and the amount of drain current flowing in an off state (hereinafter referred to as off-state current) in the Si transistor (transistor SFE) and the OS transistor (transistor OFE). From FIG. 47, the obtained results were such that the off-state current of the transistor SFE increased along with the increase in temperature, whereas the off-state current of the transistor OFE was lower than the detection limit of a measurement device. Note that the off-state current of the transistor OFE was calculated not with the measurement device but from the transistor structure or the like.

Figure 48:
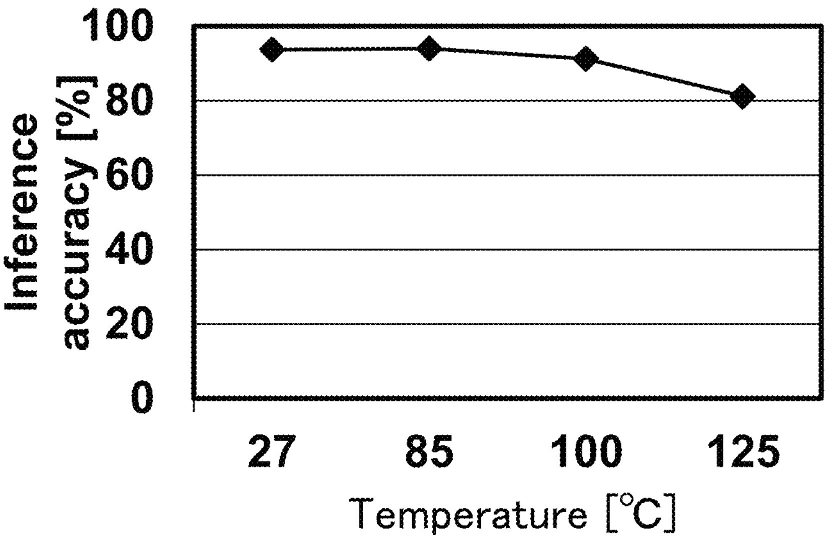
FIG. 48 is a graph showing temperature dependence of inference accuracy of a semiconductor device described in Example.

FIG. 48 is a graph showing temperature dependence of the inference accuracy of the prototyped arithmetic circuit (MACP). As shown in FIG. 48, it was demonstrated that the inference accuracy was higher than or equal to 90% at 100° C. or lower. On the other hand, the inference accuracy decreased to less than or equal to 90% at 125° C.

Figure 49:
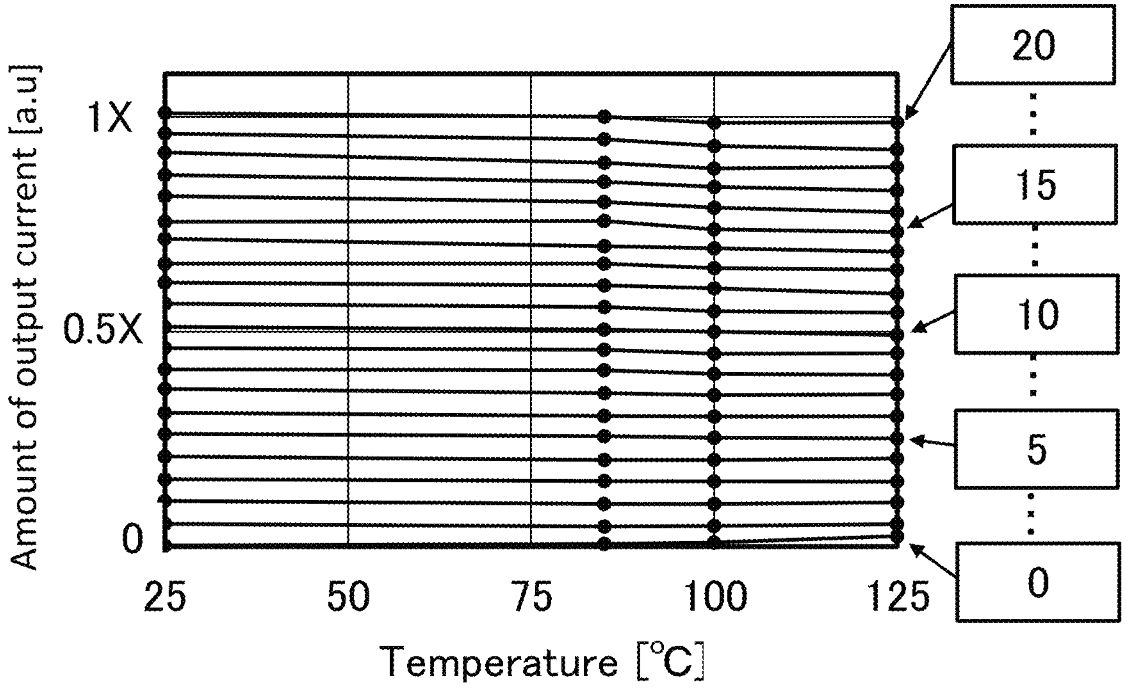
FIG. 49 is a graph showing temperature dependence of the amount of output current from an arithmetic cell in a semiconductor device described in Example.

FIG. 49 is a graph showing temperature dependence of the amount of current output from the arithmetic cell included in the prototyped arithmetic circuit (MACP). Note that in FIG. 49, the current amount output from the arithmetic cell is divided into 21 values and is normalized from 0 to 1. It is found from FIG. 49 that each current amount changes as the temperature rises. This explains why the inference accuracy decreased at high temperatures in FIG. 48.

Figure 50:
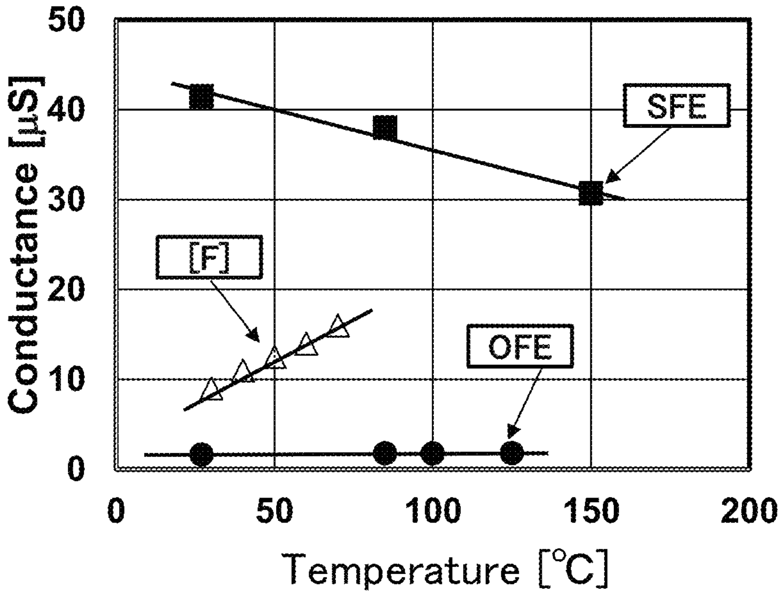
FIG. 50 is a graph showing temperature dependence of conductance of a Si transistor and an OS transistor described in Example and a PCM.

FIG. 50 is a graph showing temperature dependence of the conductance of the OS transistor (transistor OFE) and the Si transistor (transistor SFE) included in the prototyped arithmetic circuit (MACP) and a PCM (phase-change memory, [F]). Note that the contents of [F] are cited from I. Boybat at al., IEDM, 2021. As shown in FIG. 50, it is found that the conductance of the Si transistor and the PCM changes in accordance with a temperature change. Meanwhile, it is found that the conductance of the OS transistor does not significantly change even when a temperature change occurs.

Figure 51:
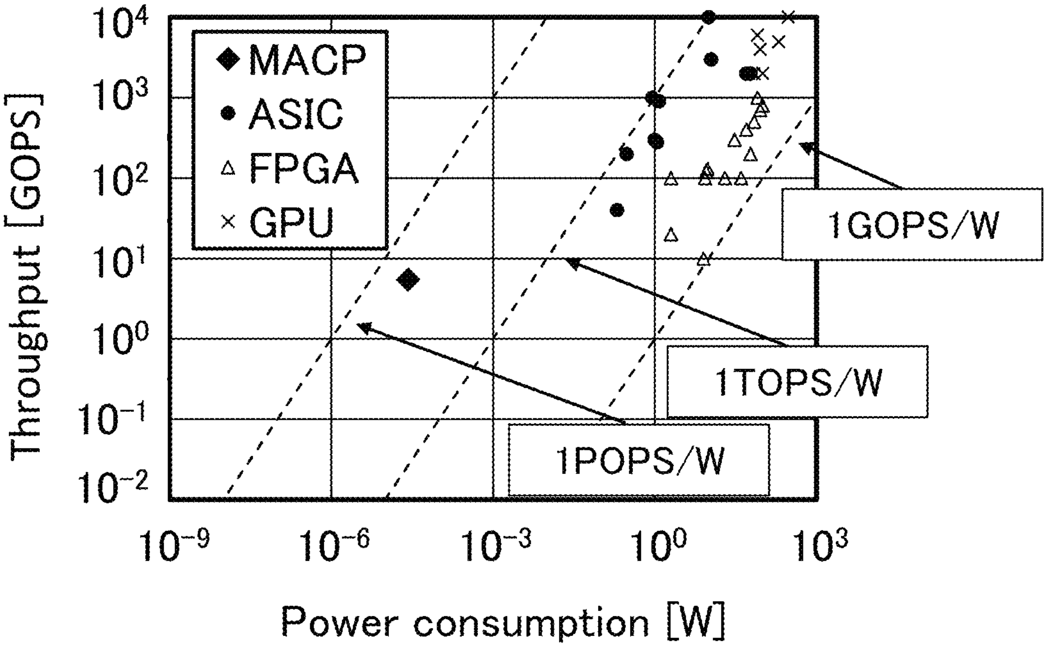
FIG. 51 is a graph showing benchmarks of a semiconductor device described in Example, ASICs, FPGAs, and GPUs.

FIG. 51 shows benchmarks of the arithmetic circuit (MACP) developed by the present applicant, ASICs, FPGAs, and GPUs.

Table 3 below shows comparison between the arithmetic circuit (MACP) developed this time by the present applicant, the arithmetic circuit ([E]) developed by the present applicant before, and arithmetic circuits developed by other research groups ([F] to [J]).

TABLE 3

| | MACP | [E] | [G] | [H] |
|---|---|---|---|---|
| Whether peripheral circuits are mounted | Yes | Yes | Yes | Yes |
| Memory device | CAAC-IGZO | CAAC-IGZO | PCM | STT MRAM |
| Current/cell | Less than 1 nA | Less than 1 nA | Less than 8 mA | N.A. |
| Capacity of memory device | 256 kb | 256 kb | 65.5 kb | 64 × 64 |
| Weight | Analog (64 values) | Analog (8 values) | Analog | 3 bits |
| Arithmetic efficiency | Over 200 TOPS/W | 143.9 TOPS/W | 10.5 TOPS/W | 262 TOPS/W |
| Accuracy | 93.1% *1 | 93.2% *1 | 85.6% *2 | 93.23% *2 |

| | [I] | [J] | [K] |
|---|---|---|---|
| Whether peripheral circuits are mounted | Yes | No (Simulation) | No (Simulation) |
| Memory device | RRAM | HZO Capacitive | FE-FinFET |
| Current/cell | Less than 4 nA | N.A. | N.A. |
| Capacity of memory device | 16 kb | 16 kb | 2 × 2 |
| Weight | Analog | 1 bit | 3 bits |
| Arithmetic efficiency | 78.4 TOPS/W | 105 TOPS/W | N.A. |
| Accuracy | 94.4% *1 | N.A. | 97.91% |

*1 MNIST
*2 CIFAR-10

Note that in Table 3, the contents of [G] are cited from R. Khaddan-Aljameh et al., VLSI, 2021; the contents of [H] are cited from S. Jung et al., Nature, 601, 211, 2022; the contents of [I] are cited from H. Jia et al., JSSC, 2020; the contents of [J] are cited from Y.-C. Luo et al., IEDM, 2021; the contents of [K] are cited from S. De et al., VLSI, 2021.

REFERENCE NUMERALS

MACA0: arithmetic circuit, MACA1: arithmetic circuit, MACA2: arithmetic circuit, MACB0: arithmetic circuit, MACB1: arithmetic circuit, MACJ: arithmetic circuit, CA: cell array, CTR: control circuit, WCS: circuit, XCS: circuit, WSD: circuit, ITS: circuit, FB: circuit, IM[1,1]: cell, IM[1,*j*]: cell, IM[m,1]: cell, IM[1, *n*]: cell, IM[m,j]: cell, IM[m,n]: cell, IM[1,256]: cell, IM[512,1]: cell, IM[512,256]: cell, IMr[1,1]: cell, IMr [1,*j*]: cell, IMr[m,1]: cell, IMr[1,*n*]: cell, IMr[m,j]: cell, IMr[m,n]: cell, IMr[1,256]: cell, IMr[512,1]: cell, IMr [512,256]: cell, CES[1,1]: cell, CES[m,1]: cell, CES[1, *n*]: cell, CES[m,n]: cell, IMd[1]: cell, IMd[m]: cell, IMd[512]: cell, WCSa[j]: circuit, WCSar[j]: circuit, XCSa[1]: circuit, XCSa[m]: circuit, ITRZ[j]: circuit, ITRZD[j]: circuit, ITRZD[256]: circuit, SWS1: circuit, SWS2: circuit, SBT[*l*]: circuit, CMP[j]: comparison circuit, CS: current source, CS1: current source, CS2: current source, CS3: current source, CS4: current source, WCL[1]: wiring, WCL[j]: wiring, WCL[n]: wiring, WCL[256]: wiring, WCLr[1]: wiring, WCLr[j]: wiring, WCLr[n]: wiring, WCLr[256]: wiring, XCL[1]: wiring, XCL[i]: wiring, XCL[m]: wiring, XCL[512]: wiring, WSL[1]: wiring, WSL[m]: wiring, WSL[512]: wiring, OL[1]: wiring, OL[n]: wiring, SWL1: wiring, SWL2: wiring, DW[1]: wiring, DW[2]: wiring, DW[K]: wiring, DX[1]: wiring, DX[2]: wiring, DX[K]: wiring, VE0: wiring, VE1: wiring, VDDL: wiring, VTHL: wiring, VINIL1: wiring, VINIL2: wiring, VWL: wiring, VTL: wiring, VRL: wiring, VGL: wiring, IT: terminal, OT: terminal, OT1: terminal, OT2: terminal, T1: terminal, T2: terminal, Nd[1]: node, Nd[m]: node, N[1,*j*]: node, N[m,j]: node, F1: transistor, F1*r*: transistor, F1*d*: transistor, F2: transistor, F2*r*: transistor, F2*d*: transistor, F5: transistor, F5*r*: transistor, F5*d*: transistor, Tr1: transistor, Tr1[1]: transistor, Tr1[2]: transistor, Tr1[K]: transistor, Tr2: transistor, Tr2[1]: transistor, Tr2[2]: transistor, Tr2[K]: transistor, Tr3: transistor, C5: capacitor, C5*r*: capacitor, C5*d*: capacitor, C6: capacitor, S3[*j*]: switch, S3*r*[j]: switch, S4[*j*]: switch, S4*r*[j]: switch, SWW: switch, SWX: switch, LE: load, LE1: load, LE2: load, LE3: load, LE4: load, OP1: operational amplifier, OP2: operational amplifier, ADC: analog-digital converter circuit, DAC: digital-analog converter circuit, NDa: node, NDb: node, Ca: output terminal, Cb: output terminal, D: output terminal, ILa: wiring, ILb: wiring, CP: comparison portion, CPTa: input terminal, CPTb: input terminal, CNR: control portion, CNR-FS: sign generation portion, CNR-SG: digital signal generation portion, IDCa: digital-analog converter circuit, IDCb: digital-analog converter circuit, S101: step, S102: step, S103: step, S103A: step, S104: step, S104A: step, S105: step, S105A: step, S106: step, S107: step, S108: step, S201: step, S202: step, S203*a*: step, S203*b*: step, S204*a*: step, S204*b*: step, S205: step, S206: step, S301: step, S302: step, S303: step, S304: step, S305: step, S306: step, SFE: transistor, OFE: transistor, CMI: capacitor, CLG-D: logic circuit, CLG-W: logic circuit, CLG-X: logic circuit, CLG-I: logic circuit, ME1: conductor, ME2: conductor, ME3: conductor, ME4: conductor, ME5: conductor, ME6: conductor, BE: conductor, TE: conductor, TM: conductor, PD: conductor, 10: memory cell, 15: memory array, 22: PSW, 23: PSW, 31: peripheral circuit, 32: control circuit, 33: voltage generation circuit, 41: peripheral circuit, 42: row decoder, 43: row driver, 44: column decoder, 45: column driver, 47: input circuit, 48: output circuit, 50: driver circuit layer, 60: memory layer, 60_*k*: memory layer, 60_N: memory layer, 60_1: memory layer, 60_2: memory layer, 60_3: memory layer, 60_5: memory layer, 100: memory device, 150: capacitor, 150*a*: capacitor, 150*b*: capacitor, 153: insulator, 154: insulator, 158: opening, 160: conductor, 160*a*: conductor, 160*b*: conductor, 200: transistor, 200*a*: transistor, 200*b*: transistor, 205: conductor, 205*a*: conductor, 205*b*: conductor, 205*c*: conductor, 209: conductor, 210: insulator, 212: insulator, 214: insulator, 216: insulator, 221: insulator, 222: insulator, 224: insulator, 230: oxide, 230*a*: oxide, 230*b*: oxide, 230*ba*: region, 230*bb*: region, 230*bc*: region, 240: conductor, 240*a*: conductor, 240*b*: conductor, 242: conductor, 242*a*: conductor, 242*al*: conductor, 242*a*2: conductor, 242*b*: conductor, 242*b*1: conductor, 242*b*2: conductor, 253: insulator, 254: insulator, 258: opening, 260: conductor, 260*a*: conductor, 260*b*: conductor, 275: insulator, 280: insulator, 282: insulator, 283: insulator, 285: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 357: insulator, 358: conductor, 366: conductor, 400: transistor, 500: transistor, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display, 5303: keyboard, 5400: ICD main body, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6106: controller chip, 6240: digital camera, 6241: housing, 6242: display portion, 6243: operation button, 6244: shutter button, 6246: lens, 6300: video camera, 6301: housing, 6302: housing, 6303: display portion, 6304: operation key, 6305: lens, 6306: joint, 7500: stationary game machine, 7520: main body, 7522: controller, 8200: electronic device, 8201: mounting portion, 8202: lens, 8203: main body, 8204: display portion, 8205: cable, 8206: battery, 8300: electronic device, 8301: housing, 8302: display portion, 8304: fixing member, 8304*a*: fixing member, 8305: lens

The invention claimed is:

1. An operation method of a semiconductor device comprising a control circuit, a first circuit, a second circuit, a first wiring, a first cell, and a converter circuit, the operation method comprising a first step, a second step, a third step, a fourth step, a fifth step, and a sixth step,
- wherein the control circuit is electrically connected to the first circuit and the second circuit,
- wherein the first circuit is electrically connected to the first wiring,
- wherein an input terminal of the converter circuit is electrically connected to the first wiring,
- wherein an output terminal of the converter circuit is electrically connected to the second circuit,
- wherein the first cell is electrically connected to the first wiring,
- wherein the first step comprises an operation in which the control circuit transmits, to the first circuit, a first signal corresponding to a value of first data,
- wherein the second step comprises:
  - an operation in which the first circuit generates a first current with an amount corresponding to the first signal by obtaining the first signal and outputs the first current to the first wiring; and
  - an operation in which the first current flowing from the first wiring to the first cell makes the first cell retain a first potential corresponding to the amount of the first current,
- wherein the third step comprises:
  - an operation in which the first cell outputs a second current to the input terminal of the converter circuit through the first wiring; and an operation in which the converter circuit outputs a second signal corresponding to the amount of the second current to the second circuit, wherein the fourth step comprises:

an operation in which the control circuit outputs the first data to the second circuit;

an operation in which the second circuit calculates a difference value between a value corresponding to the second signal obtained from the converter circuit and the value corresponding to the first data obtained from the control circuit, and transmits the difference value to the control circuit; and an operation in which the control circuit obtains the difference value, and operation termination is performed when the difference value is 0, whereas the operation method proceeds to the fifth step when the difference value is not 0, wherein the fifth step comprises an operation in which the control circuit generates an update value obtained by adding the difference value to the value of the first data in the first step, and wherein the sixth step comprises:

an operation in which the control circuit transmits, to the first circuit, the first signal corresponding to the update value; and an operation of proceeding to the second step.

2. The operation method of the semiconductor device, according to claim 1, wherein the second circuit comprises a subtractor.

3. The operation method of the semiconductor device, according to claim 1, wherein the first cell comprises a first transistor, a second transistor, a third transistor, and a capacitor, wherein one of a source and a drain of the first transistor is electrically connected to a gate of the second transistor, wherein one of a source and a drain of the second transistor is electrically connected to one of a source and a drain of the third transistor, wherein the other of the source and the drain of the first transistor is electrically connected to the other of the source and the drain of the third transistor, wherein a first terminal of the capacitor is electrically connected to the one of the source and the drain of the first transistor, and wherein the first wiring is electrically connected to the other of the source and the drain of the first transistor.

* * * * *